(12) United States Patent
Gerszberg et al.

(10) Patent No.: US 9,800,327 B2
(45) Date of Patent: Oct. 24, 2017

(54) APPARATUS FOR CONTROLLING OPERATIONS OF A COMMUNICATION DEVICE AND METHODS THEREOF

(71) Applicant: AT&T Intellectual Property I, LP, Atlanta, GA (US)

(72) Inventors: Irwin Gerszberg, Kendall Park, NJ (US); Farhad Barzegar, Branchburg, NJ (US); Paul Shala Henry, Holmdel, NJ (US); Robert Bennett, Southhold, NY (US); Donald J Barnickel, Flemington, NJ (US); Thomas M. Willis, III, Tinton Falls, NJ (US)

(73) Assignee: AT&T Intellectual Property I, L.P., Atlanta, GA (US)

(*) Notice: Subject to any disclaimer, the term of this patent is extended or adjusted under 35 U.S.C. 154(b) by 66 days.

(21) Appl. No.: 14/548,494

(22) Filed: Nov. 20, 2014

(65) Prior Publication Data
US 2016/0149636 A1 May 26, 2016

(51) Int. Cl.
| | |
|---|---|
| *H04B 10/12* | (2006.01) |
| *H04B 10/038* | (2013.01) |
| *H04L 1/00* | (2006.01) |
| *H04W 24/04* | (2009.01) |
| *G01R 31/00* | (2006.01) |

(Continued)

(52) U.S. Cl.
CPC ........... *H04B 10/038* (2013.01); *G01R 31/00* (2013.01); *H02J 13/0075* (2013.01); *H04B 3/56* (2013.01); *H04L 1/0002* (2013.01); *H04W 24/04* (2013.01); *H01Q 1/46* (2013.01); *H02J 13/00* (2013.01); *H04B 2203/5425* (2013.01);

(Continued)

(58) Field of Classification Search
None
See application file for complete search history.

(56) References Cited

U.S. PATENT DOCUMENTS

| | | |
|---|---|---|
| 395,814 A | 1/1889 | Henry et al. |
| 529,290 A | 11/1894 | Harry et al. |

(Continued)

FOREIGN PATENT DOCUMENTS

| | | |
|---|---|---|
| AU | 565039 B2 | 9/1987 |
| AU | 582630 B2 | 4/1989 |

(Continued)

OTHER PUBLICATIONS

"An Improved Solid Dielectric Lens Impulse Radiating Antenna," SBIR/STTR, DoD, sbir.gov, 2004.

(Continued)

*Primary Examiner* — Mohammed Rachedine
(74) *Attorney, Agent, or Firm* — Guntin & Gust, PLC; Jay H. Anderson

(57) ABSTRACT

Aspects of the subject disclosure may include, for example, a transmission system having a coupling device, a bypass circuit, a memory and a processor. The coupling device can facilitate transmission or reception of electromagnetic waves that propagate along a surface of a transmission medium. The memory can store instructions, which when executed by the processor, causes the processor to perform operations including restarting a timer to prevent the bypass circuit from disabling the transmission or reception of electromagnetic waves by the coupling device. Other embodiments are disclosed.

20 Claims, 27 Drawing Sheets

(51) Int. Cl.
*H04B 3/56* (2006.01)
*H01Q 1/46* (2006.01)
*H02J 13/00* (2006.01)

(52) U.S. Cl.
CPC ... *H04B 2203/5491* (2013.01); *Y02E 60/7892* (2013.01); *Y04S 40/146* (2013.01)

(56) References Cited

U.S. PATENT DOCUMENTS

| | | |
|---|---|---|
| 1,721,785 A | 7/1929 | Meyer |
| 1,798,613 A | 3/1931 | Mason et al. |
| 1,860,123 A | 5/1932 | Yagi |
| 2,058,611 A | 10/1936 | Merkle et al. |
| 2,106,770 A | 2/1938 | Southworth et al. |
| 2,129,711 A | 9/1938 | Southworth |
| 2,129,714 A | 9/1938 | Southworth et al. |
| 2,147,717 A | 2/1939 | Schelkunoff |
| 2,187,908 A | 1/1940 | Mccreary |
| 2,199,083 A | 4/1940 | Schelkunoff |
| 2,232,179 A | 2/1941 | King |
| 2,283,935 A | 5/1942 | King |
| 2,398,095 A | 4/1946 | Katzin |
| 2,402,622 A | 6/1946 | Hansen |
| 2,405,242 A | 8/1946 | Southworth et al. |
| 2,407,068 A | 9/1946 | Fiske et al. |
| 2,407,069 A | 9/1946 | Fiske |
| 2,410,113 A | 10/1946 | Edwin, Jr. |
| 2,411,338 A | 11/1946 | Roberts |
| 2,415,089 A | 2/1947 | Feldman et al. |
| 2,415,807 A | 2/1947 | Barrow et al. |
| 2,419,205 A | 4/1947 | Feldman et al. |
| 2,420,007 A | 5/1947 | Olden |
| 2,422,058 A | 6/1947 | Whinnery |
| 2,432,134 A | 12/1947 | Bagnall |
| 2,461,005 A | 2/1949 | Southworth |
| 2,471,021 A | 5/1949 | Bradley |
| 2,488,400 A | 11/1949 | Harder |
| 2,513,205 A | 6/1950 | Roberts et al. |
| 2,514,679 A | 7/1950 | Southworth |
| 2,519,603 A | 8/1950 | Reber |
| 2,562,281 A | 1/1951 | Mumford |
| 2,540,839 A | 2/1951 | Southworth |
| 2,541,843 A | 2/1951 | Tiley et al. |
| 2,542,980 A | 2/1951 | Barrow |
| 2,557,110 A | 6/1951 | Jaynes |
| 2,596,190 A | 5/1952 | Wiley |
| 2,599,864 A | 6/1952 | Robertson-Shersby-Ha et al. |
| 2,659,817 A | 11/1953 | Cutler et al. |
| 2,667,578 A | 1/1954 | Carlson et al. |
| 2,677,055 A | 4/1954 | Allen |
| 2,685,068 A | 7/1954 | Goubau |
| 2,688,732 A | 9/1954 | Kock |
| 2,691,766 A | 10/1954 | Clapp |
| 2,706,279 A | 4/1955 | Aron |
| 2,711,514 A | 6/1955 | Rines |
| 2,723,378 A | 11/1955 | Clavier et al. |
| 2,727,232 A | 12/1955 | Pyrga |
| 2,735,092 A | 2/1956 | Brown |
| 2,737,632 A | 3/1956 | Grieg et al. |
| 2,740,826 A | 4/1956 | Bondon |
| 2,745,101 A | 5/1956 | Marie |
| 2,748,350 A | 5/1956 | Miller et al. |
| 2,749,545 A | 6/1956 | Kostriza |
| 2,754,513 A | 7/1956 | Goubau |
| 2,761,137 A | 8/1956 | Atta et al. |
| 2,769,147 A | 10/1956 | Black et al. |
| 2,769,148 A | 10/1956 | Clogston et al. |
| 2,770,783 A | 11/1956 | Thomas et al. |
| 2,794,959 A | 6/1957 | Fox |
| 2,805,415 A | 9/1957 | Berkowitz |
| 2,806,177 A | 9/1957 | Haeff et al. |
| 2,806,972 A | 9/1957 | Sensiper |
| 2,810,111 A | 10/1957 | Cohn |
| 2,819,451 A | 1/1958 | Sims et al. |
| 2,820,083 A | 1/1958 | Hendrix |
| 2,825,060 A | 2/1958 | Ruze et al. |
| 2,835,871 A | 5/1958 | Raabe |
| 2,851,686 A | 9/1958 | Hagaman et al. |
| 2,867,776 A | 1/1959 | Wilkinson, Jr. |
| 2,883,135 A | 4/1959 | Smalley et al. |
| 2,883,136 A | 4/1959 | Smalley et al. |
| 2,900,558 A | 8/1959 | Watkins et al. |
| 2,910,261 A | 10/1959 | Ward et al. |
| 2,912,695 A | 11/1959 | Cutler |
| 2,914,741 A | 11/1959 | Unger |
| 2,915,270 A | 12/1959 | Gladsen et al. |
| 2,921,277 A | 1/1960 | Goubau |
| 2,925,458 A | 2/1960 | Lester et al. |
| 2,933,701 A | 4/1960 | Lanctot et al. |
| 2,946,970 A | 7/1960 | Hafner et al. |
| 2,949,589 A | 8/1960 | Hafner |
| 2,960,670 A | 11/1960 | Marcatili et al. |
| 2,970,800 A | 2/1961 | Smalley et al. |
| 2,972,148 A | 2/1961 | Rupp et al. |
| 2,974,297 A | 3/1961 | Ros |
| 2,981,949 A | 4/1961 | Elliott et al. |
| 2,990,151 A | 6/1961 | Phillips et al. |
| 2,993,205 A | 7/1961 | Cooper et al. |
| 3,016,520 A | 1/1962 | Chaimowicz et al. |
| 3,025,478 A | 3/1962 | Marcatili et al. |
| 3,028,565 A | 4/1962 | Walker et al. |
| 3,040,278 A | 6/1962 | Griemsmann et al. |
| 3,045,238 A | 7/1962 | Cheston et al. |
| 3,046,550 A | 7/1962 | Schlaud et al. |
| 3,047,822 A | 7/1962 | Lakatos et al. |
| 3,065,945 A | 11/1962 | Newsome et al. |
| 3,072,870 A | 1/1963 | Walker |
| 3,077,569 A | 2/1963 | Ikrath et al. |
| 3,096,462 A | 7/1963 | Feinstein et al. |
| 3,101,472 A | 8/1963 | Goubau |
| 3,109,175 A | 10/1963 | Lloyd |
| 3,129,356 A | 4/1964 | Phillips |
| 3,134,951 A | 5/1964 | Huber et al. |
| 3,146,297 A | 8/1964 | Hahne |
| 3,146,453 A | 8/1964 | Hagaman |
| 3,201,724 A | 8/1965 | Hafner |
| 3,205,462 A | 9/1965 | Meinke |
| 3,218,384 A | 11/1965 | Shaw |
| 3,219,954 A | 11/1965 | Rutelli |
| 3,234,559 A | 2/1966 | Bartholma et al. |
| 3,255,454 A | 6/1966 | Walter et al. |
| 3,296,364 A | 1/1967 | Jefferson |
| 3,296,685 A | 1/1967 | Menahem et al. |
| 3,310,808 A | 3/1967 | Friis et al. |
| 3,316,344 A | 4/1967 | Toms et al. |
| 3,316,345 A | 4/1967 | Toms et al. |
| 3,318,561 A | 5/1967 | Robertson, Jr. et al. |
| 3,321,763 A | 5/1967 | Ikrath et al. |
| 3,329,958 A | 7/1967 | Anderson et al. |
| 3,351,947 A | 11/1967 | Hart et al. |
| 3,355,738 A | 11/1967 | Algeo et al. |
| 3,369,788 A | 2/1968 | Eisele |
| 3,389,394 A | 6/1968 | Lewis et al. |
| 3,392,388 A | 7/1968 | Tsuneo et al. |
| 3,392,395 A | 7/1968 | Hannan |
| 3,411,112 A | 11/1968 | Honig et al. |
| 3,413,637 A | 11/1968 | Goebels, Jr. et al. |
| 3,413,642 A | 11/1968 | Cook |
| 3,414,903 A | 12/1968 | Bartlett et al. |
| 3,420,596 A | 1/1969 | Osterberg |
| 3,427,573 A | 2/1969 | White et al. |
| 3,448,455 A | 6/1969 | Alfandari et al. |
| 3,453,617 A | 7/1969 | Brickey et al. |
| 3,459,873 A | 8/1969 | Harris et al. |
| 3,465,346 A | 9/1969 | Patterson et al. |
| 3,474,995 A | 10/1969 | Amidon et al. |
| 3,482,251 A | 12/1969 | Bowes |
| 3,487,158 A | 12/1969 | Killian |
| 3,495,262 A | 2/1970 | Robert et al. |
| 3,500,422 A | 3/1970 | Grady et al. |
| 3,509,463 A | 4/1970 | Woodward et al. |
| 3,522,560 A | 8/1970 | Hayany |
| 3,524,192 A | 8/1970 | Sakiotis et al. |
| 3,529,205 A | 9/1970 | Miller |

(56) References Cited

U.S. PATENT DOCUMENTS

| | | |
|---|---|---|
| 3,530,481 A | 9/1970 | Tanaka et al. |
| 3,531,803 A | 9/1970 | Hudspeth et al. |
| 3,536,800 A | 10/1970 | Hubbard |
| 3,555,553 A | 1/1971 | Boyns |
| 3,557,341 A | 1/1971 | Sochilin et al. |
| 3,566,317 A | 2/1971 | Hafner |
| 3,568,204 A | 3/1971 | Blaisdell |
| 3,569,979 A | 3/1971 | Munk et al. |
| 3,573,838 A | 4/1971 | Ajioka |
| 3,588,754 A | 6/1971 | Hafner |
| 3,588,755 A | 6/1971 | Kunio et al. |
| 3,589,121 A | 6/1971 | Mulvey |
| 3,594,494 A | 7/1971 | Sullivan |
| 3,599,219 A | 8/1971 | Hansen et al. |
| 3,603,951 A | 9/1971 | Bracken et al. |
| 3,609,247 A | 9/1971 | Halstead |
| 3,623,114 A | 11/1971 | Seaton |
| 3,624,655 A | 11/1971 | Yamada et al. |
| 3,638,224 A | 1/1972 | Bailey et al. |
| 3,653,622 A | 4/1972 | Farmer |
| 3,666,902 A | 5/1972 | Owen et al. |
| 3,668,459 A | 6/1972 | Symons et al. |
| 3,668,574 A | 6/1972 | Barlow |
| 3,672,202 A | 6/1972 | Barber et al. |
| 3,686,596 A | 8/1972 | Albee |
| 3,693,922 A | 9/1972 | Gueguen |
| 3,699,574 A | 10/1972 | Plunk et al. |
| 3,703,690 A | 11/1972 | Ravenscroft et al. |
| 3,704,001 A | 11/1972 | Sloop |
| 3,725,937 A | 4/1973 | Schreiber |
| 3,753,086 A | 8/1973 | Shoemaker et al. |
| 3,760,127 A | 9/1973 | Grossi et al. |
| 3,765,021 A | 10/1973 | Chiron et al. |
| 3,772,528 A | 11/1973 | Anderson et al. |
| 3,775,769 A | 11/1973 | Heeren et al. |
| 3,787,872 A | 1/1974 | Kauffman |
| 3,796,970 A | 3/1974 | Snell |
| 3,806,931 A | 4/1974 | Wright |
| 3,833,909 A | 9/1974 | Schaufelberger |
| 3,835,407 A | 9/1974 | Yariv et al. |
| 3,845,426 A | 10/1974 | Barlow |
| 3,858,214 A | 12/1974 | Jones |
| 3,877,032 A | 4/1975 | Rosa |
| 3,888,446 A | 6/1975 | O'Brien et al. |
| 3,896,380 A | 7/1975 | Martin |
| 3,906,508 A | 9/1975 | Foldes |
| 3,911,415 A | 10/1975 | Whyte |
| 3,921,949 A | 11/1975 | Coon |
| 3,925,763 A | 12/1975 | Wadhwani |
| 3,935,577 A | 1/1976 | Hansen et al. |
| 3,936,836 A | 2/1976 | Wheeler et al. |
| 3,936,838 A | 2/1976 | Foldes et al. |
| 3,952,984 A | 4/1976 | Dimitry et al. |
| 3,956,751 A | 5/1976 | Herman |
| 3,959,794 A | 5/1976 | Chrepta et al. |
| 3,973,087 A | 8/1976 | Fong et al. |
| 3,973,240 A | 8/1976 | Fong et al. |
| 3,976,358 A | 8/1976 | Thompson et al. |
| 3,983,560 A | 9/1976 | MacDougall et al. |
| 4,010,799 A | 3/1977 | Kern et al. |
| 4,012,743 A | 3/1977 | Maciejewski et al. |
| 4,020,431 A | 4/1977 | Saunders et al. |
| 4,026,632 A | 5/1977 | Hill et al. |
| 4,030,048 A | 6/1977 | Foldes et al. |
| 4,030,953 A | 6/1977 | Rutschow et al. |
| 4,031,536 A | 6/1977 | Alford et al. |
| 4,035,054 A | 7/1977 | Lattanzi et al. |
| 4,047,180 A | 9/1977 | Kuo et al. |
| 4,079,361 A | 3/1978 | Woode et al. |
| 4,080,600 A | 3/1978 | Toman et al. |
| 4,099,184 A | 7/1978 | Rapshys et al. |
| 4,114,121 A | 9/1978 | Barlow et al. |
| 4,115,782 A | 9/1978 | Han et al. |
| 4,123,759 A | 10/1978 | Hines et al. |
| 4,125,768 A | 11/1978 | Jackson et al. |
| 4,129,872 A | 12/1978 | Toman et al. |
| 4,141,015 A | 2/1979 | Wong et al. |
| 4,149,170 A | 4/1979 | Campbell et al. |
| 4,155,108 A | 5/1979 | Tuttle et al. |
| 4,156,241 A | 5/1979 | Mobley et al. |
| 4,166,669 A | 9/1979 | Leonberger et al. |
| 4,175,257 A | 11/1979 | Smith et al. |
| 4,188,595 A | 2/1980 | Cronson et al. |
| 4,190,137 A | 2/1980 | Shimada et al. |
| 4,191,953 A | 3/1980 | Woode et al. |
| 4,195,302 A | 3/1980 | Leupelt et al. |
| 4,210,357 A | 7/1980 | Adachi et al. |
| 4,216,449 A | 8/1980 | Kach |
| 4,220,957 A | 9/1980 | Britt et al. |
| 4,231,042 A | 10/1980 | Turrin et al. |
| 4,234,753 A | 11/1980 | Clutter |
| 4,238,974 A | 12/1980 | Fawcett et al. |
| 4,246,584 A | 1/1981 | Noerpel et al. |
| 4,247,858 A | 1/1981 | Eichweber et al. |
| 4,250,489 A | 2/1981 | Dudash et al. |
| 4,268,804 A | 5/1981 | Spinner et al. |
| 4,274,097 A | 6/1981 | Krall et al. |
| 4,274,112 A | 6/1981 | Leysieffer et al. |
| 4,278,955 A | 7/1981 | Lunden et al. |
| 4,293,833 A | 10/1981 | Popa et al. |
| 4,298,877 A | 11/1981 | Sletten et al. |
| 4,300,242 A | 11/1981 | Nava et al. |
| 4,307,938 A | 12/1981 | Dyott et al. |
| 4,316,646 A | 2/1982 | Siebens et al. |
| 4,319,074 A | 3/1982 | Yaste et al. |
| 4,329,690 A | 5/1982 | Parker et al. |
| 4,333,082 A | 6/1982 | Susman et al. |
| 4,335,613 A | 6/1982 | Luukkala et al. |
| 4,336,719 A | 6/1982 | Lynnworth |
| 4,345,256 A | 8/1982 | Rainwater et al. |
| 4,366,565 A | 12/1982 | Herskowitz |
| 4,367,446 A | 1/1983 | Hall et al. |
| 4,378,143 A | 3/1983 | Winzer et al. |
| 4,384,289 A | 5/1983 | Fernandes et al. |
| 4,398,058 A | 8/1983 | Gerth et al. |
| 4,398,121 A | 8/1983 | Chodorow et al. |
| 4,413,263 A | 11/1983 | Amitay et al. |
| 4,447,811 A | 5/1984 | Hamid et al. |
| 4,458,250 A | 7/1984 | Bodnar et al. |
| 4,463,329 A | 7/1984 | Suzuki et al. |
| 4,468,672 A | 8/1984 | Dragone et al. |
| 4,475,209 A | 10/1984 | Udren |
| 4,477,814 A | 10/1984 | Brumbaugh et al. |
| 4,482,899 A | 11/1984 | Dragone et al. |
| 4,488,156 A | 12/1984 | DuFort et al. |
| 4,491,386 A | 1/1985 | Negishi et al. |
| 4,495,498 A | 1/1985 | Petrelis et al. |
| 4,516,130 A | 5/1985 | Dragone |
| 4,525,432 A | 6/1985 | Saito et al. |
| 4,525,693 A | 6/1985 | Suzuki et al. |
| 4,533,875 A | 8/1985 | Lau et al. |
| 4,541,303 A | 9/1985 | Kuzunishi et al. |
| 4,550,271 A | 10/1985 | Lau et al. |
| 4,553,112 A | 11/1985 | Saad et al. |
| 4,556,271 A | 12/1985 | Hubbard |
| 4,558,325 A | 12/1985 | Stroem et al. |
| 4,565,348 A | 1/1986 | Larsen |
| 4,566,012 A | 1/1986 | Choung et al. |
| 4,567,401 A | 1/1986 | Barnett et al. |
| 4,568,943 A | 2/1986 | Bowman |
| 4,573,215 A | 2/1986 | Oates et al. |
| 4,589,424 A | 5/1986 | Vaguine et al. |
| 4,598,262 A | 7/1986 | Chen et al. |
| 4,599,598 A | 7/1986 | Komoda et al. |
| 4,604,624 A | 8/1986 | Amitay et al. |
| 4,604,627 A | 8/1986 | Saad et al. |
| 4,618,867 A | 10/1986 | Gans et al. |
| 4,636,753 A | 1/1987 | Geller et al. |
| 4,638,322 A | 1/1987 | Lamberty et al. |
| 4,641,916 A | 2/1987 | Oestreich et al. |
| 4,642,651 A | 2/1987 | Kuhn et al. |
| 4,644,365 A | 2/1987 | Horning et al. |
| 4,647,329 A | 3/1987 | Oono et al. |
| 4,660,050 A | 4/1987 | Phillips et al. |

(56) References Cited

U.S. PATENT DOCUMENTS

| | | |
|---|---|---|
| 4,665,660 A | 5/1987 | Krall et al. |
| 4,672,384 A | 6/1987 | Roy et al. |
| 4,673,943 A | 6/1987 | Hannan |
| 4,680,558 A | 7/1987 | Ghosh et al. |
| 4,694,599 A | 9/1987 | Hart et al. |
| 4,704,611 A | 11/1987 | Edwards et al. |
| 4,715,695 A | 12/1987 | Nishimura et al. |
| 4,717,974 A | 1/1988 | Baumeister et al. |
| 4,730,172 A | 3/1988 | Bengeult |
| 4,730,888 A | 3/1988 | Darcie et al. |
| 4,731,810 A | 3/1988 | Watkins |
| 4,735,097 A | 4/1988 | Lynnworth et al. |
| 4,743,915 A | 5/1988 | Rammos et al. |
| 4,743,916 A | 5/1988 | Bengeult |
| 4,745,377 A | 5/1988 | Stern et al. |
| 4,746,241 A | 5/1988 | Burbank, III et al. |
| 4,749,244 A | 6/1988 | Luh |
| 4,755,830 A | 7/1988 | Plunk et al. |
| 4,757,324 A | 7/1988 | Dhanjal et al. |
| 4,758,962 A | 7/1988 | Fernandes |
| 4,764,738 A | 8/1988 | Fried et al. |
| 4,772,891 A | 9/1988 | Svy |
| 4,777,457 A | 10/1988 | Ghosh et al. |
| 4,785,304 A | 11/1988 | Stern et al. |
| 4,786,913 A | 11/1988 | Barendregt et al. |
| 4,788,553 A | 11/1988 | Phillips et al. |
| 4,792,771 A | 12/1988 | Siu et al. |
| 4,792,812 A | 12/1988 | Rinehart et al. |
| 4,799,031 A | 1/1989 | Lang et al. |
| 4,800,350 A | 1/1989 | Bridges et al. |
| 4,801,937 A | 1/1989 | Fernandes |
| 4,808,950 A * | 2/1989 | Apostolos ............... H01P 9/00 333/157 |
| 4,818,963 A | 4/1989 | Green et al. |
| 4,818,990 A | 4/1989 | Fernandes |
| 4,825,221 A | 4/1989 | Suzuki et al. |
| 4,829,310 A | 5/1989 | Losee et al. |
| 4,829,314 A | 5/1989 | Barbier et al. |
| 4,831,346 A | 5/1989 | Brooker et al. |
| 4,832,148 A | 5/1989 | Becker et al. |
| 4,835,517 A | 5/1989 | Van et al. |
| 4,839,659 A | 6/1989 | Stern et al. |
| 4,845,508 A | 7/1989 | Krall et al. |
| 4,847,610 A * | 7/1989 | Ozawa ............... H04L 12/437 340/3.44 |
| 4,849,611 A | 7/1989 | Whitney et al. |
| 4,851,788 A | 7/1989 | Ives et al. |
| 4,855,749 A | 8/1989 | DeFonzo et al. |
| 4,866,454 A | 9/1989 | Droessler et al. |
| 4,873,534 A | 10/1989 | Wohlleben et al. |
| 4,879,544 A | 11/1989 | Maki et al. |
| 4,881,028 A | 11/1989 | Bright et al. |
| 4,886,980 A | 12/1989 | Fernandes et al. |
| 4,897,663 A | 1/1990 | Kusano et al. |
| 4,904,996 A | 2/1990 | Fernandes |
| 4,915,468 A | 4/1990 | Kim et al. |
| 4,916,460 A | 4/1990 | Powell et al. |
| 4,922,180 A | 5/1990 | Saffer et al. |
| 4,929,962 A | 5/1990 | Begout et al. |
| 4,931,808 A | 6/1990 | Munson et al. |
| 4,932,620 A | 6/1990 | Foy |
| 4,946,202 A | 8/1990 | Perricone et al. |
| 4,965,856 A | 10/1990 | Swanic |
| 4,977,593 A | 12/1990 | Ballance |
| 4,977,618 A | 12/1990 | Allen |
| 4,989,011 A | 1/1991 | Rosen et al. |
| 4,998,095 A | 3/1991 | Shields |
| 5,003,318 A | 3/1991 | Hall et al. |
| 5,006,846 A | 4/1991 | Granville et al. |
| 5,006,859 A | 4/1991 | Wong et al. |
| 5,015,914 A | 5/1991 | Ives et al. |
| 5,017,936 A | 5/1991 | Massey et al. |
| 5,017,937 A | 5/1991 | Newham et al. |
| 5,018,180 A | 5/1991 | Shoulders |
| 5,019,832 A | 5/1991 | Ekdahl et al. |
| 5,036,335 A | 7/1991 | Jairam et al. |
| H956 H | 8/1991 | Reindel |
| 5,042,903 A | 8/1991 | Jakubowski et al. |
| 5,043,538 A | 8/1991 | Hughey et al. |
| 5,043,629 A | 8/1991 | Doane et al. |
| 5,044,722 A | 9/1991 | Voser et al. |
| 5,045,820 A | 9/1991 | Oehlerking et al. |
| 5,057,106 A | 10/1991 | Kasevich et al. |
| 5,065,760 A | 11/1991 | Krause et al. |
| 5,065,969 A | 11/1991 | McLean et al. |
| 5,072,228 A | 12/1991 | Kuwahara et al. |
| 5,082,349 A | 1/1992 | Cordova-Plaza et al. |
| 5,086,467 A | 2/1992 | Malek |
| 5,107,231 A | 4/1992 | Knox et al. |
| 5,109,232 A | 4/1992 | Monte et al. |
| 5,113,197 A | 5/1992 | Luh et al. |
| 5,117,237 A | 5/1992 | Legg |
| 5,121,129 A | 6/1992 | Lee et al. |
| 5,126,750 A | 6/1992 | Wang et al. |
| 5,132,968 A | 7/1992 | Cephus |
| 5,134,251 A | 7/1992 | Martin et al. |
| 5,134,423 A | 7/1992 | Haupt et al. |
| 5,134,965 A | 8/1992 | Tokuda et al. |
| 5,136,671 A | 8/1992 | Dragone et al. |
| 5,142,767 A | 9/1992 | Adams et al. |
| 5,148,509 A | 9/1992 | Kannabiran et al. |
| 5,152,861 A | 10/1992 | Hann |
| 5,153,676 A | 10/1992 | Bergh et al. |
| 5,166,698 A | 11/1992 | Ashbaugh et al. |
| 5,174,164 A | 12/1992 | Wilheim et al. |
| 5,175,560 A | 12/1992 | Lucas et al. |
| 5,182,427 A | 1/1993 | Mcgaffigan et al. |
| 5,187,409 A | 2/1993 | Ito et al. |
| 5,193,774 A | 3/1993 | Rogers et al. |
| 5,198,823 A | 3/1993 | Litchford et al. |
| 5,212,755 A | 5/1993 | Holmberg et al. |
| 5,214,394 A | 5/1993 | Wong et al. |
| 5,214,438 A | 5/1993 | Smith et al. |
| 5,216,616 A | 6/1993 | Masters |
| 5,218,657 A | 6/1993 | Tokudome et al. |
| 5,235,662 A | 8/1993 | Prince et al. |
| 5,239,537 A | 8/1993 | Sakauchi |
| 5,241,321 A | 8/1993 | Tsao et al. |
| 5,241,701 A | 8/1993 | Andoh et al. |
| 5,248,876 A | 9/1993 | Kerstens et al. |
| 5,254,809 A | 10/1993 | Martin |
| 5,265,266 A | 11/1993 | Trinh |
| 5,266,961 A | 11/1993 | Milroy et al. |
| 5,276,455 A | 1/1994 | Fitzsimmons et al. |
| 5,278,687 A | 1/1994 | Jannson et al. |
| 5,280,297 A | 1/1994 | Profera et al. |
| 5,291,211 A | 3/1994 | Tropper et al. |
| 5,298,911 A | 3/1994 | Li et al. |
| 5,299,773 A | 4/1994 | Bertrand et al. |
| 5,304,999 A | 4/1994 | Roberts et al. |
| 5,311,596 A | 5/1994 | Scott et al. |
| 5,327,149 A | 7/1994 | Kuffer et al. |
| 5,329,285 A | 7/1994 | McCandless et al. |
| 5,341,088 A | 8/1994 | Davis |
| 5,345,522 A | 9/1994 | Vali et al. |
| 5,347,287 A | 9/1994 | Speciale et al. |
| 5,352,984 A | 10/1994 | Piesinger et al. |
| 5,353,036 A | 10/1994 | Baldry |
| 5,359,338 A | 10/1994 | Hatcher et al. |
| 5,371,623 A | 12/1994 | Eastmond et al. |
| 5,379,455 A | 1/1995 | Koschek et al. |
| 5,380,224 A | 1/1995 | Dicicco |
| 5,381,160 A | 1/1995 | Landmeier |
| 5,389,442 A | 2/1995 | Kathiresan et al. |
| 5,400,040 A | 3/1995 | Lane et al. |
| 5,402,140 A | 3/1995 | Rodeffer et al. |
| 5,402,151 A | 3/1995 | Duwaer |
| 5,404,146 A | 4/1995 | Rutledge et al. |
| 5,410,318 A | 4/1995 | Wong et al. |
| 5,412,654 A | 5/1995 | Perkins |
| 5,428,364 A | 6/1995 | Lee et al. |
| 5,428,818 A | 6/1995 | Meidan et al. |
| 5,434,575 A | 7/1995 | Jelinek et al. |
| 5,440,660 A | 8/1995 | Dombrowski et al. |

(56) References Cited

U.S. PATENT DOCUMENTS

| | | |
|---|---|---|
| 5,451,969 A | 9/1995 | Toth et al. |
| 5,457,469 A | 10/1995 | Diamond et al. |
| 5,479,176 A | 12/1995 | Zavrel et al. |
| 5,481,268 A | 1/1996 | Higgins |
| 5,482,525 A | 1/1996 | Kajioka et al. |
| 5,486,839 A | 1/1996 | Rodeffer et al. |
| 5,488,380 A | 1/1996 | Harvey et al. |
| 5,495,546 A | 2/1996 | Bottoms et al. |
| 5,499,308 A | 3/1996 | Arai et al. |
| 5,499,311 A | 3/1996 | DeCusatis et al. |
| 5,502,392 A | 3/1996 | Arjavalingam et al. |
| 5,512,906 A | 4/1996 | Speciale et al. |
| 5,513,176 A | 4/1996 | Dean et al. |
| 5,514,965 A | 5/1996 | Westwood et al. |
| 5,515,059 A | 5/1996 | How et al. |
| 5,519,408 A | 5/1996 | Schnetzer et al. |
| 5,528,208 A | 6/1996 | Kobayashi et al. |
| 5,539,421 A | 7/1996 | Hong et al. |
| 5,543,000 A | 8/1996 | Lique |
| 5,557,283 A | 9/1996 | Sheen |
| 5,559,359 A | 9/1996 | Reyes |
| 5,566,022 A | 10/1996 | Segev |
| 5,566,196 A | 10/1996 | Scifres |
| 5,576,721 A | 11/1996 | Hwang et al. |
| 5,586,054 A | 12/1996 | Jensen et al. |
| 5,592,183 A | 1/1997 | Henf |
| 5,600,630 A | 2/1997 | Takahashi et al. |
| 5,603,089 A | 2/1997 | Searle et al. |
| 5,619,015 A | 4/1997 | Kirma |
| 5,621,421 A | 4/1997 | Kolz et al. |
| 5,627,879 A | 5/1997 | Russell et al. |
| 5,628,050 A | 5/1997 | McGraw et al. |
| 5,630,223 A | 5/1997 | Bahu et al. |
| 5,637,521 A | 6/1997 | Rhodes et al. |
| 5,640,168 A | 6/1997 | Heger et al. |
| 5,646,936 A | 7/1997 | Shah et al. |
| 5,650,788 A | 7/1997 | Jha |
| 5,652,554 A | 7/1997 | Krieg et al. |
| 5,663,693 A | 9/1997 | Doughty et al. |
| 5,671,304 A | 9/1997 | Duguay |
| 5,677,699 A | 10/1997 | Strickland |
| 5,677,909 A | 10/1997 | Heide |
| 5,680,139 A | 10/1997 | Huguenin et al. |
| 5,682,256 A | 10/1997 | Motley et al. |
| 5,684,495 A | 11/1997 | Dyott et al. |
| 5,686,930 A | 11/1997 | Brydon |
| 5,724,168 A | 3/1998 | Oschmann et al. |
| 5,726,980 A | 3/1998 | Rickard et al. |
| 5,748,153 A | 5/1998 | McKinzie et al. |
| 5,750,941 A | 5/1998 | Ishikawa et al. |
| 5,767,807 A | 6/1998 | Pritchett et al. |
| 5,768,689 A | 6/1998 | Borg |
| 5,769,879 A | 6/1998 | Levay et al. |
| 5,784,033 A | 7/1998 | Boldissar, Jr. et al. |
| 5,784,034 A | 7/1998 | Konishi et al. |
| 5,784,683 A | 7/1998 | Sistanizadeh et al. |
| 5,787,673 A | 8/1998 | Noble |
| 5,793,334 A | 8/1998 | Anderson et al. |
| 5,800,494 A | 9/1998 | Campbell et al. |
| 5,805,983 A | 9/1998 | Naidu et al. |
| 5,809,395 A | 9/1998 | Hamilton-Piercy et al. |
| 5,812,524 A | 9/1998 | Moran et al. |
| 5,818,390 A | 10/1998 | Hill |
| 5,818,396 A | 10/1998 | Anderson et al. |
| 5,818,512 A | 10/1998 | Fuller |
| 5,845,391 A | 12/1998 | Miklosko et al. |
| 5,848,054 A | 12/1998 | Mosebrook et al. |
| 5,850,199 A | 12/1998 | Wan et al. |
| 5,854,608 A | 12/1998 | Leisten |
| 5,859,618 A | 1/1999 | Miller, II et al. |
| 5,861,843 A | 1/1999 | Sorace et al. |
| 5,867,763 A | 2/1999 | Dean et al. |
| 5,870,060 A | 2/1999 | Chen et al. |
| 5,872,544 A | 2/1999 | Schay et al. |
| 5,872,547 A | 2/1999 | Martek |
| 5,873,324 A | 2/1999 | Kaddas et al. |
| 5,886,666 A | 3/1999 | Schellenberg et al. |
| 5,889,449 A | 3/1999 | Fiedziuszko |
| 5,890,055 A | 3/1999 | Chu et al. |
| 5,892,480 A | 4/1999 | Killen et al. |
| 5,898,133 A | 4/1999 | Bleich et al. |
| 5,898,830 A | 4/1999 | Wesinger, Jr. et al. |
| 5,900,847 A | 5/1999 | Ishikawa et al. |
| 5,903,373 A | 5/1999 | Welch et al. |
| 5,905,438 A | 5/1999 | Weiss et al. |
| 5,905,949 A | 5/1999 | Hawkes et al. |
| 5,910,790 A | 6/1999 | Ohmuro et al. |
| 5,917,977 A | 6/1999 | Barrett et al. |
| 5,922,081 A | 7/1999 | Seewig et al. |
| 5,926,128 A | 7/1999 | Brash et al. |
| 5,933,422 A | 8/1999 | Suzuki et al. |
| 5,936,589 A | 8/1999 | Kawahata |
| 5,948,044 A | 9/1999 | Varley et al. |
| 5,948,108 A | 9/1999 | Lu et al. |
| 5,952,964 A | 9/1999 | Chan et al. |
| 5,952,972 A | 9/1999 | Ittipiboon et al. |
| 5,952,984 A | 9/1999 | Kuramoto et al. |
| 5,955,992 A | 9/1999 | Shattil |
| 5,959,578 A | 9/1999 | Kreutel et al. |
| 5,959,590 A | 9/1999 | Sanford et al. |
| 5,973,641 A | 10/1999 | Smith et al. |
| 5,977,650 A | 11/1999 | Rickard et al. |
| 5,978,738 A | 11/1999 | Brown et al. |
| 5,982,276 A | 11/1999 | Stewart |
| 5,986,331 A | 11/1999 | Letavic et al. |
| 5,987,099 A | 11/1999 | O'Neill et al. |
| 5,990,848 A | 11/1999 | Annamaa et al. |
| 5,994,984 A | 11/1999 | Stancil et al. |
| 5,994,998 A | 11/1999 | Fisher et al. |
| 6,005,694 A | 12/1999 | Liu |
| 6,005,758 A | 12/1999 | Spencer et al. |
| 6,009,124 A | 12/1999 | Smith |
| 6,011,520 A | 1/2000 | Howell et al. |
| 6,011,524 A | 1/2000 | Jervis et al. |
| 6,014,110 A | 1/2000 | Bridges et al. |
| 6,018,659 A | 1/2000 | Ayyagari et al. |
| 6,023,619 A | 2/2000 | Kaminsky |
| 6,026,173 A | 2/2000 | Svenson et al. |
| 6,026,208 A | 2/2000 | Will et al. |
| 6,026,331 A | 2/2000 | Feldberg et al. |
| 6,031,455 A | 2/2000 | Grube et al. |
| 6,034,638 A | 3/2000 | Thiel et al. |
| 6,037,894 A | 3/2000 | Pfizenmaier et al. |
| 6,038,425 A | 3/2000 | Jeffrey et al. |
| 6,049,647 A | 4/2000 | Register et al. |
| 6,057,802 A | 5/2000 | Nealy |
| 6,061,035 A | 5/2000 | Kinasewitz et al. |
| 6,063,234 A | 5/2000 | Chen et al. |
| 6,075,451 A | 6/2000 | Lebowitz et al. |
| 6,075,493 A | 6/2000 | Sugawara et al. |
| 6,076,044 A | 6/2000 | Brown et al. |
| 6,078,297 A | 6/2000 | Kormanyos et al. |
| 6,088,001 A | 7/2000 | Burger et al. |
| 6,095,820 A | 8/2000 | Luxon et al. |
| 6,100,846 A | 8/2000 | Li et al. |
| 6,103,031 A | 8/2000 | Aeschbacher et al. |
| 6,107,897 A | 8/2000 | Hewett et al. |
| 6,111,553 A | 8/2000 | Steenbuck et al. |
| 6,114,998 A | 9/2000 | Schefte et al. |
| 6,121,885 A | 9/2000 | Masone et al. |
| 6,122,753 A | 9/2000 | Masuo et al. |
| 6,140,911 A | 10/2000 | Fisher et al. |
| 6,140,976 A | 10/2000 | Locke et al. |
| 6,142,434 A | 11/2000 | Brinkman et al. |
| 6,146,330 A | 11/2000 | Tujino et al. |
| 6,150,612 A | 11/2000 | Grandy et al. |
| 6,151,145 A | 11/2000 | Srivastava et al. |
| 6,154,488 A | 11/2000 | Hunt |
| 6,158,383 A | 12/2000 | Watanabe et al. |
| 6,163,296 A | 12/2000 | Lier et al. |
| 6,166,694 A | 12/2000 | Ying et al. |
| 6,167,055 A | 12/2000 | Ganek et al. |
| 6,175,917 B1 | 1/2001 | Arrow et al. |
| 6,177,801 B1 | 1/2001 | Chong et al. |

(56) References Cited

U.S. PATENT DOCUMENTS

| | | |
|---|---|---|
| 6,184,828 B1 | 2/2001 | Shoki et al. |
| 6,195,058 B1 | 2/2001 | Nakamura et al. |
| 6,195,395 B1 | 2/2001 | Frodsham et al. |
| 6,198,440 B1 | 3/2001 | Krylov et al. |
| 6,208,161 B1 | 3/2001 | Suda et al. |
| 6,208,308 B1 | 3/2001 | Lemons et al. |
| 6,208,903 B1 | 3/2001 | Richards et al. |
| 6,211,836 B1 | 4/2001 | Manasson et al. |
| 6,211,837 B1 | 4/2001 | Crouch et al. |
| 6,215,443 B1 | 4/2001 | Komatsu et al. |
| 6,219,006 B1 | 4/2001 | Rudish et al. |
| 6,222,503 B1 | 4/2001 | Gietema et al. |
| 6,225,960 B1 | 5/2001 | Collins et al. |
| 6,229,327 B1 | 5/2001 | Boll et al. |
| 6,236,365 B1 | 5/2001 | Karr et al. |
| 6,239,377 B1 | 5/2001 | Nishikawa et al. |
| 6,239,379 B1 | 5/2001 | Cotter et al. |
| 6,239,761 B1 | 5/2001 | Guo et al. |
| 6,241,045 B1 | 6/2001 | Reeve et al. |
| 6,243,049 B1 | 6/2001 | Chandler et al. |
| 6,246,821 B1 | 6/2001 | Hemken et al. |
| 6,252,553 B1 | 6/2001 | Solomon et al. |
| 6,259,337 B1 | 7/2001 | Wen et al. |
| 6,266,016 B1 | 7/2001 | Bergstedt et al. |
| 6,266,025 B1 | 7/2001 | Popa et al. |
| 6,268,835 B1 | 7/2001 | Toland et al. |
| 6,271,790 B2 | 8/2001 | Smith et al. |
| 6,271,799 B1 | 8/2001 | Rief et al. |
| 6,271,952 B1 | 8/2001 | Epworth et al. |
| 6,278,357 B1 | 8/2001 | Croushore et al. |
| 6,278,370 B1 | 8/2001 | Underwood et al. |
| 6,281,855 B1 | 8/2001 | Aoki et al. |
| 6,282,354 B1 | 8/2001 | Jones et al. |
| 6,283,425 B1 | 9/2001 | Liljevik |
| 6,285,325 B1 | 9/2001 | Nalbandian et al. |
| 6,292,139 B1 | 9/2001 | Yamamoto et al. |
| 6,292,143 B1 | 9/2001 | Romanofsky et al. |
| 6,292,153 B1 | 9/2001 | Aiello et al. |
| 6,300,898 B1 | 10/2001 | Schneider et al. |
| 6,300,906 B1 | 10/2001 | Rawnick et al. |
| 6,301,420 B1 | 10/2001 | Greenaway et al. |
| 6,308,085 B1 | 10/2001 | Shoki et al. |
| 6,311,288 B1 | 10/2001 | Heeren et al. |
| 6,317,028 B1 | 11/2001 | Valiulis et al. |
| 6,317,092 B1 | 11/2001 | de Schweinitz et al. |
| 6,320,509 B1 | 11/2001 | Brady et al. |
| 6,320,553 B1 | 11/2001 | Ergene et al. |
| 6,323,819 B1 | 11/2001 | Ergene et al. |
| 6,329,959 B1 | 12/2001 | Varadan et al. |
| 6,348,683 B1 | 2/2002 | Verghese et al. |
| 6,351,247 B1 | 2/2002 | Linstrom et al. |
| 6,357,709 B1 | 3/2002 | Parduhn et al. |
| 6,362,788 B1 | 3/2002 | Louzir |
| 6,362,789 B1 | 3/2002 | Trumbull et al. |
| 6,366,238 B1 | 4/2002 | DeMore et al. |
| 6,373,436 B1 | 4/2002 | Chen et al. |
| 6,373,441 B1 | 4/2002 | Porath et al. |
| 6,376,824 B1 | 4/2002 | Michenfelder et al. |
| 6,388,564 B1 | 5/2002 | Piercy et al. |
| 6,396,440 B1 | 5/2002 | Chen et al. |
| 6,404,773 B1 | 6/2002 | Williams et al. |
| 6,404,775 B1 | 6/2002 | Leslie |
| 6,421,021 B1 | 7/2002 | Rupp et al. |
| 6,433,736 B1 | 8/2002 | Timothy et al. |
| 6,433,741 B2 | 8/2002 | Tanizaki et al. |
| 6,436,536 B2 | 8/2002 | Peruzzotti et al. |
| 6,441,723 B1 | 8/2002 | Mansfield, Jr. et al. |
| 6,445,351 B1 | 9/2002 | Baker et al. |
| 6,445,774 B1 | 9/2002 | Kidder et al. |
| 6,452,467 B1 | 9/2002 | McEwan |
| 6,452,569 B1 | 9/2002 | Park et al. |
| 6,452,923 B1 | 9/2002 | Gerszberg et al. |
| 6,455,769 B1 | 9/2002 | Belli et al. |
| 6,456,251 B1 | 9/2002 | Rao et al. |
| 6,462,700 B1 | 10/2002 | Schmidt et al. |
| 6,463,295 B1 | 10/2002 | Yun et al. |
| 6,469,676 B1 | 10/2002 | Fehrenbach et al. |
| 6,473,049 B2 | 10/2002 | Takeuchi et al. |
| 6,480,168 B1 | 11/2002 | Lam et al. |
| 6,483,470 B1 | 11/2002 | Hohnstein et al. |
| 6,489,928 B2 | 12/2002 | Sakurada |
| 6,489,931 B2 | 12/2002 | Liu et al. |
| 6,492,957 B2 | 12/2002 | Carillo, Jr. et al. |
| 6,501,433 B2 | 12/2002 | Popa et al. |
| 6,507,573 B1 | 1/2003 | Brandt et al. |
| 6,510,152 B1 | 1/2003 | Gerszberg et al. |
| 6,515,635 B2 | 2/2003 | Chiang et al. |
| 6,522,305 B2 | 2/2003 | Sharman et al. |
| 6,531,991 B2 | 3/2003 | Adachi et al. |
| 6,532,215 B1 | 3/2003 | Muntz et al. |
| 6,534,996 B1 | 3/2003 | Amrany et al. |
| 6,535,169 B2 | 3/2003 | Fourdeux et al. |
| 6,542,739 B1 | 4/2003 | Garner |
| 6,549,106 B2 | 4/2003 | Martin et al. |
| 6,549,173 B1 | 4/2003 | King et al. |
| 6,552,693 B1 | 4/2003 | Leisten et al. |
| 6,559,811 B1 | 5/2003 | Cash et al. |
| 6,563,981 B2 | 5/2003 | Weisberg et al. |
| 6,567,573 B1 | 5/2003 | Domash et al. |
| 6,573,803 B1 | 6/2003 | Ziegner et al. |
| 6,573,813 B1 | 6/2003 | Joannopoulos et al. |
| 6,580,295 B2 | 6/2003 | Takekuma et al. |
| 6,584,084 B1 | 6/2003 | Barany et al. |
| 6,584,252 B1 | 6/2003 | Schier et al. |
| 6,587,077 B2 | 7/2003 | Vail et al. |
| 6,593,893 B2 | 7/2003 | Hou et al. |
| 6,594,238 B1 | 7/2003 | Wallentin et al. |
| 6,596,944 B1 | 7/2003 | Clark et al. |
| 6,600,456 B2 | 7/2003 | Gothard et al. |
| 6,606,057 B2 | 8/2003 | Chiang et al. |
| 6,606,066 B1 | 8/2003 | Fawcett et al. |
| 6,606,077 B2 | 8/2003 | Ebling et al. |
| 6,611,252 B1 | 8/2003 | DuFaux et al. |
| 6,614,237 B2 | 9/2003 | Ademian et al. |
| 6,631,229 B1 | 10/2003 | Norris et al. |
| 6,634,225 B1 | 10/2003 | Reime et al. |
| 6,639,484 B2 | 10/2003 | Tzuang et al. |
| 6,639,566 B2 | 10/2003 | Knop et al. |
| 6,642,887 B2 | 11/2003 | Owechko et al. |
| 6,643,254 B1 | 11/2003 | Abe et al. |
| 6,650,296 B2 | 11/2003 | Wong et al. |
| 6,653,598 B2 | 11/2003 | Sullivan et al. |
| 6,653,848 B2 | 11/2003 | Adamian et al. |
| 6,657,437 B1 | 12/2003 | LeCroy et al. |
| 6,659,655 B2 | 12/2003 | Dair et al. |
| 6,661,391 B2 | 12/2003 | Ohara et al. |
| 6,668,104 B1 | 12/2003 | Mueller-Fiedler et al. |
| 6,670,921 B2 | 12/2003 | Sievenpiper et al. |
| 6,671,824 B1 | 12/2003 | Hyland et al. |
| 6,677,899 B1 | 1/2004 | Lee et al. |
| 6,680,903 B1 | 1/2004 | Moriguchi et al. |
| 6,683,580 B2 | 1/2004 | Kuramoto |
| 6,686,832 B2 | 2/2004 | Abraham et al. |
| 6,686,873 B2 | 2/2004 | Patel et al. |
| 6,686,875 B1 | 2/2004 | Wolfson et al. |
| 6,697,027 B2 | 2/2004 | Mahon et al. |
| 6,697,030 B2 | 2/2004 | Gleener |
| 6,703,981 B2 | 3/2004 | Meitzler et al. |
| 6,714,165 B2 | 3/2004 | Verstraeten |
| 6,720,935 B2 | 4/2004 | Lamensdorf et al. |
| 6,725,035 B2 | 4/2004 | Jochim et al. |
| 6,727,470 B2 | 4/2004 | Reichle et al. |
| 6,727,891 B2 | 4/2004 | Moriya et al. |
| 6,728,439 B2 | 4/2004 | Weisberg et al. |
| 6,728,552 B2 | 4/2004 | Chatain et al. |
| 6,731,210 B2 | 5/2004 | Swanson et al. |
| 6,731,649 B1 | 5/2004 | Silverman |
| 6,741,705 B1 | 5/2004 | Nelson et al. |
| 6,747,557 B1 | 6/2004 | Petite et al. |
| 6,750,827 B2 | 6/2004 | Manasson et al. |
| 6,754,470 B2 | 6/2004 | Hendrickson et al. |
| 6,755,312 B2 | 6/2004 | Dziedzic et al. |
| 6,756,538 B1 | 6/2004 | Murga-Gonzalez et al. |
| 6,765,479 B2 | 7/2004 | Stewart et al. |

(56) References Cited

U.S. PATENT DOCUMENTS

| | | |
|---|---|---|
| 6,768,454 B2 | 7/2004 | Kingsley et al. |
| 6,768,456 B1 | 7/2004 | Lalezari et al. |
| 6,768,471 B2 | 7/2004 | Bostwick et al. |
| 6,768,474 B2 | 7/2004 | Hunt et al. |
| 6,771,216 B2 | 8/2004 | Patel et al. |
| 6,771,225 B2 | 8/2004 | Tits et al. |
| 6,771,739 B1 | 8/2004 | Beamon et al. |
| 6,774,859 B2 | 8/2004 | Schantz et al. |
| 6,788,865 B2 | 9/2004 | Kawanishi et al. |
| 6,788,951 B2 | 9/2004 | Aoki et al. |
| 6,789,119 B1 | 9/2004 | Zhu et al. |
| 6,792,290 B2 | 9/2004 | Proctor, Jr. et al. |
| 6,798,223 B2 | 9/2004 | Huang et al. |
| 6,806,710 B1 | 10/2004 | Renz et al. |
| 6,809,633 B2 | 10/2004 | Cern et al. |
| 6,809,695 B2 | 10/2004 | Le Bayon et al. |
| 6,812,895 B2 | 11/2004 | Anderson et al. |
| 6,819,744 B1 | 11/2004 | Banwell et al. |
| 6,822,615 B2 | 11/2004 | Quan et al. |
| 6,839,032 B2 | 1/2005 | Teshirogi et al. |
| 6,839,160 B2 | 1/2005 | Tsuda et al. |
| 6,839,846 B2 | 1/2005 | Mangold et al. |
| 6,842,157 B2 | 1/2005 | Phelan et al. |
| 6,842,430 B1 | 1/2005 | Melnik et al. |
| 6,850,128 B2 | 2/2005 | Park |
| 6,853,351 B1 | 2/2005 | Mohuchy et al. |
| 6,856,273 B1 | 2/2005 | Bognar et al. |
| 6,859,185 B2 | 2/2005 | Royalty et al. |
| 6,859,187 B2 | 2/2005 | Ohlsson et al. |
| 6,859,590 B1 | 2/2005 | Zaccone |
| 6,861,998 B2 | 3/2005 | Louzir |
| 6,864,851 B2 | 3/2005 | McGrath et al. |
| 6,864,853 B2 | 3/2005 | Judd et al. |
| 6,867,744 B2 | 3/2005 | Toncich et al. |
| 6,868,258 B2 | 3/2005 | Hayata et al. |
| 6,870,465 B1 | 3/2005 | Song et al. |
| 6,873,265 B2 | 3/2005 | Bleier et al. |
| 6,885,674 B2 | 4/2005 | Hunt et al. |
| 6,886,065 B2 | 4/2005 | Sides et al. |
| 6,888,623 B2 | 5/2005 | Clements |
| 6,901,064 B2 | 5/2005 | Billhartz et al. |
| 6,904,218 B2 | 6/2005 | Sun et al. |
| 6,906,676 B2 | 6/2005 | Killen et al. |
| 6,906,681 B2 | 6/2005 | Hoppenstein et al. |
| 6,909,893 B2 | 6/2005 | Aoki et al. |
| 6,917,974 B1 | 7/2005 | Stytz et al. |
| 6,920,289 B2 | 7/2005 | Zimmerman et al. |
| 6,920,315 B1 | 7/2005 | Wilcox et al. |
| 6,920,407 B2 | 7/2005 | Phillips et al. |
| 6,922,135 B2 | 7/2005 | Abraham et al. |
| 6,924,732 B2 | 8/2005 | Yokoo et al. |
| 6,924,776 B2 | 8/2005 | Le et al. |
| 6,928,194 B2 | 8/2005 | Mai et al. |
| 6,933,887 B2 | 8/2005 | Regnier et al. |
| 6,934,655 B2 | 8/2005 | Jones et al. |
| 6,937,595 B2 | 8/2005 | Barzegar et al. |
| 6,943,553 B2 | 9/2005 | Zimmermann et al. |
| 6,944,555 B2 | 9/2005 | Blackett et al. |
| 6,947,147 B2 | 9/2005 | Motamedi et al. |
| 6,947,376 B1 | 9/2005 | Deng et al. |
| 6,947,635 B2 | 9/2005 | Kohns et al. |
| 6,948,371 B2 | 9/2005 | Tanaka et al. |
| 6,950,567 B2 | 9/2005 | Kline et al. |
| 6,952,143 B2 | 10/2005 | Kinayman et al. |
| 6,952,183 B2 | 10/2005 | Yuanzhu et al. |
| 6,956,506 B2 | 10/2005 | Mantyjarvi et al. |
| 6,958,729 B1 | 10/2005 | Metz et al. |
| 6,965,302 B2 | 11/2005 | Mollenkopf et al. |
| 6,965,355 B1 | 11/2005 | Durham et al. |
| 6,965,784 B2 | 11/2005 | Kanamaluru et al. |
| 6,967,627 B2 | 11/2005 | Roper et al. |
| 6,970,502 B2 | 11/2005 | Kim et al. |
| 6,970,682 B2 | 11/2005 | Crilly, Jr. et al. |
| 6,972,729 B2 | 12/2005 | Wang et al. |
| 6,980,091 B2 | 12/2005 | White, II et al. |
| 6,982,611 B2 | 1/2006 | Cope et al. |
| 6,982,679 B2 | 1/2006 | Kralovec et al. |
| 6,983,174 B2 | 1/2006 | Hoppenstein et al. |
| 6,985,118 B2 | 1/2006 | Killen et al. |
| 6,992,639 B1 | 1/2006 | Lier et al. |
| 6,999,667 B2 | 2/2006 | Jang et al. |
| 7,008,120 B2 | 3/2006 | Zaborsky et al. |
| 7,009,471 B2 | 3/2006 | Elmore |
| 7,012,489 B2 | 3/2006 | Fisher et al. |
| 7,012,572 B1 | 3/2006 | Schaffner et al. |
| 7,016,585 B2 | 3/2006 | Diggle, III et al. |
| 7,019,704 B2 | 3/2006 | Weiss et al. |
| 7,023,400 B2 | 4/2006 | Hill et al. |
| 7,026,917 B2 | 4/2006 | Berkman et al. |
| 7,027,003 B2 | 4/2006 | Sasaki et al. |
| 7,027,454 B2 | 4/2006 | Dent et al. |
| 7,032,016 B2 | 4/2006 | Cerami et al. |
| 7,038,636 B2 | 5/2006 | Larouche et al. |
| 7,039,048 B1 | 5/2006 | Monta et al. |
| 7,042,403 B2 | 5/2006 | Colburn et al. |
| 7,042,416 B2 | 5/2006 | Kingsley et al. |
| 7,042,420 B2 | 5/2006 | Ebling et al. |
| 7,054,286 B2 | 5/2006 | Ertel et al. |
| 7,054,376 B1 | 5/2006 | Rubinstain et al. |
| 7,054,513 B2 | 5/2006 | Herz et al. |
| 7,055,148 B2 | 5/2006 | Marsh et al. |
| 7,057,558 B2 | 6/2006 | Yasuho et al. |
| 7,057,573 B2 | 6/2006 | Ohira et al. |
| 7,058,524 B2 | 6/2006 | Hayes et al. |
| 7,061,370 B2 | 6/2006 | Cern et al. |
| 7,061,891 B1 | 6/2006 | Kilfoyle et al. |
| 7,064,726 B2 | 6/2006 | Kitamori et al. |
| 7,068,998 B2 | 6/2006 | Zavidniak et al. |
| 7,069,163 B2 | 6/2006 | Gunther et al. |
| 7,075,414 B2 | 7/2006 | Giannini et al. |
| 7,075,485 B2 | 7/2006 | Song et al. |
| 7,075,496 B2 | 7/2006 | Hidai et al. |
| 7,082,321 B2 | 7/2006 | Kuwahara et al. |
| 7,084,742 B2 | 8/2006 | Haines et al. |
| 7,088,221 B2 | 8/2006 | Chan |
| 7,088,306 B2 | 8/2006 | Chiang et al. |
| 7,098,405 B2 | 8/2006 | Glew et al. |
| 7,098,773 B2 | 8/2006 | Berkman et al. |
| 7,102,581 B1 | 9/2006 | West et al. |
| 7,106,265 B2 | 9/2006 | Robertson et al. |
| 7,106,270 B2 | 9/2006 | Iigusa et al. |
| 7,106,273 B1 | 9/2006 | Brunson et al. |
| 7,109,939 B2 | 9/2006 | Lynch et al. |
| 7,113,002 B2 | 9/2006 | Otsuka et al. |
| 7,113,134 B1 | 9/2006 | Berkman et al. |
| 7,119,755 B2 | 10/2006 | Harvey et al. |
| 7,120,338 B2 | 10/2006 | Gunn, III et al. |
| 7,120,345 B2 | 10/2006 | Naitou et al. |
| 7,122,012 B2 | 10/2006 | Bouton et al. |
| 7,123,191 B2 | 10/2006 | Goldberg et al. |
| 7,123,801 B2 | 10/2006 | Fitz et al. |
| 7,125,512 B2 | 10/2006 | Crump et al. |
| 7,126,557 B2 | 10/2006 | Warnagiris et al. |
| 7,126,711 B2 | 10/2006 | Fruth |
| 7,127,348 B2 | 10/2006 | Smitherman et al. |
| 7,130,516 B2 | 10/2006 | Wu et al. |
| 7,132,950 B2 | 11/2006 | Stewart et al. |
| 7,133,930 B2 | 11/2006 | Munger et al. |
| 7,134,012 B2 | 11/2006 | Doyle et al. |
| 7,134,135 B2 | 11/2006 | Cerami et al. |
| 7,136,397 B2 | 11/2006 | Sharma et al. |
| 7,136,772 B2 | 11/2006 | Duchi et al. |
| 7,137,605 B1 | 11/2006 | Guertler et al. |
| 7,138,767 B2 | 11/2006 | Chen et al. |
| 7,138,958 B2 | 11/2006 | Syed et al. |
| 7,139,328 B2 | 11/2006 | Thomas et al. |
| 7,145,440 B2 | 12/2006 | Gerszberg et al. |
| 7,145,552 B2 | 12/2006 | Hollingsworth et al. |
| 7,151,497 B2 | 12/2006 | Crystal et al. |
| 7,151,508 B2 | 12/2006 | Schaffner et al. |
| 7,155,238 B2 | 12/2006 | Katz et al. |
| 7,161,934 B2 | 1/2007 | Buchsbaum et al. |
| 7,164,354 B1 | 1/2007 | Panzer et al. |
| 7,167,139 B2 | 1/2007 | Kim et al. |

(56) References Cited

U.S. PATENT DOCUMENTS

| | | |
|---|---|---|
| 7,171,087 B2 | 1/2007 | Takahashi et al. |
| 7,171,308 B2 | 1/2007 | Campbell et al. |
| 7,171,493 B2 | 1/2007 | Shu et al. |
| 7,176,589 B2 | 2/2007 | Rouquette et al. |
| 7,180,459 B2 | 2/2007 | Damini et al. |
| 7,180,467 B2 | 2/2007 | Fabrega-Sanchez |
| 7,183,922 B2 | 2/2007 | Mendolia et al. |
| 7,183,991 B2 | 2/2007 | Bhattacharyya et al. |
| 7,183,998 B2 | 2/2007 | Wilhelm et al. |
| 7,193,562 B2 | 3/2007 | Kish et al. |
| 7,194,528 B1 | 3/2007 | Davidow et al. |
| 7,199,680 B2 | 4/2007 | Fukunaga et al. |
| 7,200,391 B2 | 4/2007 | Chung et al. |
| 7,200,658 B2 | 4/2007 | Goeller et al. |
| 7,205,950 B2 | 4/2007 | Imai et al. |
| 7,212,163 B2 | 5/2007 | Huang et al. |
| 7,215,220 B1 | 5/2007 | Jia et al. |
| 7,215,928 B2 | 5/2007 | Gage et al. |
| 7,218,285 B2 | 5/2007 | Davis et al. |
| 7,224,170 B2 | 5/2007 | Graham et al. |
| 7,224,243 B2 | 5/2007 | Cope et al. |
| 7,224,272 B2 | 5/2007 | White, II et al. |
| 7,224,320 B2 | 5/2007 | Cook et al. |
| 7,224,985 B2 | 5/2007 | Caci et al. |
| 7,228,123 B2 | 6/2007 | Moursund et al. |
| 7,234,413 B2 | 6/2007 | Suzuki et al. |
| 7,234,895 B2 | 6/2007 | Richardson et al. |
| 7,239,284 B1 | 7/2007 | Staal et al. |
| 7,243,610 B2 | 7/2007 | Ishii et al. |
| 7,248,148 B2 | 7/2007 | Kline et al. |
| 7,250,772 B2 | 7/2007 | Furse et al. |
| 7,255,821 B2 | 8/2007 | Priedeman, Jr. et al. |
| 7,259,657 B2 | 8/2007 | Mollenkopf et al. |
| 7,260,424 B2 | 8/2007 | Schmidt et al. |
| 7,266,154 B2 | 9/2007 | Gundrum et al. |
| 7,266,275 B2 | 9/2007 | Hansen et al. |
| 7,272,281 B2 | 9/2007 | Stahulak et al. |
| 7,272,362 B2 | 9/2007 | Jeong et al. |
| 7,274,305 B1 | 9/2007 | Luttrell |
| 7,274,936 B2 | 9/2007 | Stern-Berkowitz et al. |
| 7,276,990 B2 | 10/2007 | Sievenpiper et al. |
| 7,280,033 B2 | 10/2007 | Berkman et al. |
| 7,280,803 B2 | 10/2007 | Nelson et al. |
| 7,282,922 B2 | 10/2007 | Lo et al. |
| 7,286,099 B1 | 10/2007 | Lier et al. |
| 7,289,449 B1 | 10/2007 | Rubinstein et al. |
| 7,289,704 B1 | 10/2007 | Wagman et al. |
| 7,289,828 B2 | 10/2007 | Cha et al. |
| 7,292,125 B2 | 11/2007 | Mansour et al. |
| 7,292,196 B2 | 11/2007 | Waterhouse et al. |
| 7,295,161 B2 | 11/2007 | Gaucher et al. |
| 7,297,869 B2 | 11/2007 | Hiller et al. |
| 7,301,440 B2 | 11/2007 | Mollenkopf |
| 7,301,508 B1 | 11/2007 | O'Loughlin et al. |
| 7,307,357 B2 | 12/2007 | Kopp et al. |
| 7,307,596 B1 | 12/2007 | West et al. |
| 7,308,264 B2 | 12/2007 | Stern-Berkowitz et al. |
| 7,308,370 B2 | 12/2007 | Mason, Jr. et al. |
| 7,309,873 B2 | 12/2007 | Ishikawa et al. |
| 7,310,065 B2 | 12/2007 | Anguera et al. |
| 7,310,335 B1 | 12/2007 | Garcia-Luna-Aceves et al. |
| 7,311,605 B2 | 12/2007 | Moser |
| 7,312,686 B2 | 12/2007 | Bruno |
| 7,313,087 B2 | 12/2007 | Patil et al. |
| 7,313,312 B2 | 12/2007 | Kimball et al. |
| 7,315,224 B2 | 1/2008 | Gurovich et al. |
| 7,315,678 B2 | 1/2008 | Siegel |
| 7,318,564 B1 | 1/2008 | Marshall et al. |
| 7,319,717 B2 | 1/2008 | Zitting et al. |
| 7,321,291 B2 | 1/2008 | Gidge et al. |
| 7,321,707 B2 | 1/2008 | Noda et al. |
| 7,324,046 B1 | 1/2008 | Wu et al. |
| 7,324,817 B2 | 1/2008 | Iacono et al. |
| 7,329,815 B2 | 2/2008 | Kenny et al. |
| 7,333,064 B1 | 2/2008 | Timothy et al. |
| 7,333,593 B2 | 2/2008 | Beamon et al. |
| 7,339,466 B2 | 3/2008 | Mansfield et al. |
| 7,339,897 B2 | 3/2008 | Larsson et al. |
| 7,340,768 B2 | 3/2008 | Rosenberger et al. |
| 7,345,623 B2 | 3/2008 | McEwan et al. |
| 7,346,244 B2 | 3/2008 | Gowan et al. |
| 7,346,359 B2 | 3/2008 | Damarla et al. |
| 7,353,293 B2 | 4/2008 | Hipfinger et al. |
| 7,355,560 B2 | 4/2008 | Nagai et al. |
| 7,358,808 B2 | 4/2008 | Berkman et al. |
| 7,358,921 B2 | 4/2008 | Snyder et al. |
| 7,369,085 B1 | 5/2008 | Jacomb-Hood et al. |
| 7,369,095 B2 | 5/2008 | Thudor et al. |
| 7,376,191 B2 | 5/2008 | Melick et al. |
| 7,380,272 B2 | 5/2008 | Sharp et al. |
| 7,381,089 B2 | 6/2008 | Hosler, Sr. |
| 7,382,232 B2 | 6/2008 | Gidge et al. |
| 7,383,577 B2 | 6/2008 | Hrastar et al. |
| 7,388,450 B2 | 6/2008 | Camiade et al. |
| 7,397,422 B2 | 7/2008 | Tekawy et al. |
| 7,398,946 B1 | 7/2008 | Marshall |
| 7,400,304 B2 | 7/2008 | Lewis et al. |
| 7,403,169 B2 | 7/2008 | Svensson et al. |
| 7,406,337 B2 | 7/2008 | Kim et al. |
| 7,408,426 B2 | 8/2008 | Broyde et al. |
| 7,408,507 B1 | 8/2008 | Paek et al. |
| 7,408,923 B1 | 8/2008 | Khan et al. |
| 7,410,606 B2 | 8/2008 | Atkinson et al. |
| 7,417,587 B2 | 8/2008 | Iskander et al. |
| 7,418,178 B2 | 8/2008 | Kudou et al. |
| 7,418,273 B2 | 8/2008 | Suyama et al. |
| 7,420,474 B1 | 9/2008 | Elks et al. |
| 7,420,525 B2 | 9/2008 | Colburn et al. |
| 7,423,604 B2 | 9/2008 | Nagai et al. |
| 7,426,554 B2 | 9/2008 | Kennedy et al. |
| 7,427,927 B2 | 9/2008 | Borleske et al. |
| 7,430,257 B1 | 9/2008 | Shattil et al. |
| 7,430,932 B2 | 10/2008 | Mekhanoshin et al. |
| 7,443,334 B2 | 10/2008 | Rees et al. |
| 7,444,404 B2 | 10/2008 | Wetherall et al. |
| 7,446,567 B2 | 11/2008 | Otsuka et al. |
| 7,450,000 B2 | 11/2008 | Gidge et al. |
| 7,450,001 B2 | 11/2008 | Berkman |
| 7,453,352 B2 | 11/2008 | Kline et al. |
| 7,453,393 B2 | 11/2008 | Duivenvoorden et al. |
| 7,456,650 B2 | 11/2008 | Lee et al. |
| 7,459,834 B2 | 12/2008 | Knowles et al. |
| 7,460,834 B2 | 12/2008 | Johnson et al. |
| 7,463,877 B2 | 12/2008 | Iwamura |
| 7,465,879 B2 | 12/2008 | Glew et al. |
| 7,466,225 B2 | 12/2008 | White, II et al. |
| 7,468,657 B2 | 12/2008 | Yaney |
| 7,477,285 B1 | 1/2009 | Johnson et al. |
| 7,479,776 B2 | 1/2009 | Renken et al. |
| 7,479,841 B2 | 1/2009 | Stenger et al. |
| 7,486,247 B2 | 2/2009 | Ridgway et al. |
| 7,490,275 B2 | 2/2009 | Zerbe et al. |
| 7,492,317 B2 | 2/2009 | Tinsley et al. |
| 7,496,674 B2 | 2/2009 | Jorgensen et al. |
| 7,498,822 B2 | 3/2009 | Lee et al. |
| 7,502,619 B1 | 3/2009 | Katz et al. |
| 7,504,938 B2 | 3/2009 | Eiza et al. |
| 7,508,834 B2 | 3/2009 | Berkman et al. |
| 7,509,009 B2 | 3/2009 | Suzuki et al. |
| 7,509,675 B2 | 3/2009 | Aaron et al. |
| 7,511,662 B2 | 3/2009 | Mathews et al. |
| 7,512,090 B2 | 3/2009 | Benitez Pelaez et al. |
| 7,515,041 B2 | 4/2009 | Eisold et al. |
| 7,516,487 B1 | 4/2009 | Szeto et al. |
| 7,518,529 B2 | 4/2009 | O'Sullivan et al. |
| 7,518,952 B1 | 4/2009 | Padden et al. |
| 7,519,323 B2 | 4/2009 | Mohebbi et al. |
| 7,522,115 B2 | 4/2009 | Waltman et al. |
| 7,522,812 B2 | 4/2009 | Zitting |
| 7,525,501 B2 | 4/2009 | Black et al. |
| 7,525,504 B1 | 4/2009 | Song et al. |
| 7,531,803 B2 | 5/2009 | Mittleman et al. |
| 7,532,792 B2 | 5/2009 | Skovgaard et al. |
| 7,535,867 B1 | 5/2009 | Kilfoyle et al. |

(56) References Cited

U.S. PATENT DOCUMENTS

| | | |
|---|---|---|
| 7,539,381 B2 | 5/2009 | Li et al. |
| 7,541,981 B2 | 6/2009 | Piskun et al. |
| 7,545,818 B2 | 6/2009 | Chen et al. |
| 7,546,214 B2 | 6/2009 | Rivers, Jr. et al. |
| 7,548,212 B2 | 6/2009 | Chekroun et al. |
| 7,551,921 B2 | 6/2009 | Petermann et al. |
| 7,554,998 B2 | 6/2009 | Simonsson et al. |
| 7,555,182 B2 | 6/2009 | Martin et al. |
| 7,555,186 B2 | 6/2009 | De Montmorillon et al. |
| 7,555,187 B2 | 6/2009 | Bickham et al. |
| 7,557,563 B2 | 7/2009 | Cowan et al. |
| 7,561,025 B2 | 7/2009 | Gerszberg et al. |
| 7,567,154 B2 | 7/2009 | Elmore |
| 7,567,740 B2 | 7/2009 | Bayindir et al. |
| 7,570,137 B2 | 8/2009 | Kintis et al. |
| 7,570,470 B2 | 8/2009 | Holley |
| 7,577,398 B2 | 8/2009 | Tennant et al. |
| 7,580,643 B2 | 8/2009 | Moore et al. |
| 7,581,702 B2 | 9/2009 | Wheeler et al. |
| 7,583,074 B1 | 9/2009 | Lynch et al. |
| 7,583,233 B2 | 9/2009 | Goldberg et al. |
| 7,584,470 B2 | 9/2009 | Barker et al. |
| 7,589,630 B2 | 9/2009 | Drake et al. |
| 7,589,686 B2 | 9/2009 | Balzovsky et al. |
| 7,590,404 B1 | 9/2009 | Johnson |
| 7,591,020 B2 | 9/2009 | Kammer et al. |
| 7,591,792 B2 | 9/2009 | Bouton et al. |
| 7,593,067 B2 | 9/2009 | Taguchi et al. |
| 7,596,222 B2 | 9/2009 | Jonas et al. |
| 7,598,844 B2 | 10/2009 | Corcoran et al. |
| 7,602,333 B2 | 10/2009 | Hiramatsu et al. |
| 7,602,815 B2 | 10/2009 | Houghton et al. |
| 7,605,768 B2 | 10/2009 | Ebling et al. |
| 7,620,370 B2 | 11/2009 | Barak et al. |
| 7,625,131 B2 | 12/2009 | Zienkewicz et al. |
| 7,626,489 B2 | 12/2009 | Berkman et al. |
| 7,626,542 B2 | 12/2009 | Kober et al. |
| 7,627,300 B2 | 12/2009 | Abramov et al. |
| 7,633,442 B2 | 12/2009 | Lynch et al. |
| 7,634,250 B1 | 12/2009 | Prasad et al. |
| 7,639,201 B2 | 12/2009 | Marklein et al. |
| 7,640,562 B2 | 12/2009 | Bouilloux-Lafont et al. |
| 7,640,581 B1 | 12/2009 | Brenton et al. |
| 7,653,363 B2 | 1/2010 | Karr et al. |
| RE41,147 E | 2/2010 | Pang et al. |
| 7,656,167 B1 | 2/2010 | McLean et al. |
| 7,656,358 B2 | 2/2010 | Haziza et al. |
| 7,660,244 B2 | 2/2010 | Kadaba et al. |
| 7,660,252 B1 | 2/2010 | Huang et al. |
| 7,660,328 B1 | 2/2010 | Oz et al. |
| 7,664,117 B2 | 2/2010 | Lou et al. |
| 7,669,049 B2 | 2/2010 | Wang et al. |
| 7,671,701 B2 | 3/2010 | Radtke |
| 7,671,820 B2 | 3/2010 | Tokoro et al. |
| 7,672,271 B2 | 3/2010 | Lee et al. |
| 7,676,679 B2 | 3/2010 | Weis et al. |
| 7,680,478 B2 | 3/2010 | Willars et al. |
| 7,680,516 B2 | 3/2010 | Lovberg et al. |
| 7,680,561 B2 | 3/2010 | Rodgers et al. |
| 7,683,848 B2 | 3/2010 | Musch et al. |
| 7,684,383 B1 | 3/2010 | Thompson et al. |
| 7,693,079 B2 | 4/2010 | Cerami et al. |
| 7,693,162 B2 | 4/2010 | McKenna et al. |
| 7,693,939 B2 | 4/2010 | Wu et al. |
| 7,697,417 B2 | 4/2010 | Chen et al. |
| 7,701,931 B2 | 4/2010 | Kajiwara |
| 7,705,747 B2 | 4/2010 | Twitchell, Jr. |
| 7,710,346 B2 | 5/2010 | Bloss et al. |
| 7,714,536 B1 | 5/2010 | Silberg et al. |
| 7,714,709 B1 | 5/2010 | Daniel et al. |
| 7,714,725 B2 | 5/2010 | Medve et al. |
| 7,715,672 B2 | 5/2010 | Dong et al. |
| 7,716,660 B2 | 5/2010 | Mackay et al. |
| 7,724,782 B2 | 5/2010 | Wang et al. |
| 7,728,772 B2 | 6/2010 | Mortazawi et al. |
| 7,729,285 B2 | 6/2010 | Yoon et al. |
| 7,733,094 B2 | 6/2010 | Bright et al. |
| 7,734,717 B2 | 6/2010 | Saarimäki et al. |
| 7,737,903 B1 | 6/2010 | Rao et al. |
| 7,739,402 B2 | 6/2010 | Graham et al. |
| 7,743,403 B2 | 6/2010 | McCarty et al. |
| 7,747,356 B2 | 6/2010 | Andarawis et al. |
| 7,747,774 B2 | 6/2010 | Aaron et al. |
| 7,750,244 B1 | 7/2010 | Melding et al. |
| 7,750,763 B2 | 7/2010 | Praßmayer et al. |
| 7,751,054 B2 | 7/2010 | Backes et al. |
| 7,760,978 B2 | 7/2010 | Fishteyn et al. |
| 7,761,079 B2 | 7/2010 | Mollenkopf et al. |
| 7,764,943 B2 | 7/2010 | Radtke et al. |
| 7,773,664 B2 | 8/2010 | Myers et al. |
| 7,782,156 B2 | 8/2010 | Woods et al. |
| 7,783,195 B2 | 8/2010 | Riggsby et al. |
| 7,786,894 B2 | 8/2010 | Polk et al. |
| 7,786,945 B2 | 8/2010 | Baldauf et al. |
| 7,786,946 B2 | 8/2010 | Diaz et al. |
| 7,791,549 B2 | 9/2010 | Clymer et al. |
| 7,792,016 B2 | 9/2010 | Arai et al. |
| 7,795,877 B2 | 9/2010 | Radtke et al. |
| 7,795,994 B2 | 9/2010 | Radtke et al. |
| 7,796,025 B2 | 9/2010 | Berkman et al. |
| 7,796,122 B2 | 9/2010 | Shih et al. |
| 7,796,890 B1 | 9/2010 | Johnson |
| 7,797,367 B1 | 9/2010 | Girod et al. |
| 7,805,029 B2 | 9/2010 | Bayindir et al. |
| 7,808,441 B2 | 10/2010 | Parsche et al. |
| 7,809,223 B2 | 10/2010 | Miyabe et al. |
| 7,812,686 B2 | 10/2010 | Woods et al. |
| 7,812,778 B2 | 10/2010 | Hasegawa et al. |
| 7,813,344 B2 | 10/2010 | Cheswick |
| 7,817,063 B2 | 10/2010 | Hawkins et al. |
| 7,825,793 B1 | 11/2010 | Spillman et al. |
| 7,825,867 B2 | 11/2010 | Tuttle et al. |
| 7,826,602 B1 | 11/2010 | Hunyady et al. |
| 7,827,610 B2 | 11/2010 | Wang et al. |
| 7,830,228 B2 | 11/2010 | Brown et al. |
| 7,835,128 B2 | 11/2010 | Divan et al. |
| 7,835,600 B1 | 11/2010 | Yap et al. |
| 7,843,375 B1 | 11/2010 | Rennie et al. |
| 7,844,081 B2 | 11/2010 | McMakin et al. |
| 7,848,517 B2 | 12/2010 | Britz et al. |
| 7,852,752 B2 | 12/2010 | Kano |
| 7,852,837 B1 | 12/2010 | Au et al. |
| 7,853,267 B2 | 12/2010 | Jensen et al. |
| 7,855,612 B2 | 12/2010 | Zienkewicz et al. |
| 7,856,007 B2 | 12/2010 | Corcoran et al. |
| 7,869,391 B2 | 1/2011 | Lee et al. |
| 7,872,610 B2 | 1/2011 | Motzer et al. |
| 7,873,249 B2 | 1/2011 | Kachmar et al. |
| 7,876,174 B2 | 1/2011 | Radtke et al. |
| 7,884,285 B2 | 2/2011 | Spencer |
| 7,884,648 B2 | 2/2011 | Broyde et al. |
| 7,885,542 B2 | 2/2011 | Riggsby et al. |
| 7,889,129 B2 | 2/2011 | Fox et al. |
| 7,889,148 B2 | 2/2011 | Diaz et al. |
| 7,889,149 B2 | 2/2011 | Peebles et al. |
| 7,890,053 B2 | 2/2011 | Washiro |
| 7,893,789 B2 | 2/2011 | Paynter et al. |
| 7,894,770 B2 | 2/2011 | Washiro et al. |
| 7,898,480 B2 | 3/2011 | Rebeiz et al. |
| 7,899,403 B2 | 3/2011 | Aaron |
| 7,903,918 B1 | 3/2011 | Bickham et al. |
| 7,903,972 B2 | 3/2011 | Riggsby et al. |
| 7,906,973 B1 | 3/2011 | Orr et al. |
| 7,907,097 B2 | 3/2011 | Syed et al. |
| 7,915,980 B2 | 3/2011 | Hardacker et al. |
| 7,916,081 B2 | 3/2011 | Lakkis et al. |
| 7,928,750 B2 | 4/2011 | Miller et al. |
| 7,929,940 B1 | 4/2011 | Dianda et al. |
| 7,930,750 B1 | 4/2011 | Gauvin et al. |
| 7,937,699 B2 | 5/2011 | Schneider et al. |
| 7,940,207 B1 | 5/2011 | Kienzle et al. |
| 7,940,731 B2 | 5/2011 | Gao et al. |
| 7,956,818 B1 | 6/2011 | Hsu et al. |
| 7,958,120 B2 | 6/2011 | Muntz et al. |

(56) References Cited

U.S. PATENT DOCUMENTS

| | | |
|---|---|---|
| 7,961,710 B2 | 6/2011 | Lee et al. |
| 7,962,957 B2 | 6/2011 | Keohane et al. |
| 7,965,842 B2 | 6/2011 | Whelan et al. |
| 7,970,365 B2 | 6/2011 | Martin et al. |
| 7,970,937 B2 | 6/2011 | Shuster et al. |
| 7,971,053 B2 | 6/2011 | Gibson, Sr. et al. |
| 7,973,296 B2 | 7/2011 | Quick et al. |
| 7,974,387 B2 | 7/2011 | Lutz et al. |
| 7,983,740 B2 | 7/2011 | Culver et al. |
| 7,986,711 B2 | 7/2011 | Horvath et al. |
| 7,990,146 B2 | 8/2011 | Lazar et al. |
| 7,990,329 B2 | 8/2011 | Deng et al. |
| 7,991,877 B2 | 8/2011 | Keohane et al. |
| 7,992,014 B2 | 8/2011 | Langgood et al. |
| 7,994,996 B2 | 8/2011 | Rebeiz et al. |
| 7,994,999 B2 | 8/2011 | Maeda et al. |
| 7,997,546 B1 | 8/2011 | Andersen et al. |
| 8,010,116 B2 | 8/2011 | Scheinert |
| 8,013,694 B2 | 9/2011 | Sagala et al. |
| 8,019,288 B2 | 9/2011 | Yu et al. |
| 8,022,885 B2 | 9/2011 | Smoyer et al. |
| 8,022,887 B1 | 9/2011 | Zarnaghi et al. |
| 8,023,410 B2 | 9/2011 | O'Neill et al. |
| 8,027,391 B2 | 9/2011 | Matsubara et al. |
| 8,036,207 B2 | 10/2011 | Chen et al. |
| 8,049,576 B2 | 11/2011 | Broyde et al. |
| 8,054,199 B2 | 11/2011 | Addy et al. |
| 8,059,576 B2 | 11/2011 | Vavik et al. |
| 8,059,593 B2 | 11/2011 | Shih et al. |
| 8,060,308 B2 | 11/2011 | Breed et al. |
| 8,063,832 B1 | 11/2011 | Weller et al. |
| 8,064,744 B2 | 11/2011 | Atkins et al. |
| 8,064,944 B2 | 11/2011 | Yun et al. |
| 8,065,099 B2 | 11/2011 | Gibala et al. |
| 8,069,483 B1 | 11/2011 | Matlock et al. |
| 8,072,323 B2 | 12/2011 | Kodama et al. |
| 8,072,386 B2 | 12/2011 | Lier et al. |
| 8,073,810 B2 | 12/2011 | Maes |
| 8,077,049 B2 | 12/2011 | Yaney et al. |
| 8,077,113 B2 | 12/2011 | Renilson et al. |
| 8,081,854 B2 | 12/2011 | Yoon et al. |
| 8,089,356 B2 | 1/2012 | Moore et al. |
| 8,089,404 B2 | 1/2012 | Nichols et al. |
| 8,089,952 B2 | 1/2012 | Spade et al. |
| 8,090,258 B2 | 1/2012 | DeLew et al. |
| 8,090,379 B2 | 1/2012 | Lambert et al. |
| 8,094,081 B1 | 1/2012 | Boone et al. |
| 8,094,985 B2 | 1/2012 | Imamura et al. |
| 8,095,093 B2 | 1/2012 | Takinami et al. |
| 8,098,198 B2 | 1/2012 | Thiesen et al. |
| 8,102,324 B2 | 1/2012 | Tuau et al. |
| 8,102,779 B2 | 1/2012 | Kim et al. |
| 8,106,749 B2 | 1/2012 | Ina et al. |
| 8,106,849 B2 | 1/2012 | Sudddath et al. |
| RE43,163 E | 2/2012 | Anderson |
| 8,111,148 B2 | 2/2012 | Parker et al. |
| 8,112,649 B2 | 2/2012 | Potkonjak et al. |
| 8,116,598 B2 | 2/2012 | Shutter et al. |
| 8,120,488 B2 | 2/2012 | Bloy et al. |
| 8,121,624 B2 | 2/2012 | Cai et al. |
| 8,125,282 B2 | 2/2012 | Bao et al. |
| 8,125,399 B2 | 2/2012 | McKinzie et al. |
| 8,126,393 B2 | 2/2012 | Wu et al. |
| 8,129,817 B2 | 3/2012 | Jou et al. |
| 8,131,125 B2 | 3/2012 | Molin et al. |
| 8,131,266 B2 | 3/2012 | Cai et al. |
| 8,132,239 B2 | 3/2012 | Wahl |
| 8,134,424 B2 | 3/2012 | Kato et al. |
| 8,134,458 B2 | 3/2012 | Lund |
| 8,135,050 B1 | 3/2012 | Stadler et al. |
| 8,140,113 B2 | 3/2012 | Rofougaran et al. |
| 8,150,311 B2 | 4/2012 | Hart et al. |
| 8,151,306 B2 | 4/2012 | Rakib |
| 8,156,520 B2 | 4/2012 | Casagrande et al. |
| 8,159,316 B2 | 4/2012 | Miyazato et al. |
| 8,159,342 B1 | 4/2012 | Medina, III et al. |
| 8,159,385 B2 | 4/2012 | Farneth et al. |
| 8,159,394 B2 | 4/2012 | Hayes et al. |
| 8,159,742 B2 | 4/2012 | Mckay et al. |
| 8,159,933 B2 | 4/2012 | Henry |
| 8,159,955 B2 | 4/2012 | Larsson et al. |
| 8,160,064 B2 | 4/2012 | Kokernak et al. |
| 8,160,530 B2 | 4/2012 | Corman et al. |
| 8,160,825 B1 | 4/2012 | Roe, Jr. et al. |
| 8,164,531 B2 | 4/2012 | Lier et al. |
| 8,171,146 B2 | 5/2012 | Chen et al. |
| 8,172,173 B2 | 5/2012 | Carlson et al. |
| 8,173,943 B2 | 5/2012 | Vilo et al. |
| 8,175,535 B2 | 5/2012 | Mu et al. |
| 8,175,649 B2 | 5/2012 | Harel et al. |
| 8,179,787 B2 | 5/2012 | Knapp et al. |
| 8,180,917 B1 | 5/2012 | Yan et al. |
| 8,184,015 B2 | 5/2012 | Lilien et al. |
| 8,184,059 B2 | 5/2012 | Bunch et al. |
| 8,184,311 B2 | 5/2012 | Sakai et al. |
| 8,185,062 B2 | 5/2012 | Rofougaran et al. |
| 8,188,855 B2 | 5/2012 | Sharma et al. |
| 8,199,762 B2 | 6/2012 | Michelson et al. |
| 8,203,501 B2 | 6/2012 | Kim et al. |
| 8,212,635 B2 | 7/2012 | Miller, II et al. |
| 8,212,722 B2 | 7/2012 | Ngo et al. |
| 8,213,758 B2 | 7/2012 | Dong et al. |
| 8,218,929 B2 | 7/2012 | Bickham et al. |
| 8,222,919 B2 | 7/2012 | Broyde et al. |
| 8,222,977 B2 | 7/2012 | Oyama et al. |
| 8,225,379 B2 | 7/2012 | van et al. |
| 8,233,905 B2 | 7/2012 | Vaswani et al. |
| 8,237,617 B1 | 8/2012 | Johnson |
| 8,238,824 B2 | 8/2012 | Washiro |
| 8,238,840 B2 | 8/2012 | Iio et al. |
| 8,242,358 B2 | 8/2012 | Park et al. |
| 8,243,603 B2 | 8/2012 | Gossain et al. |
| 8,249,028 B2 | 8/2012 | Porras et al. |
| 8,251,307 B2 | 8/2012 | Goossen et al. |
| 8,253,516 B2 | 8/2012 | Miller, II et al. |
| 8,255,952 B2 | 8/2012 | Boylan, III et al. |
| 8,258,743 B2 | 9/2012 | Tyler et al. |
| 8,259,028 B2 | 9/2012 | Hills et al. |
| 8,264,417 B2 | 9/2012 | Snow et al. |
| 8,269,583 B2 | 9/2012 | Miller, II et al. |
| 8,284,102 B2 | 10/2012 | Hayes et al. |
| 8,287,323 B2 | 10/2012 | Kiesow et al. |
| 8,295,301 B2 | 10/2012 | Yonge, III et al. |
| 8,300,538 B2 | 10/2012 | Kim et al. |
| 8,300,640 B2 | 10/2012 | Al-Banna et al. |
| 8,316,228 B2 | 11/2012 | Winslow et al. |
| 8,316,364 B2 | 11/2012 | Stein et al. |
| 8,324,990 B2 | 12/2012 | Vouloumanos |
| 8,325,034 B2 | 12/2012 | Moore et al. |
| 8,325,636 B2 | 12/2012 | Binder |
| 8,325,693 B2 | 12/2012 | Binder et al. |
| 8,330,259 B2 | 12/2012 | Soler et al. |
| 8,335,596 B2 | 12/2012 | Raman et al. |
| 8,340,438 B2 | 12/2012 | Anderson et al. |
| 8,343,145 B2 | 1/2013 | Brannan et al. |
| 8,344,829 B2 | 1/2013 | Miller, II et al. |
| 8,354,970 B2 | 1/2013 | Armbrecht et al. |
| 8,359,124 B2 | 1/2013 | Zhou et al. |
| 8,362,775 B2 | 1/2013 | Speckner et al. |
| 8,363,313 B2 | 1/2013 | Nakaguma et al. |
| 8,369,667 B2 | 2/2013 | Rose et al. |
| 8,373,597 B2 | 2/2013 | Schadler et al. |
| 8,374,821 B2 | 2/2013 | Rousselle et al. |
| 8,384,600 B2 | 2/2013 | Huang et al. |
| 8,385,978 B2 | 2/2013 | Leung et al. |
| 8,386,198 B2 | 2/2013 | Lancaster |
| 8,390,307 B2 | 3/2013 | Slupsky et al. |
| 8,390,402 B2 | 3/2013 | Kunes et al. |
| 8,405,567 B2 | 3/2013 | Park et al. |
| 8,406,239 B2 | 3/2013 | Hurwitz et al. |
| 8,406,593 B2 | 3/2013 | Molin et al. |
| 8,407,687 B2 | 3/2013 | Moshir et al. |
| 8,412,130 B2 | 4/2013 | Suematsu et al. |
| 8,414,326 B2 | 4/2013 | Bowman |

(56) References Cited

U.S. PATENT DOCUMENTS

| | | |
|---|---|---|
| 8,415,884 B2 | 4/2013 | Chen et al. |
| 8,428,033 B2 | 4/2013 | Hettstedt et al. |
| 8,433,168 B2 | 4/2013 | Filippov et al. |
| 8,433,338 B1 | 4/2013 | Flynn et al. |
| 8,434,103 B2 | 4/2013 | Tsuchida et al. |
| 8,437,383 B2 | 5/2013 | Wiwel et al. |
| 8,452,101 B2 | 5/2013 | Ishikawa et al. |
| 8,452,555 B2 | 5/2013 | Hayward et al. |
| 8,457,027 B2 | 6/2013 | Dougherty et al. |
| 8,458,453 B1 | 6/2013 | Mahalingaiah et al. |
| 8,462,063 B2 | 6/2013 | Gummalla et al. |
| 8,467,363 B2 | 6/2013 | Lea et al. |
| 8,468,244 B2 | 6/2013 | Redlich et al. |
| 8,471,513 B2 | 6/2013 | Han |
| 8,472,327 B2 | 6/2013 | DelRegno et al. |
| 8,484,137 B2 | 7/2013 | Johnson et al. |
| 8,484,511 B2 | 7/2013 | Tidwell et al. |
| 8,495,718 B2 | 7/2013 | Han et al. |
| 8,497,749 B2 | 7/2013 | Elmore |
| 8,503,845 B2 | 8/2013 | Winzer et al. |
| 8,504,135 B2 | 8/2013 | Bourqui et al. |
| 8,505,057 B2 | 8/2013 | Rogers |
| 8,509,114 B1 | 8/2013 | Szajdecki |
| 8,514,980 B2 | 8/2013 | Kuhtz |
| 8,515,383 B2 | 8/2013 | Prince et al. |
| 8,516,129 B1 | 8/2013 | Skene et al. |
| 8,516,470 B1 | 8/2013 | Joshi et al. |
| 8,516,474 B2 | 8/2013 | Lamba et al. |
| 8,519,892 B2 | 8/2013 | Ding et al. |
| 8,520,578 B2 | 8/2013 | Rayment et al. |
| 8,520,636 B2 | 8/2013 | Xu |
| 8,520,931 B2 | 8/2013 | Tateno et al. |
| 8,528,059 B1 | 9/2013 | Labana et al. |
| 8,532,023 B2 | 9/2013 | Buddhikot et al. |
| 8,532,046 B2 | 9/2013 | Hu et al. |
| 8,532,492 B2 | 9/2013 | Sadowski et al. |
| 8,536,857 B2 | 9/2013 | Nero, Jr. et al. |
| 8,537,068 B2 | 9/2013 | Call et al. |
| 8,537,705 B2 | 9/2013 | Afkhamie et al. |
| 8,538,428 B2 | 9/2013 | Bartlett et al. |
| 8,539,540 B2 | 9/2013 | Zenoni |
| 8,539,569 B2 | 9/2013 | Mansour |
| 8,542,968 B2 | 9/2013 | Dong et al. |
| 8,545,322 B2 | 10/2013 | George et al. |
| 8,548,294 B2 | 10/2013 | Toge et al. |
| 8,553,646 B2 | 10/2013 | Kumar |
| 8,561,104 B1 | 10/2013 | Dow et al. |
| 8,561,181 B1 | 10/2013 | Sobel et al. |
| 8,565,568 B2 | 10/2013 | Bigot-Astruc et al. |
| 8,566,058 B2 | 10/2013 | Pupalaikis et al. |
| 8,572,247 B2 | 10/2013 | Larson et al. |
| 8,572,639 B2 | 10/2013 | Ficco |
| 8,572,661 B2 | 10/2013 | Strong et al. |
| 8,578,076 B2 | 11/2013 | van der Linden et al. |
| 8,578,486 B2 | 11/2013 | Lifliand et al. |
| 8,582,502 B2 | 11/2013 | Conte et al. |
| 8,584,195 B2 | 11/2013 | Sherlock et al. |
| 8,587,490 B2 | 11/2013 | Niver et al. |
| 8,587,492 B2 | 11/2013 | Runyon et al. |
| 8,588,567 B2 | 11/2013 | Kamps et al. |
| 8,588,840 B2 | 11/2013 | Truong et al. |
| 8,588,991 B1 | 11/2013 | Forbes, Jr. |
| 8,593,238 B2 | 11/2013 | Miller, II et al. |
| 8,594,956 B2 | 11/2013 | McBee et al. |
| 8,595,141 B2 | 11/2013 | Hao et al. |
| 8,599,150 B2 | 12/2013 | Philipp |
| 8,600,602 B1 | 12/2013 | Watson et al. |
| 8,604,982 B2 | 12/2013 | Gummalla et al. |
| 8,604,999 B2 | 12/2013 | Abumrad et al. |
| 8,605,361 B2 | 12/2013 | Batchko et al. |
| 8,605,579 B2 | 12/2013 | Abraham et al. |
| 8,612,550 B2 | 12/2013 | Yoo et al. |
| 8,613,020 B2 | 12/2013 | Knudson et al. |
| 8,615,190 B2 | 12/2013 | Lu |
| 8,625,547 B1 | 1/2014 | Miller et al. |
| 8,629,811 B2 | 1/2014 | Gaynor et al. |
| 8,639,260 B2 | 1/2014 | Fox et al. |
| 8,639,390 B2 | 1/2014 | Tamarkin et al. |
| 8,639,934 B2 | 1/2014 | Kruglick |
| 8,644,219 B2 | 2/2014 | Nishizaka et al. |
| 8,653,906 B2 | 2/2014 | Mahon et al. |
| 8,655,396 B2 | 2/2014 | Malladi et al. |
| 8,656,458 B2 | 2/2014 | Heffez et al. |
| 8,660,526 B1 | 2/2014 | Heiderscheit et al. |
| 8,660,698 B2 | 2/2014 | Phillips et al. |
| 8,665,102 B2 | 3/2014 | Salewske et al. |
| 8,666,553 B2 | 3/2014 | Phillips et al. |
| 8,670,946 B2 | 3/2014 | Salazar et al. |
| 8,674,630 B1 | 3/2014 | Cornelius et al. |
| 8,676,186 B2 | 3/2014 | Niu |
| 8,680,450 B2 | 3/2014 | Pritchard et al. |
| 8,680,706 B2 | 3/2014 | Zyren et al. |
| 8,681,463 B2 | 3/2014 | Franks et al. |
| 8,686,911 B2 | 4/2014 | Kim et al. |
| 8,687,650 B2 | 4/2014 | King |
| 8,688,153 B2 | 4/2014 | Komori et al. |
| 8,699,454 B2 | 4/2014 | Hapsari et al. |
| 8,699,461 B2 | 4/2014 | Qian et al. |
| 8,705,925 B2 | 4/2014 | Terada et al. |
| 8,706,026 B2 | 4/2014 | Truong et al. |
| 8,707,432 B1 | 4/2014 | Rathi et al. |
| 8,711,538 B2 | 4/2014 | Woodworth et al. |
| 8,711,732 B2 | 4/2014 | Johnson et al. |
| 8,711,806 B2 | 4/2014 | Lim et al. |
| 8,711,857 B2 | 4/2014 | Jackson et al. |
| 8,712,200 B1 | 4/2014 | Abernathy et al. |
| 8,719,938 B2 | 5/2014 | Demeter et al. |
| 8,723,730 B2 | 5/2014 | Lu et al. |
| 8,724,102 B2 | 5/2014 | Urban et al. |
| 8,729,857 B2 | 5/2014 | Stählin et al. |
| 8,731,358 B2 | 5/2014 | Pare et al. |
| 8,732,476 B1 | 5/2014 | Van et al. |
| 8,736,502 B1 | 5/2014 | Mehr et al. |
| 8,737,793 B2 | 5/2014 | Imamura et al. |
| 8,738,318 B2 | 5/2014 | Spillane |
| 8,742,997 B2 | 6/2014 | McPeak et al. |
| 8,743,004 B2 | 6/2014 | Haziza |
| 8,749,449 B2 | 6/2014 | Caldwell et al. |
| 8,750,097 B2 | 6/2014 | Maenpaa et al. |
| 8,750,664 B2 | 6/2014 | Haung et al. |
| 8,754,852 B2 | 6/2014 | Lee et al. |
| 8,755,659 B2 | 6/2014 | Imamura et al. |
| 8,760,354 B2 | 6/2014 | Flannery et al. |
| 8,761,792 B2 | 6/2014 | Sennett et al. |
| 8,763,097 B2 | 6/2014 | Bhatnagar et al. |
| 8,766,657 B2 | 7/2014 | DeJean et al. |
| 8,767,071 B1 | 7/2014 | Marshall |
| 8,769,622 B2 | 7/2014 | Chang et al. |
| 8,773,312 B1 | 7/2014 | Diaz et al. |
| 8,780,012 B2 | 7/2014 | Llombart Juan et al. |
| 8,782,195 B2 | 7/2014 | Foti |
| 8,786,284 B2 | 7/2014 | Sirigiri et al. |
| 8,786,514 B2 | 7/2014 | Dickie et al. |
| 8,789,091 B2 | 7/2014 | Eldering et al. |
| 8,792,760 B2 | 7/2014 | Choi et al. |
| 8,792,933 B2 | 7/2014 | Chen et al. |
| 8,793,363 B2 | 7/2014 | Sater et al. |
| 8,793,742 B2 | 7/2014 | Macrae et al. |
| 8,797,207 B2 | 8/2014 | Kienzle et al. |
| 8,804,667 B2 | 8/2014 | Wang |
| 8,806,202 B2 | 8/2014 | Shoemake et al. |
| 8,810,404 B2 | 8/2014 | Bertoncini et al. |
| 8,810,421 B2 | 8/2014 | Deaver, Sr. et al. |
| 8,810,468 B2 | 8/2014 | Cannon et al. |
| 8,811,278 B2 | 8/2014 | Hori et al. |
| 8,811,912 B2 | 8/2014 | Austin et al. |
| 8,812,050 B1 | 8/2014 | Bencheikh et al. |
| 8,812,154 B2 | 8/2014 | Vian et al. |
| 8,817,741 B2 | 8/2014 | Shaheen |
| 8,824,380 B2 | 9/2014 | Jetcheva et al. |
| 8,825,239 B2 | 9/2014 | Cooper et al. |
| 8,829,934 B2 | 9/2014 | Sellathamby et al. |
| 8,830,112 B1 | 9/2014 | Buehler et al. |
| 8,831,506 B2 | 9/2014 | Claret et al. |

(56) References Cited

U.S. PATENT DOCUMENTS

| | | |
|---|---|---|
| 8,836,503 B2 | 9/2014 | Girod et al. |
| 8,836,607 B2 | 9/2014 | Cook et al. |
| 8,839,350 B1 | 9/2014 | Shapcott et al. |
| 8,847,840 B1 | 9/2014 | Diaz et al. |
| 8,847,846 B1 | 9/2014 | Diaz et al. |
| 8,856,239 B1 | 10/2014 | Oliver et al. |
| 8,856,530 B2 | 10/2014 | Lamberg et al. |
| 8,863,245 B1 | 10/2014 | Abhyanker |
| 8,866,691 B2 | 10/2014 | Montgomery et al. |
| 8,866,695 B2 | 10/2014 | Jefferson et al. |
| 8,867,226 B2 | 10/2014 | Colomb et al. |
| 8,867,798 B2 | 10/2014 | Shuster |
| 8,872,032 B2 | 10/2014 | Su et al. |
| 8,875,224 B2 | 10/2014 | Gross et al. |
| 8,878,740 B2 | 11/2014 | Coupland et al. |
| 8,880,765 B2 | 11/2014 | Seal et al. |
| 8,881,588 B2 | 11/2014 | Baer et al. |
| 8,885,689 B2 | 11/2014 | Blasco et al. |
| 8,886,229 B2 | 11/2014 | Agrawal et al. |
| 8,887,212 B2 | 11/2014 | Dua |
| 8,890,759 B2 | 11/2014 | Pantea et al. |
| 8,893,246 B2 | 11/2014 | El-Moussa et al. |
| 8,897,215 B2 | 11/2014 | Hazani et al. |
| 8,897,499 B2 | 11/2014 | Rekimoto |
| 8,897,697 B1 | 11/2014 | Willis, III et al. |
| 8,901,916 B2 | 12/2014 | Rodriguez et al. |
| 8,903,214 B2 | 12/2014 | Alkeskjold |
| 8,907,222 B2 | 12/2014 | Stransky |
| 8,907,845 B2 | 12/2014 | Jones |
| 8,908,502 B2 | 12/2014 | Hayashitani |
| 8,908,573 B1 | 12/2014 | Wang et al. |
| 8,913,862 B1 | 12/2014 | Emmerich et al. |
| 8,917,210 B2 | 12/2014 | Shamim et al. |
| 8,917,215 B2 | 12/2014 | Pohl |
| 8,917,964 B2 | 12/2014 | Blew et al. |
| 8,918,108 B2 | 12/2014 | Van Heeswyk et al. |
| 8,918,135 B2 | 12/2014 | Kang et al. |
| 8,922,447 B2 | 12/2014 | Gao et al. |
| 8,925,079 B2 | 12/2014 | Miyake et al. |
| 8,929,841 B2 | 1/2015 | Rofougaran et al. |
| 8,934,747 B2 | 1/2015 | Smith et al. |
| 8,937,577 B2 | 1/2015 | Gerini et al. |
| 8,938,144 B2 | 1/2015 | Hennink et al. |
| 8,938,255 B2 | 1/2015 | Dalla et al. |
| 8,941,912 B2 | 1/2015 | Ichii et al. |
| 8,947,258 B2 | 2/2015 | Reid et al. |
| 8,948,235 B2 | 2/2015 | Proctor, Jr. et al. |
| 8,948,690 B2 | 2/2015 | Duerksen et al. |
| 8,952,678 B2 | 2/2015 | Giboney et al. |
| 8,955,051 B2 | 2/2015 | Marzii |
| 8,955,075 B2 | 2/2015 | Smith et al. |
| 8,957,818 B2 | 2/2015 | Chen et al. |
| 8,957,821 B1 | 2/2015 | Rao et al. |
| 8,958,356 B2 | 2/2015 | Ananthakrishnan et al. |
| 8,958,665 B2 | 2/2015 | Ziari et al. |
| 8,958,812 B2 | 2/2015 | Weiguo |
| 8,958,980 B2 | 2/2015 | Hagan et al. |
| 8,963,790 B2 | 2/2015 | Brown et al. |
| 8,964,433 B2 | 2/2015 | Hai-Maharsi |
| 8,966,609 B2 | 2/2015 | Lee et al. |
| 8,968,287 B2 | 3/2015 | Shroff et al. |
| 8,970,438 B2 | 3/2015 | Hager et al. |
| 8,984,113 B2 | 3/2015 | Li et al. |
| 8,989,788 B2 | 3/2015 | Kim et al. |
| 8,994,473 B2 | 3/2015 | Levi et al. |
| 8,994,474 B2 | 3/2015 | Mahon et al. |
| 8,996,188 B2 | 3/2015 | Frader-Thompson et al. |
| 8,996,728 B2 | 3/2015 | Cochinwala et al. |
| 9,000,353 B2 | 4/2015 | Seo et al. |
| 9,001,689 B1 | 4/2015 | Ponnampalam et al. |
| 9,001,717 B2 | 4/2015 | Chun et al. |
| 9,003,492 B2 | 4/2015 | Katar |
| 9,008,208 B2 | 4/2015 | Khandani |
| 9,008,513 B2 | 4/2015 | Kim et al. |
| 9,009,460 B2 | 4/2015 | Chen |
| 9,013,361 B1 | 4/2015 | Lam et al. |
| 9,014,621 B2 | 4/2015 | Mohebbi |
| 9,015,139 B2 | 4/2015 | Wong |
| 9,015,467 B2 | 4/2015 | Buer |
| 9,019,164 B2 | 4/2015 | Syed et al. |
| 9,019,595 B2 | 4/2015 | Jain et al. |
| 9,019,846 B2 | 4/2015 | Shetty et al. |
| 9,019,892 B2 | 4/2015 | Zhou et al. |
| 9,020,555 B2 | 4/2015 | Sheikh et al. |
| 9,021,251 B2 | 4/2015 | Chawla |
| 9,021,575 B2 | 4/2015 | Martini |
| RE45,514 E | 5/2015 | Brown |
| 9,024,831 B2 | 5/2015 | Wang et al. |
| 9,031,725 B1 | 5/2015 | Diesposti et al. |
| 9,037,516 B2 | 5/2015 | Abhyanker |
| 9,042,245 B2 | 5/2015 | Tzannes et al. |
| 9,042,812 B1 | 5/2015 | Bennett et al. |
| 9,065,172 B2 | 6/2015 | Lewry et al. |
| 9,065,177 B2 | 6/2015 | Alexopoulos |
| 9,066,224 B2 | 6/2015 | Schwengler |
| 9,070,962 B2 | 6/2015 | Kobayashi |
| 9,070,964 B1 | 6/2015 | Schuss et al. |
| 9,079,349 B2 | 7/2015 | Slafer |
| 9,082,307 B2 | 7/2015 | Sharawi |
| 9,083,083 B2 | 7/2015 | Hills et al. |
| 9,083,425 B1 | 7/2015 | Moussouris et al. |
| 9,083,581 B1 | 7/2015 | Addepalli et al. |
| 9,084,124 B2 | 7/2015 | Nickel et al. |
| 9,092,962 B1 | 7/2015 | Merrill et al. |
| 9,092,963 B2 | 7/2015 | Fetzer et al. |
| 9,094,407 B1 | 7/2015 | Matthieu |
| 9,094,840 B2 | 7/2015 | Liu et al. |
| 9,098,325 B2 | 8/2015 | Reddin |
| 9,099,787 B2 | 8/2015 | Blech |
| 9,103,864 B2 | 8/2015 | Ali |
| 9,105,981 B2 | 8/2015 | Syed |
| 9,106,617 B2 | 8/2015 | Kshirsagar et al. |
| 9,112,281 B2 | 8/2015 | Bresciani et al. |
| 9,113,347 B2 | 8/2015 | Henry |
| 9,119,127 B1 | 8/2015 | Henry |
| 9,119,179 B1 | 8/2015 | Firoiu et al. |
| 9,128,941 B2 | 9/2015 | Shulman |
| 9,130,641 B2 | 9/2015 | Mohebbi |
| 9,134,945 B2 | 9/2015 | Husain |
| 9,137,485 B2 | 9/2015 | Bar-Niv et al. |
| 9,142,334 B2 | 9/2015 | Muto et al. |
| 9,143,084 B2 | 9/2015 | Siles et al. |
| 9,143,196 B2 | 9/2015 | Schwengler |
| 9,148,186 B1 | 9/2015 | Murphy et al. |
| 9,154,641 B2 | 10/2015 | Shaw |
| 9,157,954 B2 | 10/2015 | Nickel |
| 9,158,418 B2 | 10/2015 | Oda et al. |
| 9,158,427 B1 | 10/2015 | Wang |
| 9,167,535 B2 | 10/2015 | Christoffersson et al. |
| 9,171,458 B2 | 10/2015 | Salter |
| 9,173,217 B2 | 10/2015 | Teng et al. |
| 9,178,282 B2 | 11/2015 | Mittleman et al. |
| 9,194,930 B2 | 11/2015 | Pupalaikis |
| 9,201,556 B2 | 12/2015 | Free et al. |
| 9,202,371 B2 | 12/2015 | Jain |
| 9,203,149 B2 | 12/2015 | Henderson et al. |
| 9,204,112 B2 | 12/2015 | Pasteris et al. |
| 9,204,418 B2 | 12/2015 | Siomina et al. |
| 9,207,168 B2 | 12/2015 | Lovely et al. |
| 9,209,902 B2 | 12/2015 | Willis, III et al. |
| 9,210,192 B1 | 12/2015 | Pathuri et al. |
| 9,210,586 B2 | 12/2015 | Catovic et al. |
| 9,213,905 B2 | 12/2015 | Lange et al. |
| 9,219,307 B2 | 12/2015 | Takahashi et al. |
| 9,219,594 B2 | 12/2015 | Khlat |
| 9,225,396 B2 | 12/2015 | Maltsev et al. |
| 9,229,956 B2 | 1/2016 | Ke et al. |
| 9,235,763 B2 | 1/2016 | Brown et al. |
| 9,240,835 B2 | 1/2016 | Cune et al. |
| 9,244,117 B2 | 1/2016 | Khan et al. |
| 9,246,231 B2 | 1/2016 | Ju |
| 9,246,334 B2 | 1/2016 | Lo et al. |
| 9,253,588 B2 | 2/2016 | Schmidt et al. |
| 9,260,244 B1 | 2/2016 | Cohn |

(56) References Cited

U.S. PATENT DOCUMENTS

| | | |
|---|---|---|
| 9,264,204 B2 | 2/2016 | Seo et al. |
| 9,265,078 B2 | 2/2016 | Lim et al. |
| 9,270,013 B2 | 2/2016 | Ley |
| 9,271,185 B2 | 2/2016 | Abdelmonem et al. |
| 9,276,303 B2 | 3/2016 | Chang et al. |
| 9,276,304 B2 | 3/2016 | Behan |
| 9,277,331 B2 | 3/2016 | Chao et al. |
| 9,281,564 B2 | 3/2016 | Vincent |
| 9,282,144 B2 | 3/2016 | Tebay et al. |
| 9,285,461 B2 | 3/2016 | Townley et al. |
| 9,287,605 B2 | 3/2016 | Daughenbaugh et al. |
| 9,288,844 B1 | 3/2016 | Akhavan-saraf et al. |
| 9,289,177 B2 | 3/2016 | Samsudin et al. |
| 9,293,798 B2 | 3/2016 | Ye |
| 9,293,801 B2 | 3/2016 | Courtney et al. |
| 9,302,770 B2 | 4/2016 | Courtney et al. |
| 9,306,682 B2 | 4/2016 | Singh |
| 9,312,929 B2 | 4/2016 | Forenza et al. |
| 9,315,663 B2 | 4/2016 | Cohen et al. |
| 9,319,311 B2 | 4/2016 | Wang et al. |
| 9,324,003 B2 | 4/2016 | France et al. |
| 9,324,020 B2 | 4/2016 | Nazarov |
| 9,325,067 B2 | 4/2016 | Ali et al. |
| 9,325,516 B2 | 4/2016 | Frei et al. |
| 9,326,316 B2 | 4/2016 | Yonge et al. |
| 9,334,052 B2 | 5/2016 | Ubhi et al. |
| 9,338,823 B2 | 5/2016 | Saban et al. |
| 9,346,560 B2 | 5/2016 | Wang |
| 9,350,063 B2 | 5/2016 | Herbsommer et al. |
| 9,351,182 B2 | 5/2016 | Elliott et al. |
| 9,356,358 B2 | 5/2016 | Hu et al. |
| 9,362,629 B2 | 6/2016 | Miller et al. |
| 9,363,333 B2 | 6/2016 | Basso et al. |
| 9,363,690 B1 | 6/2016 | Suthar et al. |
| 9,363,761 B2 | 6/2016 | Venkatraman |
| 9,366,743 B2 | 6/2016 | Doshi et al. |
| 9,368,275 B2 | 6/2016 | McBee et al. |
| 9,369,177 B2 | 6/2016 | Hui et al. |
| 9,372,228 B2 | 6/2016 | Gavin et al. |
| 9,379,527 B2 | 6/2016 | Jean et al. |
| 9,379,556 B2 | 6/2016 | Haensgen et al. |
| 9,380,857 B2 | 7/2016 | Davis et al. |
| 9,391,874 B2 | 7/2016 | Corti et al. |
| 9,393,683 B2 | 7/2016 | Kimberlin et al. |
| 9,394,716 B2 | 7/2016 | Butler et al. |
| 9,397,380 B2 | 7/2016 | Kudela et al. |
| 9,400,941 B2 | 7/2016 | Meier et al. |
| 9,401,863 B2 | 7/2016 | Hui et al. |
| 9,404,750 B2 | 8/2016 | Rios et al. |
| 9,413,519 B2 | 8/2016 | Khoshnood et al. |
| 9,414,126 B1 | 8/2016 | Zinevich |
| 9,417,731 B2 | 8/2016 | Premont et al. |
| 9,419,712 B2 | 8/2016 | Heidler |
| 9,421,869 B1 | 8/2016 | Ananthanarayanan et al. |
| 9,422,139 B1 | 8/2016 | Bialkowski et al. |
| 9,432,478 B2 | 8/2016 | Gibbon et al. |
| 9,432,865 B1 | 8/2016 | Jadunandan et al. |
| 9,439,092 B1 | 9/2016 | Chukka et al. |
| 9,443,417 B2 | 9/2016 | Wang |
| 9,458,974 B2 | 10/2016 | Townsend, Jr. et al. |
| 9,459,746 B2 | 10/2016 | Zarraga et al. |
| 9,461,706 B1 | 10/2016 | Bennett et al. |
| 9,465,397 B2 | 10/2016 | Forbes, Jr. et al. |
| 9,467,219 B2 | 10/2016 | Vilhar |
| 9,467,870 B2 | 10/2016 | Bennett |
| 9,476,932 B2 | 10/2016 | Furse et al. |
| 9,478,865 B1 | 10/2016 | Willis et al. |
| 9,479,241 B2 | 10/2016 | Pabla |
| 9,479,266 B2 | 10/2016 | Henry et al. |
| 9,479,299 B2 | 10/2016 | Kim et al. |
| 9,479,392 B2 | 10/2016 | Anderson et al. |
| 9,479,535 B2 | 10/2016 | Cohen et al. |
| 9,490,869 B1 | 11/2016 | Henry |
| 9,490,913 B2 | 11/2016 | Berlin |
| 9,495,037 B2 | 11/2016 | King-Smith |
| 9,496,921 B1 | 11/2016 | Corum |
| 9,497,572 B2 | 11/2016 | Britt et al. |
| 9,503,170 B2 | 11/2016 | Vu |
| 9,503,189 B2 | 11/2016 | Henry et al. |
| 9,509,415 B1 | 11/2016 | Henry et al. |
| 9,510,203 B2 | 11/2016 | Jactat et al. |
| 9,515,367 B2 | 12/2016 | Herbsommer et al. |
| 9,544,006 B2 | 1/2017 | Henry et al. |
| 2001/0030789 A1 | 10/2001 | Jiang et al. |
| 2002/0002040 A1 | 1/2002 | Kline et al. |
| 2002/0008672 A1 | 1/2002 | Gothard et al. |
| 2002/0011960 A1 | 1/2002 | Yuanzhu et al. |
| 2002/0021716 A1 | 2/2002 | Terk et al. |
| 2002/0024424 A1 | 2/2002 | Burns et al. |
| 2002/0027481 A1 | 3/2002 | Fiedziuszko et al. |
| 2002/0040439 A1 | 4/2002 | Kellum et al. |
| 2002/0057223 A1 | 5/2002 | Hook |
| 2002/0061217 A1 | 5/2002 | Hillman et al. |
| 2002/0069417 A1 | 6/2002 | Kliger et al. |
| 2002/0083194 A1 | 6/2002 | Bak et al. |
| 2002/0091807 A1 | 7/2002 | Goodman et al. |
| 2002/0099949 A1 | 7/2002 | Fries et al. |
| 2002/0101852 A1 | 8/2002 | Say et al. |
| 2002/0111997 A1 | 8/2002 | Herlihy et al. |
| 2002/0156917 A1 | 10/2002 | Nye et al. |
| 2002/0186694 A1 | 12/2002 | Mahajan et al. |
| 2002/0197979 A1 | 12/2002 | Vanderveen et al. |
| 2003/0002125 A1 | 1/2003 | Fuse et al. |
| 2003/0002476 A1 | 1/2003 | Chung et al. |
| 2003/0010528 A1 | 1/2003 | Niles |
| 2003/0022694 A1 | 1/2003 | Olsen et al. |
| 2003/0038753 A1 | 2/2003 | Mahon et al. |
| 2003/0049003 A1 | 3/2003 | Ahmad et al. |
| 2003/0054793 A1 | 3/2003 | Manis et al. |
| 2003/0054811 A1 | 3/2003 | Han et al. |
| 2003/0061346 A1 | 3/2003 | Pekary et al. |
| 2003/0094976 A1 | 5/2003 | Miyashita et al. |
| 2003/0095208 A1 | 5/2003 | Chouraqui et al. |
| 2003/0137464 A1 | 7/2003 | Foti et al. |
| 2003/0151548 A1 | 8/2003 | Kingsley et al. |
| 2003/0152331 A1 | 8/2003 | Dair et al. |
| 2003/0164794 A1 | 9/2003 | Haynes et al. |
| 2003/0188308 A1 | 10/2003 | Kizuka |
| 2003/0190110 A1 | 10/2003 | Kline et al. |
| 2003/0202756 A1 | 10/2003 | Hurley et al. |
| 2003/0210197 A1 | 11/2003 | Cencich et al. |
| 2003/0224784 A1 | 12/2003 | Hunt et al. |
| 2004/0015725 A1 | 1/2004 | Boneh et al. |
| 2004/0023640 A1 | 2/2004 | Ballai et al. |
| 2004/0024913 A1 | 2/2004 | Ikeda et al. |
| 2004/0048596 A1 | 3/2004 | Wyrzykowska et al. |
| 2004/0054425 A1 | 3/2004 | Elmore |
| 2004/0084582 A1 | 5/2004 | Kralic et al. |
| 2004/0085153 A1 | 5/2004 | Fukunaga et al. |
| 2004/0090312 A1 | 5/2004 | Manis et al. |
| 2004/0091032 A1 | 5/2004 | Duchi et al. |
| 2004/0100343 A1 | 5/2004 | Tsu et al. |
| 2004/0104410 A1 | 6/2004 | Gilbert et al. |
| 2004/0109608 A1 | 6/2004 | Love et al. |
| 2004/0113756 A1 | 6/2004 | Mollenkopf et al. |
| 2004/0113757 A1 | 6/2004 | White, II et al. |
| 2004/0119564 A1 | 6/2004 | Itoh et al. |
| 2004/0131310 A1 | 7/2004 | Walker et al. |
| 2004/0163135 A1 | 8/2004 | Giaccherini et al. |
| 2004/0165669 A1 | 8/2004 | Otsuka et al. |
| 2004/0169572 A1 | 9/2004 | Elmore et al. |
| 2004/0196784 A1 | 10/2004 | Larsson et al. |
| 2004/0198228 A1 | 10/2004 | Raghothaman et al. |
| 2004/0212481 A1 | 10/2004 | Abraham et al. |
| 2004/0213147 A1 | 10/2004 | Wiese et al. |
| 2004/0213189 A1 | 10/2004 | Alspaugh et al. |
| 2004/0213294 A1 | 10/2004 | Hughes et al. |
| 2004/0242185 A1 | 12/2004 | Lee et al. |
| 2004/0250069 A1 | 12/2004 | Kosamo et al. |
| 2005/0002408 A1 | 1/2005 | Lee et al. |
| 2005/0005854 A1 | 1/2005 | Suzuki et al. |
| 2005/0017825 A1 | 1/2005 | Hansen |
| 2005/0031267 A1 | 2/2005 | Sumimoto et al. |
| 2005/0063422 A1 | 3/2005 | Lazar et al. |

(56) References Cited

U.S. PATENT DOCUMENTS

| | | |
|---|---|---|
| 2005/0068223 A1 | 3/2005 | Vavik et al. |
| 2005/0069321 A1 | 3/2005 | Sullivan et al. |
| 2005/0074208 A1 | 4/2005 | Badcock et al. |
| 2005/0097396 A1 | 5/2005 | Wood |
| 2005/0102185 A1 | 5/2005 | Barker et al. |
| 2005/0111533 A1 | 5/2005 | Berkman et al. |
| 2005/0141808 A1 | 6/2005 | Cheben et al. |
| 2005/0143868 A1 | 6/2005 | Whelan et al. |
| 2005/0151659 A1 | 7/2005 | Donovan et al. |
| 2005/0159187 A1 | 7/2005 | Mendolia et al. |
| 2005/0164666 A1 | 7/2005 | Lang et al. |
| 2005/0168326 A1 | 8/2005 | White et al. |
| 2005/0169056 A1 | 8/2005 | Berkman et al. |
| 2005/0169401 A1 | 8/2005 | Abraham et al. |
| 2005/0177463 A1 | 8/2005 | Crutchfield et al. |
| 2005/0190101 A1 | 9/2005 | Hiramatsu et al. |
| 2005/0208949 A1 | 9/2005 | Chiueh et al. |
| 2005/0212626 A1 | 9/2005 | Takamatsu et al. |
| 2005/0219126 A1 | 10/2005 | Rebeiz et al. |
| 2005/0219135 A1 | 10/2005 | Lee et al. |
| 2005/0220180 A1* | 10/2005 | Barlev ............... H04L 12/2856 375/222 |
| 2005/0226353 A1 | 10/2005 | Gebara et al. |
| 2005/0249245 A1 | 11/2005 | Hazani et al. |
| 2005/0258920 A1 | 11/2005 | Elmore |
| 2006/0034724 A1 | 2/2006 | Hamano et al. |
| 2006/0038660 A1 | 2/2006 | Doumuki et al. |
| 2006/0053486 A1 | 3/2006 | Wesinger et al. |
| 2006/0071776 A1 | 4/2006 | White et al. |
| 2006/0077906 A1 | 4/2006 | Maegawa et al. |
| 2006/0082516 A1 | 4/2006 | Strickland et al. |
| 2006/0085813 A1 | 4/2006 | Giraldin et al. |
| 2006/0094439 A1 | 5/2006 | Christian et al. |
| 2006/0106741 A1 | 5/2006 | Janarthanan et al. |
| 2006/0111047 A1 | 5/2006 | Louberg et al. |
| 2006/0113425 A1 | 6/2006 | Rader et al. |
| 2006/0114925 A1 | 6/2006 | Gerszberg et al. |
| 2006/0119528 A1 | 6/2006 | Bhattacharyya et al. |
| 2006/0120399 A1 | 6/2006 | Claret et al. |
| 2006/0128322 A1 | 6/2006 | Igarashi et al. |
| 2006/0132380 A1 | 6/2006 | Imai et al. |
| 2006/0153878 A1 | 7/2006 | Savarino et al. |
| 2006/0172781 A1 | 8/2006 | Mohebbi et al. |
| 2006/0176124 A1 | 8/2006 | Mansour et al. |
| 2006/0181394 A1 | 8/2006 | Clarke et al. |
| 2006/0187023 A1 | 8/2006 | Iwamura et al. |
| 2006/0192672 A1 | 8/2006 | Gidge et al. |
| 2006/0220833 A1 | 10/2006 | Berkman et al. |
| 2006/0221995 A1 | 10/2006 | Berkman et al. |
| 2006/0232493 A1 | 10/2006 | Huang et al. |
| 2006/0238347 A1 | 10/2006 | Parkinson et al. |
| 2006/0239501 A1 | 10/2006 | Petrovic et al. |
| 2006/0244672 A1 | 11/2006 | Avakian et al. |
| 2006/0249622 A1 | 11/2006 | Steele et al. |
| 2006/0255930 A1 | 11/2006 | Berkman et al. |
| 2006/0286927 A1 | 12/2006 | Berkman et al. |
| 2007/0002771 A1 | 1/2007 | Berkman et al. |
| 2007/0022475 A1 | 1/2007 | Rossi et al. |
| 2007/0025265 A1 | 2/2007 | Marcotullio et al. |
| 2007/0025386 A1 | 2/2007 | Riedel et al. |
| 2007/0040628 A1 | 2/2007 | Kanno et al. |
| 2007/0041464 A1 | 2/2007 | Kim et al. |
| 2007/0041554 A1 | 2/2007 | Newman |
| 2007/0054622 A1 | 3/2007 | Berkman |
| 2007/0063914 A1 | 3/2007 | Becker et al. |
| 2007/0090185 A1 | 4/2007 | Lewkowitz et al. |
| 2007/0105508 A1 | 5/2007 | Tong et al. |
| 2007/0135044 A1 | 6/2007 | Rhodes et al. |
| 2007/0144779 A1 | 6/2007 | Vicente et al. |
| 2007/0164908 A1 | 7/2007 | Turchinetz et al. |
| 2007/0189182 A1 | 8/2007 | Berkman et al. |
| 2007/0201540 A1 | 8/2007 | Berkman et al. |
| 2007/0202913 A1 | 8/2007 | Ban et al. |
| 2007/0211689 A1 | 9/2007 | Campero et al. |
| 2007/0211786 A1 | 9/2007 | Shattil et al. |
| 2007/0216596 A1 | 9/2007 | Lewis et al. |
| 2007/0223381 A1 | 9/2007 | Radtke et al. |
| 2007/0226779 A1 | 9/2007 | Yokomitsu et al. |
| 2007/0229184 A1 | 10/2007 | Liu et al. |
| 2007/0229231 A1 | 10/2007 | Hurwitz et al. |
| 2007/0252998 A1 | 11/2007 | Berthold et al. |
| 2007/0257858 A1 | 11/2007 | Liu et al. |
| 2007/0258484 A1 | 11/2007 | Tolaio et al. |
| 2007/0268124 A1 | 11/2007 | Berkman et al. |
| 2007/0268846 A1 | 11/2007 | Proctor et al. |
| 2007/0300280 A1 | 12/2007 | Turner et al. |
| 2008/0002652 A1 | 1/2008 | Gupta et al. |
| 2008/0003872 A1 | 1/2008 | Chen et al. |
| 2008/0007416 A1 | 1/2008 | Cern et al. |
| 2008/0008116 A1 | 1/2008 | Buga et al. |
| 2008/0043655 A1 | 2/2008 | Lee et al. |
| 2008/0055149 A1 | 3/2008 | Rees et al. |
| 2008/0060832 A1 | 3/2008 | Razavi et al. |
| 2008/0064331 A1 | 3/2008 | Washiro et al. |
| 2008/0077336 A1 | 3/2008 | Fernandes et al. |
| 2008/0080389 A1 | 4/2008 | Hart et al. |
| 2008/0084937 A1 | 4/2008 | Barthold et al. |
| 2008/0094298 A1 | 4/2008 | Kralovec et al. |
| 2008/0120667 A1 | 5/2008 | Zaltsman |
| 2008/0122723 A1 | 5/2008 | Rofougaran et al. |
| 2008/0130639 A1 | 6/2008 | Costa-Requena et al. |
| 2008/0143491 A1 | 6/2008 | Deaver et al. |
| 2008/0153416 A1 | 6/2008 | Washiro et al. |
| 2008/0177678 A1 | 7/2008 | Di Martini et al. |
| 2008/0191851 A1 | 8/2008 | Koga et al. |
| 2008/0211727 A1 | 9/2008 | Elmore et al. |
| 2008/0247716 A1 | 10/2008 | Thomas et al. |
| 2008/0252522 A1 | 10/2008 | Asbridge et al. |
| 2008/0253723 A1 | 10/2008 | Stokes et al. |
| 2008/0255782 A1 | 10/2008 | Bilac et al. |
| 2008/0258993 A1 | 10/2008 | Gummalla et al. |
| 2008/0266060 A1 | 10/2008 | Takei et al. |
| 2008/0267076 A1 | 10/2008 | Laperi et al. |
| 2008/0279199 A1 | 11/2008 | Park et al. |
| 2008/0280574 A1 | 11/2008 | Rofougaran et al. |
| 2008/0313691 A1 | 12/2008 | Cholas |
| 2009/0002137 A1 | 1/2009 | Radtke et al. |
| 2009/0007189 A1 | 1/2009 | Gutknecht |
| 2009/0007190 A1 | 1/2009 | Weber et al. |
| 2009/0007194 A1 | 1/2009 | Brady, Jr. et al. |
| 2009/0009408 A1 | 1/2009 | Rofougaran et al. |
| 2009/0015239 A1 | 1/2009 | Georgiou et al. |
| 2009/0054056 A1 | 2/2009 | Gil et al. |
| 2009/0054737 A1 | 2/2009 | Magar et al. |
| 2009/0061940 A1 | 3/2009 | Scheinert et al. |
| 2009/0067441 A1 | 3/2009 | Ansari et al. |
| 2009/0079660 A1 | 3/2009 | Elmore |
| 2009/0085726 A1 | 4/2009 | Radtke et al. |
| 2009/0088907 A1 | 4/2009 | Lewis et al. |
| 2009/0093267 A1 | 4/2009 | Ariyur et al. |
| 2009/0109981 A1 | 4/2009 | Keselman |
| 2009/0125351 A1 | 5/2009 | Davis, Jr. et al. |
| 2009/0129301 A1 | 5/2009 | Belimpasakis et al. |
| 2009/0135848 A1 | 5/2009 | Chan et al. |
| 2009/0138931 A1 | 5/2009 | Lin et al. |
| 2009/0140852 A1 | 6/2009 | Stolarczyk et al. |
| 2009/0144417 A1 | 6/2009 | Kisel et al. |
| 2009/0171780 A1 | 7/2009 | Aldrey et al. |
| 2009/0175195 A1 | 7/2009 | Macauley et al. |
| 2009/0181664 A1 | 7/2009 | Kuruvilla et al. |
| 2009/0201133 A1 | 8/2009 | Bruns et al. |
| 2009/0202020 A1 | 8/2009 | Hafeez et al. |
| 2009/0210901 A1 | 8/2009 | Hawkins et al. |
| 2009/0212938 A1 | 8/2009 | Swaim et al. |
| 2009/0250449 A1 | 10/2009 | Petrenko et al. |
| 2009/0254971 A1 | 10/2009 | Herz et al. |
| 2009/0258652 A1 | 10/2009 | Lambert et al. |
| 2009/0284435 A1 | 11/2009 | Elmore et al. |
| 2009/0286482 A1 | 11/2009 | Gorokhov et al. |
| 2009/0289863 A1 | 11/2009 | Lier et al. |
| 2009/0304124 A1 | 12/2009 | Graef et al. |
| 2009/0311960 A1 | 12/2009 | Farahani et al. |
| 2009/0315668 A1 | 12/2009 | Leete, III et al. |
| 2009/0320058 A1 | 12/2009 | Wehmeyer et al. |

(56) References Cited

U.S. PATENT DOCUMENTS

| | | |
|---|---|---|
| 2009/0325479 A1 | 12/2009 | Chakrabarti et al. |
| 2009/0325628 A1 | 12/2009 | Becker et al. |
| 2010/0002618 A1 | 1/2010 | Eichinger et al. |
| 2010/0002731 A1 | 1/2010 | Kimura et al. |
| 2010/0013696 A1 | 1/2010 | Schmitt et al. |
| 2010/0026607 A1 | 2/2010 | Imai et al. |
| 2010/0039339 A1 | 2/2010 | Kuroda et al. |
| 2010/0045447 A1 | 2/2010 | Mollenkopf et al. |
| 2010/0052799 A1 | 3/2010 | Watanabe et al. |
| 2010/0053019 A1 | 3/2010 | Ikawa et al. |
| 2010/0057894 A1 | 3/2010 | Glasser |
| 2010/0080203 A1 | 4/2010 | Reynolds et al. |
| 2010/0085036 A1 | 4/2010 | Banting et al. |
| 2010/0090887 A1 | 4/2010 | Cooper et al. |
| 2010/0091712 A1 | 4/2010 | Lu et al. |
| 2010/0100918 A1 | 4/2010 | Egan, Jr. et al. |
| 2010/0111521 A1 | 5/2010 | Kim et al. |
| 2010/0119234 A1 | 5/2010 | Suematsu et al. |
| 2010/0121945 A1 | 5/2010 | Gerber et al. |
| 2010/0127848 A1 | 5/2010 | Mustapha et al. |
| 2010/0141527 A1 | 6/2010 | Lalezari et al. |
| 2010/0142435 A1 | 6/2010 | Kim et al. |
| 2010/0150215 A1 | 6/2010 | Black et al. |
| 2010/0153990 A1 | 6/2010 | Ress et al. |
| 2010/0169937 A1 | 7/2010 | Atwal et al. |
| 2010/0175080 A1 | 7/2010 | Yuen et al. |
| 2010/0176894 A1 | 7/2010 | Tahara et al. |
| 2010/0177894 A1 | 7/2010 | Yasuma et al. |
| 2010/0185614 A1 | 7/2010 | O'Brien et al. |
| 2010/0201313 A1 | 8/2010 | Vorenkamp et al. |
| 2010/0214183 A1 | 8/2010 | Stoneback et al. |
| 2010/0214185 A1 | 8/2010 | Sammoura et al. |
| 2010/0220024 A1 | 9/2010 | Snow et al. |
| 2010/0224732 A1 | 9/2010 | Olson et al. |
| 2010/0225426 A1 | 9/2010 | Unger et al. |
| 2010/0232539 A1 | 9/2010 | Han et al. |
| 2010/0243633 A1 | 9/2010 | Huynh et al. |
| 2010/0253450 A1 | 10/2010 | Kim et al. |
| 2010/0256955 A1 | 10/2010 | Pupalaikis et al. |
| 2010/0265877 A1 | 10/2010 | Foxworthy et al. |
| 2010/0266063 A1 | 10/2010 | Harel et al. |
| 2010/0283693 A1 | 11/2010 | Xie et al. |
| 2010/0284446 A1 | 11/2010 | Mu et al. |
| 2010/0319068 A1 | 12/2010 | Abbadessa et al. |
| 2010/0327880 A1 | 12/2010 | Stein et al. |
| 2011/0018704 A1 | 1/2011 | Burrows et al. |
| 2011/0040861 A1 | 2/2011 | Van der Merwe et al. |
| 2011/0042120 A1 | 2/2011 | Otsuka et al. |
| 2011/0043051 A1 | 2/2011 | Meskens et al. |
| 2011/0053498 A1 | 3/2011 | Nogueira-Nine |
| 2011/0068893 A1 | 3/2011 | Lahiri et al. |
| 2011/0068988 A1 | 3/2011 | Monte et al. |
| 2011/0080301 A1 | 4/2011 | Chang et al. |
| 2011/0083399 A1 | 4/2011 | Lettkeman et al. |
| 2011/0103274 A1 | 5/2011 | Vavik et al. |
| 2011/0107364 A1 | 5/2011 | Lajoie et al. |
| 2011/0109936 A1 | 5/2011 | Coffee et al. |
| 2011/0110404 A1* | 5/2011 | Washiro ............. H04B 5/00 375/219 |
| 2011/0118888 A1 | 5/2011 | White et al. |
| 2011/0132658 A1 | 6/2011 | Miller, II et al. |
| 2011/0133865 A1 | 6/2011 | Miller, II et al. |
| 2011/0133867 A1 | 6/2011 | Miller, II et al. |
| 2011/0136432 A1 | 6/2011 | Miller, II et al. |
| 2011/0140911 A1 | 6/2011 | Reid et al. |
| 2011/0141555 A1 | 6/2011 | Fermann et al. |
| 2011/0143673 A1 | 6/2011 | Landesman et al. |
| 2011/0148578 A1 | 6/2011 | Aloi et al. |
| 2011/0148687 A1 | 6/2011 | Wright et al. |
| 2011/0164514 A1 | 7/2011 | Afkhamie et al. |
| 2011/0165847 A1 | 7/2011 | Kawasaki et al. |
| 2011/0169336 A1 | 7/2011 | Yerazunis et al. |
| 2011/0172000 A1 | 7/2011 | Quigley et al. |
| 2011/0173447 A1 | 7/2011 | Zhang et al. |
| 2011/0187578 A1 | 8/2011 | Farneth et al. |
| 2011/0199265 A1 | 8/2011 | Lin et al. |
| 2011/0201269 A1 | 8/2011 | Hobbs et al. |
| 2011/0208450 A1 | 8/2011 | Salka et al. |
| 2011/0214176 A1 | 9/2011 | Burch et al. |
| 2011/0219402 A1 | 9/2011 | Candelore et al. |
| 2011/0220394 A1 | 9/2011 | Szylakowski et al. |
| 2011/0225046 A1 | 9/2011 | Eldering et al. |
| 2011/0228814 A1 | 9/2011 | Washiro et al. |
| 2011/0235536 A1 | 9/2011 | Nishizaka et al. |
| 2011/0268085 A1 | 11/2011 | Barany et al. |
| 2011/0274396 A1 | 11/2011 | Nakajima et al. |
| 2011/0286506 A1 | 11/2011 | Libby et al. |
| 2011/0291878 A1 | 12/2011 | McLaughlin et al. |
| 2011/0294509 A1 | 12/2011 | Kim et al. |
| 2011/0311231 A1 | 12/2011 | Ridgway et al. |
| 2011/0316645 A1 | 12/2011 | Takeuchi |
| 2012/0002973 A1 | 1/2012 | Bruzzi et al. |
| 2012/0015382 A1 | 1/2012 | Weitz et al. |
| 2012/0015654 A1 | 1/2012 | Palanki et al. |
| 2012/0019420 A1 | 1/2012 | Caimi et al. |
| 2012/0019427 A1 | 1/2012 | Ishikawa et al. |
| 2012/0038520 A1 | 2/2012 | Cornwell et al. |
| 2012/0039366 A1 | 2/2012 | Wood et al. |
| 2012/0046891 A1 | 2/2012 | Yaney et al. |
| 2012/0054571 A1* | 3/2012 | Howard ............. H04W 4/001 714/748 |
| 2012/0068903 A1 | 3/2012 | Thevenard et al. |
| 2012/0077485 A1 | 3/2012 | Shin et al. |
| 2012/0078452 A1 | 3/2012 | Daum et al. |
| 2012/0084807 A1 | 4/2012 | Thompson et al. |
| 2012/0091820 A1 | 4/2012 | Campanella et al. |
| 2012/0092161 A1 | 4/2012 | West et al. |
| 2012/0093078 A1 | 4/2012 | Perlman et al. |
| 2012/0102568 A1 | 4/2012 | Tarbotton et al. |
| 2012/0105246 A1 | 5/2012 | Sexton et al. |
| 2012/0105637 A1 | 5/2012 | Yousefi et al. |
| 2012/0109545 A1 | 5/2012 | Meynardi et al. |
| 2012/0109566 A1 | 5/2012 | Adamian et al. |
| 2012/0117584 A1 | 5/2012 | Gordon |
| 2012/0129566 A1 | 5/2012 | Lee et al. |
| 2012/0133373 A1 | 5/2012 | Ali et al. |
| 2012/0137332 A1 | 5/2012 | Kumar et al. |
| 2012/0144420 A1 | 6/2012 | Del Sordo et al. |
| 2012/0146861 A1 | 6/2012 | Armbrecht et al. |
| 2012/0153087 A1 | 6/2012 | Collette et al. |
| 2012/0154239 A1 | 6/2012 | Bar-Sade et al. |
| 2012/0161543 A1 | 6/2012 | Reuven et al. |
| 2012/0176906 A1 | 7/2012 | Hartenstein et al. |
| 2012/0181258 A1 | 7/2012 | Shan et al. |
| 2012/0190386 A1 | 7/2012 | Anderson |
| 2012/0197558 A1 | 8/2012 | Henig et al. |
| 2012/0201145 A1 | 8/2012 | Ree et al. |
| 2012/0214538 A1 | 8/2012 | Kim et al. |
| 2012/0224807 A1 | 9/2012 | Winzer et al. |
| 2012/0226394 A1 | 9/2012 | Marcus et al. |
| 2012/0235864 A1 | 9/2012 | Lu et al. |
| 2012/0235881 A1 | 9/2012 | Pan et al. |
| 2012/0250534 A1 | 10/2012 | Langer et al. |
| 2012/0250752 A1 | 10/2012 | McHann et al. |
| 2012/0263152 A1 | 10/2012 | Fischer et al. |
| 2012/0267863 A1 | 10/2012 | Kiest et al. |
| 2012/0268340 A1 | 10/2012 | Capozzoli et al. |
| 2012/0270507 A1 | 10/2012 | Qin et al. |
| 2012/0272741 A1 | 11/2012 | Xiao et al. |
| 2012/0274528 A1 | 11/2012 | McMahon et al. |
| 2012/0287922 A1 | 11/2012 | Heck et al. |
| 2012/0299671 A1 | 11/2012 | Ikeda et al. |
| 2012/0304294 A1 | 11/2012 | Fujiwara et al. |
| 2012/0306587 A1 | 12/2012 | Strid et al. |
| 2012/0306708 A1 | 12/2012 | Henderson et al. |
| 2012/0313895 A1 | 12/2012 | Haroun et al. |
| 2012/0319903 A1 | 12/2012 | Huseth et al. |
| 2012/0322380 A1 | 12/2012 | Nannarone et al. |
| 2012/0322492 A1 | 12/2012 | Koo et al. |
| 2012/0324018 A1 | 12/2012 | Metcalf et al. |
| 2012/0327908 A1 | 12/2012 | Gupta et al. |
| 2012/0329523 A1 | 12/2012 | Stewart et al. |
| 2012/0330756 A1 | 12/2012 | Morris et al. |
| 2013/0002409 A1 | 1/2013 | Molina et al. |

(56) References Cited

U.S. PATENT DOCUMENTS

| | | |
|---|---|---|
| 2013/0003876 A1 | 1/2013 | Bennett |
| 2013/0010679 A1 | 1/2013 | Ma et al. |
| 2013/0015922 A1 | 1/2013 | Liu et al. |
| 2013/0016022 A1 | 1/2013 | Heiks et al. |
| 2013/0023302 A1 | 1/2013 | Sivanesan et al. |
| 2013/0039624 A1 | 2/2013 | Scherer et al. |
| 2013/0064178 A1 | 3/2013 | Cs et al. |
| 2013/0064311 A1 | 3/2013 | Turner et al. |
| 2013/0070621 A1 | 3/2013 | Marzetta et al. |
| 2013/0077612 A1 | 3/2013 | Khorami et al. |
| 2013/0077664 A1 | 3/2013 | Lee et al. |
| 2013/0080290 A1 | 3/2013 | Kamm |
| 2013/0086639 A1 | 4/2013 | Sondhi et al. |
| 2013/0093638 A1 | 4/2013 | Shoemaker et al. |
| 2013/0095875 A1 | 4/2013 | Reuven et al. |
| 2013/0108206 A1 | 5/2013 | Sasaoka et al. |
| 2013/0109317 A1 | 5/2013 | Kikuchi et al. |
| 2013/0117852 A1 | 5/2013 | Stute et al. |
| 2013/0120548 A1 | 5/2013 | Li et al. |
| 2013/0122828 A1 | 5/2013 | Choi et al. |
| 2013/0124365 A1 | 5/2013 | Pradeep |
| 2013/0127678 A1 | 5/2013 | Chandler et al. |
| 2013/0136410 A1 | 5/2013 | Sasaoka et al. |
| 2013/0144750 A1 | 6/2013 | Brown |
| 2013/0148194 A1 | 6/2013 | Altug et al. |
| 2013/0159153 A1 | 6/2013 | Lau et al. |
| 2013/0159856 A1 | 6/2013 | Ferren |
| 2013/0160122 A1 | 6/2013 | Choi et al. |
| 2013/0162490 A1 | 6/2013 | Blech et al. |
| 2013/0166690 A1 | 6/2013 | Shatzkamer et al. |
| 2013/0173807 A1 | 7/2013 | De Groot et al. |
| 2013/0178998 A1 | 7/2013 | Gadiraju et al. |
| 2013/0182804 A1 | 7/2013 | Yutaka et al. |
| 2013/0185552 A1 | 7/2013 | Steer et al. |
| 2013/0187636 A1 | 7/2013 | Kast et al. |
| 2013/0191052 A1 | 7/2013 | Fernandez et al. |
| 2013/0201006 A1 | 8/2013 | Kummetz et al. |
| 2013/0201904 A1 | 8/2013 | Toskala et al. |
| 2013/0205370 A1 | 8/2013 | Kalgi et al. |
| 2013/0207681 A1 | 8/2013 | Slupsky et al. |
| 2013/0207859 A1 | 8/2013 | Legay et al. |
| 2013/0219308 A1 | 8/2013 | Britton et al. |
| 2013/0230235 A1 | 9/2013 | Tateno et al. |
| 2013/0234904 A1 | 9/2013 | Blech et al. |
| 2013/0234961 A1 | 9/2013 | Garfinkel et al. |
| 2013/0235845 A1 | 9/2013 | Kovvali et al. |
| 2013/0235871 A1 | 9/2013 | Brzozowski et al. |
| 2013/0262656 A1 | 10/2013 | Cao et al. |
| 2013/0262857 A1 | 10/2013 | Neuman et al. |
| 2013/0263263 A1 | 10/2013 | Narkolayev et al. |
| 2013/0265732 A1 | 10/2013 | Herbsommer et al. |
| 2013/0268414 A1* | 10/2013 | Lehtiniemi ............ G06Q 30/06 705/27.2 |
| 2013/0271349 A1 | 10/2013 | Wright et al. |
| 2013/0278464 A1 | 10/2013 | Xia et al. |
| 2013/0279523 A1 | 10/2013 | Denney et al. |
| 2013/0279561 A1 | 10/2013 | Jin et al. |
| 2013/0279868 A1 | 10/2013 | Zhang et al. |
| 2013/0285864 A1 | 10/2013 | Clymer et al. |
| 2013/0303089 A1 | 11/2013 | Wang et al. |
| 2013/0305369 A1 | 11/2013 | Karta et al. |
| 2013/0306351 A1 | 11/2013 | Lambert et al. |
| 2013/0307645 A1 | 11/2013 | Mita et al. |
| 2013/0311661 A1 | 11/2013 | McPhee |
| 2013/0314182 A1 | 11/2013 | Takeda et al. |
| 2013/0321225 A1 | 12/2013 | Pettus et al. |
| 2013/0326063 A1 | 12/2013 | Burch et al. |
| 2013/0326494 A1 | 12/2013 | Nunez et al. |
| 2013/0330050 A1 | 12/2013 | Yang et al. |
| 2013/0335165 A1 | 12/2013 | Arnold et al. |
| 2013/0336370 A1 | 12/2013 | Jovanovic et al. |
| 2013/0336418 A1 | 12/2013 | Tomeba et al. |
| 2013/0341094 A1 | 12/2013 | Taherian et al. |
| 2013/0342287 A1 | 12/2013 | Randall et al. |
| 2013/0343213 A1 | 12/2013 | Reynolds et al. |
| 2013/0343351 A1 | 12/2013 | Sambhwani et al. |
| 2014/0003394 A1 | 1/2014 | Rubin et al. |
| 2014/0003775 A1 | 1/2014 | Ko et al. |
| 2014/0007076 A1 | 1/2014 | Kim et al. |
| 2014/0009270 A1 | 1/2014 | Yamazaki et al. |
| 2014/0009822 A1 | 1/2014 | Dong et al. |
| 2014/0015705 A1* | 1/2014 | Ebihara .................. H02J 17/00 342/22 |
| 2014/0019576 A1 | 1/2014 | Lobo et al. |
| 2014/0026170 A1 | 1/2014 | Francisco et al. |
| 2014/0028184 A1 | 1/2014 | Voronin et al. |
| 2014/0028190 A1 | 1/2014 | Voronin et al. |
| 2014/0028532 A1 | 1/2014 | Ehrenberg et al. |
| 2014/0032005 A1 | 1/2014 | Iwamura |
| 2014/0036694 A1 | 2/2014 | Courtice et al. |
| 2014/0041925 A1 | 2/2014 | Siripurapu et al. |
| 2014/0043189 A1 | 2/2014 | Lee et al. |
| 2014/0043977 A1 | 2/2014 | Wiley et al. |
| 2014/0044139 A1 | 2/2014 | Dong et al. |
| 2014/0050212 A1 | 2/2014 | Braz et al. |
| 2014/0052810 A1 | 2/2014 | Osorio et al. |
| 2014/0056130 A1 | 2/2014 | Grayson et al. |
| 2014/0057576 A1 | 2/2014 | Liu et al. |
| 2014/0062784 A1 | 3/2014 | Rison et al. |
| 2014/0071818 A1 | 3/2014 | Wang et al. |
| 2014/0072064 A1 | 3/2014 | Lemson et al. |
| 2014/0072299 A1 | 3/2014 | Stapleton et al. |
| 2014/0077995 A1 | 3/2014 | Artemenko et al. |
| 2014/0086080 A1 | 3/2014 | Hui et al. |
| 2014/0086152 A1 | 3/2014 | Bontu et al. |
| 2014/0112184 A1 | 4/2014 | Chai |
| 2014/0124236 A1 | 5/2014 | Vu et al. |
| 2014/0126914 A1 | 5/2014 | Berlin et al. |
| 2014/0130111 A1 | 5/2014 | Nulty et al. |
| 2014/0132728 A1 | 5/2014 | Verano et al. |
| 2014/0139375 A1 | 5/2014 | Faragher et al. |
| 2014/0143055 A1 | 5/2014 | Johnson |
| 2014/0146902 A1 | 5/2014 | Liu et al. |
| 2014/0148107 A1 | 5/2014 | Maltsev et al. |
| 2014/0155054 A1 | 6/2014 | Henry et al. |
| 2014/0165145 A1 | 6/2014 | Baentsch et al. |
| 2014/0169186 A1 | 6/2014 | Zhu et al. |
| 2014/0177692 A1 | 6/2014 | Yu et al. |
| 2014/0179302 A1 | 6/2014 | Polehn et al. |
| 2014/0189677 A1 | 7/2014 | Curzi et al. |
| 2014/0189732 A1 | 7/2014 | Shkedi et al. |
| 2014/0191913 A1 | 7/2014 | Ge et al. |
| 2014/0204000 A1 | 7/2014 | Sato et al. |
| 2014/0204754 A1 | 7/2014 | Jeong et al. |
| 2014/0207844 A1 | 7/2014 | Mayo et al. |
| 2014/0208272 A1 | 7/2014 | Vats et al. |
| 2014/0222997 A1 | 8/2014 | Mermoud et al. |
| 2014/0223527 A1 | 8/2014 | Bortz et al. |
| 2014/0225129 A1 | 8/2014 | Inoue et al. |
| 2014/0227905 A1 | 8/2014 | Knott et al. |
| 2014/0227966 A1 | 8/2014 | Artemenko et al. |
| 2014/0233900 A1 | 8/2014 | Hugonnot et al. |
| 2014/0241718 A1 | 8/2014 | Jiang et al. |
| 2014/0254516 A1 | 9/2014 | Lee et al. |
| 2014/0254896 A1 | 9/2014 | Zhou et al. |
| 2014/0254979 A1 | 9/2014 | Zhang et al. |
| 2014/0266946 A1 | 9/2014 | Stevenson et al. |
| 2014/0266953 A1 | 9/2014 | Yen et al. |
| 2014/0267700 A1 | 9/2014 | Wang et al. |
| 2014/0269260 A1 | 9/2014 | Xue et al. |
| 2014/0269691 A1 | 9/2014 | Xue et al. |
| 2014/0269972 A1 | 9/2014 | Rada et al. |
| 2014/0273873 A1 | 9/2014 | Huynh et al. |
| 2014/0285277 A1 | 9/2014 | Herbsommer et al. |
| 2014/0285293 A1 | 9/2014 | Schuppener et al. |
| 2014/0285373 A1 | 9/2014 | Kuwahara et al. |
| 2014/0285389 A1 | 9/2014 | Fakharzadeh et al. |
| 2014/0286189 A1 | 9/2014 | Kang et al. |
| 2014/0286235 A1 | 9/2014 | Chang et al. |
| 2014/0286284 A1 | 9/2014 | Lim et al. |
| 2014/0287702 A1 | 9/2014 | Schuppener et al. |
| 2014/0299349 A1 | 10/2014 | Yamaguchi et al. |
| 2014/0304498 A1 | 10/2014 | Gonuguntla et al. |
| 2014/0317229 A1 | 10/2014 | Hughes et al. |

(56) References Cited

U.S. PATENT DOCUMENTS

| | | |
|---|---|---|
| 2014/0320364 A1 | 10/2014 | Gu et al. |
| 2014/0321273 A1 | 10/2014 | Morrill et al. |
| 2014/0325594 A1 | 10/2014 | Klein et al. |
| 2014/0334773 A1 | 11/2014 | Mathai et al. |
| 2014/0334789 A1 | 11/2014 | Matsuo et al. |
| 2014/0340271 A1 | 11/2014 | Petkov et al. |
| 2014/0343883 A1 | 11/2014 | Libby et al. |
| 2014/0349696 A1 | 11/2014 | Hyde et al. |
| 2014/0351571 A1 | 11/2014 | Jacobs |
| 2014/0355525 A1 | 12/2014 | Barzegar et al. |
| 2014/0355989 A1 | 12/2014 | Finkelstein |
| 2014/0357269 A1 | 12/2014 | Zhou et al. |
| 2014/0359275 A1 | 12/2014 | Murugesan et al. |
| 2014/0362374 A1 | 12/2014 | Santori |
| 2014/0362694 A1 | 12/2014 | Rodriques |
| 2014/0368301 A1 | 12/2014 | Herbsommer et al. |
| 2014/0369430 A1 | 12/2014 | Parnell et al. |
| 2014/0372068 A1 | 12/2014 | Seto et al. |
| 2014/0373053 A1 | 12/2014 | Leley et al. |
| 2014/0376655 A1 | 12/2014 | Ruan et al. |
| 2015/0008996 A1 | 1/2015 | Jessup et al. |
| 2015/0009089 A1 | 1/2015 | Pesa |
| 2015/0016260 A1 | 1/2015 | Chow et al. |
| 2015/0017473 A1 | 1/2015 | Verhoeven et al. |
| 2015/0022399 A1 | 1/2015 | Flannery et al. |
| 2015/0026460 A1 | 1/2015 | Walton |
| 2015/0029065 A1 | 1/2015 | Cheng |
| 2015/0036610 A1 | 2/2015 | Kim et al. |
| 2015/0042526 A1 | 2/2015 | Zeine |
| 2015/0048238 A1 | 2/2015 | Kawai |
| 2015/0049998 A1 | 2/2015 | Dumais |
| 2015/0061859 A1 | 3/2015 | Matsuoka et al. |
| 2015/0065166 A1 | 3/2015 | Ward et al. |
| 2015/0070231 A1 | 3/2015 | Park et al. |
| 2015/0071594 A1 | 3/2015 | Register |
| 2015/0073594 A1 | 3/2015 | Trujillo et al. |
| 2015/0077740 A1 | 3/2015 | Fuse |
| 2015/0078756 A1 | 3/2015 | Soto |
| 2015/0084660 A1 | 3/2015 | Knierim et al. |
| 2015/0084703 A1 | 3/2015 | Sanduleanu |
| 2015/0084814 A1 | 3/2015 | Rojanski et al. |
| 2015/0091650 A1 | 4/2015 | Nobbe |
| 2015/0094104 A1 | 4/2015 | Wilmhoff et al. |
| 2015/0098387 A1 | 4/2015 | Garg et al. |
| 2015/0099555 A1 | 4/2015 | Krishnaswamy et al. |
| 2015/0102972 A1 | 4/2015 | Scire-Scappuzzo et al. |
| 2015/0103685 A1 | 4/2015 | Butchko et al. |
| 2015/0104005 A1 | 4/2015 | Holman |
| 2015/0105115 A1 | 4/2015 | Hata et al. |
| 2015/0109178 A1 | 4/2015 | Hyde et al. |
| 2015/0116154 A1 | 4/2015 | Artemenko |
| 2015/0122886 A1 | 5/2015 | Koch |
| 2015/0126107 A1 | 5/2015 | Bennett et al. |
| 2015/0130675 A1 | 5/2015 | Parsche |
| 2015/0138022 A1 | 5/2015 | Takahashi |
| 2015/0138144 A1 | 5/2015 | Tanabe |
| 2015/0153248 A1 | 6/2015 | Hayward et al. |
| 2015/0156266 A1 | 6/2015 | Gupta |
| 2015/0162988 A1 | 6/2015 | Henry et al. |
| 2015/0171522 A1 | 6/2015 | Liu et al. |
| 2015/0172036 A1 | 6/2015 | Katar et al. |
| 2015/0181449 A1 | 6/2015 | Didenko et al. |
| 2015/0185425 A1 | 7/2015 | Gundel et al. |
| 2015/0195349 A1 | 7/2015 | Cardamore |
| 2015/0195719 A1 | 7/2015 | Rahman |
| 2015/0201228 A1 | 7/2015 | Hasek |
| 2015/0207527 A1 | 7/2015 | Eliaz et al. |
| 2015/0214615 A1 | 7/2015 | Patel et al. |
| 2015/0215268 A1 | 7/2015 | Dinha |
| 2015/0223078 A1 | 8/2015 | Bennett et al. |
| 2015/0223113 A1 | 8/2015 | Matsunaga |
| 2015/0223160 A1 | 8/2015 | Ho |
| 2015/0230109 A1 | 8/2015 | Turner et al. |
| 2015/0236778 A1 | 8/2015 | Jalali |
| 2015/0236779 A1 | 8/2015 | Jalali |
| 2015/0237519 A1 | 8/2015 | Ghai |
| 2015/0249965 A1 | 9/2015 | Dussmann et al. |
| 2015/0263424 A1 | 9/2015 | Sanford |
| 2015/0271830 A1 | 9/2015 | Shin et al. |
| 2015/0276577 A1 | 10/2015 | Ruege et al. |
| 2015/0277569 A1 | 10/2015 | Sprenger |
| 2015/0280328 A1 | 10/2015 | Sanford et al. |
| 2015/0284079 A1 | 10/2015 | Matsuda |
| 2015/0288532 A1 | 10/2015 | Veyseh et al. |
| 2015/0289247 A1 | 10/2015 | Liu et al. |
| 2015/0303892 A1 | 10/2015 | Desclos |
| 2015/0304045 A1 | 10/2015 | Henry et al. |
| 2015/0304869 A1 | 10/2015 | Johnson et al. |
| 2015/0311951 A1 | 10/2015 | Hariz |
| 2015/0312774 A1 | 10/2015 | Lau |
| 2015/0318610 A1 | 11/2015 | Lee et al. |
| 2015/0323948 A1 | 11/2015 | Jeong |
| 2015/0325913 A1 | 11/2015 | Vagman |
| 2015/0326274 A1 | 11/2015 | Flood |
| 2015/0326287 A1 | 11/2015 | Kazmi et al. |
| 2015/0333386 A1 | 11/2015 | Kaneda et al. |
| 2015/0333804 A1 | 11/2015 | Yang et al. |
| 2015/0334769 A1 | 11/2015 | Kim et al. |
| 2015/0339912 A1 | 11/2015 | Farrand et al. |
| 2015/0344136 A1 | 12/2015 | Dahlstrom |
| 2015/0349415 A1 | 12/2015 | Iwanaka |
| 2015/0356482 A1 | 12/2015 | Whipple et al. |
| 2015/0356848 A1 | 12/2015 | Hatch |
| 2015/0369660 A1 | 12/2015 | Yu |
| 2015/0370251 A1 | 12/2015 | Siegel et al. |
| 2015/0373557 A1 | 12/2015 | Bennett et al. |
| 2015/0380814 A1 | 12/2015 | Boutayeb et al. |
| 2015/0382208 A1 | 12/2015 | Elliott et al. |
| 2015/0382363 A1 | 12/2015 | Wang et al. |
| 2016/0006129 A1 | 1/2016 | Haziza |
| 2016/0012460 A1 | 1/2016 | Kruglick |
| 2016/0014749 A1 | 1/2016 | Kang et al. |
| 2016/0021545 A1 | 1/2016 | Shaw |
| 2016/0026301 A1 | 1/2016 | Zhou et al. |
| 2016/0029009 A1 | 1/2016 | Lu et al. |
| 2016/0038074 A1 | 2/2016 | Brown et al. |
| 2016/0043478 A1 | 2/2016 | Hartenstein |
| 2016/0044705 A1 | 2/2016 | Gao |
| 2016/0050028 A1 | 2/2016 | Henry et al. |
| 2016/0056543 A1 | 2/2016 | Kwiatkowski |
| 2016/0063642 A1 | 3/2016 | Luciani et al. |
| 2016/0064794 A1 | 3/2016 | Henry et al. |
| 2016/0065252 A1 | 3/2016 | Preschutti |
| 2016/0065335 A1 | 3/2016 | Koo et al. |
| 2016/0066191 A1 | 3/2016 | Li |
| 2016/0068265 A1 | 3/2016 | Hoareau et al. |
| 2016/0068277 A1 | 3/2016 | Manitta |
| 2016/0069934 A1 | 3/2016 | Saxby et al. |
| 2016/0069935 A1 | 3/2016 | Kreikebaum et al. |
| 2016/0070265 A1 | 3/2016 | Liu et al. |
| 2016/0072173 A1 | 3/2016 | Herbsommer et al. |
| 2016/0072191 A1 | 3/2016 | Iwai |
| 2016/0072287 A1 | 3/2016 | Jia |
| 2016/0079769 A1 | 3/2016 | Corum et al. |
| 2016/0079771 A1 | 3/2016 | Corum |
| 2016/0079809 A1 | 3/2016 | Corum et al. |
| 2016/0080035 A1 | 3/2016 | Fuchs et al. |
| 2016/0080839 A1 | 3/2016 | Fuchs et al. |
| 2016/0082460 A1 | 3/2016 | McMaster et al. |
| 2016/0087344 A1 | 3/2016 | Artemenko et al. |
| 2016/0088498 A1 | 3/2016 | Sharawi |
| 2016/0094420 A1 | 3/2016 | Clemm et al. |
| 2016/0094879 A1 | 3/2016 | Gerszberg et al. |
| 2016/0099749 A1 | 4/2016 | Bennett et al. |
| 2016/0100324 A1 | 4/2016 | Henry et al. |
| 2016/0103199 A1 | 4/2016 | Rappaport |
| 2016/0105218 A1 | 4/2016 | Henry et al. |
| 2016/0105233 A1 | 4/2016 | Jalali |
| 2016/0105239 A1 | 4/2016 | Henry et al. |
| 2016/0105255 A1 | 4/2016 | Henry et al. |
| 2016/0111890 A1 | 4/2016 | Corum et al. |
| 2016/0112092 A1 | 4/2016 | Henry et al. |
| 2016/0112093 A1 | 4/2016 | Barzegar et al. |
| 2016/0112094 A1 | 4/2016 | Stuckman et al. |

(56) References Cited

U.S. PATENT DOCUMENTS

| | | |
|---|---|---|
| 2016/0112115 A1 | 4/2016 | Henry et al. |
| 2016/0112132 A1 | 4/2016 | Gerszberg et al. |
| 2016/0112133 A1 | 4/2016 | Henry et al. |
| 2016/0112135 A1 | 4/2016 | Henry et al. |
| 2016/0112263 A1 | 4/2016 | Henry et al. |
| 2016/0116914 A1 | 4/2016 | Mucci |
| 2016/0118717 A1 | 4/2016 | Britz et al. |
| 2016/0124071 A1 | 5/2016 | Baxley et al. |
| 2016/0127931 A1 | 5/2016 | Baxley et al. |
| 2016/0131347 A1 | 5/2016 | Hill et al. |
| 2016/0134006 A1 | 5/2016 | Ness et al. |
| 2016/0135132 A1 | 5/2016 | Donepudi et al. |
| 2016/0135184 A1 | 5/2016 | Zavadsky et al. |
| 2016/0137311 A1 | 5/2016 | Peverill et al. |
| 2016/0139731 A1 | 5/2016 | Kim |
| 2016/0149312 A1 | 5/2016 | Henry et al. |
| 2016/0149614 A1 | 5/2016 | Barzegar |
| 2016/0149665 A1 | 5/2016 | Henry et al. |
| 2016/0149731 A1 | 5/2016 | Henry et al. |
| 2016/0149753 A1 | 5/2016 | Gerszberg et al. |
| 2016/0150427 A1 | 5/2016 | Ramanath |
| 2016/0153938 A1 | 6/2016 | Balasubramaniam et al. |
| 2016/0164571 A1 | 6/2016 | Bennett et al. |
| 2016/0164573 A1 | 6/2016 | Birk et al. |
| 2016/0165472 A1 | 6/2016 | Gopalakrishnan et al. |
| 2016/0165478 A1 | 6/2016 | Yao et al. |
| 2016/0174040 A1 | 6/2016 | Roberts et al. |
| 2016/0179134 A1 | 6/2016 | Ryu |
| 2016/0181701 A1 | 6/2016 | Sangaran et al. |
| 2016/0182161 A1 | 6/2016 | Barzegar |
| 2016/0182981 A1 | 6/2016 | Minarik et al. |
| 2016/0188291 A1 | 6/2016 | Vilermo et al. |
| 2016/0189101 A1 | 6/2016 | Kantor et al. |
| 2016/0197392 A1 | 7/2016 | Henry et al. |
| 2016/0197409 A1 | 7/2016 | Henry et al. |
| 2016/0197630 A1 | 7/2016 | Kawasaki |
| 2016/0197642 A1 | 7/2016 | Henry et al. |
| 2016/0207627 A1 | 7/2016 | Hoareau et al. |
| 2016/0212065 A1 | 7/2016 | To et al. |
| 2016/0212641 A1 | 7/2016 | Kong et al. |
| 2016/0214717 A1 | 7/2016 | De Silva |
| 2016/0218407 A1 | 7/2016 | Henry et al. |
| 2016/0218437 A1 | 7/2016 | Guntupalli |
| 2016/0221039 A1 | 8/2016 | Fuchs et al. |
| 2016/0224235 A1 | 8/2016 | Forsstrom |
| 2016/0226681 A1 | 8/2016 | Henry et al. |
| 2016/0244165 A1 | 8/2016 | Patrick et al. |
| 2016/0248149 A1 | 8/2016 | Kim et al. |
| 2016/0248165 A1 | 8/2016 | Henry |
| 2016/0248509 A1 | 8/2016 | Henry |
| 2016/0249233 A1 | 8/2016 | Murray |
| 2016/0252970 A1 | 9/2016 | Dahl |
| 2016/0261309 A1 | 9/2016 | Henry |
| 2016/0261310 A1 | 9/2016 | Fuchs et al. |
| 2016/0261312 A1 | 9/2016 | Fuchs et al. |
| 2016/0269156 A1 | 9/2016 | Barzegar et al. |
| 2016/0276725 A1 | 9/2016 | Barnickel et al. |
| 2016/0277939 A1 | 9/2016 | Olcott et al. |
| 2016/0285508 A1 | 9/2016 | Bennett et al. |
| 2016/0285512 A1 | 9/2016 | Henry et al. |
| 2016/0294444 A1 | 10/2016 | Gerszberg et al. |
| 2016/0294517 A1 | 10/2016 | Barzegar et al. |
| 2016/0295431 A1 | 10/2016 | Henry et al. |
| 2016/0306361 A1 | 10/2016 | Shalom et al. |
| 2016/0315659 A1 | 10/2016 | Henry |
| 2016/0315660 A1 | 10/2016 | Henry |
| 2016/0315661 A1 | 10/2016 | Henry |
| 2016/0315662 A1 | 10/2016 | Henry |
| 2016/0322691 A1 | 11/2016 | Bennett et al. |
| 2016/0329957 A1 | 11/2016 | Schmid et al. |
| 2016/0336091 A1 | 11/2016 | Henry et al. |
| 2016/0336092 A1 | 11/2016 | Henry et al. |
| 2016/0336636 A1 | 11/2016 | Henry et al. |
| 2016/0336996 A1 | 11/2016 | Henry |
| 2016/0336997 A1 | 11/2016 | Henry |
| 2016/0351987 A1 | 12/2016 | Henry |
| 2016/0359523 A1 | 12/2016 | Bennett |
| 2016/0359524 A1 | 12/2016 | Bennett et al. |
| 2016/0359529 A1 | 12/2016 | Bennett et al. |
| 2016/0359530 A1 | 12/2016 | Bennett |
| 2016/0359541 A1 | 12/2016 | Bennett |
| 2016/0359542 A1 | 12/2016 | Bennett |
| 2016/0359543 A1 | 12/2016 | Bennett et al. |
| 2016/0359544 A1 | 12/2016 | Bennett |
| 2016/0359546 A1 | 12/2016 | Bennett |
| 2016/0359547 A1 | 12/2016 | Bennett et al. |
| 2016/0359649 A1 | 12/2016 | Bennett et al. |
| 2016/0360511 A1 | 12/2016 | Barzegar |
| 2016/0360533 A1 | 12/2016 | Bennett et al. |
| 2016/0365175 A1 | 12/2016 | Bennett et al. |
| 2016/0365893 A1 | 12/2016 | Bennett et al. |
| 2016/0365894 A1 | 12/2016 | Bennett et al. |
| 2016/0365897 A1 | 12/2016 | Gross |
| 2016/0365916 A1 | 12/2016 | Bennett et al. |
| 2016/0365943 A1 | 12/2016 | Henry et al. |
| 2016/0365966 A1 | 12/2016 | Bennett et al. |
| 2016/0366586 A1 | 12/2016 | Gross et al. |
| 2016/0366587 A1 | 12/2016 | Gross |
| 2016/0373937 A1 | 12/2016 | Bennett et al. |
| 2016/0380327 A1 | 12/2016 | Henry |
| 2016/0380328 A1 | 12/2016 | Henry |
| 2016/0380358 A1 | 12/2016 | Henry |
| 2016/0380701 A1 | 12/2016 | Henry et al. |
| 2016/0380702 A1 | 12/2016 | Henry et al. |
| 2017/0018174 A1 | 1/2017 | Gerszberg |
| 2017/0018332 A1 | 1/2017 | Barzegar et al. |
| 2017/0018830 A1 | 1/2017 | Henry et al. |
| 2017/0018831 A1 | 1/2017 | Henry et al. |
| 2017/0018832 A1 | 1/2017 | Henry et al. |
| 2017/0018833 A1 | 1/2017 | Henry et al. |
| 2017/0018851 A1 | 1/2017 | Henry et al. |
| 2017/0018852 A1 | 1/2017 | Adriazola et al. |
| 2017/0018856 A1 | 1/2017 | Henry et al. |
| 2017/0019130 A1 | 1/2017 | Henry et al. |
| 2017/0019131 A1 | 1/2017 | Henry et al. |
| 2017/0019150 A1 | 1/2017 | Henry |
| 2017/0019189 A1 | 1/2017 | Henry et al. |
| 2017/0025728 A1 | 1/2017 | Henry et al. |
| 2017/0025732 A1 | 1/2017 | Henry et al. |
| 2017/0025734 A1 | 1/2017 | Henry et al. |
| 2017/0025839 A1 | 1/2017 | Henry et al. |
| 2017/0026063 A1 | 1/2017 | Henry |
| 2017/0026082 A1 | 1/2017 | Henry et al. |
| 2017/0026084 A1 | 1/2017 | Henry et al. |
| 2017/0026129 A1 | 1/2017 | Henry |
| 2017/0033464 A1 | 2/2017 | Henry et al. |
| 2017/0033465 A1 | 2/2017 | Henry et al. |
| 2017/0033466 A1 | 2/2017 | Henry et al. |
| 2017/0033834 A1 | 2/2017 | Gross |
| 2017/0033835 A1 | 2/2017 | Bennett et al. |
| 2017/0033953 A1 | 2/2017 | Henry et al. |
| 2017/0033954 A1 | 2/2017 | Henry et al. |
| 2017/0034042 A1 | 2/2017 | Gross et al. |
| 2017/0041081 A1 | 2/2017 | Henry et al. |
| 2017/0047662 A1 | 2/2017 | Henry et al. |

FOREIGN PATENT DOCUMENTS

| | | |
|---|---|---|
| AU | 606303 B2 | 1/1991 |
| AU | 7261000 A | 4/2001 |
| AU | 760272 B2 | 5/2003 |
| AU | 2005227368 B2 | 2/2009 |
| AU | 2010101079 A4 | 11/2010 |
| AU | 2007215252 B2 | 1/2011 |
| AU | 201400748 | 3/2014 |
| AU | 2014200748 A1 | 3/2014 |
| CA | 1136267 A1 | 11/1982 |
| CA | 1211813 A1 | 9/1986 |
| CA | 1328009 C | 3/1994 |
| CA | 2260380 C | 12/2000 |
| CA | 2449596 A1 | 6/2005 |
| CA | 2515560 A1 | 2/2007 |
| CA | 2664573 A1 | 4/2008 |
| CA | 2467988 C | 11/2010 |

(56) References Cited

FOREIGN PATENT DOCUMENTS

| | | | |
|---|---|---|---|
| CA | 2777147 | A1 | 4/2011 |
| CA | 2814529 | A1 | 4/2012 |
| CA | 2787580 | A1 | 2/2013 |
| CA | 2927054 | A1 | 5/2015 |
| CA | 2940976 | | 9/2015 |
| CN | 2116969 | U | 9/1992 |
| CN | 1155354 | C | 7/1997 |
| CN | 1411563 | A | 4/2003 |
| CN | 1126425 | C | 10/2003 |
| CN | 2730033 | Y | 9/2005 |
| CN | 1833397 | A | 9/2006 |
| CN | 1885736 | A | 12/2006 |
| CN | 201048157 | Y | 4/2008 |
| CN | 201146495 | Y | 11/2008 |
| CN | 201207179 | Y | 3/2009 |
| CN | 100502181 | C | 6/2009 |
| CN | 201282193 | Y | 7/2009 |
| CN | 101834011 | U | 4/2010 |
| CN | 1823275 | B | 5/2010 |
| CN | 101785201 | A | 7/2010 |
| CN | 1820482 | B | 12/2010 |
| CN | 101075702 | B | 2/2011 |
| CN | 101978613 | A | 2/2011 |
| CN | 102130698 | A | 7/2011 |
| CN | 102136634 | A | 7/2011 |
| CN | 201985870 | U | 9/2011 |
| CN | 102208716 | A | 10/2011 |
| CN | 102280704 | A | 12/2011 |
| CN | 102280709 | A | 12/2011 |
| CN | 202093126 | U | 12/2011 |
| CN | 102351415 | A | 2/2012 |
| CN | 102396111 | A | 3/2012 |
| CN | 202253536 | U | 5/2012 |
| CN | 102544736 | A | 7/2012 |
| CN | 102590893 | A | 7/2012 |
| CN | 102694351 | A | 9/2012 |
| CN | 202424729 | U | 9/2012 |
| CN | 101662076 | B | 11/2012 |
| CN | 102017692 | B | 4/2013 |
| CN | 103078673 | A | 5/2013 |
| CN | 103117118 | A | 5/2013 |
| CN | 103163881 | A | 6/2013 |
| CN | 203204743 | U | 9/2013 |
| CN | 1863244 | B | 10/2013 |
| CN | 101958461 | B | 11/2013 |
| CN | 103700442 | | 4/2014 |
| CN | 103700442 | A | 4/2014 |
| CN | 103943925 | A | 7/2014 |
| CN | 104052742 | A | 9/2014 |
| CN | 104064844 | A | 9/2014 |
| CN | 203813973 | U | 9/2014 |
| CN | 104091987 | A | 10/2014 |
| CN | 104092028 | A | 10/2014 |
| CN | 203931626 | U | 11/2014 |
| CN | 203950607 | U | 11/2014 |
| CN | 104181552 | A | 12/2014 |
| CN | 204538183 | | 8/2015 |
| CN | 102412442 | B | 10/2015 |
| CN | 204760545 | U | 11/2015 |
| CN | 105262551 | A | 1/2016 |
| CN | 205265924 | | 1/2016 |
| CN | 105359572 | A | 2/2016 |
| CN | 105453340 | | 3/2016 |
| CN | 105594138 | A | 5/2016 |
| CN | 104162995 | B | 6/2016 |
| CN | 105813193 | A | 7/2016 |
| DE | 3504546 | A1 | 8/1986 |
| DE | 3533204 | A1 | 3/1987 |
| DE | 3533211 | A1 | 3/1987 |
| DE | 3827956 | A1 | 3/1989 |
| DE | 4027367 | C1 | 7/1991 |
| DE | 4225595 | C1 | 9/1993 |
| DE | 19501448 | A1 | 7/1996 |
| DE | 19939832 | A1 | 2/2001 |
| DE | 10043761 | C2 | 11/2002 |
| DE | 102004024356 | A1 | 9/2005 |
| DE | 69732676 | T2 | 4/2006 |
| DE | 4337835 | B4 | 5/2008 |
| DE | 102007049914 | A1 | 4/2009 |
| DE | 102012004998 | A1 | 7/2013 |
| DE | 102012203816 | A1 | 9/2013 |
| EP | 0102846 | | 3/1984 |
| EP | 0110478 | | 6/1984 |
| EP | 0136818 | | 4/1985 |
| EP | 0330303 | | 8/1989 |
| EP | 0331248 | | 9/1989 |
| EP | 0342149 | | 11/1989 |
| EP | 0391719 | | 4/1990 |
| EP | 425979 | A2 | 5/1991 |
| EP | 0485467 | | 5/1992 |
| EP | 272785 | B1 | 2/1994 |
| EP | 0651487 | | 10/1994 |
| EP | 0371660 | | 4/1996 |
| EP | 0756392 | | 1/1997 |
| EP | 0840464 | | 5/1998 |
| EP | 0280379 | | 8/1998 |
| EP | 0871241 | B1 | 10/1998 |
| EP | 0890132 | | 1/1999 |
| EP | 755092 | A3 | 4/1999 |
| EP | 0896380 | | 10/1999 |
| EP | 676648 | B1 | 5/2000 |
| EP | 1085599 | A2 | 3/2001 |
| EP | 0907983 | B1 | 6/2001 |
| EP | 0756786 | | 8/2001 |
| EP | 1127283 | A1 | 8/2001 |
| EP | 1129550 | A1 | 9/2001 |
| EP | 1184930 | A1 | 3/2002 |
| EP | 1195847 | A2 | 4/2002 |
| EP | 1237303 | A2 | 9/2002 |
| EP | 1296146 | A1 | 3/2003 |
| EP | 0772061 | | 7/2003 |
| EP | 1346431 | A1 | 9/2003 |
| EP | 1249056 | B1 | 1/2004 |
| EP | 1376755 | A1 | 1/2004 |
| EP | 1401048 | A1 | 3/2004 |
| EP | 1454422 | A1 | 9/2004 |
| EP | 1488397 | A1 | 12/2004 |
| EP | 1509970 | | 3/2005 |
| EP | 1371108 | B1 | 6/2005 |
| EP | 1550327 | A2 | 7/2005 |
| EP | 1341255 | B8 | 8/2005 |
| EP | 1577687 | A1 | 9/2005 |
| EP | 1312135 | B2 | 11/2005 |
| EP | 1608110 | A1 | 12/2005 |
| EP | 1624685 | A2 | 2/2006 |
| EP | 1642468 | A2 | 4/2006 |
| EP | 1647072 | A1 | 4/2006 |
| EP | 1608110 | B1 | 10/2006 |
| EP | 1793508 | A1 | 6/2007 |
| EP | 1842265 | A1 | 10/2007 |
| EP | 1898532 | A2 | 3/2008 |
| EP | 1930982 | A1 | 6/2008 |
| EP | 1953940 | A1 | 8/2008 |
| EP | 1696509 | B1 | 10/2009 |
| EP | 2159749 | A1 | 3/2010 |
| EP | 2165550 | A1 | 3/2010 |
| EP | 1166599 | B1 | 5/2010 |
| EP | 1807950 | A4 | 1/2011 |
| EP | 2404347 | A2 | 1/2012 |
| EP | 2472671 | A1 | 7/2012 |
| EP | 1817855 | B1 | 1/2013 |
| EP | 2568528 | A2 | 3/2013 |
| EP | 2302735 | B1 | 9/2013 |
| EP | 2472737 | B1 | 9/2013 |
| EP | 2640115 | A1 | 9/2013 |
| EP | 2016643 | B1 | 7/2014 |
| EP | 2760081 | A1 | 7/2014 |
| EP | 2804259 | A1 | 11/2014 |
| EP | 2507939 | B1 | 12/2014 |
| EP | 2680452 | B1 | 1/2015 |
| EP | 2838155 | A1 | 2/2015 |
| EP | 2846480 | A1 | 3/2015 |
| EP | 2849524 | A1 | 3/2015 |
| EP | 2850695 | A1 | 3/2015 |

(56) References Cited

FOREIGN PATENT DOCUMENTS

| | | |
|---|---|---|
| EP | 2853902 A1 | 4/2015 |
| EP | 2854361 A1 | 4/2015 |
| EP | 2870802 A1 | 5/2015 |
| EP | 2710400 A4 | 6/2015 |
| EP | 3076482 A1 | 10/2016 |
| FR | 2119804 A1 | 8/1972 |
| FR | 2214161 A1 | 8/1974 |
| FR | 2416562 A1 | 8/1979 |
| FR | 2583226 A1 | 12/1986 |
| FR | 2691602 A1 | 11/1993 |
| FR | 2849728 A1 | 7/2004 |
| FR | 2841387 B1 | 4/2006 |
| FR | 2893717 A1 | 5/2007 |
| FR | 2946466 B1 | 3/2012 |
| FR | 2986376 B1 | 10/2014 |
| FR | 3034203 | 9/2016 |
| GB | 175489 A | 2/1922 |
| GB | 462804 A | 3/1937 |
| GB | 529290 A | 11/1940 |
| GB | 603119 A | 10/1945 |
| GB | 589603 A | 6/1947 |
| GB | 640181 A | 7/1950 |
| GB | 663166 A | 12/1951 |
| GB | 667290 A | 2/1952 |
| GB | 668827 A | 3/1952 |
| GB | 682115 A | 11/1952 |
| GB | 682817 A | 11/1952 |
| GB | 731473 A | 6/1955 |
| GB | 746111 A | 3/1956 |
| GB | 751153 A | 6/1956 |
| GB | 767506 A | 2/1957 |
| GB | 835976 A | 6/1960 |
| GB | 845492 A | 8/1960 |
| GB | 859951 A | 1/1961 |
| GB | 889856 A | 2/1962 |
| GB | 905417 A | 9/1962 |
| GB | 993561 A | 5/1965 |
| GB | 1004318 A | 9/1965 |
| GB | 1076772 A | 7/1967 |
| GB | 1141390 A | 1/1969 |
| GB | 1298387 A | 11/1972 |
| GB | 1383549 A | 2/1974 |
| GB | 1370669 A | 10/1974 |
| GB | 1422956 A | 1/1976 |
| GB | 1424351 A | 2/1976 |
| GB | 1468310 A | 3/1977 |
| GB | 1469840 A | 4/1977 |
| GB | 1527228 A | 10/1978 |
| GB | 2010528 A | 6/1979 |
| GB | 2045055 A | 10/1980 |
| GB | 1580627 A | 12/1980 |
| GB | 1584193 A | 2/1981 |
| GB | 2227369 A | 7/1990 |
| GB | 2247990 A | 3/1992 |
| GB | 2368468 A | 5/2002 |
| GB | 2362472 B | 10/2003 |
| GB | 2393370 A | 3/2004 |
| GB | 2394364 B | 6/2005 |
| GB | 2414862 A | 12/2005 |
| GB | 2411554 B | 1/2006 |
| GB | 705192 | 4/2007 |
| GB | 714974 | 9/2007 |
| GB | 718597 | 10/2007 |
| GB | 2474037 A | 4/2011 |
| GB | 2476787 A | 7/2011 |
| GB | 2474605 B | 9/2011 |
| GB | 2485355 A | 5/2012 |
| GB | 2481715 B | 1/2014 |
| GB | 2507269 A | 4/2014 |
| GB | 2476149 B | 7/2014 |
| GB | 2532207 A | 5/2016 |
| IN | 261253 A1 | 6/2014 |
| IN | 7352/CHENP/2015 A | 7/2016 |
| IN | 201647015348 A | 8/2016 |
| JP | S50109642 | 9/1975 |
| JP | 55124303 U | 9/1980 |
| JP | 55138902 U | 10/1980 |
| JP | 574601 | 1/1982 |
| JP | 61178682 U | 11/1986 |
| JP | 61260702 A | 11/1986 |
| JP | 62110303 U | 7/1987 |
| JP | 62190903 U | 8/1987 |
| JP | 02214307 A | 8/1990 |
| JP | 03167906 A | 7/1991 |
| JP | 0653894 | 8/1991 |
| JP | 04369905 A | 12/1992 |
| JP | 3001844 U | 9/1994 |
| JP | 077769 | 1/1995 |
| JP | 7212126 | 11/1995 |
| JP | 0829545 | 2/1996 |
| JP | 08167810 A | 6/1996 |
| JP | 08196022 A | 7/1996 |
| JP | 08316918 A | 11/1996 |
| JP | 2595339 B2 | 4/1997 |
| JP | 2639531 B2 | 8/1997 |
| JP | 10206183 A | 8/1998 |
| JP | 10271071 A | 10/1998 |
| JP | 116928 A | 1/1999 |
| JP | 1114749 A | 1/1999 |
| JP | 11239085 A | 8/1999 |
| JP | 11313022 A | 11/1999 |
| JP | 2000077889 A | 3/2000 |
| JP | 2000216623 A | 8/2000 |
| JP | 2000244238 A | 9/2000 |
| JP | 2001217634 A | 8/2001 |
| JP | 2002029247 A | 1/2002 |
| JP | 2002236174 A | 8/2002 |
| JP | 200328219 A | 1/2003 |
| JP | 2003008336 A | 1/2003 |
| JP | 2003057464 A | 2/2003 |
| JP | 2003511677 A | 3/2003 |
| JP | 3411428 B2 | 6/2003 |
| JP | 2003324309 A | 11/2003 |
| JP | 3480153 B2 | 12/2003 |
| JP | 2003344883 A | 12/2003 |
| JP | 2004521379 A | 7/2004 |
| JP | 2004253853 A | 9/2004 |
| JP | 2004274656 A | 9/2004 |
| JP | 2004297107 A | 10/2004 |
| JP | 2004304659 A | 10/2004 |
| JP | 2005110231 A | 4/2005 |
| JP | 2005182469 A | 7/2005 |
| JP | 3734975 B2 | 1/2006 |
| JP | 2006153878 A | 6/2006 |
| JP | 2006163886 A | 6/2006 |
| JP | 2006166399 A | 6/2006 |
| JP | 2007042009 A | 2/2007 |
| JP | 2007072945 A | 3/2007 |
| JP | 3938315 B2 | 6/2007 |
| JP | 2007174017 A | 7/2007 |
| JP | 2007259001 A | 10/2007 |
| JP | 4025674 B2 | 12/2007 |
| JP | 2008017263 A | 1/2008 |
| JP | 2008021483 A | 1/2008 |
| JP | 4072280 B2 | 4/2008 |
| JP | 4142062 B2 | 8/2008 |
| JP | 2008209965 A | 9/2008 |
| JP | 2008218362 A | 9/2008 |
| JP | 2009004986 A | 1/2009 |
| JP | 4252573 B2 | 4/2009 |
| JP | 4259760 B2 | 4/2009 |
| JP | 2009124229 A | 6/2009 |
| JP | 2010045471 A | 2/2010 |
| JP | 2010192992 A | 9/2010 |
| JP | 2010541468 A | 12/2010 |
| JP | 2011160446 A | 8/2011 |
| JP | 2012058162 A | 3/2012 |
| JP | 2012090242 A | 5/2012 |
| JP | 2012175680 A | 9/2012 |
| JP | 2012205104 A | 10/2012 |
| JP | 2012248035 A | 12/2012 |
| JP | 2013046412 A | 3/2013 |
| JP | 2013110503 A | 6/2013 |
| JP | 5230779 B2 | 7/2013 |

(56) References Cited

FOREIGN PATENT DOCUMENTS

| | | |
|---|---|---|
| JP | 2014045237 A | 3/2014 |
| JP | 5475475 B2 | 4/2014 |
| JP | 5497348 B2 | 5/2014 |
| JP | 5618072 B2 | 11/2014 |
| JP | 2015095520 A | 5/2015 |
| JP | 2015188174 | 10/2015 |
| KR | 20000074034 | 12/2000 |
| KR | 20020091917 | 12/2002 |
| KR | 100624049 B1 | 9/2006 |
| KR | 200425873 Y1 | 9/2006 |
| KR | 100636388 B1 | 10/2006 |
| KR | 100725002 B1 | 6/2007 |
| KR | 100849702 B1 | 7/2008 |
| KR | 100916077 B1 | 8/2009 |
| KR | 100952976 B1 | 4/2010 |
| KR | 100989064 B1 | 10/2010 |
| KR | 101060584 B1 | 8/2011 |
| KR | 101070364 B1 | 9/2011 |
| KR | 101212354 B1 | 12/2012 |
| KR | 101259715 B1 | 4/2013 |
| KR | 101288770 B1 | 7/2013 |
| KR | 20140104097 A | 8/2014 |
| KR | 101435538 B1 | 9/2014 |
| KR | 101447809 B1 | 10/2014 |
| KR | 20150087455 | 7/2015 |
| KR | 101549622 | 9/2015 |
| KR | 200479199 Y1 | 12/2015 |
| KR | 101586236 B1 | 1/2016 |
| KR | 101606803 | 1/2016 |
| KR | 101607420 B1 | 3/2016 |
| NL | 69072 | 1/1945 |
| RU | 2129746 C1 | 4/1999 |
| RU | 2432647 C1 | 10/2011 |
| TW | 201537432 | 10/2015 |
| WO | 8301711 A1 | 5/1983 |
| WO | 9116770 A1 | 10/1991 |
| WO | 9210014 | 6/1992 |
| WO | 9323928 | 11/1993 |
| WO | 9424467 A1 | 10/1994 |
| WO | 9523440 A1 | 8/1995 |
| WO | 9529537 | 11/1995 |
| WO | 9529537 A1 | 11/1995 |
| WO | 9603801 A1 | 2/1996 |
| WO | 9619089 | 6/1996 |
| WO | 9639729 A1 | 12/1996 |
| WO | 9641157 | 12/1996 |
| WO | 9735387 A1 | 9/1997 |
| WO | 9737445 A1 | 10/1997 |
| WO | 9829853 A1 | 7/1998 |
| WO | 9857207 | 12/1998 |
| WO | 9859254 A1 | 12/1998 |
| WO | 9948230 A1 | 1/1999 |
| WO | 9923848 A2 | 5/1999 |
| WO | 9945310 | 9/1999 |
| WO | 9967903 A1 | 12/1999 |
| WO | 0070891 A1 | 11/2000 |
| WO | 00/74428 A1 | 12/2000 |
| WO | 0114985 A1 | 3/2001 |
| WO | 0128159 A2 | 4/2001 |
| WO | 0131746 A1 | 5/2001 |
| WO | 0145206 A1 | 6/2001 |
| WO | 02061467 A2 | 8/2002 |
| WO | 02061971 A1 | 8/2002 |
| WO | 03/005629 | 1/2003 |
| WO | 03009083 | 1/2003 |
| WO | 03012614 A1 | 2/2003 |
| WO | 03026166 | 3/2003 |
| WO | 03026462 A1 | 4/2003 |
| WO | 03044981 A1 | 5/2003 |
| WO | 03088418 | 10/2003 |
| WO | 03099740 A1 | 12/2003 |
| WO | 2004011995 A1 | 2/2004 |
| WO | 2004038891 A2 | 5/2004 |
| WO | 2004/051804 | 6/2004 |
| WO | 2004051804 A1 | 6/2004 |
| WO | 2004054159 A2 | 6/2004 |
| WO | 2004077746 A1 | 9/2004 |
| WO | 2005015686 A1 | 2/2005 |
| WO | 2005072469 A2 | 8/2005 |
| WO | 2006012610 A2 | 2/2006 |
| WO | 2006061865 A1 | 6/2006 |
| WO | 2006085804 A1 | 8/2006 |
| WO | 2006102419 A2 | 9/2006 |
| WO | 2006111809 A1 | 10/2006 |
| WO | 2006116396 A2 | 11/2006 |
| WO | 2006122041 A2 | 11/2006 |
| WO | 2006125279 A1 | 11/2006 |
| WO | 2007000777 B1 | 2/2007 |
| WO | 2006050331 A3 | 3/2007 |
| WO | 2007031435 A1 | 3/2007 |
| WO | 2007071797 A1 | 6/2007 |
| WO | 2007148097 A2 | 12/2007 |
| WO | 2008003939 A1 | 1/2008 |
| WO | 2007094944 A3 | 3/2008 |
| WO | 2007149746 A3 | 4/2008 |
| WO | 2008044062 A1 | 4/2008 |
| WO | 2008055084 A2 | 5/2008 |
| WO | 2008061107 A2 | 5/2008 |
| WO | 2008069358 A1 | 6/2008 |
| WO | 2008070957 A1 | 6/2008 |
| WO | 2008102987 A1 | 8/2008 |
| WO | 2008117973 A1 | 10/2008 |
| WO | 2008155769 A2 | 12/2008 |
| WO | 2009014704 A1 | 1/2009 |
| WO | 2007098061 A3 | 2/2009 |
| WO | 2009031794 A1 | 3/2009 |
| WO | 2009035285 A2 | 3/2009 |
| WO | 2009090602 A1 | 7/2009 |
| WO | 2009123404 A4 | 10/2009 |
| WO | 2009131316 A2 | 10/2009 |
| WO | 2010017549 A1 | 2/2010 |
| WO | 2010050892 A1 | 5/2010 |
| WO | 2010147806 A1 | 12/2010 |
| WO | 2011006210 A1 | 1/2011 |
| WO | 2011032605 A1 | 3/2011 |
| WO | 2011085650 A1 | 7/2011 |
| WO | 2011137793 A1 | 11/2011 |
| WO | 0192910 A2 | 12/2011 |
| WO | 2012/007831 | 1/2012 |
| WO | 2012038816 A1 | 3/2012 |
| WO | 2012050069 A1 | 4/2012 |
| WO | 2012064333 A1 | 5/2012 |
| WO | 2012113219 A1 | 8/2012 |
| WO | 2012171205 A1 | 12/2012 |
| WO | 2012172565 A1 | 12/2012 |
| WO | 2013013162 A2 | 1/2013 |
| WO | 2013013465 A1 | 1/2013 |
| WO | 2013017822 | 2/2013 |
| WO | 2013023226 A1 | 2/2013 |
| WO | 2013028197 A1 | 2/2013 |
| WO | 2013035110 A2 | 3/2013 |
| WO | 2013/073548 | 5/2013 |
| WO | 2013073548 A1 | 5/2013 |
| WO | 2013100912 A1 | 7/2013 |
| WO | 2013112353 A1 | 8/2013 |
| WO | 2013115802 A1 | 8/2013 |
| WO | 2013121682 A1 | 8/2013 |
| WO | 2013123445 A1 | 8/2013 |
| WO | 2013/138627 | 9/2013 |
| WO | 2014/045236 | 9/2013 |
| WO | 2013136213 A1 | 9/2013 |
| WO | 2013138627 A1 | 9/2013 |
| WO | 2013157978 A1 | 10/2013 |
| WO | 2013172502 A1 | 11/2013 |
| WO | 2014/018434 | 1/2014 |
| WO | 2014011438 A1 | 1/2014 |
| WO | 2014018434 A2 | 1/2014 |
| WO | 2014065952 A1 | 5/2014 |
| WO | 2014069941 A1 | 5/2014 |
| WO | 2014083500 A1 | 6/2014 |
| WO | 2014092644 A1 | 6/2014 |
| WO | 2014094559 A1 | 6/2014 |
| WO | 2014096868 A1 | 6/2014 |
| WO | 2014099340 A2 | 6/2014 |

(56) References Cited

FOREIGN PATENT DOCUMENTS

| | | |
|---|---|---|
| WO | 2013076499 A3 | 7/2014 |
| WO | 2014112994 A1 | 7/2014 |
| WO | 2014128253 A1 | 8/2014 |
| WO | 2014137546 A1 | 9/2014 |
| WO | 2014145862 A2 | 9/2014 |
| WO | 2014147002 A1 | 9/2014 |
| WO | 2014197926 A1 | 12/2014 |
| WO | 2015002658 A1 | 1/2015 |
| WO | 2015006636 A1 | 1/2015 |
| WO | 2015008442 A1 | 1/2015 |
| WO | 2015024006 A1 | 2/2015 |
| WO | 2015027033 A1 | 2/2015 |
| WO | 2015035463 A1 | 3/2015 |
| WO | 2015/055230 | 4/2015 |
| WO | 2015052478 | 4/2015 |
| WO | 2015052480 | 4/2015 |
| WO | 2015069090 A1 | 5/2015 |
| WO | 2015069431 A2 | 5/2015 |
| WO | 2015077644 | 5/2015 |
| WO | 2015088650 A1 | 6/2015 |
| WO | 2015120626 | 8/2015 |
| WO | 2015123623 A1 | 8/2015 |
| WO | 2015132618 A1 | 9/2015 |
| WO | 2015167566 A1 | 11/2015 |
| WO | 2015175054 A2 | 11/2015 |
| WO | 2015197580 A1 | 12/2015 |
| WO | 2016003291 A1 | 1/2016 |
| WO | 2016004003 | 1/2016 |
| WO | 2016009402 A2 | 1/2016 |
| WO | 2016012889 | 1/2016 |
| WO | 2016027007 A1 | 2/2016 |
| WO | 2016028767 | 2/2016 |
| WO | 2016/043949 | 3/2016 |
| WO | 2016032592 A1 | 3/2016 |
| WO | 2016036951 A1 | 3/2016 |
| WO | 2016043949 A1 | 3/2016 |
| WO | 2016048214 A1 | 3/2016 |
| WO | 2016048257 A1 | 3/2016 |
| WO | 2016/064502 | 4/2016 |
| WO | 2016053572 A1 | 4/2016 |
| WO | 2016053573 A1 | 4/2016 |
| WO | 2016060761 A1 | 4/2016 |
| WO | 2016060762 A1 | 4/2016 |
| WO | 2016061021 A1 | 4/2016 |
| WO | 2016064505 A1 | 4/2016 |
| WO | 2016064516 A1 | 4/2016 |
| WO | 2016064700 A2 | 4/2016 |
| WO | 2016073072 A1 | 5/2016 |
| WO | 2016081125 | 5/2016 |
| WO | 2016081128 | 5/2016 |
| WO | 2016081129 A1 | 5/2016 |
| WO | 2016081134 | 5/2016 |
| WO | 2016081136 | 5/2016 |
| WO | 2015090382 | 6/2016 |
| WO | 2016086306 A1 | 6/2016 |
| WO | 2016089491 | 6/2016 |
| WO | 2016096029 A1 | 6/2016 |
| WO | 2016/125161 | 8/2016 |
| WO | 2016/133509 | 8/2016 |
| WO | 2016122409 A1 | 8/2016 |
| WO | 2016133672 A1 | 8/2016 |
| WO | 2016/137982 | 9/2016 |
| WO | 2016145411 | 9/2016 |
| WO | 2016161637 A1 | 10/2016 |
| WO | 2016169058 A1 | 10/2016 |
| WO | 2016171907 | 10/2016 |
| WO | 2016176030 | 11/2016 |
| WO | 2016200492 | 12/2016 |
| WO | 2016200579 | 12/2016 |
| WO | 2017/011099 | 1/2017 |
| WO | 2017011100 | 1/2017 |
| WO | 2017011101 | 1/2017 |
| WO | 2017011102 | 1/2017 |
| WO | 2017011103 | 1/2017 |
| WO | 2017011227 | 1/2017 |
| WO | 2017014840 | 1/2017 |
| WO | 2017014842 | 1/2017 |
| WO | 2017023412 | 2/2017 |
| WO | 2017023413 | 2/2017 |
| WO | 2017023417 | 2/2017 |

OTHER PUBLICATIONS

"Cband & L/Sband Telemetry Horn Antennas," mWAVE, mwavellc.com, Jul. 6, 2012, http://www.mwavellc.com/custom-Band-LS-BandTelemetryHornAntennas.php.

"Dielectric Antenna," Microwave Technologies, Ind., microwavetechnologiesinc.co.in http://www.microwavetechnologiesinc.co.in/microwavecommunicationlab.products.html#dielectricantenna, May 21, 2015.

"Horn Antennas," Steatite QPar Antennas, steatiteqparantennas.co.uk, http://www.steatiteqparantennas.co.uk/products hornantennas.html? http://www.steatiteqparantennas.co.uk/consultancy/customhornantennas/, May 21, 2015.

"How is ELine Different?," ELine Corridor Systems, corridor.biz http://www.corridor.biz/ELine_is_different.html, Apr. 23, 2015.

"Identity Management," Tuomas Aura CSE-C3400 Information Security, Aalto University, Autumn 2014, 33 pgs.

"Power Communication," Communication Power Solutions, Inc., cpspower.biz, http://www.cpspower.biz/services/powercommunications/, Oct. 2013.

"Power Line Communications," Atmel®, atmel.com http://www.atmel.com/products/smartenergy/powerlinecommunications/default.aspx, 2015.

"Power line communications: An overview Part I." King Fand University of Petroleum and Minerals, Dhahran, KSA, 2008.

"Powerline Communication," Cypress Perform, cypress.com http://www.cypress.com/?id=2330, Apr. 23, 2015.

"Products: GSM Mircro Repeater." L-TEL: Quanzhou L-TEL Communication Equipment Co., Ltd., I-tel.com, Apr. 24, 2015.

"Waveguide-fed Conical Horn," Antenna Magus, antennamagus.com, ©2015, accessed: Aug. 2015.

"Product Abstract—Program on Technology Innovation: Study on the Integration of High Temperature Superconducting DC Cables Within the Eastern and West urn North American Power Grids." EPRI—Electronic Power Research Institute, epri.com, Product ID:10203, Nov. 25, 2009.

"About Firelight Media Group", http://www.insu ra ncetechnologies.com/Products/Prod ucts_firelight_overview .shtml, Firelight®. Insurance Technologies, LLC,, Apr. 19, 2015.

"Asahi Multi-Core Fiber Cable", Industrial Fiber optics, i-fiberoptics.com http://i-fiberoptics.com/m u lti-core-fi ber-ca ble.ph p, Apr. 26, 2015.

"Denso", Winn & Coales (Denso) Ltd. UK, denso.net, http://www.denso.net/voidfiller/voidpump.htm, 2015, 1 page.

"Detecting and Preventing MAC Spoofing", Detecting and Preventing MAC Spoofing | Network Access Control Solutions, infoexpress, 2014.

"Electronic Business Fulfillment FireLight ®", Firelight Media Group LLC, firelightmedia.net http://www .firelightmedia .net/fmg/index.php/home, Apr. 19, 2015, 2 pages.

"Elliptical Polarization", "Elliptical Polarization" Wikipedia, <http://en.wikipedia.org/wiki/Elliptical_polarization>, Apr. 21, 2015, 3 pgs.

"How to Use STUF", STUF Page Link Info, crossdevices.com, http://www.crossdevices.com/cross_devices_010.htm, 2015, 1 page.

"Network technology", nbnTM, nbnco.com.au, Jun. 27, 2014.

"Powerline—Juice Up Your Network With Powerline", Netgear®, netgear.com http://www.netgear.com/home/products/networking/powerline/, Apr. 21, 2015, 3 pages.

"Resilience to Smart Meter Disconnect Attacks", ADSC Illinois at Singapore PTE, LTD., publish.illinois.edu http://publish.illinois.edu/integrativesecurityassessment/resiliencetosmartmeterdisconnectattacks/, 2015.

"Tapered waveguide", Lumerical Solutions, Inc., docs.lumerical.com, 2010.

(56) References Cited

OTHER PUBLICATIONS

"Tapered Waveguides Improve Fiber Light Coupling Efficiency", Tech Briefs, techbriefs.com, Jan. 1, 2006, Molex Inc., Downers Grove, Illinois and KiloLambda Technologies Ltd., Tel Aviv, Israel.
Akiba, Shigeyuki et al., "Photonic Architecture for Beam Forming of RF Phased Array Antenna", Optical Fiber Communication Conference. Optical Society of America, 2014.
Alam, M.N. et al., "Novel surface wave exciters for power line fault detection and communications." Antennas and Propagation (APSURSI), 2011 IEEE International Symposium on. IEEE, 2011.
Ali, Muhammad Q. et al., "Randomizing AMI configuration for proactive defense in smart grid", Smart Grid Communications (SmartGridComm), 2013 IEEE International Conference on. IEEE, http://ieeexplore.ieee.org/xpl/login.jsp?tp=&arnumber=6688027, 2013.
Angove, Alex, "Direct Bury Duct Assemblies, MPB 302 3+—Ribbonet Microducts", Ericsson, archive.ericsson.net, Jul. 30, 2014.
Angove, Alex , "How the NBN Differs from ADSL2+, Cable and Wireless", Whistle Out, whistleout.com.au, Jul. 30, 2014.
Arage, Alebel et al., "Measurement of wet antenna effects on millimetre wave propagation", Radar, 2006 IEEE Conference on IEEE, 2006.
Arthur, Joseph Kweku, "Improving QoS in UMTS Network in ACCRA Business District Using Tower-Less Towers", IPASJ International Journal of Electrical Engineering (IIJEE), vol. 2, Issue 11, Nov. 2014.
Asadallahi, Sina et al., "Performance comparison of CSMA/CA Advanced Infrared (AIr) and a new pointtomultipoint optical MAC protocol." Wireless Communications and Mobile Computing Conference (IWCMC), 2012 8th International. IEEE, 2012.
Atwater, Harry A., "The promise of plasmonics." Scientific American 296.4 (2007): 56-62.
Barron, Ashleigh L. , "Integrated Multicore Fibre Devices for Optical Trapping", Diss. Heriot-Watt University, 2014, 11-15.
Beal, J.C. et al., "Coaxial-slot surface-wave launcher", Electronics Letters 4.25 (1968): 557559.
Bhushan, Naga , "Network densification: the dominant theme for wireless evolution into 5G", Communications Magazine, IEEE 52.2 (2014): 82-89.
Bing, Benny , "Ubiquitous Broadband Access Networks with Peer-to-Peer Application Support", Evolving the Access Network (2006): 27-36.
Bing, Benny , "Ubiquitous Broadband Access Networks with Peer-to-Peer Application Support", Evolving the Access Network, 2006, 27-36.
Bock, James et al., "Optical coupling." Journal of Physics: Conference Series. vol. 155. No. 1. IOP Publishing, 2009.
Bowen, Leland H. et al., "A Solid Dielectric Lens Impulse Radiating Antenna with High Dielectric Constant Surrounded by a Cylindrical Shroud," Sensor and Simulation Note 498, Apr. 2005.
Bridges, Greg E. et al., "Plane wave coupling to multiple conductor transmission lines above a lossy earth", Compatibility, IEEE Transactions on 31.1, 1989, 21-33.
Brooke, Gary H. , Properties of surface waveguides with discontinuities and perturbations in cross-section. Diss. University of British Columbia, 1977.
Brown, J. et al., "The launching of radial cylindrical surface waves by a circumferential slot", Proceedings of the IEE Part B: Radio and Electronic Engineering 106.26 (1959): 123128.
Bruno, Joseph , "Interference Reduction in Wireless Networks", Computing Research Topics, Computing Sciences Department, Villanova University, Nov. 14, 2007, 8 pages.
Burkhart, Martin et al., "Does Topology Control Reduce Interference?", Department of Computer Science, ETH Zurich, Proceedings of the 5th ACM international symposium on Mobile ad hoc networking and computing, ACM, 2004, 11 pages.
Callis, et al., "An In-Line Power Monitor for HE11 Low Loss Transmission Lines", Proceedings of the 29th International Conference on Infrared and Millimeter Waves (IRMMW), Karlsruhe, Germany, 2004.
Carroll, John M. et al., "Developing the Blacksburg electronic village", Communications of the ACM 39.12 (1996): 69-74.
Chen, Dong et al., "A trust management model based on fuzzy reputation for internet of things", Computer Science and Information Systems 8.4 (2011): 12071228.
Chen, Yingying , "Detecting and Localizing Wireless Spoofing Attacks", Sensor, Mesh and Ad Hoc Communications and Networks, 2007, SECON'07. 4th Annual IEEE Communications Society Conference on IEEE, 2007, 10 pages.
Cimini, Carlos Alberto et al., "Temperature profile of progressive damaged overhead electrical conductors", Journal of Electrical Power & Energy Systems 49 (2013): 280-286.
Covington, Michael J. et al., "Threat implications of the internet of things", Cyber Conflict (CyCon), 2013 5th International Conference on. IEEE, 2013.
Crane, Robert K. , "Analysis of the effects of water on the ACTS propagation terminal antenna", Antennas and Propagation, IEEE Transactions on 50.7 (2002): 954965.
De Sabata, Aldo et al., "Universitatea" Politehnica, din Timisoara Facultatea de Electronică si Telecomunicatii, 2012.
Doane, J.L. et al., "Oversized rectangular waveguides with modefree bends and twists for broadband applications", Microwave Journal 32(3), 1989, 153-160.
Dostert, Klaus , "Frequency-hopping spread-spectrum modulation for digital communications over electrical power lines." Selected Areas in Communications, IEEE Journal on 8.4 (1990): 700-710.
Dragoo, R.E. et al., "Fiber Optic Data Bus for the AN/GYQ21(V)." Harris Corp, U.S. Communications Syst. Div. CHART, Microcopy Resolution Test, 1980.
Dutton, Harry Jr. , "Understanding Optical Communications", International Technical Support Organization, SG24-5230-00, Sep. 1998.
Erickson, Katherine , "Conductive cylindrical surface waveguides." (2012). https://www.ideals.illinois.edu/bitstream/handle/2142/30914/Erickson_Katherine.pdf?sequence=1.
Erickson, Katherine , "Conductive cylindrical surface waveguides", 2012.
Eskelinen, Harri , "DFM (A)-aspects for a horn antenna design," Lappeenranta University of Technology, 2004.
Eskelinen, P. , "A low-cost microwave rotary joint," International Radar Conference, Oct. 13-17, 2014, p. 1-4.
Feng, Taiming et al., "Design of a survivable hybrid wireless-optical broadband-access network", Journal of Optical Communications and Networking 3.5, 2011, 458-464.
Fenye, Bao et al., "Dynamic trust management for internet of things applications", Proceedings of the 2012 international workshop on Selfaware internet of things. ACM, 2012.
Freyer, Dan , "Combating the Challenges of Ka-Band Signal Degradation", SatMagazine, satmagzine.com, Sep. 2014.
Fromm, W. et al., "A new microwave rotary joint," 1958 IRE International Convention Record, Mar. 21-25, 1966, 6:78-82.
Ghazisaidi, Navid et al., "Survivability analysis of next-generation passive optical networks and fiber-wireless access networks", Reliability, IEEE Transactions on 60.2, 2011, 479-492.
Gomes, Nathan J. et al., "Radio-over-fiber transport for the support of wireless broadband services", Journal of Optical Networking 8.2 (2009): 156-178.
Gonthier, François et al., "Mode coupling in nonuniform fibers: comparison between coupled-mode theory and finite-difference beam-propagation method simulations", JOSA B 8.2 (1991): 416421.
Han, Chong et al., "crosslayer communication module for the Internet of Things", Computer Networks 57.3 (2013): 622633.
Haroun, Ibrahim et al., "WLANs meet fiber optics-Evaluating 802.11 a WLANs over fiber optics links", RF Des. Mag (2003): 36-39.
Hassan, Karim , "Fabrication and characterization of thermoplasmonic routers for telecom applications", Diss. Univ. de Bourgogne, 2014.
Hassan, Maaly A. , "Interference reduction in mobile ad hoc and sensor networks", Journal of Engineering and Computer Innovations vol. 2(7), Sep. 2011, 138-154.

(56) References Cited

OTHER PUBLICATIONS

Hassani, Alireza et al., "Porous polymer fibers for low-loss Terahertz guiding." Optics express 16.9 (2008): 6340-6351.
Hoss, R.J. et al., "Manufacturing Methods and Technology Program for Ruggedized Tactical Fiber Optic Cable", No. ITT-80-03-078. ITT Electrooptical Products Div Roanoke VA, 1980.
Ippolito, Louis J. , "Propagation effects handbook for satellite systems design. A summary of propagation impairments on 10 to 100 GHz satellite links with techniques for system design", 1989.
Jackson, Mark , "Timico CTO Hit by Slow FTTC Broadband Speeds After Copper Corrosion", ISP review, ispreview.co.uk, Mar. 5, 2013.
Jaeger, Raymond et al., "Radiation Performance of Germanium Phosphosilicate Optical Fibers." RADC-TR-81-69: Final Technical Report, Galileo Electro-Optical Corp, (May 1981).
James, J.R. et al., "Investigations and Comparisons of New Types of Millimetre-Wave Planar Arrays Using Microstrip and Dielectric Structures", Royal Military Coll of Science Shrivenham (England), 1985.
Jang, Hung-Chin , "Applications of Geometric Algorithms to Reduce Interference in Wireless Mesh Network", Journal on Applications of Graph Theory in Wireless Ad hoc Networks and Sensor Networks (JGRAPH-HOC) vol. 2, No. 1, Mar. 2010.
Jeong, et al., "Study of elliptical polarization requirement of KSTAR 84-GHz EcH system", Journal-Korean Physical Society 49, 2006.
Jin, "Quasi-optical mode converter for a coaxial cavity gyrotron", Forschungszentrum, 2007.
Kang, , "Chapter 6: Array Antennas," IHS Engineering360, globalspec.com, http://www.globalspec.com/reference/75109/203279/chapter-6-array-antennas, Apr. 22, 2015.
Khan, , "Dual polarized dielectric resonator antennas", Chalmers University of Technology, 2010.
Kikuchi, H. et al., "Hybrid transmission mode of Goubau lines" ,J.Inst.Electr.Comm.Engrs., Japan,vol. 43, pp. 39-45, 1960.
Kirkham, H. et al., "Power system applications of fiber optics (Jet Propulsion Lab." JPL Publication 84-28, Electric Energy Systems Division, U.S. DoE, p. 180, (1984).
Koshiba, Masanori et al., "Analytical expression of average power-coupling coefficients for estimating intercore crosstalk in multicore fibers", Photonics Journal, IEEE 4.5, 2012, 1987-1995.
Kroon, Barnard et al., "Steady state RF fingerprinting for identity verification: one class classifier versus customized ensemble." Artificial Intelligence and Cognitive Science. Springer Berlin Heidelberg, 2010. 198206.
Kroyer, Thomas , "A Waveguide High Order Mode Reflectometer for the Large Hadron Collider Beam-pipe", Diss. TU Wien, 2003.
Lappgroupusa, "Selection of Number of Cable Cores With Emphasis on Sizing Parameters", Industrial Cable & Connector Technology News, lappconnect.blogspot.com, http://lappconnect.blogspot.com/2014_10_01_archive.html, Oct. 30, 2014.
Leech, Jamie et al., "Experimental investigation of a low-cost, high performance focal-plane horn array." Terahertz Science and Technology, IEEE Transactions on 2.1 (2012): 61-70.
Li, Xiang-Yang et al., "Interference-Aware Topology Control for Wireless Sensor Networks", SECON. vol. 5, 2005.
Li, Xiaowei et al., "Integrated plasmonic semi-circular launcher for dielectric-loaded surface plasmonpolariton waveguide", Optics express 19.7 (2011): 65416548.
Li, Xu et al., "Smart community: an internet of things application", Communications Magazine, IEEE 49.11 (2011): 68-75.
Lier, E. et al., "Simple hybrid mode horn feed loaded with a dielectric cone," Electronics Letters 21.13 (1985): 563564.
Lim, Christina et al., "Fiber-wireless networks and subsystem technologies", Lightwave Technology, Journal of 28.4 (2010): 390-405.
Lou, Tiancheng , "Minimizing Average Interference through Topology Control", Algorithms for Sensor Systems, Springer Berlin Heidelberg, 2012, 115-129.
Luo, Qi et al., "Circularly polarized antennas", John Wiley & Sons, 2013.
Mahato, Suvranshu Sekhar , Studies on an Infrared Sensor Based Wireless Mesh Network. Diss. 2010.
Maier, Martin et al., "The audacity of fiberwireless (FiWi) networks", AccessNets. Springer Berlin Heidelberg, 2009. 16-35.
Marcatili, E.A. et al., "Hollow Metallic and Dielectric Waveguides for Long Distance Optical Transmission and Lasers", Bell System Technical Journal 43(4), 1964, 1783-1809.
McAllister, M.W. et al., "Resonant hemispherical dielectric antenna," Electronics Letters 20.16 (1984): 657659.
Meng, H. et al., "A transmission line model for high-frequency power line communication channel", Power System Technology, PowerCon 2002. International Conference on. vol. 2. IEEE, 2002. http:/ /infocom. uniroma 1.it/ ""enzobac/MengChen02. pdf, 2002.
Menon, S.S. et al., "Propagation characteristics of guided modes in a solid dielectric pyramidal horn," Proceedings of the 2012 International Conference on Communication Systems and Network Technologies. IEEE Computer Society, 2012.
Mitchell, John E. , "Integrated Wireless Backhaul Over Optical Access Networks", Journal of Lightwave Technology 32.20, 2014, 3373-3382.
Lappgroupusa, , "Selection of Number of Cable Cores With Emphasis on Sizing Parameters", Industrial Cable & Connector Technology News, lappconnect.blogspot.com, http://lappconnect.blogspot.com/2014_10_01_archive.html, Oct. 30, 2014.
Moaveni-Nejad, Kousha et al., "Low-Interference Topology Control for Wireless Ad Hoc Networks", Department of Computer Science, Illinois Institute of Technology, Ad Hoc & Sensor Wireless Networks 1.1-2, 2005, 41-64.
Moisan, M. et al., "Plasma sources based on the propagation of electromagnetic surface waves", Journal of Physics D: Applied Physics 24.7 (1991): 1025.
Morse, T.F. , "Research Support for the Laboratory for Lightwave Technology." Brown Univ Providence RI Div of Engineering, 1992.
Mruk, Joseph Rene , "Wideband monolithically integrated frontend subsystems and components", Diss. University of Colorado, 2011.
Nachiketh, P. et al., "Optimizing public-key encryption for wireless clients", Proceedings of the IEEE International Conference on Communications (ICC 2002). No. 1. 2002.
Narayanan, Arvind , "Fingerprinting of RFID Tags and HighTech Stalking." 33 Bits of Entropy, 33bits.org, Oct. 4, 2011.
Nassa, Vinay Kumar , "Wireless Communications: Past, Present and Future", Dronacharya Research Journal: 50. vol. III, Issue-II, Jul.-Dec. 2011.
Nibarger, John P. , "An 84 pixel all-silicon corrugated feedhorn for CMB measurements." Journal of Low Temperature Physics 167.3-4 (2012): 522-527.
Nuvotronics, "PolyStrata—Phased Arrays & Antennas", Nuvotronics, nuvotronics.com http://www.nuvotronics.com/antennas.php, Apr. 26, 2015.
Olver, A. D. , "Microwave horns and feeds," vol. 39. IET, 1994.
Olver, A.D. et al., "Dielectric cone loaded horn antennas," Microwaves, Antennas and Propagation, IEE Proceedings H. vol. 135. No. 3. IET, 1988.
Pahlavan, Kaveh et al., "Wireless data communications", Proceedings of the IEEE 82.9 (1994): 1398-1430.
Perkons, Alfred R. et al., "TM surface-wave power combining by a planar active-lens amplifier", Microwave Theory and Techniques, IEEE Transactions on 46.6 (1998): 775783.
Péter, Zsolt et al., "Assessment of the current intensity for preventing ice accretion on overhead conductors", Power Delivery, IEEE Transactions on 22.1 (2007): 565-574.
Petrovsky, Oleg , "The Internet of Things: A Security Overview", w.druva.com, Mar. 31, 2015.
Pham, Tien-Thang et al., "A WDM-PON-compatible system for simultaneous distribution of gigabit baseband and wireless ultrawideband services with flexible bandwidth allocation", Photonics Journal, IEEE 3.1, 2011, 13-19.
Plagemann, Thomas et al., "Infrastructures for community networks", Content Delivery Networks. Springer Berlin Heidelberg, 2008. 367-388.

(56) References Cited

OTHER PUBLICATIONS

Pohl, "A dielectric lens-based antenna concept for high-precision industrial radar measurements at 24GHz," Radar Conference (EuRAD), 2012 9th European, IEEE, 2012.
Prashant, R.R. et al., "Detecting and Identifying the Location of Multiple Spoofing Adversaries in Wireless Network", International Journal of Computer Science and Mobile Applications, vol. 2 Issue. 5, May 2014, 1-6.
Rahim, S. K. A. et al., "Measurement of wet antenna losses on 26 GHz terrestrial microwave link in Malaysia", Wireless Personal Communications 64.2 (2012): 225231.
Rambabu, K. et al., "Compact single-channel rotary joint using ridged waveguide sections for phase adjustment," IEEE Transactions on Microwave Theory and Techniques (Aug. 2003) 51(8):1982-1986.
Raychaudhuri, Dipankar et al., "Emerging Wireless Technologies and the Future Mobile Internet", Cambridge University Press, Mar. 2011.
Raychem, "Wire and Cable", Dimensions 2 (1996): 1.
Reynet, Olivier et al., "Effect of the magnetic properties of the inclusions on the high-frequency dielectric response of diluted composites." Physical Review B66.9 (2002): 094412.
Rouse, Margaret , "Transport Layer Security (TLS)", TechTarget, searchsecurity.techtarget.com, Jul. 2006.
Roze, Mathieu et al., "Suspended core subwavelength fibers: towards practical designs for low-loss terahertz guidance." Optics express 19.10 (2011): 9127-9138.
Sagues, Mikel et al., "Multi-tap complex-coefficient incoherent microwave photonic filters based on optical single-sideband modulation and narrow band optical filtering." Optics express 16.1 (2008): 295-303.
Saied, Yosra Ben et al., "Trust management system design for the internet of things: a contextaware and multiservice approach", Computers & Security 39 (2013): 351365.
Salema, Carlos et al., "Solid dielectric horn antennas," Artech House Publishers, 1998, Amazon.
Salema, Carlos et al., "Solid dielectric horn antennas," Artech House Publishers, 1998.
Sarafi, A. et al., "Hybrid wireless-broadband over power lines: A promising broadband solution in rural areas." Communications Magazine, IEEE 47.11 (2009): 140-147.
Sarnecki, Joseph et al., "Microcell design principles", Communications Magazine, IEEE 31.4 (1993): 76-82.
Saruhan, Ibrahim Halil , "Detecting and Preventing Rogue Devices on the Network", SANS Institute InfoSec Reading Room, sans.org, Aug. 8, 2007.
Shafi, Mansoor et al., "Advances in Propagation Modeling for Wireless Systems", EURASIP Journal on Wireless Communications and Networking. Hindawi Publishing Corp, 2009, p. 5.
Shimabukuko, F.I. et al., "Attenuation measurement of very low-loss dielectric waveguides by the cavity resonator method in the millimeter/submillimeter wavelength range." No. TR-0086A (2925-06)-1. Aerospace Corp El Segundo CA Electronics Research Lab, 1989.
Shindo, Shuichi et al., "Attenuation measurement of cylindrical dielectric-rod waveguide." Electronics Letters 12.5 (1976): 117-118.
Shumate, Paul W. et al., "Evolution of fiber in the residential loop plant." IEEE Communications Magazine 29.3 (1991): 68-74.
Strieby, M.E. et al., "Television transmission over wire lines." American Institute of Electrical Engineers, Transactions of the 60.12 (1941): 1090-1096.
Szabó, Csaba A. , "European Broadband Initiatives with Public Participation", Broadband Services (2005): 255.
Taboada, John M. et al., "Thermo-optically tuned cascaded polymer waveguide taps." Applied physics letters 75.2 (1999): 163-165.
Templeton, Steven J. et al., "Detecting Spoofed Packets", DARPA Information Survivability Conference and Expostion, vol. 1, IEEE, 2003.
Theoleyr, Fabrice , "Internet of Things and M2M Communications", books.google.com, ISBN13: 9788792982483, Apr. 17, 2013.
Valladares, Cindy , "20 Critical Security Controls: Control 7—Wireless Device Control", Tripwire—The State of Security, tripwire.com, Mar. 21, 2013.
Vogelgesang, Ralf et al., "Plasmonic nanostructures in aperture-less scanning near-field optical microscopy (aSNOM)", physica status solidi (b) 245.10 (2008): 22552260.
Volat, C. et al., "De-icing/anti-icing techniques for power lines: current methods and future direction", Proceedings of the 11th International Workshop on Atmospheric Icing of Structures, Montreal, Canada. 2005.
Wagter, Herman , "Fiber-to-the-X: the economics of last-mile fiber", ARS Technica, arstechnica.com,, Mar. 31, 2010.
Wake, David et al., "Radio over fiber link design for next generation wireless systems", Lightwave Technology, Journal of 28.16 (2010): 2456-2464.
Wang, Jing et al., "The influence of optical fiber bundle parameters on the transmission of laser speckle patterns", Optics express 22.8, 2014, 8908-8918.
Wilkins, George A. , "Fiber Optic Telemetry in Ocean Cable Systems", Chapter in new edition of Handbook of Oceanographic Winch, Wire and Cable Technology, Alan H. Driscoll, Ed.,(to be published by University of Rhode Island) (1986).
Xia, Cen et al., "Supermodes for optical transmission", Optics express 19.17, 2011, 16653-16664.
Yeh, C. et al., "Ceramic Waveguides." Interplanetary Network Progress Report141.26 (2000): 1.
Yu, Shui et al., "Predicted packet padding for anonymous web browsing against traffic analysis attacks", Information Forensics and Security, IEEE Transactions on 7.4, http://nsp.org.au/syu/papers/tifs12.pdf, 2012, 1381-1393.
Zelby, Leon W. , "Propagation Modes on a Dielectric Coated Wire", J. The Franklin Institute, vol. 274(2), pp. 85-97, Aug. 1962.
Zheng, Zhu et al., "Efficient coupling of propagating broadband terahertz radial beams to metal wires", Optics express 21.9 (2013): 1064210650.
Zucker, "Surface-wave antennas", Antenna engineering handbook 4, 2007.
"AirCheck G2 Wireless Tester", NetScout®, enterprise.netscout.com, Dec. 6, 2016 10 pages.
"Brackets, Conduit Standoff", Hubbell Power Systems, Inc., hubbellpowersystems.com, Dec. 2, 2010, 2 pages.
"Broadband Over Power Lines (BPL): Developments and Policy Issues", Organisation for Economic Co-operation and Development, Directorate for Science, Technology and Industry, Committee for Information, Computer and Communications Policy, Jun. 2, 2009, 35 pages.
"Cisco Aironet 1500 Series Access Point Large Pole Mounting Kit Instructions", www.cisco.com/c/en/us/td/docs/wireless/antenna/installation/guide/18098.html, 2008, 9 pages.
"Doubly-fed Cage-cone Combined Broadband Antennas for Marine Applications", http://www.edatop.com/down/paper/antenna/%E5%A4%A9%E7%BA%BF%E8%AE%BE%E8%AE%A1-890w5nebp5ilpq.pdf, 2007, 7 pages.
"Dual Band Switched-Parasitic Wire Antennas for Communications and Direction Finding", www.researchgate.net/profile/David_Thiel2/publication/3898574_Dual_band_switched-parasitic_wire_antennas_for_communications_and_direction_finding/link s/0fcfd5091b4273ce54000000.pdf, 2000, 5 pages.
"Electronic Countermeasure (ECM) Antennas", vol. 8, No. 2, Apr. 2000, 2 pages.
"Harvest energy from powerline", www.physicsforums.com/threads/harvest-energy-from-powerline.685148/, Discussion thread about harvesting power from powerlines that includes the suggestion of clamping a device to the power line., 2013, 8 pages.
"International Search Report & Written Opinion", PCT/US2016/035384, mailed Oct. 31, 2016.
"International Search Report & Written Opinion", PCT/US2016/036288, Sep. 1, 2016.
"International Search Report & Written Opinion", PCT/2016/035383, Sep. 2, 2016.

(56) References Cited

OTHER PUBLICATIONS

"International Search Report & Written Opinion", PCT/US16/036284, Sep. 8, 2016.
"International Search Report & Written Opinion", PCT/US2016/036286, Sep. 13, 2016.
"International Search Report & Written Opinion", PCT/US2016/036293, Sep. 15, 2016.
"International Search Report & Written Opinion", PCT/US2016/040992, Oct. 17, 2006.
"International Search Report & Written Opinion", PCT/US16/050488, Nov. 11, 2016.
"International Search Report & Written Opinion", PCT/US16/50345, Nov. 15, 2016.
"International Search Report & Written Opinion", PCT/US2016/050346, Nov. 17, 2016.
"International Search Report & Written Opinion", PCT/US2016/050860, Nov. 17, 2016 11 pages.
"International Search Report & Written Opinion", PCT/US2016/050344, Nov. 25, 2016 16 pages.
"International Search Report and Written Opinion", PCT/US2016/036297, Sep. 5, 2016.
"International Search Report and Written Opinion", PCT/US2016/036292, Sep. 13, 2016.
"International Search Report and Written Opinion", PCT/US2016/046315, Nov. 3, 2016.
"International Search Report and Written Opinion", PCT/US2016/050039, Nov. 14, 2016.
"International Search Report and Written Opinion", PCT/US2016/050347, Nov. 15, 2016.
"International Search Report and Written Opinion", PCT/US2016/051217, Nov. 29, 2016.
"International Search Report and Written Opinion", PCT/US2016/036289, Aug. 11, 2016.
"International Search Report and Written Opinion", PCT/US2016/036295, Aug. 30, 2016.
"International Search Report and Written opinion", PCT/US2016/036556, mailed Sep. 22, 2016.
"International Searching Authority", International Search Report and Written Opinion, Sep. 28, 2016 1-12.
"Invitation to Pay Additional Fees and, Where Applicable, Protest Fee", PCT/US2016/035384, Aug. 31, 2016 7 pages.
"Micromem Demonstrates UAV Installation of Power Line Monitoring Mounting System", MicroMem, micromem.com, Mar. 4, 2015, 1-3.
"Newsletter 4.4—Antenna Magus version 4.4 released!", antennamagus.com, Aug. 10, 2013, 8 pages.
"PCT International Search Report", PCT/US2016/057161, PCT International Search Report and Written Opinion, Jan. 12, 2017, 1-13, Jan. 12, 2017, 1-13.
"PCT/US2016/041561, PCT International Search Report and Written Opinion", Oct. 10, 2016 1-15.
"PCT/US2016/046323, PCT International Search Report", Oct. 24, 2016 1-13.
"Technology Brief 13: Touchscreens and Active Digitizers", https://web.archive.org/web/20100701004625/http://web.engr.oregonstate.edu/~moon/engr203/read/read4.pdf, 2010, 289-311.
"The world's first achievement of microwave electric-field measurement utilizing an optical electric-field sensor mounted on an optical fiber, within a microwave discharge ion engine boarded on asteroid explorers etc.", Investigation of internal phenomena and performance improvement in microwave discharge ion engines, Japan Aerospace Exploration Agency (JAXA), Nippon Telegraph and Telephone Corporation, Aug. 7, 2013, 4 pages.
Adabo, Geraldo J. , "Long Range Unmanned Aircraft System for Power Line Inspection of Brazilian Electrical System", Journal of Energy and Power Engineering 8 (2014), Feb. 28, 2014, 394-398.
Al-Ali, A.R. et al., "Mobile RFID Tracking System", Information and Communication Technologies: From Theory to Applications, ICTTA 2008, 3rd International Conference on IEEE, 2008, 4 pages.
Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.
Alaridhee, T. et al., "Transmission properties of slanted annular aperture arrays. Giant energy deviation over sub-wavelength distance", Optics express 23.9, 2015, 11687-11701.
Ali, Tariq et al., "Diagonal and Vertical Routing Protocol for Underwater Wireless Sensor Network", Procedia-Social and Behavioral Sciences 129, 2014, 372-379.
Allen, Jeffrey et al., "New Concepts in Electromagnetic Materials and Antennas", Air Force Research Laboratory, Jan. 2015, 80 pages.
Amirshahi, P. et al., "Transmission channel model and capacity of overhead multiconductor mediumvoltage powerlines for broadband communications", Consumer Communications and Networking Conference, 2005, 5 pages.
Amt, John H. et al., "Flight Testing of a Pseudolite Navigation System on a UAV", Air Force Institute of Technology: ION Conference, Jan. 2007, 9 pages.
Antennamagus, "Parabolic focus pattern fed reflector with shroud", antennamagus.com, Jul. 4, 2014, 2 pages.
Ares-Pena, Francisco J. et al., "A simple alternative for beam reconfiguration of array antennas", Progress in Electromagnetics Research 88, 2008, 227-240.
Ascom, "TEMS Pocket—a Complete Measurement Smartphone System in your Hand", http://www.ascom.us/us-en/tems_pocket_14.0_feature_specific_datasheet.pdf, 2014, 2 pages.
A-Tech Fabrication, "Dual Antenna Boom Assembly", http://web.archive.org/web/20090126192215/http://atechfabrication.com/products/dual_antenna_boom.htm, 2009, 2 pages.
Baanto, "Surface Acoustive Wave (SAW) Touch Screen", http://baanto.com/surface-acoustic-wave-saw-touch-screen, 2016 4 pages.
Babakhani, Aydin , "Direct antenna modulation (DAM) for on-chip mm-wave transceivers", Diss. California Institute of Technology, 2008, 2 pages.
Barlow, H. M. et al., "Surface Waves", 621.396.11 : 538.566, Paper No. 1482 Radio Section, 1953, pp. 329-341.
Barnes, Heidi et al., "DeMystifying the 28 Gb/s PCB Channel: Design to Measurement", Design Con. 2014, Feb. 28, 2014, 54 pages.
Benevent, Evangéline , "Transmission lines in MMIC technology", Universitá Mediterranea di Reggio Calabria, Jan. 28, 2010, 63 pages.
Benkhelifa, Elhadj , "User Profiling for Energy Optimisation in Mobile Cloud Computing", 2015, 1159-1165.
Berweger, Samuel et al., "Light on the Tip of a Needle: Plasmonic Nanofocusing for Spectroscopy on the Nanoscale", The Journal of Physical Chemistry Letters; pubs.acs.org/JPCL, 2012, 945-952.
Blanco-Redondo, Andrea et al., "Coupling midinfrared light from a photonic crystal waveguide to metallic transmission lines", Applied Physics Letters 104.1, 2014, 6 pages.
Blattenberger, Kirt , "DroneBased Field Measurement System (dBFMS)", RF Cafe, rfcafe.com, Jul. 29, 2014, 3 pages.
Brambilla, Gilberto et al., "Ultra-low-loss optical fiber nanotapers", Optoelectronics Research Centre, University of Southampton; http://www.orc.soton.ac.uk, vol. 12, No. 10, May 7, 2004, 2258-2263.
Briso-Rodriguez, "Measurements and Modeling of Distributed Antenna Systems in Railway Tunnels", IEEE Transactions on Vehicular Technology, vol. 56, No. 5, Sep. 2007, 2870-2879.
Budde, Matthias , "Using a 2DST Waveguide for Usable, Physically Constrained Out-of-Band Wi-Fi Authentication", https://pdfs.semanticscholar.org/282e/826938ab7170c198057f9236799e92e21219.pdf, 2013, 8 pages.
Campista, Miguel E. et al."Improving the Data Transmission Throughput Over the Home Electrical Wiring", The IEEE Conference on Local Computer Networks 30th Anniversary, 2005, 1-8.
Capece, P. et al., "FDTD Analysis of a Circular Coaxial Feeder for Reflector Antenna", Antennas and Propagation Society International Symposium, IEEE Digest, vol. 3, 1997, pp. 1570-1573.

(56) References Cited

OTHER PUBLICATIONS

Chaimae, Elmakfalji et al., "New Way of Passive RFID Deployment for Smart Grid", Journal of Theoretical and Applied Information Technology 82.1, Dec. 10, 2015, 81-84.
Chen, Ke et al., "Geometric phase coded metasurface: from polarization dependent directive electromagnetic wave scattering to diffusionlike scattering", Scientific Reports 6, 2016, 1-10.
Cipo, "Office Action mailed Feb. 3, 2017 for Canadian application 2,928,355", 1-4.
Cliff, Oliver M. et al., "Online localization of radio-tagged wildlife with an autonomous aerial robot system", Proceedings of Robotics Science and Systems XI, 2015, 1317.
Collins, D.D. et al., "Final Report on Advanced Antenna Design Techniques", GER 11246, Report No. 4, Sep. 6, 1963, 1-70.
Comsol, "Fast Numerical Modeling of a Conical Horns Lens Antenna", comsol.com, Application ID: 18695, Sep. 16, 2016 3 pages.
Crisp, "Uplink and Downlink Coverage Improvements of 802.11g Signals Using a Distributed Antenna Network", Journal of Lightwave Technology ( vol. 25, Issue: 11), Dec. 6, 2007, 1-4.
Crosswell, "Aperture excited dielectric antennas", http://ntrs.nasa.gov/archive/nasa/casi.ntrs.nasa.gov/19740017567.pdf, 1974, 128 pages.
Curry, James M., "A Web of Drones: A 2040 Strategy to Reduce the United States Dependance on Space Based Capabilities", Air War College, Feb. 17, 2015, 34 pages.
Daniel, Kai et al., "Using Public Network Infrastructures for UAV Remote Sensing in Civilian Security Operations", Homeland Security Affairs, Supplement 3, Mar. 2011, 11 pages.
De Freitas, Carvalho et al., "Unmanned Air Vehicle Based Localization and Range Estimation of WiFi Nodes", 2014, 109 pages.
Debord, Benoit et al., "Generation and confinement of microwave gas-plasma in photonic dielectric microstructure", Optics express 21.21, 2013, 25509-25516.
Deilmann, Michael, "Silicon oxide permeation barrier coating and sterilization of PET bottles by pulsed low-pressure microwave plasmas", Dissertation, 2008, 142 pages.
Deng, Chuang et al., "Unmanned Aerial Vehicles for Power Line Inspection: A Cooperative Way in Platforms and Communications", Journal of Communicatinos vol. No. 9, No. 9, Sep. 2014, 687-692.
Dyson, John D., "The Equiangular Spiral Antenna", IRE Transactions on Antennas and Propagation, 1959, 181-187.
Earth Data, "Remote Sensors", NASA, earthdata.nasa.gov, Oct. 17, 2016 36 pages.
Eizo, "How can a screen sense touch? A basic understanding of touch panels", www.eizo.com/library/basics/basic_understanding_of_touch_panel, Sep. 27, 2010, 8 pages.
Ekstrom, "Slot-line end-fire antennas for THz frequencies", Third International Symposium on Space Terahertz Technology, 280-290.
Elmore, Glenn et al., "A Surface Wave Transmission Line", QEX, May/Jun. 2012, pp. 3-9.
Emerson, "About Rosemount 5300 Level Transmitter", www.emerson.com, Nov. 2016 6 pages.
Eom, Seung-Hyun et al., "Pattern switchable antenna system using inkjet-printed directional bow-tie for bi-direction sensing applications", Sensors 15.12, 2015, 31171-31179.
Faggiani, Adriano, "Smartphone-based crowdsourcing for network monitoring: opportunities, challenges, and a case study", http://vecchio.iet.unipi.it/vecchio/files/2010/02/article.pdf, 2014, 8 pages.
Fattah, E. Abdel et al., "Numerical 3D simulation of surface wave excitation in planar-type plasma processing device with a corrugated dielectric plate", Elsevier, Vacuum 86, 2011, 330-334.
Feko, "Lens Antennas", Altair, feko.info, Jun. 30, 2014, 2 pages.
Fenn, Alan J. et al., "A Terrestrial Air Link for Evaluating Dual-Polarization Techniques in Satellite Communications", vol. 9, No. 1, The Lincoln Laboratory Journal, 1996, 3-18.
Fiorelli, Riccardo et al., "ST7580 power line communication systemonchip design guide", Doc ID 022923 Rev 2, Jul. 2012, 63 pages.
Fitzgerald, William D., "A 35-GHz Beam Waveguide System for the Millimeter-Wave Radar", The Lincoln Laboratory Journal, vol. 5, No. 2, 1992, 245-272.
Galli "For the Grid and Through the Grid: The Role of Power Line Communications in the Smart Grid", Proceedings of the IEEE 99.6, Jun. 2011, 1-26.
Gerini, Giampiero, "Multilayer array antennas with integrated frequency selective surfaces conformal to a circular cylindrical surface", http://alexandria.tue.nl/openaccess/Metis248614.pdf, 2005, 2020-2030.
Geterud, Erik G., "Design and Optimization of Wideband Hat-Fed Reflector Antenna with Radome for Satellite Earth Station", http://publications.lib.chalmers.se/records/fulltext/163718.pdf, Discloses Frequency Selective Surfaces for antenna coverings for weather protection (table of materials on p. 29-30; pp. 37-46), 2012, 70 pages.
Gilbert, Barrie et al., "The Gears of Genius", IEEE SolidState Circuits Newsletter 4.12, 2007, 10-28.
Godara, ,"Applications of Antenna Arrays to Mobile Communications, Part I: Performance Improvement, Feasibility, and System Considerations", Proceedings of the IEEE, vol. 85, No. 7, Jul. 1997, 1031-1060.
Greco, R., "Soil water content inverse profiling from single TDR waveforms", Journal of hydrology 317.3, 2006, 325-339.
Gunduz, Deniz et al., "The multiway relay channel", IEEE Transactions on Information Theory 59.1, 2013, 5163.
Guo, Shuo et al., "Detecting Faulty Nodes with Data Errors for Wireless Sensor Networks", 2014, 25 pages.
Hadi, Ghozali S. et al., "Autonomous UAV System Development for Payload Dropping Mission", The Journal of Instrumentation, Automation and Systems, vol. 1, No. 2, 2014, pp. 72-22.
Hafeez, , "Smart Home Area Networks Protocols within the Smart Grid Context", Journal of Communications vol. 9, No. 9, Sep. 2014, 665-671.
Halder, Achintya et al., "Low-cost alternate EVM test for wireless receiver systems", 23rd IEEE VLSI Test Symposium (VTS'05), 2005, 6 pages.
Hale, Paul et al., "A statistical study of deembedding applied to eye diagram analysis", IEEE Transactions on Instrumentation and Measurement 61.2, 2012, 475-488.
Halligan, Matthew S., "Maximum crosstalk estimation and modeling of electromagnetic radiation from PCB/highdensity connector interfaces", http://scholarsmine.mst.edu/cgi/viewcontent.cgiarticle=3326&context=doctoral_dissertations, 2014, 251 pages.
Hanashi, Abdalla M. et al., "Effect of the Dish Angle on the Wet Antenna Attenuation", IEEE, 2014, 1-4.
Hays, Phillip, "SPG-49 Tracking Radar", www.okieboat.com/SPG-49%20description.html, 2015, 15 pages.
Heo, Joon et al. "Identity-Based Mutual Device Authentication Schemes for PLC Systems", IEEE International Symposium on Power Line Communications and Its Applications, 2008, pp. 47-51.
Howard, Courtney, "UAV command, control & communications", Military & Aerospace Electronics, militaryaerospace.com, Jul. 11, 2013, 15 pages.
Hussain, Mohamed T. et al., "Closely Packed Millimeter-Wave MIMO Antenna Arrays with Dielectric Resonator Elements", Antennas and Propagation (EuCAP) 2016 10th European Conference, Apr. 2016, 1-5.
Huth, G. K. "Integrated source and channel encoded digital communication system design study", http://ntrs.nasa.gov/archive/nasa/casi.ntrs.nasa.gov/19750003064.pdf, 1974, 65 pages.
Ikrath, K. et al., "Antenna Innovation Glass-Fiber Tube Focuses Microwave Beam", Electronics, vol. 35, No. 38, Sep. 21, 1962, 44-47.
Illinois Historic Archive, , "Antennas on the Web", Photo Archive of Antennas, ece.illinois.ed, 1-18, Dec. 2016.
Islam, M. T., "Coplanar Waveguide Fed Microstrip Patch Antenna", Information Technology Journal 9.2 (2010): 367-370., 2010, 367-370.
James, Graeme L. et al., "Diplexing Feed Assemblies for Application to Dual-Reflector Antennas", IEEE Transactions on Antennas and Propagation, vol. 51, No. 5, May 2003, 1024-1029.

(56) References Cited

OTHER PUBLICATIONS

James, J. R. et al."Investigations and Comparisons of New Types of Millimetre-Wave Planar Arrays Using Microstrip and Dielectric Structures", Royal Military College of Science, Apr. 1985, 122 pages.
Jensen, Michael, "Data-Dependent Fingerprints for Wireless Device Authentication", www.dtic.mil/cgi-bin/GetTRDoc?AD=ADA626320, 2014, 15 pages.
Jiang, Peng, "A New Method for Node Fault Detection in Wireless Sensor Networks", 2009, 1282-1294.
Jiang, Y.S. et al., "Electromagnetic orbital angular momentum in remote sensing", PIERS Proceedings, Moscow, Russia, Aug. 18-21, 2009, 1330-1337.
Jones, Jr., Howard S., "Conformal and Small Antenna Designs", U.S. Army Electronics Research and Development Command, Harry Diamond Laboratories, Apr. 1981, 32 pages.
Kado, Yuichi et al., "Exploring SubTHz Waves for Communications, Imaging, and Gas Sensing", Fog 2: O2, Piers Proceedings, Beijing, China, Mar. 23-27, 2009, 42-47.
Karbowiak, A. E. et al., "Characteristics of Waveguides for Long-Distance Transmission", Journal of Research of the National Bureau of Standards, vol. 65D, No. 1, Jan.-Feb. 1961, May 23, 1960, 75-88.
Katrasnik, Jaka, "New Robot for Power Line Inspection", 2008 IEEE Conference on Robotics, Automation and Mechatronics, 2008, 1-6.
Kedar,, "Wide Beam Tapered Slot Antenna for Wide Angle Scanning Phased Array Antenna", Progress in Electromagnetics Research B, vol. 27, 2011, 235-251.
Khan, Kaleemullah, "Authentication in Multi-Hop Wireless Mesh Networks", World Academy of Science, Engineering and Technology, International Journal of Electrical, Computer, Energetic, Electronic and Communication Engineering vol. 2, No. 10, 2008, 2406-2411.
Khan, Mohammed R., "A beam steering technique using dielectric wedges", Diss. University of London, Dec. 1985, 3 pages.
Kim, Jong-Hyuk et al., "Real-time Navigation, Guidance, and Control of a UAV using Low-cost Sensors", Australian Centre for Field Robotics, Mar. 5, 2011, 6 pages.
Kim, Myungsik et al., "Automated RFID-based identification system for steel coils", Progress in Electromagnetics Research 131, 2012, 1-17.
Kima, Yi-Gon et al., "Generating and detecting torsional guided waves using magnetostrictive sensors of crossed coils", Chonnam National University, Republic of Korea, Elsevier Ltd, 2010, 145-151.
Kleinrock, Leonard et al., "On measured behavior of the ARPA network", National Computer Conference, 1974, 767-780.
Kliros, George S., "Dielectric-EBG covered conical antenna for UWB applications", www.researchgate.net/profile/George_Kliros/publication/235322849_Dielectric-EBG_covered_conical_antenna_for_UWB_applications/links/54329e410cf225bddcc7c037.pdf, 2010, 10 pages.
Koga, Hisao et al., "High-Speed Power Line Communication System Based on Wavelet OFDM", 7th International Symposium on Power-Line Communications and Its Applications, Mar. 26-28, 2003, 226231.
Kolpakov, Stanislav A. et al., "Toward a new generation of photonic humidity sensors", Sensors 14.3, 2014, 3986-4013.
Kuehn, E, "Self-configuration and self-optimization of 4G Radio Access Networks", http://wirelessman.org/tgm/contrib/S80216m-07_169.pdf, 2007, 13 pages.
Kumar, Sumeet et al., "Urban street lighting infrastructure monitoring using a mobile sensor platform", IEEE Sensors Journal, 16.12, 2016 4981-4994.
Kune, Denis F. et al., "Ghost Talk: Mitigating EMI Signal Injection Attacks against Analog Sensors", IEEE Symposium on Security and Privacy, 2013, 145-159.
Lairdtech, "Allpurpose Mount Kit", www.lairdtech.com, Mar. 29, 2015, 2 pages.

Lazaropoulos, Athanasios, "TowardsModal Integration of Overhead and Underground Low-Voltage and Medium-Voltage Power Line Communication Channels in the Smart Grid Landscape:Model Expansion, Broadband Signal Transmission Characteristics, and Statistical Performance Metrics", International Scholarly Research Network, ISRN Signal Processing, vol. 2012, Article ID 121628, 17 pages, Mar. 26, 2012, 18 pages.
Lazaropoulos, Athanasios G., "Wireless sensor network design for transmission line monitoring, metering, and controlling: introducing broadband over power lines-enhanced network model (BPLeNM)", ISRN Power Engineering, 2014, 23 pages.
Lee, Joseph C., "A Compact Q-/K-Band Dual Frequency Feed Horn", No. TR-645, Massachusetts Institute of Technology, Lincoln Laboratory, May 3, 1983, 40 pages.
Lee, Sung-Woo, "Mutual Coupling Considerations in the Development of Multi-feed Antenna Systems", http://ntrs.nasa.gov/archive/nasa/casi.ntrs.nasa.gov/19750003064.pdf, 2008, 127 pages.
Li, Mo et al., "Underground structure monitoring with wireless sensor networks", Proceedings of the 6th international conference on Information processing in sensor networks, ACM, 2007, 69-78.
Liang, Bin, "Cylindrical Slot FSS Configuration for Beam-Switching Applications", IEEE Transactions on Antennas and Propagation, vol. 63, No. 1, Jan. 2015, 166-173.
Lier, Erik, "A Dielectric Hybrid Mode Antenna Feed: A Simple Alternative to the Corrugated Horn", IEEE Transactions on Antennas and Propagation, vol. AP-34, No. 1, Jan. 1986, 21-30.
Lumerical Solutions, Inc. "Waveguide Bragg Microcavity", www.lumerical.com, Sep. 2016 6 pages.
Luo, Hailu et al., "Reversed propagation dynamics of Laguerre-Gaussian beams in left-handed materials", Physical Review A 77.2, 023812., Feb. 20, 208, 1-7.
Makwana, G. D. et al., "Wideband Stacked Rectangular Dielectric Resonator Antenna at 5.2 GHz", International Journal of Electromagnetics and Applications 2012, 2(3), 2012, 41-45.
Marin, Leandro, "Optimized ECC Implementation for Secure Communication between Heterogeneous IoT Devices", www.mdpi.com/1424-8220/15/9/21478/pdf, 2015, 21478-21499.
Marrucci, Lorenzo, "Rotating light with light: Generation of helical modes of light by spin-to-orbital angular momentum conversion in inhomogeneous liquid crystals", International Congress on Optics and Optoelectronics. International Society for Optics and Photonics, 2007, 12 pages.
Marzetta, "Noncooperative Cellular Wireless with Unlimited Numbers of Base Station Antennas", IEEE Transactions on Wireless Communications, vol. 9, No. 11, Nov. 2010, 3590-3600.
Matikainen, Leena et al., "Remote sensing methods for power line corridor surveys", ISPRS Journal of Photogrammetry and Remote Sensing, 119, 2016 10-31.
McKeown, David M. et al., "Rulebased interpretation of aerial imagery", IEEE Transactions on Pattern Analysis and Machine Intelligence 5, 1985, 570-585.
Meessen, A., "Production of EM Surface Waves by Superconducting Spheres: A New Type of Harmonic Oscillators", Progress in Electromagnetics Research Symposium Proceedings, Moscow, Russia, Aug. 19-23, 2012, pp. 529-533.
Mehta,, "Advance Featuring Smart Energy Meter With Bi-Directional Communication", Electronics & Communication MEFGI, Feb. 9, 2014, 169-174.
Mena, F.P. et al., "Design and Performance of a 600720GHz SidebandSeparating Receiver Using and AIN SIS Junctions", IEEE Transactions on Microwave Theory and Techniques 59.1, 2011, 166-177.
Miller, Ashley et al., "Pathway to Ubiquitous Broadband: Environments, Policies, and Technologies to Implementation", Oct. 2016 20 pages.
Miller, David A., "Establishing Optimal Wave Communication Channels Automatically", Journal of Lightwave Technology, vol. 31, No. 24, Dec. 15, 2013, 3987-3994.
Mishra, Sumita et al., "Load Balancing Optimization in LTE/LTEA Cellular Networks: A Review", arXiv preprint arXiv:1412.7273 (2014), 2014, 1-7.

(56) References Cited

OTHER PUBLICATIONS

Mori, A. et al., "The Power Line Transmission Characteristics for an OFDM Signal", Progress in Electromagnetics Research, PIER 61, Musashi Institute of Technology, 2006, 279-290.

Mueller, G.E. et al., "Polyrod Antennas", Bell System Technical Journal, vol. 26., No. 4, Oct. 29, 1947, 837-851.

Mushref, Muhammad, "Matrix solution to electromagnetic scattering by a conducting cylinder with an eccentric metamaterial coating", www.sciencedirect.com/science/article/pii/S0022247X06011450/pdf?md5=4823be0348a3771b5cec9ffb7f326c2c&pid=1-s2.0-S0022247X06011450-main.pdf, Discloses controlling antenna radiation pattern with coatings, 2007, 356-366.

Nakano, Hisamatsu, "A Low-Profile Conical Beam Loop Antenna with an Electromagnetically Coupled Feed System", http://repo.lib.hosei.ac.jp/bitstream/10114/3835/1/31_TAP(Low-Profile).pdf, Dec. 2000, 1864-1866.

Nakano, Hisamatsu et al., "A Spiral Antenna Backed by a Conducting Plane Reflector", IEEE Transactions on Antennas and Propagation, vol. AP-34 No. 6, Jun. 1986, 791-796.

Nandi, Somen et al., "Computing for rural empowerment: enabled by last-mile telecommunications", IEEE Communications Magazine 54.6, 2016, 102-109.

Nassar, , "Local Utility Powerline Communications in the 3-500 kHz Band: Channel Impairments, Noise, and Standards", IEEE Signal Processing Magazine, 2012, 1-22.

Niedermayer, Uwe et al., "Analytic modeling, simulation and interpretation of broadband beam coupling impedance bench measurements", Nuclear Instruments and Methods in Physics Research Section A: Accelerators, Spectrometers, Detectors and Associated Equipment 776, 2015, 129-143.

Nikitin, A. Y. et al., "Efficient Coupling of Light to Graphene Plasmons by Compressing Surface Polaritons with Tapered Bulk Materials", NanoLetters; pubs.acs.org/NanoLett, Apr. 28, 2014, 2896-2901.

Nikitin, Pavel V. et al., "Propagation Model for the HVAC Duct as a Communication Channel", IEEE Transactions on Antennas and Propagation 51.5, 2003, 7 pages.

Nwclimate, "Weather Instruments and Equipment Explained", nwclimate.org, May 7, 2015, 22 pages.

Ohliger, Michael, "An introduction to coil array design for parallel MRI", http://mriquestions.com/uploads/3/4/5/7/34572113/intro_to_coil_design_parallel_.pdf, 2006, 16 pages.

Paruchuri, et al., "Securing Powerline Communication", IEEE, 2008, 64-69.

Patel, Pinak S. et al., "Sensor Fault Detection in Wireless Sensor Networks and Avoiding the Path Failure Nodes", International Journal of Industrial Electronics and Electrical Engineering, vol. 2, Issue- 3, Mar. 2014, 2347-6982.

PCT, "International Search Report", Oct. 25, 2016, 1-12.

Pike, Kevin J. et al., "A spectrometer designed for 6.7 and 14.1 T DNP-enhanced solid-state MAS NMR using quasi-optical microwave transmission", Journal of Magnetic Resonance, 2012, 9 pages.

Qi, Xue et al., "Ad hoc QoS ondemand routing (AQOR) in mobile ad hoc networks", Journal of parallel and distributed computing 63.2, 2003, 154-165.

Qiu, Lili et al., "Fault Detection, Isolation, and Diagnosis in Multihop Wireless Networks", Dec. 2003, 16 pages.

Quan, Xulin, "Analysis and Design of a Compact Dual-Band Directional Antenna", IEEE Antennas and Wireless Propagation Letters, vol. 11, 2012, 547-550.

Quinstar Technology, Inc. "Prime Focus Antenna (QRP series)", quinstar.com, Aug. 19, 2016, 2 pages.

Ranga, Yogesh et al., "An ultra-wideband quasi-planar antenna with enhanced gain", Progress in Electromagnetics Research C 49, 2014, 59-65.

Rangan, Sundeep et al., "Millimeter-Wave Cellular Wireless Networks: Potentials and Challenges", Proceedings of the IEEE, vol. 102, No. 3, Mar. 2014, 366-385.

Rangel, Rodrigo K. et al., "Sistema de Inspecao de Linhas de Transmissao de Energia Electrica Utilizando Veiculos Aereos Nao-Tripulados", Sep. 14-16, 2009, 1-9.

Rekimoto, Jun , "SmartSkin: An Infrastructure for Freehand Manipulation on Interactive Surfaces", https://vs.inf.ethz.ch/edu/SS2005/DS/papers/surfaces/rekimoto-smartskin.pdf, 2002, 8 pages.

Ren-Bin, Zhong et al., "Surface plasmon wave propagation along single metal wire", Chin. Phys. B, vol. 21, No. 11, May 2, 2012, 9 pages.

Ricardi, L. J., "Some Characteristics of a Communication Satellite Multiple-Beam Antenna", Massachusetts Institute of Technology, Lincoln Laboratory, Technical Note 1975-3, Jan. 28, 1975, 62 pages.

Rieke, M. et al., "High-Precision Positioning and Real-Time Data Processing of UAV Systems", International Archives of the Photogrammetry, Remote Sensing and Spatial Information Sciences, vol. XXXVIII-1/C22, 2011, 119-124.

Robinson, D.A. et al., "Advancing processbased watershed hydrological research using nearsurface geophysics: A vision for, and review of, electrical and magnetic geophysical methods", Hydrological Processes 22.18, Mar. 11, 2008, 3604-3635.

Robles, Rosslin John et al., "A Review on Security in Smart Home Development", International Journal of Advanced Science and Technology 15, Feb. 2010, 13-22.

Rosenberg, Uwe et al., "A novel frequency-selective power combiner/divider in single-layer substrate integrated waveguide technology", IEEE Microwave and Wireless Components Letters, vol. 23, No. 8, Aug. 2013, 406-408.

Rousstia, M. W., "Switched-beam antenna array design for millimeter-wave applications", https://pure.tue.nl/ws/files/4418145/599448877400424.pdf, Jan. 1, 2011, 148 pages.

Sahoo, Srikanta, "Faulty Node Detection in Wireless Sensor Networks Using Cluster", Apr. 2013, 212-223.

Scerri, Paul et al., "Geolocation of RF emitters by many UAVs", AIAA Infotech, Aerospace 2007 Conference and Exhibit, 2007, 1-13.

Schoning, Johannes et al., "Multi-Touch Surfaces: A Technical Guide", Johannes Schöning, Institute for Geoinformatics University of Munster, Technical Report TUM-I0833, 2008, 19 pages.

Sembiring, Krisantus, "Dynamic Resource Allocation for Cloud-based Media Processing", http://www.chinacloud.cn/upload/2013-04/13042109511919.pdf, 2013, 49-54.

Sharma, Archana et al., "Dielectric Resonator Antenna for X band Microwave Application", Research & Reviews, International Journal of Advanced Research in Electrical, Electronics and Instrumentation Engineering, Oct. 2016, 9 pages.

Shila, Devu M., "Load-Aware Traffic Engineering for Mesh Networks", Computer Communications 31.7, 2008, 1460-1469.

Shin, Donghoon et al., "10 Gbps Millimeter-Wave OFDM Experimental System with Iterative Phase Noise Compensation", Tokyo Institute of Technology, IEEE, 2013, 184-186.

Silvonen, Kimmo, "Calibration and DeEmbedding of Microwave Measurements Using Any Combination of Oneor TwoPort Standards", Publication of the Circuit Theory Laboratory, CT4, 1987, 1-28.

Simionovici, Ana-Maria et al., "Predictive Modeling in a VoIP System", 2013, 32-40.

Simons, Rainee N., "Coplanar Waveguide Feeds for Phased Array Antennas", Solid State Technology Branch of NASA Lewis Research Center Fourth Annual Digest, Conference on Advanced Space Exploration Initiative Technologies cosponsored by AIAA, NASA and OAI, 1992, 1-9.

Singh, Sapana et al., "Key Concepts and Network Architecture for 5G Mobile Technology", International Journal of Scientific Research Engineering & Technology (IJSRET), IIMT Engineering College, Meerut, India, vol. 1, Issue 5, Aug. 2012, 165-170.

Singh, Seema M. et al., "Broadband Over Power Lines a White Paper", State of New Jersey, Division of the Ratepayer Advocate, NJ, Oct. 2016, 67 pages.

Song, Kaijun et al., "Broadband radial waveguide power amplifier using a spatial power combining technique", www.mtech.edu/academics/mines/geophysical/xzhou/publications/songfanzhou_2009b_impa.pdf, 2009, 7 pages.

(56) References Cited

OTHER PUBLICATIONS

Sospedra, Joaquim et al., "Badalona Oil PierBased Met-Ocean Monitoring Station", Campbell Scientific, www.campbellsci.com, Nov. 2016 2 pages.
Souryal, Michael R. et al., "Rapidly Deployable Mesh Network Testbed", https://pdfs.semanticscholar.org/f914/1ce6999c4095eab3bdea645745761ebe5141.pdf, 2009, 6 pages.
Sowmya, Arcot et al., "Modelling and representation issues in automated feature extraction from aerial and satellite images", ISPRS journal of photogrammetry and remote sensing, 55.1, 2000, 34-47.
Stancil, Daniel D. et al., "High-speed internet access via HVAC ducts: a new approach", Global Telecommunications Conference, IEEE vol. 6, 2001, 4 pages.
Sun, Zhi et al., "Magnetic Induction Communications for Wireless Underground Sensor Networks", IEEE Transactions on Antennas and Propagation, vol. 58, No. 7, Jul. 2010, 2426-2435.
Sundqvist, Lassi, "Cellular Controlled Drone Experiment: Evaluation of Network Requirements", 2015, 71 pages.
Szczys, Mike, "Cameras Perch on Power Lines, Steal Electricity", http://hackaday.com/2010/06/28/cameras-perch-on-power-lines-steal-electricity/, Discloses cameras that clamp on to power lines and use induction as a power source., 2010, 1 page.
Tantawi, Sami G. et al., "High-power multimode X-band rf pulse compression system for future linear colliders", Physical Review Special Topics-Accelerators and Beams, 1098-4402/05/8(4)/042002, 2005, 19 pages.
Teng, Ervin et al., "Aerial Sensing and Characterization of ThreeDimensional RF Fields", Univ. at Buffalo, cse.buffalo.edu, Sep. 2016 6 pages.
Tesoriero, Ricardo et al., "Tracking autonomous entities using RFID technology", IEEE Transactions on Consumer Electronics 55.2, 2009, 650-655.
Thota, Saigopal et al., "Computing for Rural Empowerment: Enabled by Last-Mile Telecommunications (Extended Version)", Technical Report, 2013, 14 pages.
Thottapan, M., "Design and simulation of metal PBG waveguide mode launcher", www.researchgate.net/profile/Dr_M_Thottappan/publication/262415753_Design_and_Simulation_of_Metal_PBG_Waveguide_Mode_Launcher/links/0f317537ad93a5e2a4000000.pdf, 2014, 383-387.
Tillack, M. S. et al., "Configuration and engineering design of the ARIES-RS tokamak power plant", https://www.researchgate.net/publication/222496003_Configuration_and_engineering_design_of_the_ARIES-RS_tokamak_power_plant, 1997, 87-113.
Tucson Electric Power, "Energy-Harvesting Power Supply", http://sdpm.arizona.edu/projects/project-publi/upid/38a8cf3b42f35576de25de1f6dcc20f3, Discloses a project to harvest energy from a power line and that a device was built that clamps onto a power line., 2016 1 page.
UK Essays, "Beam Adaptive Algorithms for Smart Antennas Computer Science Essay", www.ukessays.com, Mar. 23, 2015, 21 pages.
Van Atta, L.C., "Contributions to the antenna field during World War II", www.nonstopsystems.com/radio/pdf-hell/article-IRE-5-1962.pdf, 1962, 692-697.
Wade, Paul, "Multiple Reflector Dish Antennas", www.w1ghz.org/antbook/conf/Multiple_reflector_antennas.pdf, 2004, 45 pages.
Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.
Wang, Wei, "Optimization Design of an Inductive Energy Harvesting Device for Wireless Power Supply System Overhead High-Voltage Power Lines", https://pdfs.semanticscholar.org/3941/601af7a21d55e8b57ab0c50d5f1d9 f9f6868.pdf, Discloses an induction based energy harvesting device that takes energy from overhead powerlines (Figure 4)., 2016 16 pages.
Wang, Xingfu et al., "Zigzag coverage scheme algorithm & analysis for wireless sensor networks", Network Protocols and Algorithms 5.4, 2013, 19-38.
Washiro, Takanori, "Applications of RFID over power line for Smart Grid", Power Line Communications and Its Applications (ISPLC), 2012 16th IEEE International Symposium on. IEEE, 2012, 83-87.
Wenger, N., "The launching of surface waves on an axial-cylindrical reactive surface", IEEE Transactions on Antennas and Propagation 13.1, 1965, 126-134.
Werner, Louis B. et al., "Operation Greenhouse", Scientific Director's Report of Atomic Weapon Tests at Eniwetok, Annex 6.7 Contimation-Decontamination Studies Naval Radiological Defense Lab, 1951, 209 pages.
Wikipedia, "Angular Momentum of Light", https://en.wikipedia.org/wiki/Angular_momentum_of_light, Nov. 10, 2016, 1-7.
Wilkes, Gilbert, "Wave Length Lenses", Dec. 5, 1946, 49 pages.
Wolfe, Victor et al., "Feasibility Study of Utilizing 4G LTE Signals in Combination With Unmanned Aerial Vehicles for the Purpose of Search and Rescue of Avalanche Victims (Increment 1)", University of Colorado at Boulder, Research Report, 2014, 26 pages.
Won Jung, Chang et al., "Reconfigurable Scan-Beam Single-Arm Spiral Antenna Integrated With RF-MEMS Switches", IEEE Transactions on Antennas and Propagation, vol. 54, No. 2, Feb. 2006, 455-463.
Woodford, Chris, "How do touchscreens work?", www.explainthatstuff.com/touchscreens.html, Aug. 23, 2016 8 pages.
Xiao, Shiyi et al., "Spin-dependent optics with metasurfaces", Nanophotonics 6.1, 215-234., 2016 215-234.
Yeh, C. et al., "Thin-Ribbon Tapered Coupler for Dielectric Waveguides", May 15, 1994, 42-48.
Zhang, "Modified Tapered Slot-line Antennas for Special Applications", REV Journal on Electronics and Communications, vol. 2, Jul.-Dec. 2012, 106-112.
Zhang, Ming et al., "PlanetSeer: Internet Path Failure Monitoring and Characterization in Wide Area Services", OSDI, vol. 4, 2004, 33 pages.
Alam, M N et al., "Novel surface wave exciters for power line fault detection and communications", Antennas and Propagation (APSUSRI), 2011 IEEE International Symposium on, IEEE, Jul. 3, 2011 (Jul. 3, 2011). pp. 1139-1142.
Doelitzscher, et al., "ViteraaS: Virtual cluster as a service." Cloud Computing Technology and Science (CloudCom), 2011 IEEE Third International Conference on. IEEE, 2011.
Golrezaei, Negin et al., "FemtoCaching: Wireless Video Content Delivery through Distributed Caching Helpers", INFOCOM, 2012 Proceedings IEEE.
Gritzalis, Dimitris et al., "The Sphinx enigma in critical VoIP infrastructures: Human or botnet?." Information, Intelligence, Systems and Applications (IISA), 2013 Fourth International Conference, IEEE, 2013.
Hautakorpi, Jani et al., "Requirements from Session Initiation Protocol (SIP) Session Border Control (SBC) Deployments." RFC5853, IETF (2010).
Hawrylyshen, A. et al., "Sipping Working Group J. Hautakorpi, Ed. Internet-Draft G. Camarillo Intended status: Informational Ericsson Expires: Dec. 18, 2008 R. Penfield Acme Packet." (2008).
Jin, Yu et al., "NEVERMIND, the Problem Is Already Fixed: Proactively Detecting and Troubleshooting Customer DSL Problems", ACM CoNEXT, Philadelphia, USA, Nov.-Dec. 2010, 12 pages.
Kamilaris, et al., "Exploring the Use of DNS as a Search Engine for the Web of Things." Internet of Things (WF-loT), 2014 IEEE World Forum on. IEEE, 2014.
Mokhtarian, Kianoosh et al., "Caching in Video CDNs: Building Strong Lines of Defense", EuroSys 2014, Apr. 13-16, 2014, Amsterdam, Netherlands.
Paul, Sanjoy et al., "The Cache-and-Forward Network Architecture for Efficient Mobile Content Delivery Services in the Future Internet", Innovations in NGN: Future Network and Services, 2008. K-INGN 2008. First ITU-T Kaleidoscope Academic Conference.
International Search Report and Written Opinion in PCT/US2016/028417, mailed Jul. 5, 2016, 13 pages, Authorized officer Brigitte Bettiol.
PCT/US16/027397 International Search Report & Written Opinion mailed Jun. 24, 2016.

(56) References Cited

OTHER PUBLICATIONS

PCT/US16/027398 International Search Report and Written Opinion mailed Jun. 24, 2016.
PCT/US16/027403 Internatioanl Search Report & Written Opinion mailed Jun. 22, 2016.
PCT/US16/028395 International Search Report and Written Opinion mailed Jun. 29, 2016.
PCT/US16/032441 International Search Report and Written Opinion mailed Jul. 29, 2016.
PCT/US16/036388 International Search Report and Written Opinion mailed Aug. 30, 2016.
PCT/US2016/036285 International Search Report and Written Opinion mailed Aug. 23, 2016.
PCT/US2016/036290 International Search Report & Written Opinion mailed Aug. 11, 2016.
"Boost: The world's first WI-FI extending led bulb," Sengled, sengled.com, http://www.sengled.com/sites/default/files/field/product/downloads/manual/a01-a60__na__user__manual.pdf, Dec. 2014.
"Examples of Cell Antennas," RF Check®, rfcheck.com, https://web.archive.org/web/20100201214318/http://www.rfcheck.com/Examplesof-Cell-Antennas.php, Feb. 1, 2010.
"Flashing Light : IR.Lamp," Beninca®, beninca.com, http://www.beninca.com/en/news/2015/02/23/lampeggiante-irlamp.html, Feb. 23, 2015.
"Integrated Radio Masts Fully camouflaged Outdoor-Wi-Fi APs in GRP-lamp poles," Brown-iposs, brown-iposs.com., Mar. 21, 2014.
"New Wi-Fi antenna enhances wireless coverage," ScienceDaily®, sciencedaily.com., Apr. 29, 2015.
"24 Volt D.C Flashing Light With Built-in Antenna 433Mhz, DEA+ Product Guide" Meteor electrical, meteorelectrical.com, Code: LUMY/24A., Jul. 28, 2010.
"7785-1167-WO International Search Report and Written Opinion", PCT/US2016/030964, Aug. 4, 2016.
"A Dielectric Lens Antenna with Enhanced Aperture Efficiency for Industrial Radar Applications", Computer Simulation Technology, cst.com, May 10, 2011.
"Alternative Local Loop Technologies: A Review", Organisation for Economic Co-Operation and Development, Paris, OCDE/GD(96)181, https://www.oecd.org/sti/2090965.pdf, 1996.
"Bi-Axial PA Horn with Gimbal Mount", Atlas Sound, MCM Electronics, mcmelectronics.com, MCM Part #555-13580., 2011.
"Broadband Negligible Loss Metamaterials", Computer Electmagnetics and Antennas Research Laboratory, cearl.ee.psu.edu., May 15, 2012.
"Broadband: Bringing Home the Bits: Chapter 4 Technology Options and Economic Factors", The National Academies Press, nap.edu, 2002.
"Cloud Management", Cisco Meraki, cisco.com., Sep. 11, 2015.
"Decryption: Identify & Control Encrypted Traffic", Palo Alto Networks, paloaltonetworks.com, Mar. 7, 2011.
"Delivering broadband over existing wiring", Cabling Installation & Maintenance, cablinginstall.com, May 1, 2002.
"GM-12 Gimbal Mount", Newmark System, Inc, newmarksystems.com., 2015.
"HiveManager Network Management System", Aerohive® Networks, aerohive.com., Sep. 2015.
"Home", Darktrace, darktrace.com, Jul. 10, 2014.
"IEEE Standard for Information technology—Local and metropolitan area networks—Specific requirements", Part 15.4: Wireless Medium Access Control (MAC) and Physical Layer (PHY) Specifications for Low Rate Wireless Personal Area Networks (WPANs), in IEEE Std 802.15.4, (Revision of IEEE Std 802.15.4-2003), Sep. 7, 2006, 1-320.
"Installing Satellite Accessories", ACE®, acehardware.com., May 8, 2006.
"International Preliminary Report on Patentability", PCT/US2014/039746, Dec. 10, 2015.
"International Preliminary Report on Patentability", PCT/US2014/060841, May 19, 2016, 8 pages.
"International Preliminary Report on Patentability & Written Opinion", PCT/US2014/061445, Jun. 23, 2016, 9 pages.
"International Search Report & Written Opinion", PCT/US2015/034827, Sep. 30, 2015.
"International Search Report & Written Opinion", PCT/US2015/056316, Jan. 21, 2016.
"International Search Report & Written Opinion", PCT/US2015/056320, Jan. 29, 2016.
"International Search Report & Written Opinion", PCT/US2015/056365, Jan. 22, 2016.
"International Search Report & Written Opinion", PCT/US2015/056368, Jan. 25, 2016.
"International Search Report & Written Opinion", PCT/US2015/056598, Jan. 28, 2016.
"International Search Report & Written Opinion", PCT/US2015/056615, Jan. 21, 2016.
"International Search Report & Written Opinion", PCT/US2015/056626, Jan. 21, 2016.
"International Search Report & Written Opinion", PCT/US2015/056632, Jan. 26, 2016.
"International Search Report & Written Opinion", PCT/US2016/013988, Apr. 8, 2016.
"International Search Report & Written Opinion", PCT/US2016/020001, May 23, 2016.
"International Search Report & Written Opinion", PCT/US2016/026860, Jun. 1, 2016.
"International Search Report & Written Opinion", PCT/US2016/026318, Jun. 15, 2016.
"International Search Report & Written Opinion", PCT/US2016/028412, Jun. 27, 2016.
"International Search Report & Written Opinion", PCT/US2016/028206, Jun. 29, 2016.
"International Search Report & Written Opinion", PCT/US16/033182, Jul. 12, 2016.
"International Search Report & Written Opinion", PCT/US2016/036551, Aug. 11, 2016.
"International Search Report & Written Opinion", PCT/US2016/036798, Aug. 11, 2016.
"International Search Report & Written Opinion", PCT/US2016/028205, Aug. 16, 2016.
"International Search Report & Written Opinion", PCT/US2016/032460, Aug. 17, 2016.
"International Search Report & Written Opinion", PCT/US2014/039746, Jan. 12, 2015.
"International Search Report & Written Opinion", PCT/US2014/060841, Jan. 7, 2015.
"International Search Report & Written Opinion", PCT/US2015/039848, Oct. 20, 2015.
"International Search Report & Written Opinion", PCT/US2015/047315, Oct. 30, 2015.
"International Search Report & Written Opinion", PCT/US2015/048454, Nov. 11, 2015.
"International Search Report & Written Opinion", PCT/US2015/049928, Nov. 16, 2015.
"International Search Report & Written Opinion", PCT/US2015/049932, Nov. 16, 2015.
"International Search Report & Written Opinion", PCT/US2015/049927, Nov. 24, 2015.
"International Search Report & Written Opinion", PCT/US2015/051193, Nov. 27, 2015.
"International Search Report & Written Opinion", PCT/US2015/051146, Dec. 15, 2015.
"International Search Report & Written Opinion", PCT/US2015/051183, Dec. 15, 2015.
"International Search Report & Written Opinion", PCT/US2015/051194, Dec. 15, 2015.
"International Search Report & Written Opinion", PCT/US2015/051578, Dec. 17, 2015.
"International Search Report & Written Opinion", PCT/US2015/051583, Dec. 21, 2015.
"International Search Report & Written Opinion", PCT/US2015/048458, Dec. 23, 2015.

(56) References Cited

OTHER PUBLICATIONS

"International Search Report & Written Opinion", PCT/US2015/051213, Dec. 4, 2015.
"International Search Report & Written Opinion", PCT/US2015/051163, Dec. 7, 2015.
"International Search Report & Written Opinion", PCT/US2014/061445, Feb. 10, 2015.
"International Search Report & Written Opinion", PCT/US16/28207, Jun. 15, 2016.
"International Search Report & Written Opinion", PCT/US2016/015501, Apr. 29, 2016, 11 pages.
"International Search Report & Written Opinion", PCT/US2015/047225, mailed Nov. 6, 2015, Nov. 6, 2015.
"International Search Report and Written Opinion", PCT/US2016/028197, Jun. 24, 2016.
"Invitation to Pay Additional Fees & Partial Search Report", PCT/US2016/028205, Jun. 22, 2016.
"Invitation to Pay Additional Fees & Partial Search Report", PCT/US2016/032430, Jun. 22, 2016.
"mmWave Axial Choke Horn Antenna with Lens", Feko, Sep. 24, 2013.
"Norse Appliance™: Block attacks before they target your network, and dramatically improve the ROI on your entire security infrastructure", norsecorp.com, 2015.
"Out-of-Band Mgmt", Cradle Point, cradlepoint.com., Sep. 2015.
"Out-of-Band Security Solution", Gigamon®, gigamon.com., Aug. 3, 2014.
"PCT International Search Report & Written Opinion", PCT/US2016/026193, Jun. 1, 2016.
"PRO 600 Sirius XM Radio Amplified Outdoor Antenna", Pixel Technologies, Oct. 3, 2014.
"Product Overview: Introducing SilentDefense", Security Matters, secmatters.com, Nov. 9, 2013.
"Quickly identify malicious traffics: Detect", Lancope®, lancope.com, Mar. 15, 2015.
"radar at st Andrews", mmwaves.epr, st-andrews.ac.uk., Feb. 4, 2011.
"Smart Out-Of-Band Management", Open Gear, opengear.com., Sep. 2015.
"Transducer", IEEE Std 100-2000, Sep. 21, 2015, 1154.
"Troubleshooting Problems Affecting Radio Frequency Communication", cisco.com, Oct. 19, 2009.
Alam, MD N. et al., "Design and Application of Surface Wave Sensors for nonintrusive Power Line Fault Detection," IEEE Sensors Journal, IEEE Service Center, New York, NY, US, vol. 13, No. 1, pp. 339-347, Jan. 1, 2013.
Bing, Benny , "Ubiquitous Broadband Access Networks with Peer-to-Peer Application Support", Evolving the Access Network: 27-36, 2006.
Chandra, Shekar , "Transmission Line Fault Detection & Indication through GSM", IRD India, ISSN (Online): 2347-2812, vol. 2, Iss. 5, 2014.
Choudhury, Romit R. , "Utilizing Beamforming Antennas for Wireless Mult-hop Networks", www.slideserve.com, Sep. 20, 2012.
Chu, Eunmi et al., Self-organizing and self-healing mechanisms in cooperative small cell networks. PIMRC. 2013.
Costantine, Joseph et al., "The analysis of a reconfigurable antenna with a rotating feed using graph models", Antennas and Wireless Propagation Letters 8: 943-946, 2009.
Dini, Gianluca et al., "MADAM: A Multilevel Anomaly Detector for Android Malware", MMMACNS. vol. 12, 2012.
Dooley, Kevin , "Out-of-Band Management", auvik, auvik.com., Apr. 12, 2014.
Doshi, D.A. et al., "Real Time Fault Failure Detection in Power Distribution Line using Power Line Communication", International Journal of Engineering Science 4834, 2016.
Ehyaie, Danial , "Novel Approaches to the Design of Phased Array Antennas," Diss. The University of Michigan., 2011.
Feng, Wei et al., Downlink power allocation for distributed antenna systems in a multi-cell environment. 2009 5th International Conference on Wireless Communications, Networking and Mobile Computing. IEEE, 2009., 2009.
Ford, Steven , AT&T's new antenna system will boost cellular coverage at Walt Disney World. Orlando Sentinel, orlandosentinel.com, Mar. 9, 2014., 2014.
Friedman, M et al., "Low-loss RF transport over long distances," IEEE Transactions on Microwave Theory and Techniques, Jan. 1, 2001, pp. 341-348.
Friedman, M et al., "Low-Loss RF Transport Over Long Distances", IEEE Transactions on Microwave Theory and Techniques, vol. 49, No. 2, Feb. 2001, 8 pages.
Garcia-Etxarri, Aitzol et al., "A combination of concave/convex surfaces for fieldenhancement optimization: the indented nanocone", Optics express 20.23, 2012, 2520125212.
Goldsmith, P.F. , "Quasi-optical techniques", Proceedings of the IEEE., vol . 80, No. 11, Nov. 1, 1992.
Haider, Muhammad Kumail et al., Mobility resilience and overhead constrained adaptation in directional 60 GHz WLANs: protocol design and system implementation. Proceedings of the 17th ACM International Symposium on Mobile Ad Hoc Networking and Computing. ACM, 2016., 2016.
Katkovnik, Vladimir et al., "High-resolution signal processing for a switch antenna array FMCW radar with a single channel receiver", Sensor Array and Multichannel Signal Processing Workshop Proceedings, IEEE., 2002.
Kumar, Sailesh , "Survey of Current Network Intrusion Detection Techniques", Washington Univ. in St. Louis, Dec. 2007.
Laforte, J.L. et al., "State-of-the-art on power line de-icing", Atmospheric Research 46, 143-158, 1998.
Li, Xi et al., a FCM-Based peer grouping scheme for node failure recovery in wireless P2P file sharing. 2009 IEEE International Conference on Communications. IEEE, 2009., 2009.
Liu, et al., A 25 Gb/s (/km 2) urban wireless network beyond IMTadvanced. IEEE Communications Magazine 49.2 (2011): 122-129.
Lucyszyn, S. et al., "Novel RF MEMS Switches", Microwave Conference, APMC, Asia-Pacific. IEEE, 2007.
Lucyszyn, Stepan et al., "RF MEMS for antenna applications", Antennas and Propagation (EuCAP), 7th European Conference on. IEEE 2013.
Matsukawa, et al., A dynamic channel assignment scheme for distributed antenna networks. Vehicular Technology Conference (VTC Spring), 2012 IEEE 75th. IEEE, 2012.
Nicholson, Basil J. , "Microwave Rotary Joints for X-, C-, and S-band", Battelle Memorial Inst Columbus OH, 1965.
Orfanidis, Sophocles J. , "Electromagnetic waves and antennas," Rutgers University., 2002.
Pato, et al., On building a distributed antenna system with joint signal processing for next generation wireless access networks: The FUTON approach. 7th Conference on Telecommunications, Portugal. 2008.
Piksa, Petr et al., "Elliptic and hyperbolic dielectric lens antennas in mmwaves", Radioengineering 20.1, 2011, 271.
Ponchak, George E. et al., "A New Model for Broadband Waveguide to Microstrip Transition Design", NASA TM-88905, Dec. 1, 1986, 18 pgs.
Pranonsatit, S. et al., "Sectorised horn antenna array using an RF MEMS rotary switch", Asia-Pacific Microwave Conf., APMC., 2010.
Pranonsatit, Suneat et al., "Single-pole eight-throw RF MEMS rotary switch", Microelectromechanical Systems, Journal of 15.6: 1735-1744, 2006.
Scarfone, Karen et al., "Technical Guide to Information Security Testing and Assessment", National Institute of Standards and Technology, csrc.nist.gov, Special Publication, Sep. 2008, 800-115.
Shafai, Lotfollah , "Dielectric Loaded Antennas", John Wiley & Sons, Inc., http://www.researchgate.net/publication/227998803_Dielectric_Loaded_Antennas, Apr. 15, 2005.
Shankland, Steven , "Lowly DSL poised for gigabit speed boost", C|Net, cnet.com, Oct. 21, 2014.

(56) References Cited

OTHER PUBLICATIONS

Sievenpiper, D.F. et al., "Two-dimensional beam steering using an electrically tunable impedance surface," in Antennas and Propagation, IEEE Transactions on , vol. 51, No. 10, pp. 2713-2722., Oct. 2003.
Silver, Ralph U. , "Local Loop Overview", National Communications System (NCS), BellSouth Network Training, newnetworks.com, Aug. 2016.
Strahler, Olivier , "Network Based VPNs", SANS Institute InfoSec Reading Room, sans.org., Aug. 2002.
Talbot, David , "Adapting Old-Style Phone Wires for Superfast Internet", Adapting Old-Style Phone Wires for Superfast Internet, Jul. 30, 2013.
Thornton, John et al., "Modern lens antennas for communications engineering", vol. 39, 2013.
Wolff, Christian , "Phased Array Antenna" Radar Tutorial, web.archive.org, radartutorial.eu, Oct. 21, 2014.
Wu, Xidong et al., "Design and characterization of singleand multiplebeam mmwave circularly polarized substrate lens antennas for wireless communications", Microwave Theory and Techniques, IEEE Transactions on 49.3, 2001, 431-441.
Xi, Liu Xiao , "Security services in SoftLayer", Sep. 21, 2015.
Yilmaz, et al., Self-optimization of coverage and capacity in LTE using adaptive antenna systems. Diss. Aalto University, 2010.
"A New Approach to Outdoor DAS Network Physical Layer Using E-Line Technology", Corridor Systems, Mar. 2011, 5 pages.
"Cisco IP VSAT Satellite WAN Network Module for Cisco Integrated Services Routers", http://www.cisco.com/c/en/us/products/collateral/interfaces-modules/ip-vsatsatellite-wan-module/product_data_sheet0900aecd804bbf6f.html, Jul. 23, 2014.
"Exacter Outage-Avoidance System", http://www.epri.com/abstracts/Pages/ProductAbstract.aspx?ProductId=0 00000000001020393, Nov. 30, 2009.
"Ipitek All-Optical Sensors", http://www.ipitek.com/solutions-by-industry/all-optical-sensors; Jun. 2, 2014.
"RF Sensor Node Development Platform for 6LoWPAN and 2.4 GHz Applications", http://www.ti.com/tool/TIDM-RF-SENSORNODE, Jun. 2, 2014.
"Wireless powerline sensor", wikipedia.org, http://en.wikipedia.org/wiki/Wireless_powerline_sensor, 2014, 3 pages.
Bach, Christian , "Current Sensor—Power Line Monitoring for Energy Demand Control", Application Note 308, http://www.enocean.com/fileadmin/redaktion/pdf/app_notes/AN308_CURRENT_SENSOR_Jan09.pdf, Jan. 2009, 4 pages.
Chiba, Jiro , "Experimental Studies of the Losses and Radiations Due to Bends in the Goubau Line", IEEE Transactions on Microwave Theory and Techniques, Feb. 1977, 94-100.
Chiba, Jiro , "On the Equivalent Circuit for the G-Line Above Ground", International Wroclaw Symposium on Electromagnetic Compatibility, 1998, 78-82.
Elmore, Glenn , "Introduction to the Propagating Wave on a Single Conductor", www.corridor.biz, Jul. 27, 2009, 30 pages.
Friedman, M. et al., "Low-Loss RF Transport Over Long Distances", IEEE Transactions on Microwave Theory an Techniques, vol. 49, No. 2, Feb. 2001, 341-348.
Izumiyama, Hidetaka et al., "Multicast over satellite", Applications and the Internet, 2002.(SAINT 2002). Proceedings. 2002 Symposium on. IEEE, 2002.
Jawhar, Imad et al., "A hierarchical and topological classification of linear sensor networks", Wireless Telecommunications Symposium, WTS, IEEE, http://faculty.uaeu.ac.ae/Nader_M/papers/WTS2009.pdf, 2009, 8 pages.
Jee, George et al., "Demonstration of the Technical Viability of PLC Systems on Medium- and Low-Voltage Lines in the United States", Broadband is Power: Internet Access Via Power Line Networks, IEEE Communication Magazine, May 2003, 5 pages.
Kuhn, Marc et al., "Power Line Enhanced Cooperative Wireless Communications", IEEE Journal on Selected Areas in Communications, vol. 24, No. 7, Jul. 2006, 10 pages.
Patel, Shwetak N. et al., "The Design and Evaluation of an End-User-Deployable, Whole House, Contactless Power Consumption Sensor", CHI 2010: Domestic Life, Apr. 2010, 10 pages.
Rappaport, Theodore S. et al., "Mobile's Millimeter-Wave Makeover", Spectrum.IEEE.Org; Sep. 2014.
Sagar, Nishant , "Powerline Communications Systems: Overview and Analysis", Thesis, May 2011, 80 pages.
Sarafi, Angeliki M. et al., "Hybrid Wireless-Broadband over Power Lines: A Promising Broadband Solution in Rural Areas", IEEE Communications Magazine, Nov. 2009, 8 pages.
Sommerfeld, A. , "On the propagation of electrodynamic waves along a wire", Annals of Physics and Chemistry New Edition, vol. 67, No. 2, 1899, 72 pages.
Yang, , "Power Line Sensor Networks for Enhancing Power Line Reliability and Utilization", Georgia Institute of Technology, https://smartech.gatech.edu/bitstream/handle/1853/41087/Yang_Yi_201108_phd.pdf, Apr. 26, 2011, 264 pages.
Yang, et al., "Power line sensornet—a new concept for power grid monitoring", IEEE Power Engineering Society General Meeting, 2006, pp. 8.
Zhao, et al., "Energy harvesting for a wireless-monitoring system of overhead high-voltage power lines", IET Generation, Transmission & Distribution 7, IEEE Xplore Abstract, 2013, 2 pages.

\* cited by examiner

1950

APPARATUS FOR CONTROLLING OPERATIONS OF A COMMUNICATION DEVICE AND METHODS THEREOF

FIELD OF THE DISCLOSURE

The subject disclosure relates to an apparatus for controlling operations of a communication device and methods thereof.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

BRIEF DESCRIPTION OF THE DRAWINGS

Reference will now be made to the accompanying drawings, which are not necessarily drawn to scale, and wherein.

DETAILED DESCRIPTION

Figure 1:
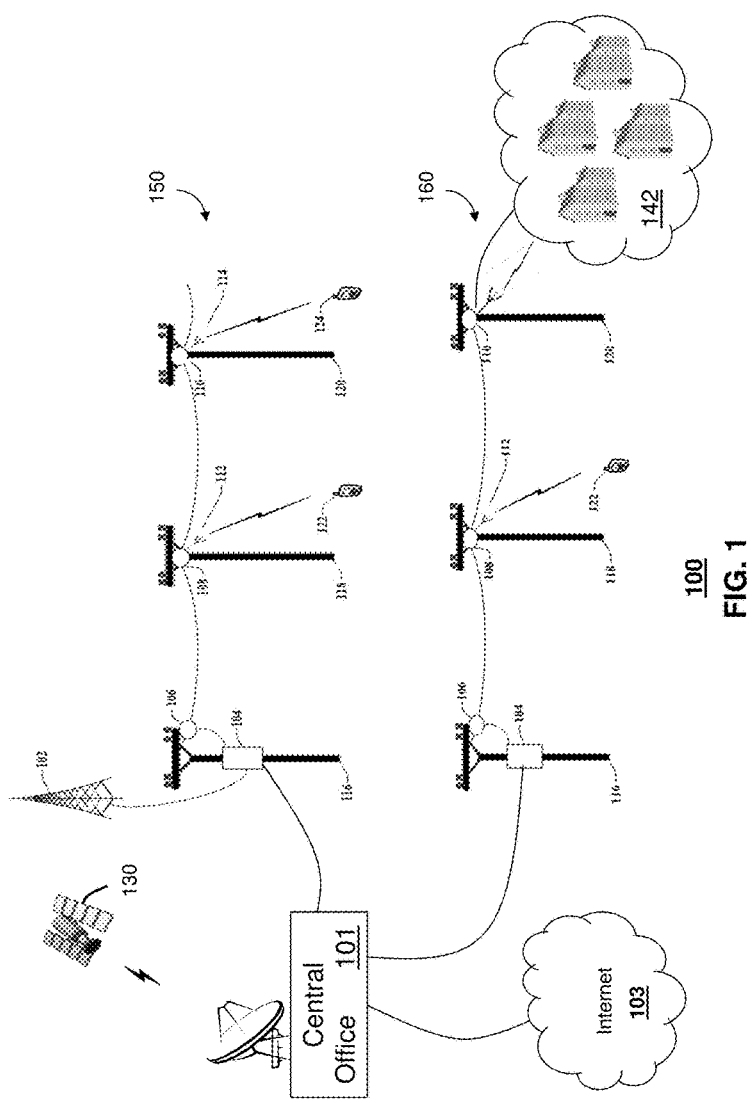
FIG. 1 is a block diagram illustrating an example, non-limiting embodiment of a guided wave communications system in accordance with various aspects described herein.

One or more embodiments are now described with reference to the drawings, wherein like reference numerals are used to refer to like elements throughout. In the following description, for purposes of explanation, numerous details are set forth in order to provide a thorough understanding of the various embodiments. It is evident, however, that the various embodiments can be practiced without these details (and without applying to any particular networked environment or standard).

To provide network connectivity to additional base station devices, the backhaul network that links the communication cells (e.g., microcells and macrocells) to network devices of the core network correspondingly expands. Similarly, to provide network connectivity to a distributed antenna system, an extended communication system that links base station devices and their distributed antennas is desirable. A guided wave communication system can be provided to enable alternative, increased or additional network connectivity and a waveguide coupling system can be provided to transmit and/or receive guided wave (e.g., surface wave) communications on a wire, such as a wire that operates as a single-wire transmission line (e.g., a utility line), that operates as a waveguide and/or that otherwise operates to guide the transmission of an electromagnetic wave.

In an embodiment, a waveguide coupler that is utilized in a waveguide coupling system can be made of a dielectric material, or other low-loss insulator (e.g., Teflon, polyethylene and etc.), or even be made of a conducting (e.g., metallic, non-metallic, etc.) material, or any combination of the foregoing materials. Reference throughout the detailed description to "dielectric waveguide" is for illustration purposes and does not limit embodiments to being constructed solely of dielectric materials. In other embodiments, other dielectric or insulating materials are possible. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including wire bundles, cables, rods, rails, pipes; non-conductors such as dielectric pipes, rods, rails, or other dielectric members; combinations of conductors and dielectric materials; or other guided wave transmission media.

For these and/or other considerations, in one or more embodiments, an apparatus comprises a waveguide that facilitates propagation of a first electromagnetic wave at least in part on a waveguide surface, wherein the waveguide surface does not surround in whole or in substantial part a wire surface of a wire, and, in response to the waveguide being positioned with respect to the wire, the first electromagnetic wave couples at least in part to the wire surface and travels at least partially around the wire surface as a second electromagnetic wave, and wherein the second electromagnetic wave has at least one wave propagation mode for propagating longitudinally along the wire.

In another embodiment, an apparatus comprises a waveguide that has a waveguide surface that defines a cross sectional area of the waveguide wherein a wire is positioned outside of the cross-sectional area of the waveguide such that a first electromagnetic wave, traveling along the wire at least in part on the wire surface, couples at least in part to the waveguide surface and travels at least partially around the waveguide surface as a second electromagnetic wave.

In an embodiment, a method comprises emitting, by a transmission device, a first electromagnetic wave that propagates at least in part on a waveguide surface of a waveguide, wherein the waveguide is not coaxially aligned with a wire. The method can also include configuring the waveguide in proximity of the wire to facilitate coupling of at least a part of the first electromagnetic wave to a wire surface, forming a second electromagnetic wave that propagates longitudinally along the wire and at least partially around the wire surface.

In another embodiment, an apparatus comprises, in one or more embodiments, a waveguide having a slot formed by opposing slot surfaces that are non-parallel, wherein the opposing slot surfaces are separated by a distance that enables insertion of a wire in the slot, wherein the waveguide facilitates propagation of a first electromagnetic wave at least in part on a waveguide surface, and, in response to the waveguide being positioned with respect to the wire, the first electromagnetic wave couples at least in part to a wire surface of the wire and travels at least partially around the wire surface as a second electromagnetic wave for propagating longitudinally along the wire, and wherein the second electromagnetic wave has at least one wave propagation mode.

In another embodiment, an apparatus comprises, in one or more embodiments, a waveguide, wherein the waveguide comprises a material that is not electrically conductive and is suitable for propagating electromagnetic waves on a waveguide surface of the waveguide, wherein the waveguide facilitates propagation of a first electromagnetic wave at least in part on the waveguide surface, and, in response to the waveguide being positioned with respect to a wire, the first electromagnetic wave couples at least in part to a wire surface of the wire and travels at least partially around the wire surface as a second electromagnetic wave, and wherein the second electromagnetic wave has at least one wave propagation mode for propagating longitudinally along the wire.

One embodiment of the subject disclosure includes an apparatus having a waveguide that facilitates transmission or reception of electromagnetic waves along a wire surface of a wire of a power grid that also facilitates delivery of electric energy to devices. The apparatus can further include one or more sensors that facilitate sensing of a disturbance that is adverse to the waveguide, the wire, the transmission or reception of electromagnetic waves that propagate along the wire surface or waveguide surface, or any combination thereof.

One embodiment of the subject disclosure includes a method for transmitting, by an apparatus having a waveguide and a sensor, electromagnetic waves that propagate along a wire surface of a wire that facilitates delivery of electric energy to devices, and sensing, by the sensor, a disturbance that is adverse to the electromagnetic waves that propagate along the wire surface.

One embodiment of the subject disclosure includes a machine-readable (e.g., computer-readable, processor-readable, etc.) storage medium having executable instructions that, when executed by a processor, facilitate performance of operations, including inducing with or via a waveguide, electromagnetic waves guided along a surface of a transmission medium, and collecting sensing data from a sensor, the sensing data associated with a disturbance that is adverse to the electromagnetic waves guided along the surface of the transmission medium.

One embodiment of the subject disclosure includes an apparatus having a processor and a memory. The processor can perform an operation of receiving telemetry information from a waveguide system coupled to a sensor, detecting from the telemetry information a disturbance that is adverse to one of operations of the waveguide system, the transmission or reception of the electromagnetic waves along the wire surface or the waveguide surface, or a combination thereof, and reporting the disturbance. The waveguide system can comprise a waveguide that can be positioned with respect to a wire of a power grid that facilitates delivery of electric energy to devices. The waveguide can also facilitate transmission or reception of electromagnetic waves along a wire surface of the wire, while the sensor can facilitate sensing disturbances adverse to electromagnetic waves.

One embodiment of the subject disclosure includes a method for receiving, by a network element comprising a processor, telemetry information from a waveguide system, determining, by the network element, a disturbance from sensing data included in the telemetry information, and transmitting, by the network element, instructions to the waveguide system to adjust a route of the electromagnetic waves to avoid or compensate for the disturbance determined. The waveguide system can facilitate transmission of electromagnetic waves along a wire surface of a wire of a power grid and sensing of disturbances adverse to the transmission or reception of the electromagnetic waves.

One embodiment of the subject disclosure includes a machine-readable (e.g., computer-readable, processor-readable, etc.) storage medium having executable instructions that, when executed by a processor, facilitate performance of operations, including receiving telemetry information from an apparatus that induces electromagnetic waves on a wire surface of a wire of a power grid for delivery of communication signals to a recipient communication device coupled to the power grid, and detecting a disturbance from the telemetry information that is adverse to a delivery of the communication signals to the recipient communication device.

One embodiment of the subject disclosure includes a method for detecting, by a waveguide system comprising a processor, a fault in operations of the waveguide system, and enabling, by the waveguide system, a bypass mode of a bypass circuit responsive to detecting the fault. Subsequent to the bypass mode being enabled, electromagnetic waves propagating along a surface of a transmission medium bypass the waveguide system.

One embodiment of the subject disclosure includes a method for transmitting, by a first device, first electromagnetic waves along an outer surface of a transmission medium. The first electromagnetic waves can be directed to a second device. Additionally, the first electromagnetic waves can operate at a first carrier frequency. The method can further include detecting, by the first device, a fault in operations of the second device, identifying, by the first device, a third device that utilizes the transmission medium for receiving second electromagnetic waves at a second carrier frequency that differs from the first carrier frequency, and transmitting, by the first device, adjusted first electromagnetic waves along the outer surface of the transmission medium directed to the third device. The adjusted first electromagnetic waves can propagate along the outer surface of the transmission medium traversing the second device. Additionally, the adjusted first electromagnetic waves can operate at the second carrier frequency, which reduces electromagnetic wave interference by the second device.

One embodiment of the subject disclosure includes a transmission system having a coupling device, a memory and a processor. The coupling device can facilitate transmission or reception of electromagnetic waves that propagate along a surface of a transmission medium. The memory can store instructions, which when executed by the processor, causes the processor to perform operations including restarting a timer to prevent a bypass circuit from disabling the transmission or reception of electromagnetic waves by the coupling device.

Various embodiments described herein relate to a waveguide coupling system for launching and extracting guided wave (e.g., surface wave communications that are electromagnetic waves) transmissions from a wire. At millimeter-wave frequencies (e.g., 30 to 300 GHz), wherein the wavelength can be small compared to the size of the equipment, transmissions can propagate as waves guided by a waveguide, such as a strip or length of dielectric material or other coupler. The electromagnetic field structure of the guided wave can be inside and/or outside of the waveguide. When this waveguide is brought into close proximity to a wire (e.g., a utility line or other transmission line), at least a portion of the guided waves decouples from the waveguide and couples to the wire, and continue to propagate as guided waves, such as surface waves about the surface of the wire.

According to an example embodiment, a surface wave is a type of guided wave that is guided by a surface of the wire, which can include an exterior or outer surface of the wire, or another surface of the wire that is adjacent to or exposed to another type of medium having different properties (e.g., dielectric properties). Indeed, in an example embodiment, a surface of the wire that guides a surface wave can represent a transitional surface between two different types of media. For example, in the case of a bare or uninsulated wire, the surface of the wire can be the outer or exterior conductive surface of the bare or uninsulated wire that is exposed to air or free space. As another example, in the case of insulated wire, the surface of the wire can be the conductive portion of the wire that meets the insulator portion of the wire, or can otherwise be the insulator surface of the wire that is exposed to air or free space, or can otherwise be any material region between the insulator surface of the wire and the conductive portion of the wire that meets the insulator portion of the wire, depending upon the relative differences in the properties (e.g., dielectric properties) of the insulator, air, and/or the conductor and further dependent on the frequency and propagation mode or modes of the guided wave.

According to an example embodiment, guided waves such as surface waves can be contrasted with radio transmissions over free space/air or conventional propagation of electrical power or signals through the conductor of the wire. Indeed, with surface wave or guided wave systems described herein, conventional electrical power or signals can still propagate or be transmitted through the conductor of the wire, while guided waves (including surface waves and other electromagnetic waves) can propagate or be transmitted about the surface of the wire, according to an example embodiment. In an embodiment, a surface wave can have a field structure (e.g., an electromagnetic field structure) that lies primarily or substantially outside of the line, wire, or transmission medium that serves to guide the surface wave.

According to an example embodiment, the electromagnetic waves traveling along the wire and around the outer surface of the wire are induced by other electromagnetic waves traveling along a waveguide in proximity to the wire. The inducement of the electromagnetic waves can be independent of any electrical potential, charge or current that is injected or otherwise transmitted through the wires as part of an electrical circuit. It is to be appreciated that while a small current in the wire may be formed in response to the propagation of the electromagnetic wave along the wire, this can be due to the propagation of the electromagnetic wave along the wire surface, and is not formed in response to electrical potential, charge or current that is injected into the wire as part of an electrical circuit. The electromagnetic waves traveling on the wire therefore do not require a circuit to propagate along the wire surface. The wire therefore is a single wire transmission line that is not part of a circuit. Also, in some embodiments, a wire is not necessary, and the electromagnetic waves can propagate along a single line transmission medium that is not a wire.

According to an example embodiment, the term "about" a wire used in conjunction with a guided wave (e.g., surface wave) can include fundamental wave propagation modes and other guided waves having a circular or substantially circular field distribution (e.g., electric field, magnetic field, electromagnetic field, etc.) at least partially around a wire or other transmission medium. In addition, when a guided wave propagates "about" a wire or other transmission medium, it can do so according to a wave propagation mode that includes not only the fundamental wave propagation modes (e.g., zero order modes), but additionally or alternatively other non-fundamental wave propagation modes such as higher-order guided wave modes (e.g., $1^{st}$ order modes, $2^{nd}$ order modes, etc.), asymmetrical modes and/or other guided (e.g., surface) waves that have non-circular field distributions around a wire or other transmission medium.

For example, such non-circular field distributions can be unilateral or multi-lateral with one or more axial lobes characterized by relatively higher field strength and/or one or more nulls or null regions characterized by relatively low-field strength, zero-field strength or substantially zero field strength. Further, the field distribution can otherwise vary as a function of a longitudinal axial orientation around the wire such that one or more regions of axial orientation around the wire have an electric or magnetic field strength (or combination thereof) that is higher than one or more other regions of axial orientation, according to an example embodiment. It will be appreciated that the relative positions of the wave higher order modes or asymmetrical modes can vary as the guided wave travels along the wire.

Referring now to FIG. 1, a block diagram illustrating an example, non-limiting embodiment of a guided wave communication system 100 is shown. Guided wave communication system 100 depicts an exemplary environment in which a dielectric waveguide coupling system can be used.

Guided wave communication system 100 can comprise a first instance of a distributed system 150 that includes one or more base station devices (e.g., base station device 104) that are communicably coupled to a central office 101 and/or a macrocell site 102. Base station device 104 can be connected by a wired (e.g., fiber and/or cable), or by a wireless (e.g., microwave wireless) connection to the macrocell site 102 and the central office 101. A second instance of the distributed system 160 can be used to provide wireless voice and data services to mobile device 122 and to residential and/or commercial establishments 142 (herein referred to as establishments 142). System 100 can have additional instances of the distribution systems 150 and 160 for providing voice and/or data services to mobile devices 122-124 and establishments 142 as shown in FIG. 1.

Macrocells such as macrocell site 102 can have dedicated connections to the mobile network and base station device 104 can share and/or otherwise use macrocell site 102's connection. Central office 101 can be used to distribute media content and/or provide internet service provider (ISP) services to mobile devices 122-124 and establishments 142. The central office 101 can receive media content from a constellation of satellites 130 (one of which is shown in FIG. 1) or other sources of content, and distribute such content to mobile devices 122-124 and establishments 142 via the first and second instances of the distribution system 15 and 160. The central office 101 can also be communicatively coupled to the Internet 103 for providing internet data services to mobile devices 122-124 and establishments 142.

Base station device 104 can be mounted on, or attached to, utility pole 116. In other embodiments, base station device 104 can be near transformers and/or other locations situated nearby a power line. Base station device 104 can facilitate connectivity to a mobile network for mobile devices 122 and 124. Antennas 112 and 114, mounted on or near utility poles 118 and 120, respectively, can receive signals from base station device 104 and transmit those signals to mobile devices 122 and 124 over a much wider area than if the antennas 112 and 114 were located at or near base station device 104.

It is noted that FIG. 1 displays three utility poles, in each instance of the distribution systems 150 and 160, with one base station device, for purposes of simplicity. In other embodiments, utility pole 116 can have more base station devices, and more utility poles with distributed antennas and/or tethered connections to establishments 142.

A dielectric waveguide coupling device 106 can transmit the signal from base station device 104 to antennas 112 and 114 via utility or power line(s) that connect the utility poles 116, 118, and 120. To transmit the signal, radio source and/or coupler 106 upconverts the signal (e.g., via frequency mixing) from base station device 104 or otherwise converts the signal from the base station device 104 to a millimeter-wave band signal and the dielectric waveguide coupling device 106 launches a millimeter-wave band wave that propagates as a guided wave (e.g., surface wave or other electromagnetic wave) traveling along the utility line or other wire. At utility pole 118, another dielectric waveguide coupling device 108 receives the guided wave (and optionally can amplify it as needed or desired or operate as a digital repeater to receive it and regenerate it) and sends it forward as a guided wave (e.g., surface wave or other electromagnetic wave) on the utility line or other wire. The dielectric waveguide coupling device 108 can also extract a signal from the millimeter-wave band guided wave and shift it down in frequency or otherwise convert it to its original cellular band frequency (e.g., 1.9 GHz or other defined cellular frequency) or another cellular (or non-cellular) band frequency. An antenna 112 can transmit (e.g., wirelessly transmit) the downshifted signal to mobile device 122. The process can be repeated by dielectric waveguide coupling device 110, antenna 114 and mobile device 124, as necessary or desirable.

Transmissions from mobile devices 122 and 124 can also be received by antennas 112 and 114 respectively. Repeaters on dielectric waveguide coupling devices 108 and 110 can upshift or otherwise convert the cellular band signals to millimeter-wave band and transmit the signals as guided wave (e.g., surface wave or other electromagnetic wave) transmissions over the power line(s) to base station device 104.

Media content received by the central office 101 can be supplied to the second instance of the distribution system 160 via the base station device 104 for distribution to mobile devices 122 and establishments 142. The dielectric waveguide coupling device 110 can be tethered to the establishments 142 by one or more wired connections or a wireless interface. The one or more wired connections may include without limitation, a power line, a coaxial cable, a fiber cable, a twisted pair cable, or other suitable wired mediums for distribution of media content and/or for providing internet services. In an example embodiment, the wired connections from the waveguide coupling device 110 can be communicatively coupled to one or more very high bit rate digital subscriber line (VDSL) modems located at one or more corresponding service area interfaces (SAIs—not shown), each SAI providing services to a portion of the establishments 142. The VDSL modems can be used to selectively distribute media content and/or provide internet services to gateways (not shown) located in the establishments 142. The SAIs can also be communicatively coupled to the establishments 142 over a wired medium such as a power line, a coaxial cable, a fiber cable, a twisted pair cable, or other suitable wired mediums. In other example embodiments, the waveguide coupling device 110 can be communicatively coupled directly to establishments 142 without intermediate interfaces such as the SAIs.

In another example embodiment, system 100 can employ diversity paths, where two or more utility lines or other wires are strung between the utility poles 116, 118, and 120 (e.g., for example, two or more wires between poles 116 and 120) and redundant transmissions from base station 104 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 100 can enable alternate routing capabilities, load balancing, increased load handling, concurrent bi-directional or synchronous communications, spread spectrum communications, etc. (See FIG. 8 for more illustrative details).

It is noted that the use of the dielectric waveguide coupling devices 106, 108, and 110 in FIG. 1 are by way of example only, and that in other embodiments, other uses are possible. For instance, dielectric waveguide coupling devices can be used in a backhaul communication system, providing network connectivity to base station devices. Dielectric waveguide coupling devices can be used in many circumstances where it is desirable to transmit guided wave communications over a wire, whether insulated or not insulated. Dielectric waveguide coupling devices are improvements over other coupling devices due to no contact or limited physical and/or electrical contact with the wires that may carry high voltages. With dielectric waveguide coupling devices, the apparatus can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 104 and macrocell site 102 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, Bluetooth protocol, Zigbee protocol or other wireless protocol.

Figure 2:
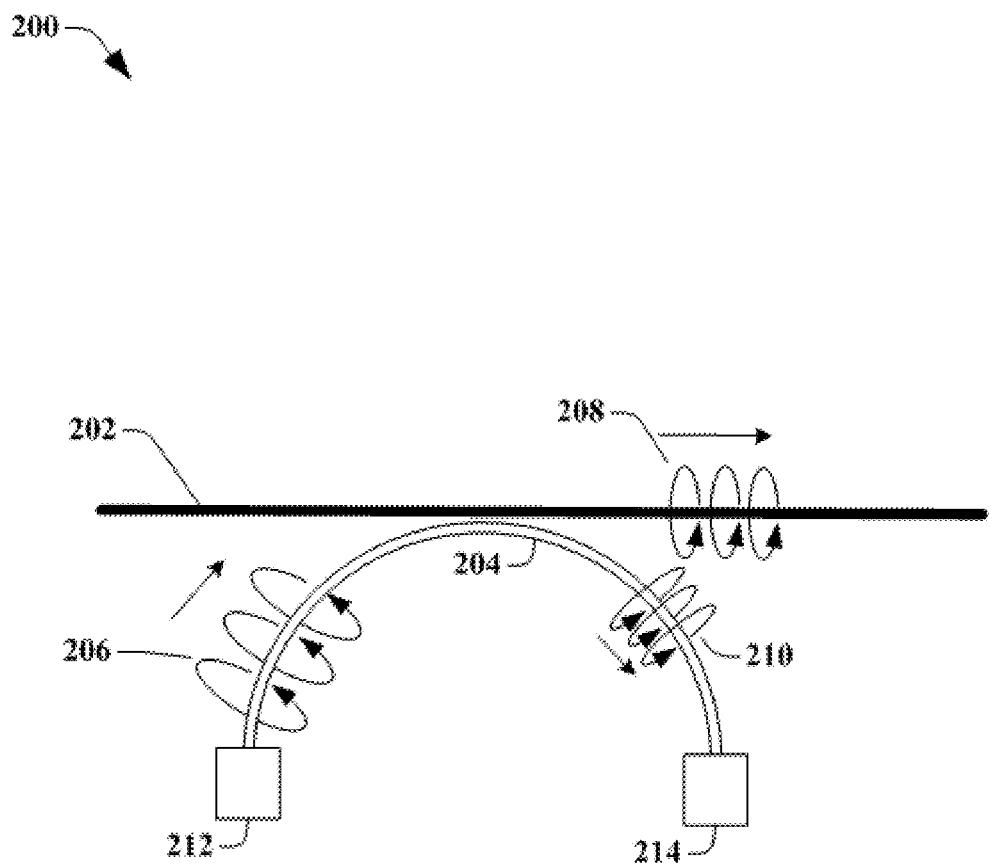
FIG. 2 is a block diagram illustrating an example, non-limiting embodiment of a dielectric waveguide coupler in accordance with various aspects described herein.

Turning now to FIG. 2, illustrated is a block diagram of an example, non-limiting embodiment of a dielectric waveguide coupling system 200 in accordance with various aspects described herein. System 200 comprises a dielectric waveguide 204 that has a wave 206 propagating as a guided wave about a waveguide surface of the dielectric waveguide 204. In an embodiment, the dielectric waveguide 204 is curved, and at least a portion of the waveguide 204 can be placed near a wire 202 in order to facilitate coupling between the waveguide 204 and the wire 202, as described herein. The dielectric waveguide 204 can be placed such that a portion of the curved dielectric waveguide 204 is parallel or substantially parallel to the wire 202. The portion of the dielectric waveguide 204 that is parallel to the wire can be an apex of the curve, or any point where a tangent of the curve is parallel to the wire 202. When the dielectric waveguide 204 is positioned or placed thusly, the wave 206 travelling along the dielectric waveguide 204 couples, at least in part, to the wire 202, and propagates as guided wave 208 around or about the wire surface of the wire 202 and longitudinally along the wire 202. The guided wave 208 can be characterized as a surface wave or other electromagnetic wave, although other types of guided waves 208 can supported as well without departing from example embodiments. A portion of the wave 206 that does not couple to the wire 202 propagates as wave 210 along the dielectric waveguide 204. It will be appreciated that the dielectric waveguide 204 can be configured and arranged in a variety of positions in relation to the wire 202 to achieve a desired level of coupling or non-coupling of the wave 206 to the wire 202. For example, the curvature and/or length of the dielectric waveguide 2014 that is parallel or substantially parallel, as well as its separation distance (which can include zero separation distance in an embodiment), to the wire 202 can be varied without departing for example embodiments. Likewise, the arrangement of dielectric waveguide 204 in relation to the wire 202 may be varied based upon considerations of the respective intrinsic characteristics (e.g., thickness, composition, electromagnetic properties, etc.) of the wire 202 and the dielectric waveguide 204, as well as the characteristics (e.g., frequency, energy level, etc.) of the waves 206 and 208.

The guided wave 208 stays parallel or substantially parallel to the wire 202, even as the wire 202 bends and flexes. Bends in the wire 202 can increase transmission losses, which are also dependent on wire diameters, frequency, and materials. If the dimensions of the dielectric waveguide 204 are chosen for efficient power transfer, most of the power in the wave 206 is transferred to the wire 202, with little power remaining in wave 210. It will be appreciated that the guided wave 208 can still be multi-modal in nature (discussed herein), including having modes that are non-fundamental or asymmetric, while traveling along a path that is parallel or substantially parallel to the wire 202, with or without a fundamental transmission mode. In an embodiment, non-fundamental or asymmetric modes can be utilized to minimize transmission losses and/or obtain increased propagation distances.

It is noted that the term parallel is generally a geometric construct which often is not exactly achievable in real systems. Accordingly, the term parallel as utilized in the subject disclosure represents an approximation rather than an exact configuration when used to describe embodiments disclosed in the subject disclosure. In an embodiment, substantially parallel can include approximations that are within 30 degrees of true parallel in all dimensions.

In an embodiment, the wave 206 can exhibit one or more wave propagation modes. The dielectric waveguide modes can be dependent on the shape and/or design of the waveguide 204. The one or more dielectric waveguide modes of wave 206 can generate, influence, or impact one or more wave propagation modes of the guided wave 208 propagating along wire 202. In an embodiment, the wave propagation modes on the wire 202 can be similar to the dielectric waveguide modes since both waves 206 and 208 propagate about the outside of the dielectric waveguide 204 and wire 202 respectively. In some embodiments, as the wave 206 couples to the wire 202, the modes can change form, or new modes can be created or generated, due to the coupling between the dielectric waveguide 204 and the wire 202. For example, differences in size, material, and/or impedances of the dielectric waveguide 204 and wire 202 may create additional modes not present in the dielectric waveguide modes and/or suppress some of the dielectric waveguide modes. The wave propagation modes can comprise the fundamental transverse electromagnetic mode (Quasi-$TEM_{00}$), where only small electric and/or magnetic fields extend in the direction of propagation, and the electric and magnetic fields extend radially outwards while the guided wave propagates along the wire. This guided wave mode can be donut shaped, where few of the electromagnetic fields exist within the dielectric waveguide 204 or wire 202.

Waves 206 and 208 can comprise a fundamental TEM mode where the fields extend radially outwards, and also comprise other, non-fundamental (e.g., asymmetric, higher-level, etc.) modes. While particular wave propagation modes are discussed above, other wave propagation modes are likewise possible such as transverse electric (TE) and transverse magnetic (TM) modes, based on the frequencies employed, the design of the dielectric waveguide 204, the dimensions and composition of the wire 202, as well as its surface characteristics, its optional insulation, the electromagnetic properties of the surrounding environment, etc. It should be noted that, depending on the frequency, the electrical and physical characteristics of the wire 202 and the particular wave propagation modes that are generated, guided wave 208 can travel along the conductive surface of an oxidized uninsulated wire, an unoxidized uninsulated wire, an insulated wire and/or along the insulating surface of an insulated wire.

In an embodiment, a diameter of the dielectric waveguide 204 is smaller than the diameter of the wire 202. For the millimeter-band wavelength being used, the dielectric waveguide 204 supports a single waveguide mode that makes up wave 206. This single waveguide mode can change as it couples to the wire 202 as surface 208. If the dielectric waveguide 204 were larger, more than one waveguide mode can be supported, but these additional waveguide modes may not couple to the wire 202 as efficiently, and higher coupling losses can result. However, in some alternative embodiments, the diameter of the dielectric waveguide 204 can be equal to or larger than the diameter of the wire 202, for example, where higher coupling losses are desirable or when used in conjunction with other techniques to otherwise reduce coupling losses (e.g., impedance matching with tapering, etc.).

In an embodiment, the wavelength of the waves 206 and 208 are comparable in size, or smaller than a circumference of the dielectric waveguide 204 and the wire 202. In an example, if the wire 202 has a diameter of 0.5 cm, and a corresponding circumference of around 1.5 cm, the wavelength of the transmission is around 1.5 cm or less, corresponding to a frequency of 20 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the dielectric waveguide 204 and wire 202 is comparable in size to, or greater, than a wavelength of the transmission, the waves 206 and 208 can exhibit multiple wave propagation modes including fundamental and/or non-fundamental (symmetric and/or asymmetric) modes that propagate over sufficient distances to support various communication systems described herein. The waves 206 and 208 can therefore comprise more than one type of electric and magnetic field configuration. In an embodiment, as the guided wave 208 propagates down the wire 202, the electrical and magnetic field configurations will remain the same from end to end of the wire 202. In other embodiments, as the guided wave 208 encounters interference or loses energy due to transmission losses, the electric and magnetic field configurations can change as the guided wave 208 propagates down wire 202.

In an embodiment, the dielectric waveguide 204 can be composed of nylon, Teflon, polyethylene, a polyamide, or other plastics. In other embodiments, other dielectric materials are possible. The wire surface of wire 202 can be metallic with either a bare metallic surface, or can be insulated using plastic, dielectric, insulator or other sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 202 (e.g., resulting from exposure of the bare metallic surface to oxygen/air) can also provide insulating or dielectric properties similar to those provided by some insulators or sheathings.

It is noted that the graphical representations of waves 206, 208 and 210 are presented merely to illustrate the principles that wave 206 induces or otherwise launches a guided wave 208 on a wire 202 that operates, for example, as a single wire transmission line. Wave 210 represents the portion of wave 206 that remains on the dielectric waveguide 204 after the generation of guided wave 208. The actual electric and magnetic fields generated as a result of such wave propagation may vary depending on the frequencies employed, the particular wave propagation mode or modes, the design of the dielectric waveguide 204, the dimensions and composition of the wire 202, as well as its surface characteristics, its optional insulation, the electromagnetic properties of the surrounding environment, etc.

It is noted that dielectric waveguide 204 can include a termination circuit or damper 214 at the end of the dielectric waveguide 204 that can absorb leftover radiation or energy from wave 210. The termination circuit or damper 214 can prevent and/or minimize the leftover radiation or energy from wave 210 reflecting back toward transmitter circuit 212. In an embodiment, the termination circuit or damper 214 can include termination resistors, and/or other components that perform impedance matching to attenuate reflection. In some embodiments, if the coupling efficiencies are high enough, and/or wave 210 is sufficiently small, it may not be necessary to use a termination circuit or damper 214. For the sake of simplicity, these transmitter and termination circuits or dampers 212 and 214 are not depicted in the other figures, but in those embodiments, transmitter and termination circuits or dampers may possibly be used.

Further, while a single dielectric waveguide 204 is presented that generates a single guided wave 208, multiple dielectric waveguides 204 placed at different points along the wire 202 and/or at different axial orientations about the wire can be employed to generate and receive multiple guided waves 208 at the same or different frequencies, at the same or different phases, at the same or different wave propagation modes. The guided wave or waves 208 can be modulated to convey data via a modulation technique such as phase shift keying, frequency shift keying, quadrature amplitude modulation, amplitude modulation, multi-carrier modulation and via multiple access techniques such as frequency division multiplexing, time division multiplexing, code division multiplexing, multiplexing via differing wave propagation modes and via other modulation and access strategies.

Figure 3A:
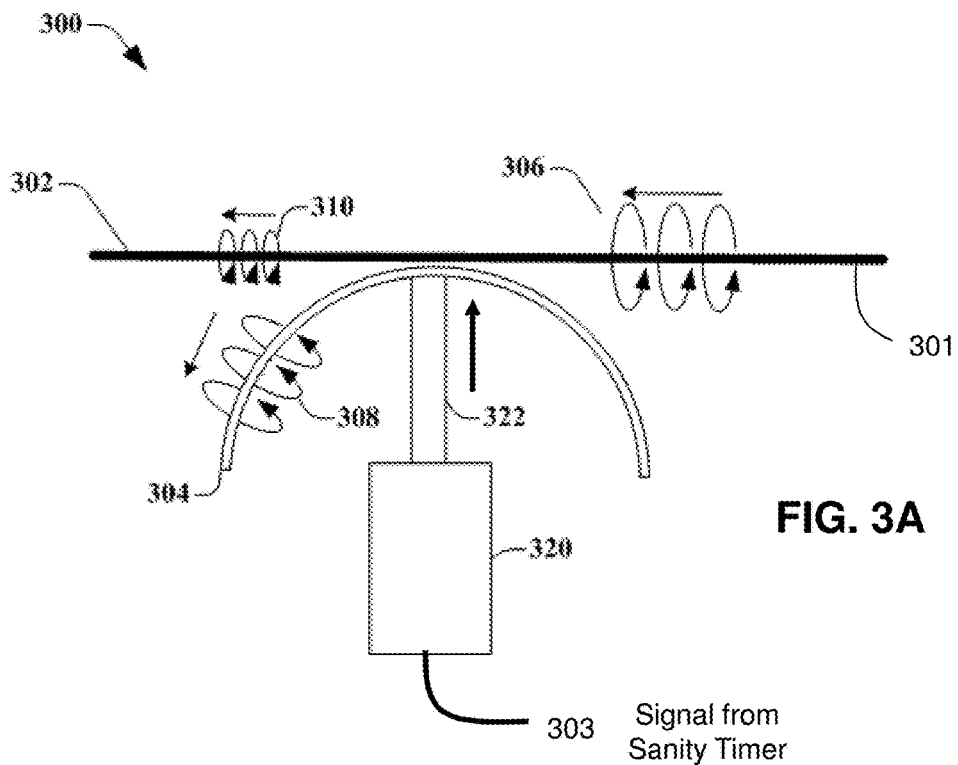
FIGS. 3A and 3B are block diagrams illustrating example, non-limiting embodiments of an adjustable dielectric waveguide coupler in accordance with various aspects described herein.

Turning now to FIG. 3A, illustrated is a block diagram of an example, non-limiting embodiment of a dielectric waveguide coupling system 300 in accordance with various aspects described herein. System 300 comprises a dielectric waveguide 304 and a wire 302 that has a wave 306 propagating as a guided wave about a wire surface of the wire 302. In an example embodiment, the wave 306 can be characterized as a surface wave or other electromagnetic wave.

In an example embodiment, the dielectric waveguide 304 is curved or otherwise has a curvature, and can be placed near a wire 302 such that a portion of the curved dielectric waveguide 304 is parallel or substantially parallel to the wire 302. The portion of the dielectric waveguide 304 that is parallel to the wire can be an apex of the curve, or any point where a tangent of the curve is parallel to the wire 302. When the dielectric waveguide 304 is near the wire, the guided wave 306 travelling along the wire 302 can couple to the dielectric waveguide 304 and propagate as guided wave 308 about the dielectric waveguide 304. A portion of the guided wave 306 that does not couple to the dielectric waveguide 304 propagates as guided wave 310 (e.g., surface wave or other electromagnetic wave) along the wire 302.

The guided waves 306 and 308 stay parallel to the wire 302 and dielectric waveguide 304, respectively, even as the wire 302 and dielectric waveguide 304 bend and flex. Bends can increase transmission losses, which are also dependent on wire diameters, frequency, and materials. If the dimensions of the dielectric waveguide 304 are chosen for efficient power transfer, most of the energy in the guided wave 306 is coupled to the dielectric waveguide 304 and little remains in guided wave 310.

In an embodiment, a receiver circuit can be placed on the end of waveguide 304 in order to receive wave 308. A termination circuit can be placed on the opposite end of the waveguide 304 in order to receive guided waves traveling in the opposite direction to guided wave 306 that couple to the waveguide 304. The termination circuit would thus prevent and/or minimize reflections being received by the receiver circuit. If the reflections are small, the termination circuit may not be necessary.

It is noted that the dielectric waveguide 304 can be configured such that selected polarizations of the surface wave 306 are coupled to the dielectric waveguide 304 as guided wave 308. For instance, if guided wave 306 is made up of guided waves or wave propagation modes with respective polarizations, dielectric waveguide 304 can be configured to receive one or more guided waves of selected polarization(s). Guided wave 308 that couples to the dielectric waveguide 304 is thus the set of guided waves that correspond to one or more of the selected polarization(s), and further guided wave 310 can comprise the guided waves that do not match the selected polarization(s).

The dielectric waveguide 304 can be configured to receive guided waves of a particular polarization based on an angle/rotation around the wire 302 that the dielectric waveguide 304 is placed. For instance, if the guided wave 306 is polarized horizontally, most of the guided wave 306 transfers to the dielectric waveguide as wave 308. As the dielectric waveguide 304 is rotated 90 degrees around the wire 302, though, most of the energy from guided wave 306 would remain coupled to the wire as guided wave 310, and only a small portion would couple to the wire 302 as wave 308.

It is noted that waves 306, 308, and 310 are shown using three circular symbols in FIG. 3A and in other figures in the specification. These symbols are used to represent a general guided wave, but do not imply that the waves 306, 308, and 310 are necessarily circularly polarized or otherwise circularly oriented. In fact, waves 306, 308, and 310 can comprise a fundamental TEM mode where the fields extend radially outwards, and also comprise other, non-fundamental (e.g. higher-level, etc.) modes. These modes can be asymmetric (e.g., radial, bilateral, trilateral, quadrilateral, etc,) in nature as well.

It is noted also that guided wave communications over wires can be full duplex, allowing simultaneous communications in both directions. Waves traveling one direction can pass through waves traveling in an opposite direction. Electromagnetic fields may cancel out at certain points and for short times due to the superposition principle as applied to waves. The waves traveling in opposite directions propagate as if the other waves weren't there, but the composite effect to an observer may be a stationary standing wave pattern. As the guided waves pass through each other and are no longer in a state of superposition, the interference subsides. As a guided wave (e.g., surface wave or other electromagnetic wave) couples to a waveguide and move away from the wire, any interference due to other guided waves (e.g., surface waves or other electromagnetic wave) decreases. In an embodiment, as guided wave 306 (e.g., surface wave or other electromagnetic wave) approaches dielectric waveguide 304, another guided wave (e.g., surface wave or other electromagnetic wave) (not shown) traveling from left to right on the wire 302 passes by causing local interference. As guided wave 306 couples to dielectric waveguide 304 as wave 308, and moves away from the wire 302, any interference due to the passing guided wave subsides.

It is noted that the graphical representations of waves 306, 308 and 310 are presented merely to illustrate the principles that guided wave 306 induces or otherwise launches a wave 308 on a dielectric waveguide 304. Guided wave 310 represents the portion of guided wave 306 that remains on the wire 302 after the generation of wave 308. The actual electric and magnetic fields generated as a result of such guided wave propagation may vary depending on one or more of the shape and/or design of the dielectric waveguide, the relative position of the dielectric waveguide to the wire, the frequencies employed, the design of the dielectric waveguide 304, the dimensions and composition of the wire 302, as well as its surface characteristics, its optional insulation, the electromagnetic properties of the surrounding environment, etc.

Figure 4:
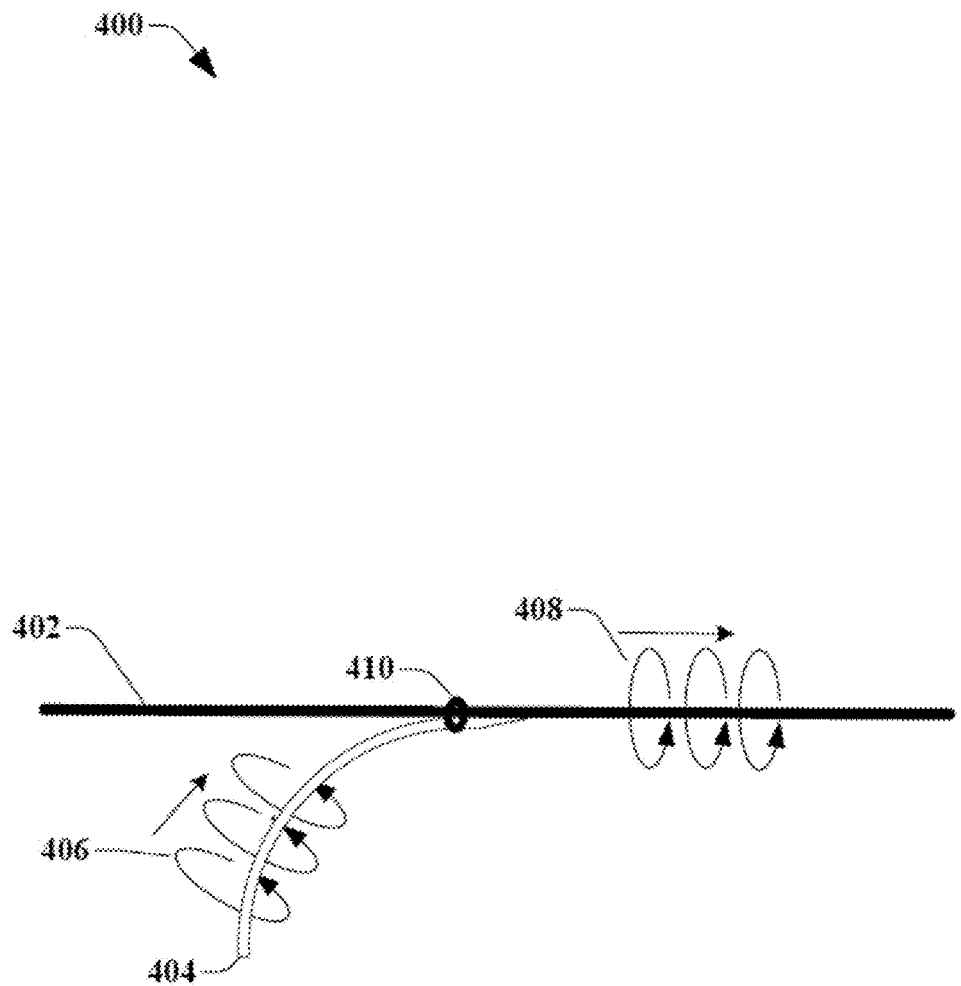
FIG. 4 is a block diagram illustrating an example, non-limiting embodiment of a dielectric waveguide coupler in accordance with various aspects described herein.

Turning now to FIG. 4, illustrated is a block diagram of an example, non-limiting embodiment of a dielectric waveguide coupling system 400 in accordance with various aspects described herein. System 400 comprises a dielectric waveguide 404 that has a wave 406 propagating as a guided wave about a waveguide surface of the dielectric waveguide 404. In an embodiment, the dielectric waveguide 404 is curved, and an end of the dielectric waveguide 404 can be tied, fastened, or otherwise mechanically coupled to a wire 402. When the end of the dielectric waveguide 404 is fastened to the wire 402, the end of the dielectric waveguide 404 is parallel or substantially parallel to the wire 402. Alternatively, another portion of the dielectric waveguide beyond an end can be fastened or coupled to wire 402 such that the fastened or coupled portion is parallel or substantially parallel to the wire 402. The coupling device 410 can be a nylon cable tie or other type of non-conducting/dielectric material that is either separate from the dielectric waveguide 404 or constructed as an integrated component of the dielectric waveguide 404. The dielectric waveguide 404 can be adjacent to the wire 402 without surrounding the wire 402.

When the dielectric waveguide 404 is placed with the end parallel to the wire 402, the guided wave 406 travelling along the dielectric waveguide 404 couples to the wire 402, and propagates as guided wave 408 about the wire surface of the wire 402. In an example embodiment, the guided wave 408 can be characterized as a surface wave or other electromagnetic wave.

It is noted that the graphical representations of waves 406 and 408 are presented merely to illustrate the principles that wave 406 induces or otherwise launches a guided wave 408 on a wire 402 that operates, for example, as a single wire transmission line. The actual electric and magnetic fields generated as a result of such wave propagation may vary depending on one or more of the shape and/or design of the dielectric waveguide, the relative position of the dielectric waveguide to the wire, the frequencies employed, the design of the dielectric waveguide 404, the dimensions and composition of the wire 402, as well as its surface characteristics, its optional insulation, the electromagnetic properties of the surrounding environment, etc.

In an embodiment, an end of dielectric waveguide 404 can taper towards the wire 402 in order to increase coupling efficiencies. Indeed, the tapering of the end of the dielectric waveguide 404 can provide impedance matching to the wire 402, according to an example embodiment of the subject disclosure. For example, an end of the dielectric waveguide 404 can be gradually tapered in order to obtain a desired level of coupling between waves 406 and 408 as illustrated in FIG. 4.

In an embodiment, the coupling device 410 can be placed such that there is a short length of the dielectric waveguide 404 between the coupling device 410 and an end of the dielectric waveguide 404. Maximum coupling efficiencies are realized when the length of the end of the dielectric waveguide 404 that is beyond the coupling device 410 is at least several wavelengths long for whatever frequency is being transmitted.

Figure 5A:
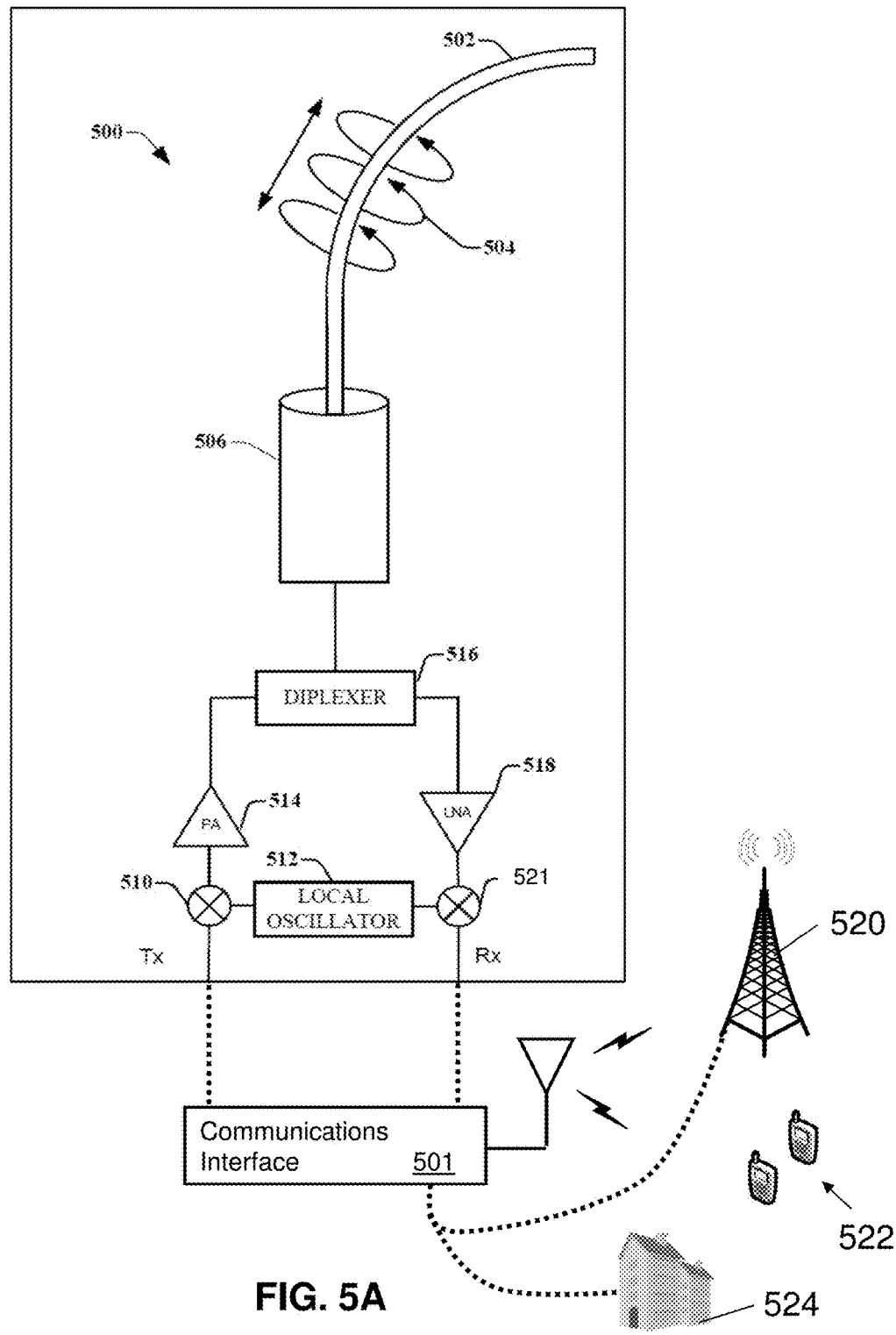
FIGS. 5A and 5B are block diagrams illustrating example, non-limiting embodiments of a dielectric waveguide coupler and transceiver in accordance with various aspects described herein.

Turning now to FIG. 5A, illustrated is a block diagram of an example, non-limiting embodiment of a dielectric waveguide coupler and transceiver system 500 (referred to herein collectively as system 500) in accordance with various aspects described herein. System 500 comprises a transmitter/receiver device 506 that launches and receives waves (e.g., guided wave 504 onto dielectric waveguide 502). The guided waves 504 can be used to transport signals received from and sent to a base station 520, mobile devices 522, or a building 524 by way of a communications interface 501. The communications interface 501 can be an integral part of system 500. Alternatively, the communications interface 501 can be tethered to system 500. The communications interface 501 can comprise a wireless interface for interfacing to the base station 520, the mobile devices 522, or building 524 utilizing any of various wireless signaling protocols (e.g., LTE, WiFi, WiMAX, IEEE 802.xx, etc.). The communications interface 501 can also comprise a wired interface such as a fiber optic line, coaxial cable, twisted pair, or other suitable wired mediums for transmitting signals to the base station 520 or building 524. For embodiments where system 500 functions as a repeater, the communications interface 501 may not be necessary.

The output signals (e.g., Tx) of the communications interface 501 can be combined with a millimeter-wave carrier wave generated by a local oscillator 512 at frequency mixer 510. Frequency mixer 510 can use heterodyning techniques or other frequency shifting techniques to frequency shift the output signals from communications interface 501. For example, signals sent to and from the communications interface 501 can be modulated signals such as orthogonal frequency division multiplexed (OFDM) signals formatted in accordance with a Long-Term Evolution (LTE) wireless protocol or other wireless 3G, 4G, 5G or higher voice and data protocol, a Zigbee, WIMAX, UltraWideband or IEEE 802.11 wireless protocol or other wireless protocol. In an example embodiment, this frequency conversion can be done in the analog domain, and as a result, the frequency shifting can be done without regard to the type of communications protocol that the base station 520, mobile devices 522, or in-building devices 524 use. As new communications technologies are developed, the communications interface 501 can be upgraded or replaced and the frequency shifting and transmission apparatus can remain, simplifying upgrades. The carrier wave can then be sent to a power amplifier ("PA") 514 and can be transmitted via the transmitter receiver device 506 via the diplexer 516.

Signals received from the transmitter/receiver device 506 that are directed towards the communications interface 501 can be separated from other signals via diplexer 516. The transmission can then be sent to low noise amplifier ("LNA") 518 for amplification. A frequency mixer 521, with help from local oscillator 512 can downshift the transmission (which is in the millimeter-wave band or around 38 GHz in some embodiments) to the native frequency. The communications interface 501 can then receive the transmission at an input port (Rx).

In an embodiment, transmitter/receiver device 506 can include a cylindrical or non-cylindrical metal (which, for example, can be hollow in an embodiment, but not necessarily drawn to scale) or other conducting or non-conducting waveguide and an end of the dielectric waveguide 502 can be placed in or in proximity to the waveguide or the transmitter/receiver device 506 such that when the transmitter/receiver device 506 generates a transmission, the guided wave couples to dielectric waveguide 502 and propagates as a guided wave 504 about the waveguide surface of the dielectric waveguide 502. In some embodiments, the guided wave 504 can propagate in part on the outer surface of the dielectric waveguide 502 and in part inside the dielectric waveguide 502. In other embodiments, the guided wave 504 can propagate substantially or completely on the outer surface of the dielectric waveguide 502. In yet other embodiments, the guided wave 504 can propagate substantially or completely inside the dielectric waveguide 502. In this latter embodiment, the guide wave 504 can radiate at an end of the dielectric waveguide 502 (such as the tapered end shown in FIG. 4) for coupling to a transmission medium such as a wire 402 of FIG. 4. Similarly, if guided wave 504 is incoming (coupled to the dielectric waveguide 502 from a wire), guided wave 504 then enters the transmitter/receiver device 506 and couples to the cylindrical waveguide or conducting waveguide. While transmitter/receiver device 506 is shown to include a separate waveguide—an antenna, cavity resonator, klystron, magnetron, travelling wave tube, or other radiating element can be employed to induce a guided wave on the waveguide 502, without the separate waveguide.

In an embodiment, dielectric waveguide 502 can be wholly constructed of a dielectric material (or another suitable insulating material), without any metallic or otherwise conducting materials therein. Dielectric waveguide 502 can be composed of nylon, Teflon, polyethylene, a polyamide, other plastics, or other materials that are non-conducting and suitable for facilitating transmission of electromagnetic waves at least in part on an outer surface of such materials. In another embodiment, dielectric waveguide 502 can include a core that is conducting/metallic, and have an exterior dielectric surface. Similarly, a transmission medium that couples to the dielectric waveguide 502 for propagating electromagnetic waves induced by the dielectric waveguide 502 or for supplying electromagnetic waves to the dielectric waveguide 502 can be wholly constructed of a dielectric material (or another suitable insulating material), without any metallic or otherwise conducting materials therein.

It is noted that although FIG. 5A shows that the opening of transmitter receiver device 506 is much wider than the dielectric waveguide 502, this is not to scale, and that in other embodiments the width of the dielectric waveguide 502 is comparable or slightly smaller than the opening of the hollow waveguide. It is also not shown, but in an embodiment, an end of the waveguide 502 that is inserted into the transmitter/receiver device 506 tapers down in order to reduce reflection and increase coupling efficiencies.

The transmitter/receiver device 506 can be communicably coupled to a communications interface 501, and alternatively, transmitter/receiver device 506 can also be communicably coupled to the one or more distributed antennas 112 and 114 shown in FIG. 1. In other embodiments, transmitter receiver device 506 can comprise part of a repeater system for a backhaul network.

Before coupling to the dielectric waveguide 502, the one or more waveguide modes of the guided wave generated by the transmitter/receiver device 506 can couple to the dielectric waveguide 502 to induce one or more wave propagation modes of the guided wave 504. The wave propagation modes of the guided wave 504 can be different than the hollow metal waveguide modes due to the different characteristics of the hollow metal waveguide and the dielectric waveguide. For instance, wave propagation modes of the guide wave 504 can comprise the fundamental transverse electromagnetic mode (Quasi-TEM$_{00}$), where only small electrical and/or magnetic fields extend in the direction of propagation, and the electric and magnetic fields extend radially outwards from the dielectric waveguide 502 while the guided waves propagate along the dielectric waveguide 502. The fundamental transverse electromagnetic mode wave propagation mode may not exist inside a waveguide that is hollow. Therefore, the hollow metal waveguide modes that are used by transmitter/receiver device 506 are waveguide modes that can couple effectively and efficiently to wave propagation modes of dielectric waveguide 502.

Figure 5B:
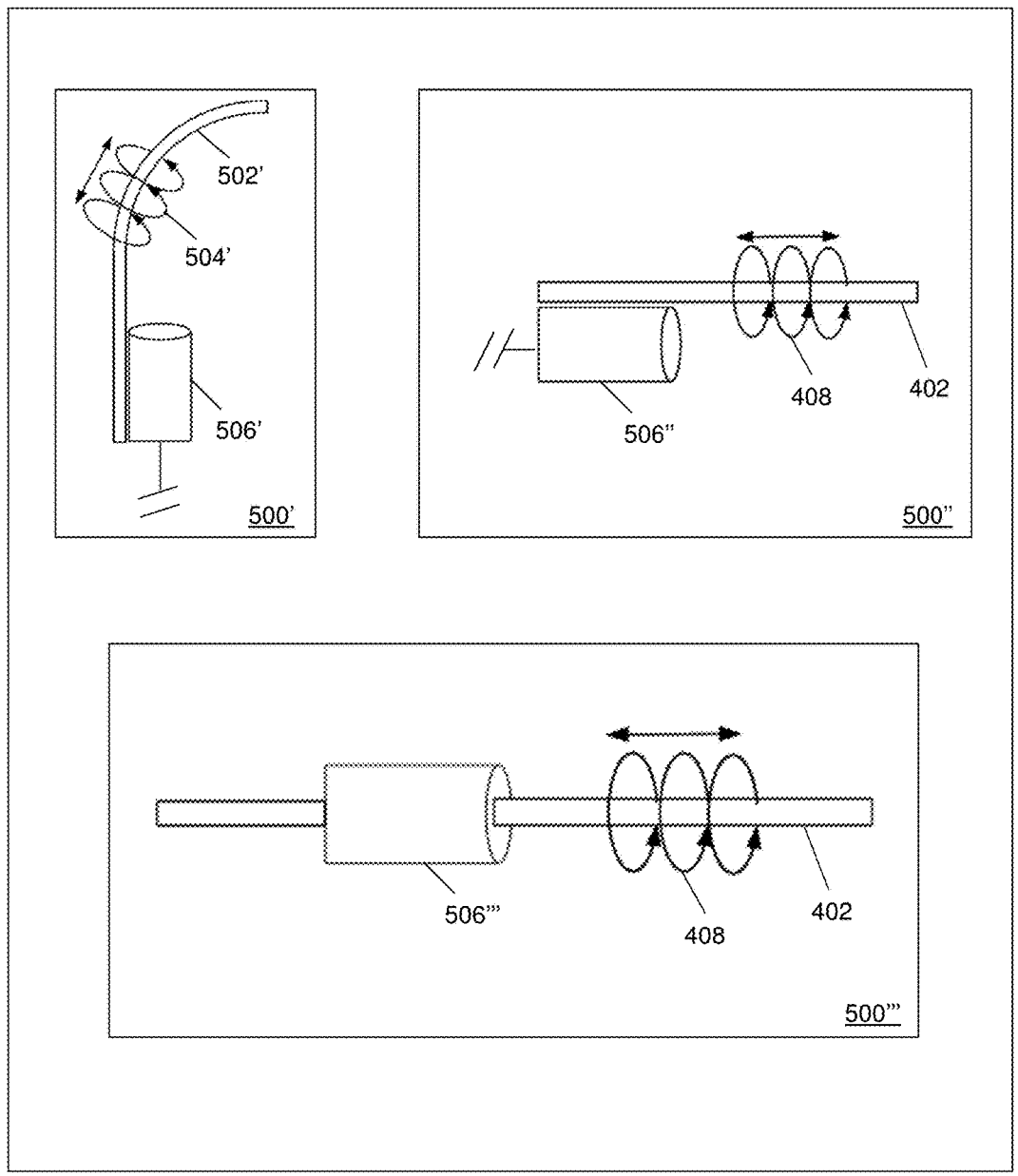

It will be appreciated that other constructs or combinations of the transmitter/receiver device 506 and dielectric waveguide 502 are possible. For example, a dielectric waveguide 502' can be placed tangentially or in parallel (with or without a gap) with respect to an outer surface of the hollow metal waveguide of the transmitter/receiver device 506' (corresponding circuitry not shown) as depicted by reference 500' of FIG. 5B. In another embodiment, not shown by reference 500', the dielectric waveguide 502' can be placed inside the hollow metal waveguide of the transmitter/receiver device 506' without an axis of the dielectric waveguide 502' being coaxially aligned with an axis of the hollow metal waveguide of the transmitter/receiver device 506'. In either of these embodiments, the guided wave generated by the transmitter/receiver device 506' can couple to a surface of the dielectric waveguide 502' to induce one or more wave propagation modes of the guided wave 504' on the dielectric waveguide 502' including a fundamental mode (e.g., a symmetric mode) and/or a non-fundamental mode (e.g., asymmetric mode).

In one embodiment, the guided wave 504' can propagate in part on the outer surface of the dielectric waveguide 502' and in part inside the dielectric waveguide 502'. In another embodiment, the guided wave 504' can propagate substantially or completely on the outer surface of the dielectric waveguide 502'. In yet other embodiments, the guided wave 504' can propagate substantially or completely inside the dielectric waveguide 502'. In this latter embodiment, the guide wave 504' can radiate at an end of the dielectric waveguide 502' (such as the tapered end shown in FIG. 4) for coupling to a transmission medium such as a wire 402 of FIG. 4.

It will be further appreciated that other constructs the transmitter/receiver device 506 are possible. For example, a hollow metal waveguide of a transmitter/receiver device 506'' (corresponding circuitry not shown), depicted in FIG. 5B as reference 500'', can be placed tangentially or in parallel (with or without a gap) with respect to an outer surface of a transmission medium such as the wire 402 of FIG. 4 without the use of the dielectric waveguide 502. In this embodiment, the guided wave generated by the transmitter/receiver device 506'' can couple to a surface of the wire 402 to induce one or more wave propagation modes of a guided wave 408 on the wire 402 including a fundamental mode (e.g., a symmetric mode) and/or a non-fundamental mode (e.g., asymmetric mode). In another embodiment, the wire 402 can be positioned inside a hollow metal waveguide of a transmitter/receiver device 506''' (corresponding circuitry not shown) so that an axis of the wire 402 is coaxially (or not coaxially) aligned with an axis of the hollow metal waveguide without the use of the dielectric waveguide 502—see FIG. 5B reference 500''', also see FIGS. 10A-10C described below. In this embodiment, the guided wave generated by the transmitter/receiver device 506''' can couple to a surface of the wire 402 to induce one or more wave propagation modes of a guided wave 408 on the wire including a fundamental mode (e.g., a symmetric mode) and/or a non-fundamental mode (e.g., asymmetric mode).

In the embodiments of 500'' and 500''', the guided wave 408 can propagate in part on the outer surface of the wire 402 and in part inside the wire 402. In another embodiment, the guided wave 408 can propagate substantially or completely on the outer surface of the wire 402. The wire 402 can be a bare conductor or a conductor with an insulated outer surface.

Figure 6:
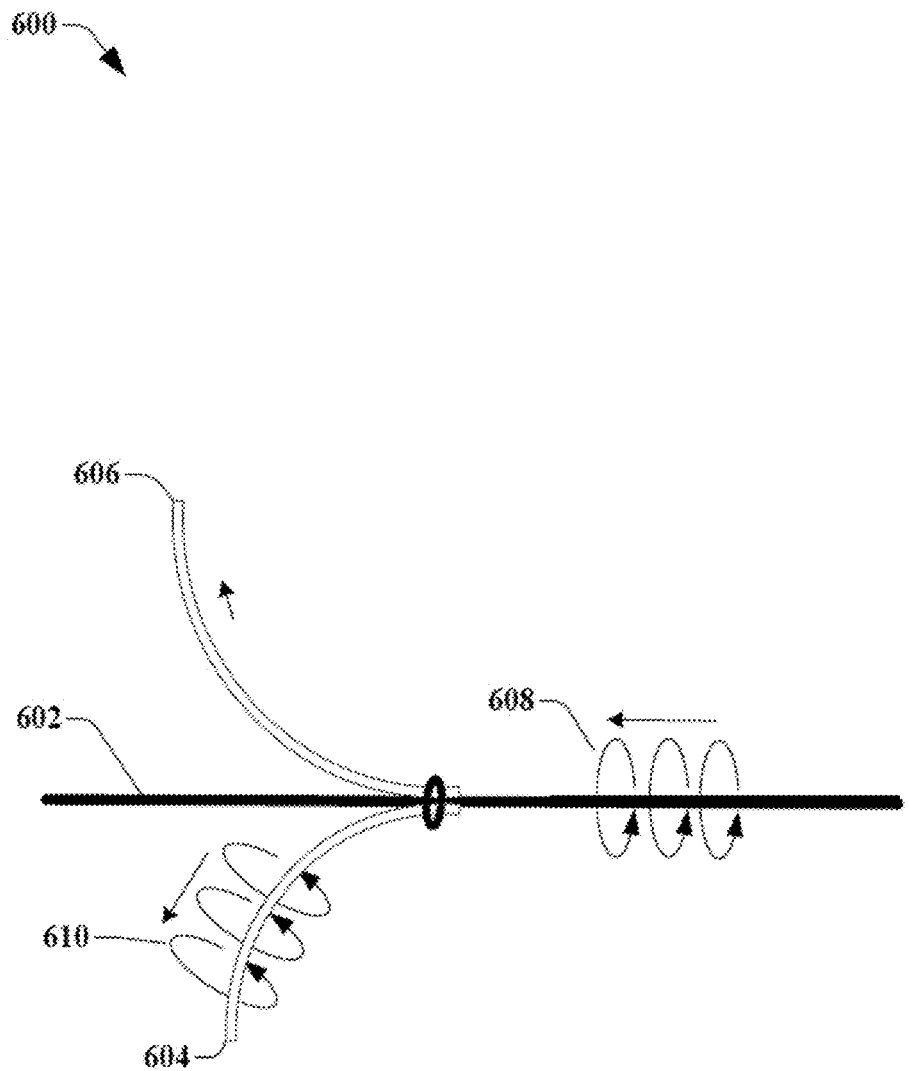
FIG. 6 is a block diagram illustrating an example, non-limiting embodiment of a dual dielectric waveguide coupler in accordance with various aspects described herein.

Turning now to FIG. 6, illustrated is a block diagram illustrating an example, non-limiting embodiment of a dual dielectric waveguide coupling system 600 in accordance with various aspects described herein. In an embodiment, two or more dielectric waveguides (e.g., 604 and 606) can be positioned around a wire 602 in order to receive guided wave 608. In an embodiment, the guided wave 608 can be characterized as a surface wave or other electromagnetic wave. In an embodiment, one dielectric waveguide is enough to receive the guided wave 608. In that case, guided wave 608 couples to dielectric waveguide 604 and propagates as guided wave 610. If the field structure of the guided wave 608 oscillates or undulates around the wire 602 due to various outside factors, then dielectric waveguide 606 can be placed such that guided wave 608 couples to dielectric waveguide 606. In some embodiments, four or more dielectric waveguides can be placed around a portion of the wire 602, e.g., at 90 degrees or another spacing with respect to each other, in order to receive guided waves that may oscillate or rotate around the wire 602, that have been induced at different axial orientations or that have non-fundamental or higher order modes that, for example, have lobes and/or nulls or other asymmetries that are orientation dependent. However, it will be appreciated that there may be less than or more than four dielectric waveguides placed around a portion of the wire 602 without departing from example embodiments. It will also be appreciated that while some example embodiments have presented a plurality of dielectric waveguides around at least a portion of a wire 602, this plurality of dielectric waveguides can also be considered as part of a single dielectric waveguide system having multiple dielectric waveguide subcomponents. For example, two or more dielectric waveguides can be manufactured as single system that can be installed around a wire in a single installation such that the dielectric waveguides are either pre-positioned or adjustable relative to each other (either manually or automatically) in accordance with the single system. Receivers coupled to dielectric waveguides 606 and 604 can use diversity combining to combine signals received from both dielectric waveguides 606 and 604 in order to maximize the signal quality. In other embodiments, if one or the other of a dielectric waveguides 604 and 606 receive a transmission that is above a predetermined threshold, receivers can use selection diversity when deciding which signal to use.

It is noted that the graphical representations of waves 608 and 610 are presented merely to illustrate the principles that guided wave 608 induces or otherwise launches a wave 610 on a dielectric waveguide 604. The actual electric and magnetic fields generated as a result of such wave propagation may vary depending on the frequencies employed, the design of the dielectric waveguide 604, the dimensions and composition of the wire 602, as well as its surface characteristics, its optional insulation, the electromagnetic properties of the surrounding environment, etc.

Figure 7:
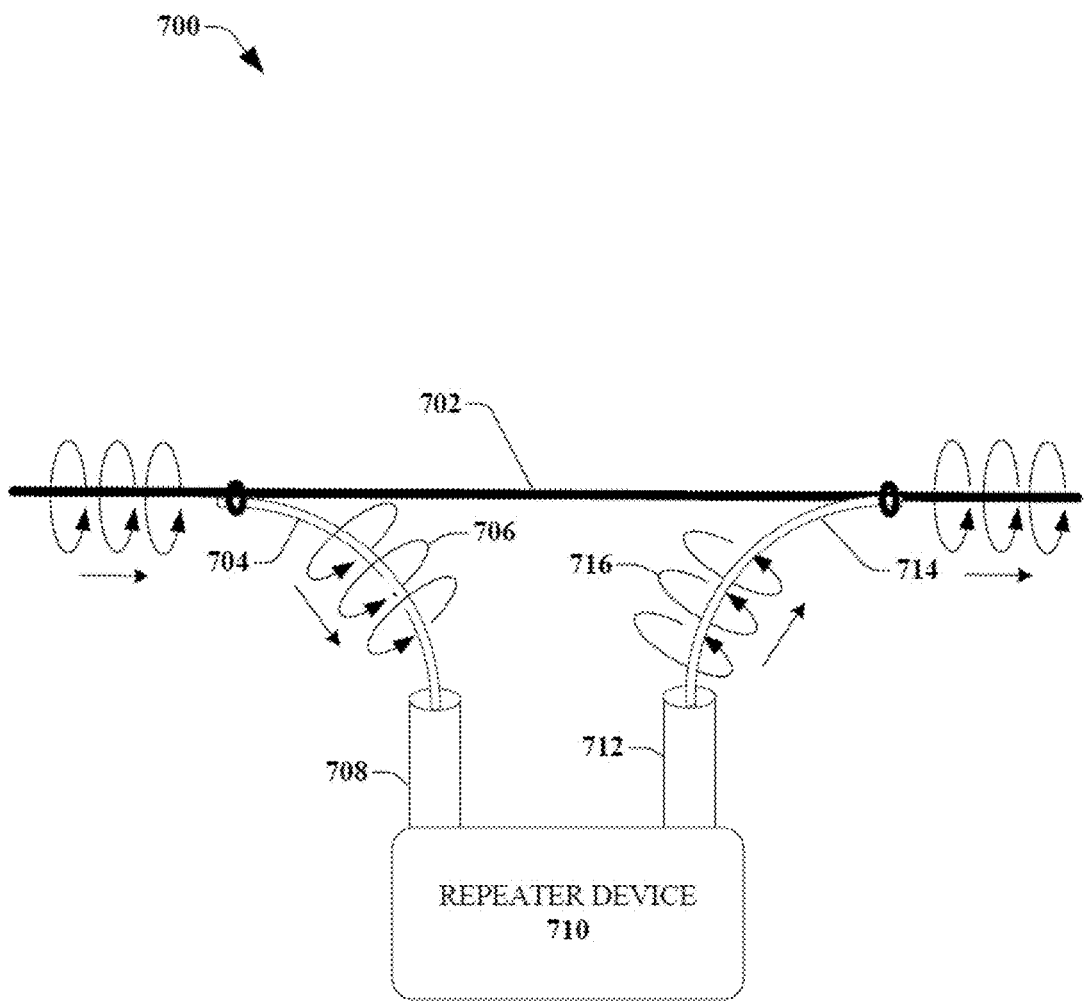
FIG. 7 is a block diagram illustrating an example, non-limiting embodiment of a bidirectional dielectric waveguide coupler in accordance with various aspects described herein.

Turning now to FIG. 7, illustrated is a block diagram of an example, non-limiting embodiment of a bidirectional dielectric waveguide coupling system 700 in accordance with various aspects described herein. In system 700, two dielectric waveguides 704 and 714 can be placed near a wire 702 such that guided waves (e.g., surface waves or other electromagnetic waves) propagating along the wire 702 are coupled to dielectric waveguide 704 as wave 706, and then are boosted or repeated by repeater device 710 and launched as a guided wave 716 onto dielectric waveguide 714. The guided wave 716 can then couple to wire 702 and continue to propagate along the wire 702. In an embodiment, the repeater device 710 can receive at least a portion of the power utilized for boosting or repeating through magnetic coupling with the wire 702, which can be a power line.

In some embodiments, repeater device 710 can repeat the transmission associated with wave 706, and in other embodiments, repeater device 710 can be associated with a distributed antenna system and/or base station device located near the repeater device 710. Receiver waveguide 708 can receive the wave 706 from the dielectric waveguide 704 and transmitter waveguide 712 can launch guided wave 716 onto dielectric waveguide 714. Between receiver waveguide 708 and transmitter waveguide 712, the signal can be amplified to correct for signal loss and other inefficiencies associated with guided wave communications or the signal can be received and processed to extract the data contained therein and regenerated for transmission. In an embodiment, a signal can be extracted from the transmission and processed and otherwise emitted to mobile devices nearby via distributed antennas communicably coupled to the repeater device 710. Similarly, signals and/or communications received by the distributed antennas can be inserted into the transmission that is generated and launched onto dielectric waveguide 714 by transmitter waveguide 712. Accordingly, the repeater system 700 depicted in FIG. 7 can be comparable in function to the dielectric waveguide coupling device 108 and 110 in FIG. 1.

It is noted that although FIG. 7 shows guided wave transmissions 706 and 716 entering from the left and exiting to the right respectively, this is merely a simplification and is not intended to be limiting. In other embodiments, receiver waveguide 708 and transmitter waveguide 712 can also function as transmitters and receivers respectively, allowing the repeater device 710 to be bi-directional.

In an embodiment, repeater device 710 can be placed at locations where there are discontinuities or obstacles on the wire 702. These obstacles can include transformers, connections, utility poles, and other such power line devices. The repeater device 710 can help the guided (e.g., surface) waves jump over these obstacles on the line and boost the transmission power at the same time. In other embodiments, a dielectric waveguide can be used to jump over the obstacle without the use of a repeater device. In that embodiment, both ends of the dielectric waveguide can be tied or fastened to the wire, thus providing a path for the guided wave to travel without being blocked by the obstacle.

Figure 8:
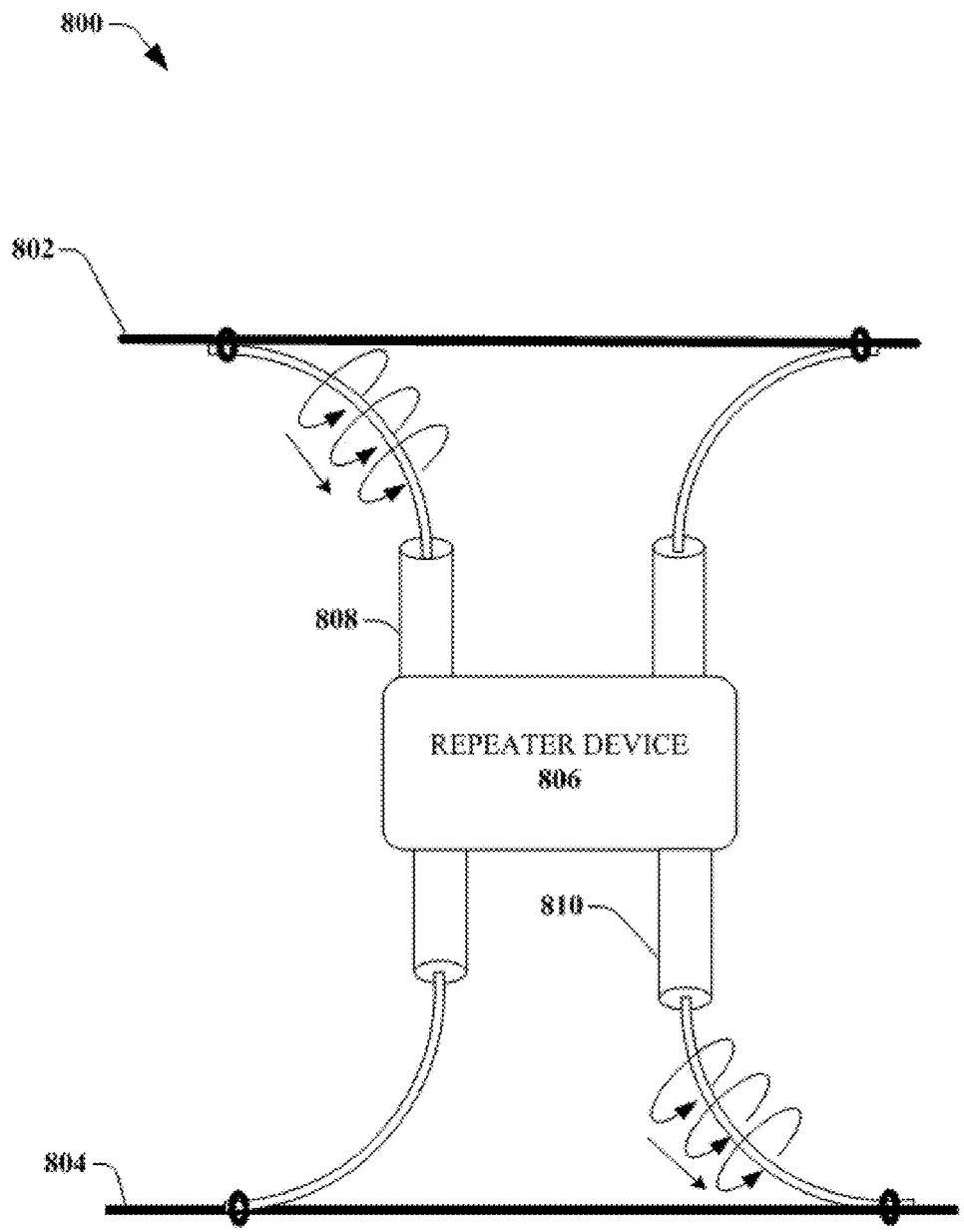
FIG. 8 illustrates a block diagram illustrating an example, non-limiting embodiment of a bidirectional dielectric waveguide coupler in accordance with various aspects described herein.

Turning now to FIG. 8, illustrated is a block diagram of an example, non-limiting embodiment of a bidirectional dielectric waveguide coupler 800 in accordance with various aspects described herein. The bidirectional dielectric waveguide coupler 800 can employ diversity paths in the case of when two or more wires are strung between utility poles. Since guided wave transmissions have different transmission efficiencies and coupling efficiencies for insulated wires and un-insulated wires based on weather, precipitation and atmospheric conditions, it can be advantageous to selectively transmit on either an insulated wire or un-insulated wire at certain times.

In the embodiment shown in FIG. 8, repeater device uses a receiver waveguide 808 to receive a guided wave traveling along uninsulated wire 802 and repeats the transmission using transmitter waveguide 810 as a guided wave along insulated wire 804. In other embodiments, repeater device can switch from the insulated wire 804 to the un-insulated wire 802, or can repeat the transmissions along the same paths. Repeater device 806 can include sensors, or be in communication with sensors that indicate conditions that can affect the transmission. Based on the feedback received from the sensors, the repeater device 806 can make the determination about whether to keep the transmission along the same wire, or transfer the transmission to the other wire.

Figure 9:
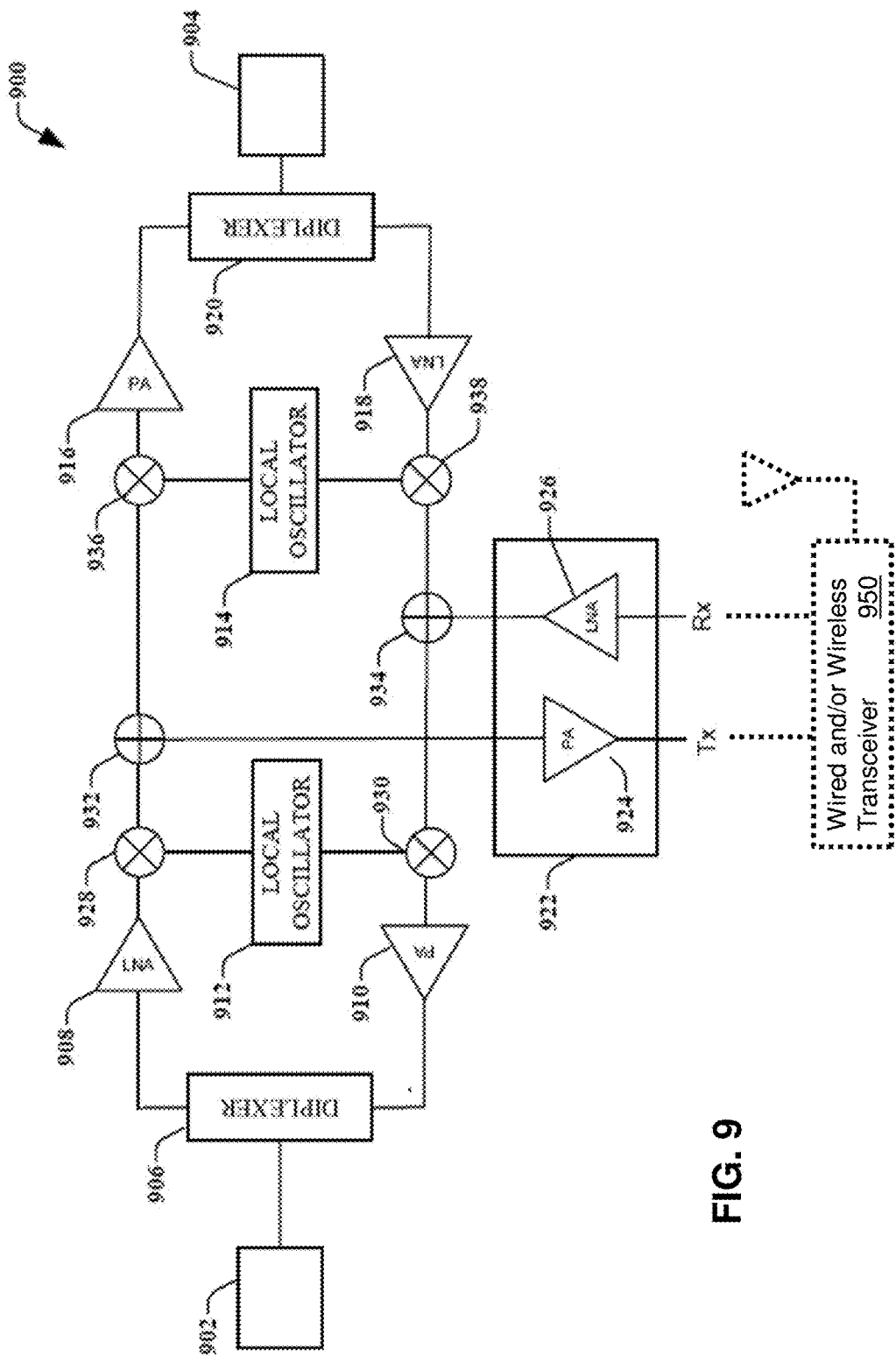
FIG. 9 illustrates a block diagram illustrating an example, non-limiting embodiment of a bidirectional repeater system in accordance with various aspects described herein.

Turning now to FIG. 9, illustrated is a block diagram illustrating an example, non-limiting embodiment of a bidirectional repeater system 900. Bidirectional repeater system 900 includes waveguide coupling devices 902 and 904 that receive and transmit transmissions from other coupling devices located in a distributed antenna system or backhaul system.

In various embodiments, waveguide coupling device 902 can receive a transmission from another waveguide coupling device, wherein the transmission has a plurality of subcarriers. Diplexer 906 can separate the transmission from other transmissions, and direct the transmission to low-noise amplifier ("LNA") 908. A frequency mixer 928, with help from a local oscillator 912, can downshift the transmission (which is in the millimeter-wave band or around 38 GHz in some embodiments) to a lower frequency, whether it is a cellular band (~1.9 GHz) for a distributed antenna system, a native frequency, or other frequency for a backhaul system. An extractor 932 can extract the signal on the subcarrier that corresponds to antenna or other output component 922 and direct the signal to the output component 922. For the signals that are not being extracted at this antenna location, extractor 932 can redirect them to another frequency mixer 936, where the signals are used to modulate a carrier wave generated by local oscillator 914. The carrier wave, with its subcarriers, is directed to a power amplifier ("PA") 916 and is retransmitted by waveguide coupling device 904 to another repeater system, via diplexer 920.

At the output device 922 (antenna in a distributed antenna system), a PA 924 can boost the signal for transmission to the mobile device. An LNA 926 can be used to amplify weak signals that are received from the mobile device and then send the signal to a multiplexer 934 which merges the signal with signals that have been received from waveguide coupling device 904. The signals received from coupling device 904 have been split by diplexer 920, and then passed through LNA 918, and downshifted in frequency by frequency mixer 938. When the signals are combined by multiplexer 934, they are upshifted in frequency by frequency mixer 930, and then boosted by PA 910, and transmitted back to the launcher or on to another repeater by waveguide coupling device 902. In an embodiment bidirectional repeater system 900 can be just a repeater without the antenna/output device 922. It will be appreciated that in some embodiments, a bidirectional repeater system 900 could also be implemented using two distinct and separate uni-directional repeaters. In an alternative embodiment, a bidirectional repeater system 900 could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 10A:
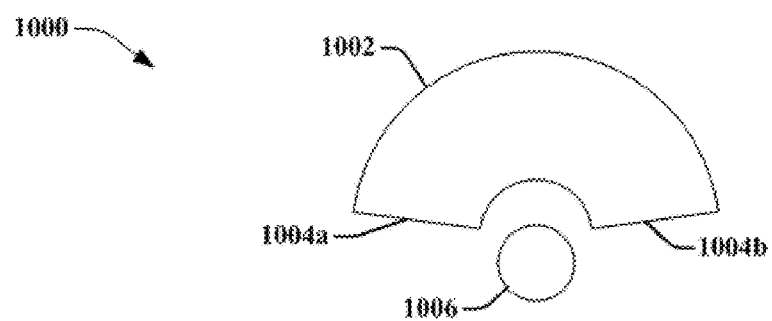
FIGS. 10A, 10B, and 10C are block diagrams illustrating example, non-limiting embodiments of a slotted waveguide coupler in accordance with various aspects described herein.
Figure 10B:
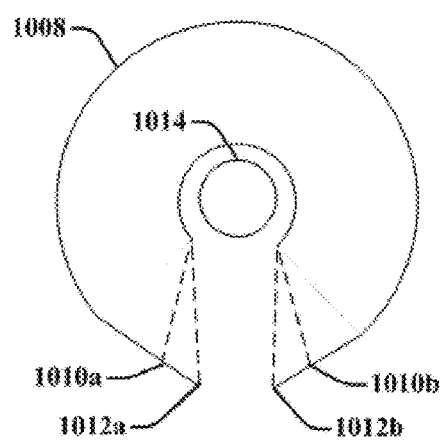
Figure 10C:
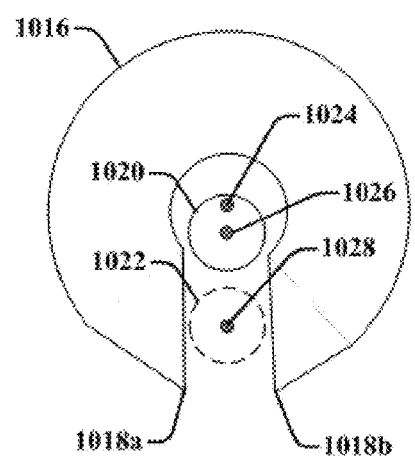

Turning now to FIGS. 10A, 10B, and 10C, illustrated are block diagrams of example, non-limiting embodiments of a slotted waveguide coupler system 1000 in accordance with various aspects described herein. In FIG. 10A, the waveguide coupler system comprises a wire 1006 that is positioned with respect to a waveguide 1002, such that the wire 1006 fits within or near a slot formed in the waveguide 1002 that runs longitudinally with respect to the wire 1004. The opposing ends 1004a and 1004b of the waveguide 1002, and the waveguide 1002 itself, surrounds less than 180 degrees of the wire surface of the wire 1006.

In FIG. 10B the waveguide coupler system comprises a wire 1014 that is positioned with respect to a waveguide 1008, such that the wire 1014 fits within or near a slot formed in the waveguide 1008 that runs longitudinally with respect to the wire 1004. The slot surfaces of the waveguide 1008 can be non parallel, and two different exemplary embodiments are shown in FIG. 10B. In the first, slot surfaces 1010a and 1010b can be non parallel and aim outwards, slightly wider than the width of the wire 1014. In the other embodiment, the slots surfaces 1012a and 1012b can still be non-parallel, but narrow to form a slot opening smaller than a width of the wire 1014. Any range of angles of the non parallel slot surfaces are possible, of which these are two exemplary embodiments.

In FIG. 10C, the waveguide coupler system shows a wire 1020 that fits within a slot formed in waveguide 1016. The slot surfaces 1018a and 1018b in this exemplary embodiment can be parallel, but the axis 1026 of the wire 1020 is not aligned with the axis 1024 of the waveguide 1016. The waveguide 1016 and the wire 1020 are therefore not coaxially aligned. In another embodiment, shown, a possible position of the wire at 1022 also has an axis 1028 that is not aligned with the axis 1024 of the waveguide 1016.

It is to be appreciated that while three different embodiments showing a) waveguide surfaces that surround less than 180 degrees of the wire, b) non parallel slot surfaces, and c) coaxially unaligned wires and waveguide were shown separately in FIGS. 10A, 10B, and 10C, in various embodiments, diverse combinations of the listed features are possible.

Figure 11:
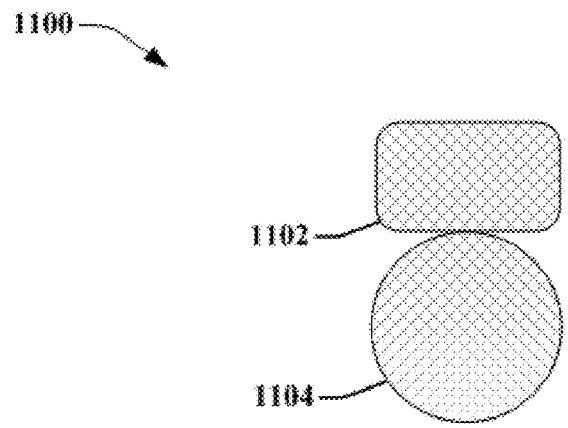
FIG. 11 is a block diagram illustrating an example, non-limiting embodiment of a waveguide coupling system in accordance with various aspects described herein

Turning now to FIG. 11, illustrated is an example, non-limiting embodiment of a waveguide coupling system 1100 in accordance with various aspects described herein. FIG. 11 depicts a cross sectional representation of the waveguide and wire embodiments shown in FIGS. 2, 3, 4, and etc. As can be seen in 1100, the wire 1104 can be positioned directly next to and touching waveguide 1102. In other embodiments, as shown in waveguide coupling system 1200 in FIG. 12, the wire 1204 can still be placed near, but not actually touching waveguide strip 1202. In both cases, electromagnetic waves traveling along the waveguides can induce other electromagnetic waves on to the wires and vice versa. Also, in both embodiments, the wires 1104 and 1204 are placed outside the cross-sectional area defined by the outer surfaces of waveguides 1102 and 1202.

For the purposes of this disclosure, a waveguide does not surround, in substantial part, a wire surface of a wire when the waveguide does not surround an axial region of the surface, when viewed in cross-section, of more than 180 degrees. For avoidance of doubt, a waveguide does not surround, in substantial part a surface of a wire when the waveguide surrounds an axial region of the surface, when viewed in cross-section, of 180 degrees or less.

Figure 12:
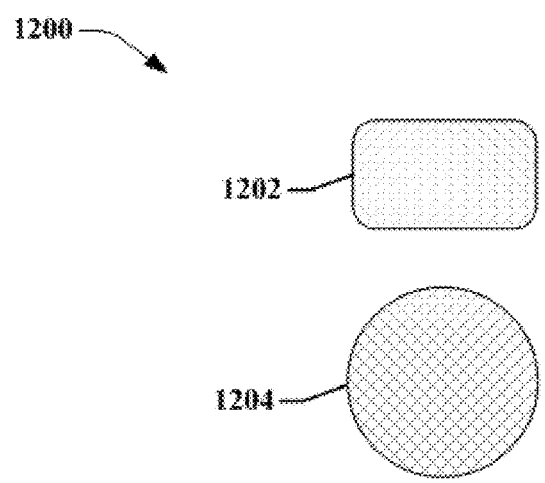
FIG. 12 is a block diagram illustrating an example, non-limiting embodiment of a waveguide coupling system in accordance with various aspects described herein.

It is to be appreciated that while FIGS. 11 and 12 show wires 1104 and 1204 having a circular shape and waveguides 1102 and 1202 having rectangular shapes, this is not meant to be limiting. In other embodiments, wires and waveguides can have a variety of shapes, sizes, and configurations. The shapes can include, but not be limited to: ovals or other elliptoid shapes, octagons, quadrilaterals or other polygons with either sharp or rounded edges, or other shapes. Additionally, in some embodiments, the wires 1104 and 1204 can be stranded wires comprising smaller gauge wires, such as a helical strand, braid or other coupling of individual strands into a single wire. Any of wires and waveguides shown in the figures and described throughout this disclosure can include one or more of these embodiments.

Figure 13:
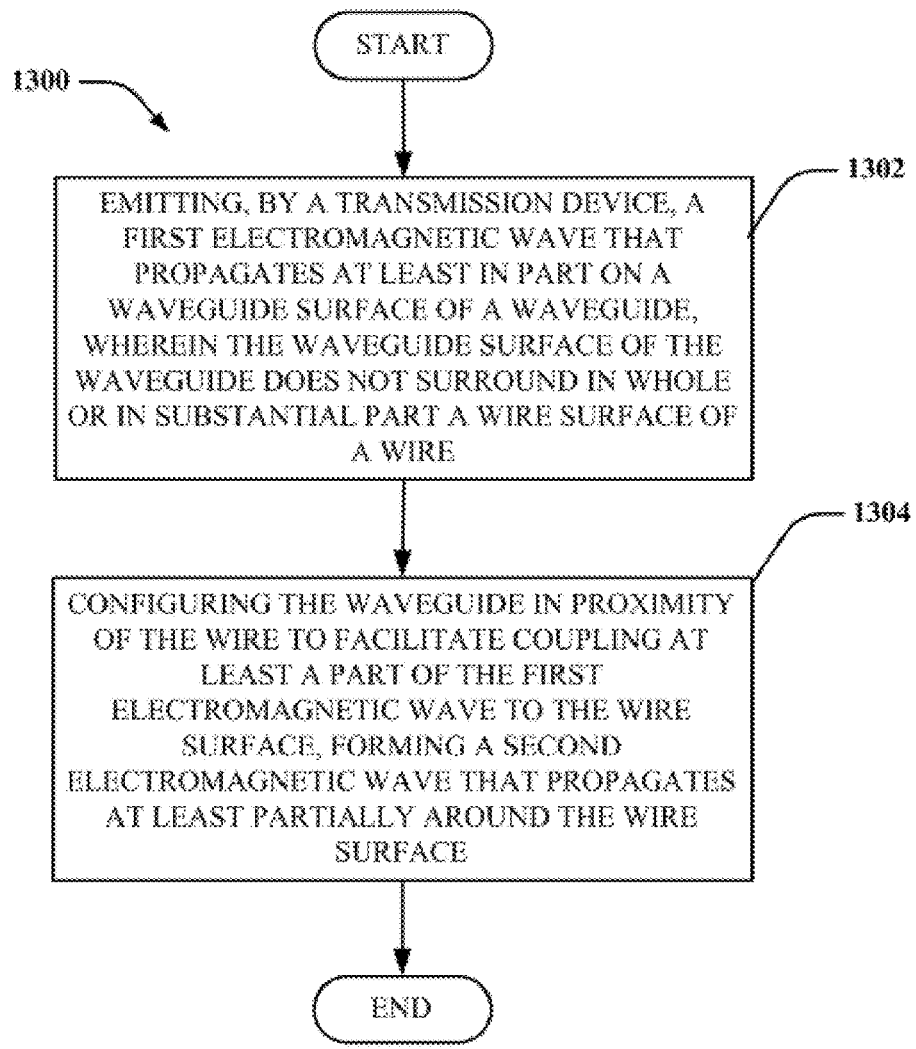
FIG. 13 illustrates a flow diagram of an example, non-limiting embodiment of a method for transmitting a transmission with a dielectric waveguide coupler as described herein.

FIG. 13 illustrates a process in connection with the aforementioned systems. The process in FIG. 13 can be implemented for example by systems 100, 200, 300, 400, 500, 600, 700, 800, and 900 illustrated in FIGS. 1-9 respectively. While for purposes of simplicity of explanation, the process is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 13 illustrates a flow diagram of an example, non-limiting embodiment of a method for transmitting a transmission with a dielectric waveguide coupler as described herein. Method 1300 can begin at 1302 where a first electromagnetic wave is emitted by a transmission device as a guided wave that propagates at least in part on a waveguide surface of a waveguide, wherein the waveguide surface of the waveguide does not surround in whole or in substantial part a wire surface of a wire. The transmission that is generated by a transmitter can be based on a signal received from a base station device, access point, network, a mobile device, or other signal source.

At 1304, based upon configuring or positioning the waveguide in proximity of the wire, the guided wave then couples at least a part of the first electromagnetic wave to a wire surface, forming a second electromagnetic wave (e.g., a surface wave) that propagates at least partially around the wire surface, wherein the wire is in proximity to the waveguide. This can be done in response to positioning a portion of the dielectric waveguide (e.g., a tangent of a curve of the dielectric waveguide) near and parallel to the wire, wherein a wavelength of the electromagnetic wave is smaller than a circumference of the wire and the dielectric waveguide. The guided wave, or surface wave, stays parallel to the wire even as the wire bends and flexes. Bends can increase transmission losses, which are also dependent on wire diameters, frequency, and materials. The coupling interface between the wire and the waveguide can also be configured to achieve the desired level of coupling, as described herein, which can include tapering an end of the waveguide to improve impedance matching between the waveguide and the wire.

The transmission that is emitted by the transmitter can exhibit one or more waveguide modes. The waveguide modes can be dependent on the shape and/or design of the waveguide. The propagation modes on the wire can be different than the waveguide modes due to the different characteristics of the waveguide and the wire. When the circumference of the wire is comparable in size to, or greater, than a wavelength of the transmission, the guided wave exhibits multiple wave propagation modes. The guided wave can therefore comprise more than one type of electric and magnetic field configuration. As the guided wave (e.g., surface wave) propagates down the wire, the electrical and magnetic field configurations may remain substantially the same from end to end of the wire or vary as the transmission traverses the wave by rotation, dispersion, attenuation or other effects.

Figure 14:
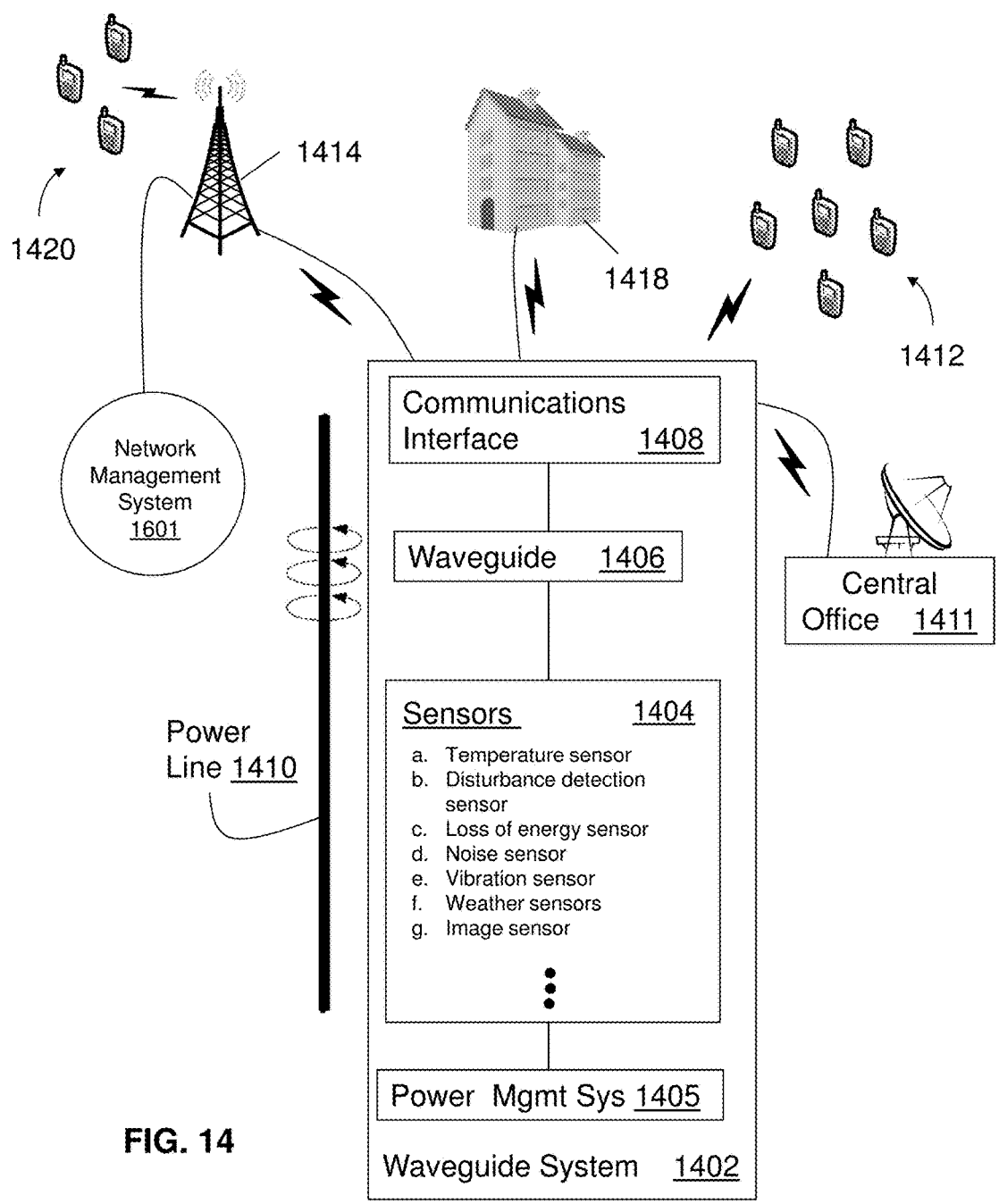
FIG. 14 is a block diagram illustrating an example, non-limiting embodiment of a waveguide system in accordance with various aspects described herein.

FIG. 14 is a block diagram illustrating an example, non-limiting embodiment of a waveguide system 1402 in accordance with various aspects described herein. The waveguide system 1402 can comprise sensors 1404, a power management system 1405, a waveguide 1406, and a communications interface 1408.

The waveguide system 1402 can be coupled to a power line 1410 for facilitating data communications in accordance with embodiments described in the subject disclosure. In an example embodiment, the waveguide 1406 can comprise all or part of the system 500, such as shown in FIG. 5A, for inducing electromagnetic waves on a surface of the power line 1410 that longitudinally propagate along the surface of the power line 1410 as described in the subject disclosure. Non-limiting techniques for coupling the waveguide 1406 to the power line 1410 are shown in FIGS. 2-4 and 6. The waveguide 1406 can also serve as a repeater for retransmitting electromagnetic waves on the same power line 1410 or for routing electromagnetic waves between power lines 1410 as shown in FIGS. 7-8.

The communications interface 1408 can comprise the communications interface 501 shown in FIG. 5A, in an example embodiment. The communications interface 1408 couples to the waveguide 1406 for up-converting signals operating at an original frequency range to electromagnetic waves operating at, exhibiting, or associated with a carrier frequency that propagate along a surface of a coupling device of the waveguide 1406, such as the dielectric waveguide 502 of FIG. 5A, and that induce corresponding electromagnetic waves that propagate along a surface of the power line 1410. A carrier frequency can be represented by a center frequency having upper and lower cutoff frequencies that define the bandwidth of the electromagnetic waves. The power line 1410 can be a wire (e.g., single stranded or multi-stranded) having a conducting surface or insulated surface. The communications interface 1408 can also receive signals from the waveguide 1406 that have been down-converted from electromagnetic waves operating at a carrier frequency to signals at their original frequency.

Signals received by the communications interface 1408 for up-conversion can include without limitation signals supplied by a central office 1411 over a wired or wireless interface of the communications interface 1408, a base station 1414 over a wired or wireless interface of the communications interface 1408, wireless signals transmitted by mobile devices 1420 to the base station 1414 for delivery over the wired or wireless interface of the communications interface 1408, signals supplied by in-building communication devices 1418 over the wired or wireless interface of the communications interface 1408, and/or wireless signals supplied to the communications interface 1408 by mobile devices 1412 roaming in a wireless communication range of the communications interface 1408. In embodiments where the waveguide system 1402 functions as a repeater, such as shown in FIGS. 7-8, the communications interface 1408 may not be included in the waveguide system 1402.

The electromagnetic waves propagating along the surface of the power 1410 can be modulated and formatted to include packets or frames of data that include a data payload and further include networking information (such as header information for identifying one or more destination waveguide systems 1402). The networking information may be provided by the waveguide system 1402 or an originating device such as the central office 1411, the base station 1414, mobile devices 1420, or in-building devices 1418, or a combination thereof. Additionally, the modulated electromagnetic waves can include error correction data for mitigating signal disturbances. The networking information and error correction data can be used by a destination waveguide system 1402 for detecting transmissions directed to it, and for down-converting and processing with error correction data transmissions that include voice and/or data signals directed to recipient communication devices communicatively coupled to the destination waveguide system 1402.

Referring now to the sensors 1404 of the waveguide system 1402, the sensors 1404 can comprise one or more of a temperature sensor 1404$a$, a disturbance detection sensor 1404$b$, a loss of energy sensor 1404$c$, a noise sensor 1404$d$, a vibration sensor 1404$e$, an environmental (e.g., weather) sensor 1404$f$, and/or an image sensor 1404$g$. The temperature sensor 1404$a$ can be used to measure ambient temperature, a temperature of the waveguide 1406, a temperature of the power line 1410, temperature differentials (e.g., compared to a setpoint or baseline, between 1046 and 1410, etc.), or any combination thereof. In one embodiment, temperature metrics can be collected and reported periodically to a network management system 1601 by way of the base station 1414.

The disturbance detection sensor 1404$b$ can perform measurements on the power line 1410 to detect disturbances such as signal reflections, which may indicate a presence of a downstream disturbance that may impede the propagation of electromagnetic waves on the power line 1410. A signal reflection can represent a distortion resulting from, for example, an electromagnetic wave transmitted on the power line 1410 by the waveguide 1406 that reflects in whole or in part back to the waveguide 1406 from a disturbance in the power line 1410 located downstream from the waveguide 1406.

Figure 15A:
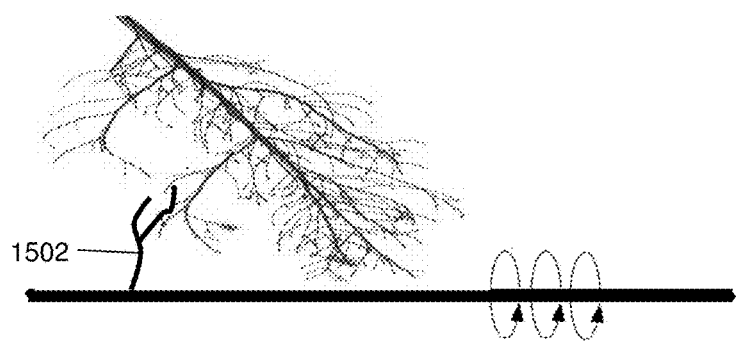
FIGS. 15A, 15B, 15C, 15D, 15E, 15F and 15G illustrate example, non-limiting embodiments of sources for disturbances detectable by the waveguide system of FIG. 14 as described herein.
Figure 15B:
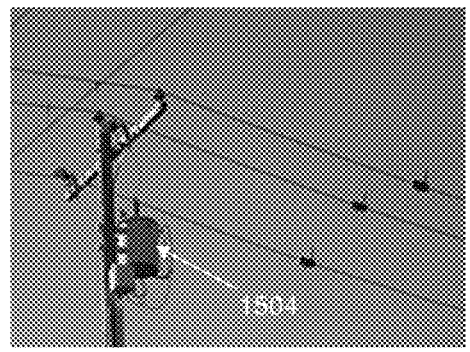
Figure 15C:
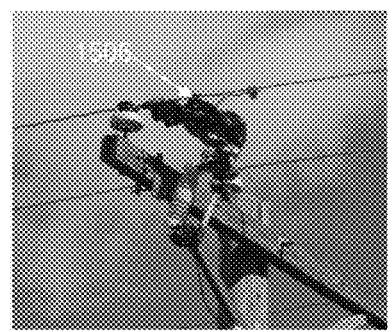
Figure 15D:
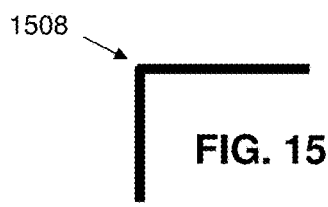
Figure 15E:
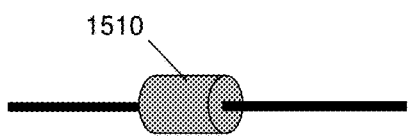
Figure 15F:
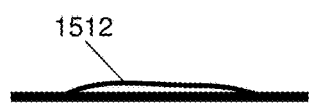
Figure 15G:

Signal reflections can be caused by obstructions on the power line 1410. For example, a tree limb shown in FIG. 15(A) may cause electromagnetic wave reflections when the tree limb is lying on the power line 1410, or is in close proximity to the power line 1410 which may cause a corona discharge 1502. Other illustrations of obstructions that can cause electromagnetic wave reflections can include without limitation an object 1506 that has been entangled on the power line 1410 as shown in FIG. 15(C) (e.g., clothing, a shoe wrapped around a power line 1410 with a shoe string, etc.), a corroded build-up 1512 on the power line 1410 as shown in FIG. 15(F), or an ice build-up 1514 as shown in FIG. 15 (G). Power grid components may also interfere with the transmission of electromagnetic waves on the surface of power lines 1410. Illustrations of power grid components that may cause signal reflections include without limitation a transformer 1504 illustrated in FIG. 15(B) and a joint 1510 for connecting spliced power lines such as illustrated in FIG. 15(E). A sharp angle 1508 on a power line 1410, as shown in FIG. 15(D), may also cause electromagnetic wave reflections.

The disturbance detection sensor 1404*b* can comprise a circuit to compare magnitudes of electromagnetic wave reflections to magnitudes of original electromagnetic waves transmitted by the waveguide 1406 to determine how much a downstream disturbance in the power line 1410 attenuates transmissions. The disturbance detection sensor 1404*b* can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1404*b* or may be remotely accessible by the disturbance detection sensor 1404*b*. The profiles can comprise spectral data that models different disturbances that may be encountered on power lines 1410 to enable the disturbance detection sensor 1404*b* to identify disturbances locally. An identification of the disturbance if known can be reported to the network management system 1601 by way of the base station 1414. The disturbance detection sensor 1404*b* can also utilize the waveguide 1406 to transmit electromagnetic waves as test signals to determine a round-trip time for an electromagnetic wave reflection. The round trip time measured by the disturbance detection sensor 1404*b* can be used to calculate a distance traveled by the electromagnetic wave up to a point where the reflection takes place, which enables the disturbance detection sensor 1404*b* to calculate a distance from the waveguide 1406 to the downstream disturbance on the power line 1410.

The distance calculated can be reported to the network management system 1601 by way of the base station 1414. In one embodiment, the location of the waveguide system 1402 on the power line 1410 may be known to the network management system 1601, which the network management system 1601 can use to determine a location of the disturbance on the power line 1410 based on a known topology of the power grid. In another embodiment, the waveguide system 1402 can provide its location to the network management system 1601 to assist in the determination of the location of the disturbance on the power line 1410. The location of the waveguide system 1402 can be obtained by the waveguide system 1402 from a pre-programmed location of the waveguide system 1402 stored in a memory of the waveguide system 1402, or the waveguide system 1402 can determine its location using a GPS receiver (not shown) included in the waveguide system 1402.

The power management system 1405 provides energy to the aforementioned components of the waveguide system 1402. The power management system 1405 can receive energy from solar cells, or from a transformer (not shown) coupled to the power line 1410, or by inductive coupling to the power line 1410 or another nearby power line. The power management system 1405 can also include a backup battery and/or a super capacitor or other capacitor circuit for providing the waveguide system 1402 with temporary power. The loss of energy sensor 1404*c* can be used to detect when the waveguide system 1402 has a loss of power condition and/or the occurrence of some other malfunction. For example, the loss of energy sensor 1404*c* can detect when there is a loss of power due to defective solar cells, an obstruction on the solar cells that causes them to malfunction, loss of power on the power line 1410, and/or when the backup power system malfunctions due to expiration of a backup battery, or a detectable defect in a super capacitor. When a malfunction and/or loss of power occurs, the loss of energy sensor 1404*c* can notify the network management system 1601 by way of the base station 1414.

The noise sensor 1404*d* can be used to measure noise on the power line 1410 that may adversely affect transmission of electromagnetic waves on the power line 1410. The noise sensor 1404*d* can sense unexpected electromagnetic interference, noise bursts, or other sources of disturbances that may interrupt transmission of modulated electromagnetic waves on a surface of a power line 1410. A noise burst can be caused by, for example, a corona discharge, or other source of noise. The noise sensor 1404*d* can compare the measured noise to a noise profile obtained by the waveguide system 1402 from an internal database of noise profiles or from a remotely located database that stores noise profiles via pattern recognition, an expert system, curve fitting, matched filtering or other artificial intelligence, classification or comparison technique. From the comparison, the noise sensor 1404*d* may identify a noise source (e.g., corona discharge or otherwise) based on, for example, the noise profile that provides the closest match to the measured noise. The noise sensor 1404*d* can also detect how noise affects transmissions by measuring transmission metrics such as bit error rate, packet loss rate, jitter, packet retransmission requests, etc. The noise sensor 1404*d* can report to the network management system 1601 by way of the base station 1414 the identity of noise sources, their time of occurrence, and transmission metrics, among other things.

The vibration sensor 1404*e* can include accelerometers and/or gyroscopes to detect 2D or 3D vibrations on the power line 1410. The vibrations can be compared to vibration profiles that can be stored locally in the waveguide system 1402, or obtained by the waveguide system 1402 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1404e to the network management system 1601 by way of the base station 1414.

The environmental sensor 1404f can include a barometer for measuring atmospheric pressure, ambient temperature (which can be provided by the temperature sensor 1404a), wind speed, humidity, wind direction, and rainfall, among other things. The environmental sensor 1404f can collect raw information and process this information by comparing it to environmental profiles that can be obtained from a memory of the waveguide system 1402 or a remote database to predict weather conditions before they arise via pattern recognition, an expert system, knowledge-based system or other artificial intelligence, classification or other weather modeling and prediction technique. The environmental sensor 1404f can report raw data as well as its analysis to the network management system 1601.

The image sensor 1404g can be a digital camera (e.g., a charged coupled device or CCD imager, infrared camera, etc.) for capturing images in a vicinity of the waveguide system 1402. The image sensor 1404g can include an electromechanical mechanism to control movement (e.g., actual position or focal points/zooms) of the camera for inspecting the power line 1410 from multiple perspectives (e.g., top surface, bottom surface, left surface, right surface and so on). Alternatively, the image sensor 1404g can be designed such that no electromechanical mechanism is needed in order to obtain the multiple perspectives. The collection and retrieval of imaging data generated by the image sensor 1404g can be controlled by the network management system 1601, or can be autonomously collected and reported by the image sensor 1404g to the network management system 1601.

Other sensors that may be suitable for collecting telemetry information associated with the waveguide system 1402 and/or the power lines 1410 for purposes of detecting, predicting and/or mitigating disturbances that can impede electromagnetic wave transmissions on power lines 1410 (or any other form of a transmission medium of electromagnetic waves) may be utilized by the waveguide system 1402.

Figure 16:
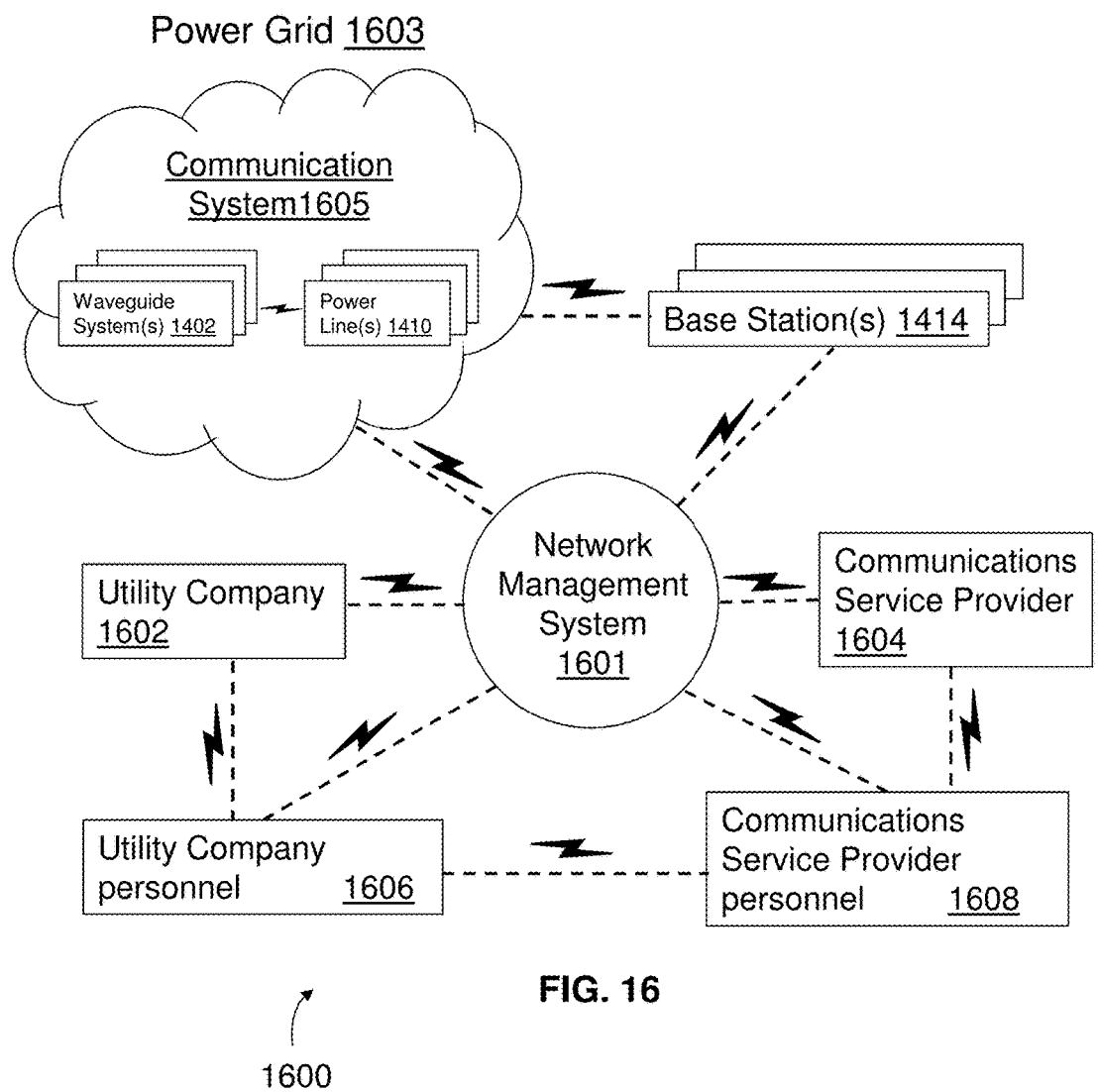
FIG. 16 is a block diagram illustrating an example, non-limiting embodiment of a system for managing a power grid communication system in accordance with various aspects described herein.

FIG. 16 is a block diagram illustrating an example, non-limiting embodiment of a system 1600 for managing a power grid 1603 and a communication system 1605 embedded therein in accordance with various aspects described herein. The communication system 1605 comprises a plurality of waveguide systems 1402 coupled to power lines 1410 of the power grid 1603. At least a portion of the waveguide systems 1402 used in the communication system 1605 can be in direct communication with a base station 1414 and/or the network management system 1601. Waveguide systems 1402 not directly connected to a base station 1414 or the network management system 1601 can engage in communication sessions with either a base station 1414 or the network management system 1601 by way of other downstream waveguide systems 1402 connected to a base station 1414 or the network management system 1601.

The network management system 1601 can be communicatively coupled to equipment of a utility company 1602 and equipment of a communications service provider 1604 for providing each entity, status information associated with the power grid 1603 and the communication system 1605, respectively. The network management system 1601, the equipment of the utility company 1602, and the communications service provider 1604 can access communication devices utilized by utility company personnel 1606 and/or communication devices utilized by communications service provider personnel 1608 for purposes of providing status information and/or for directing such personnel in the management of the power grid 1603 and/or communication system 1605.

Figure 17A:
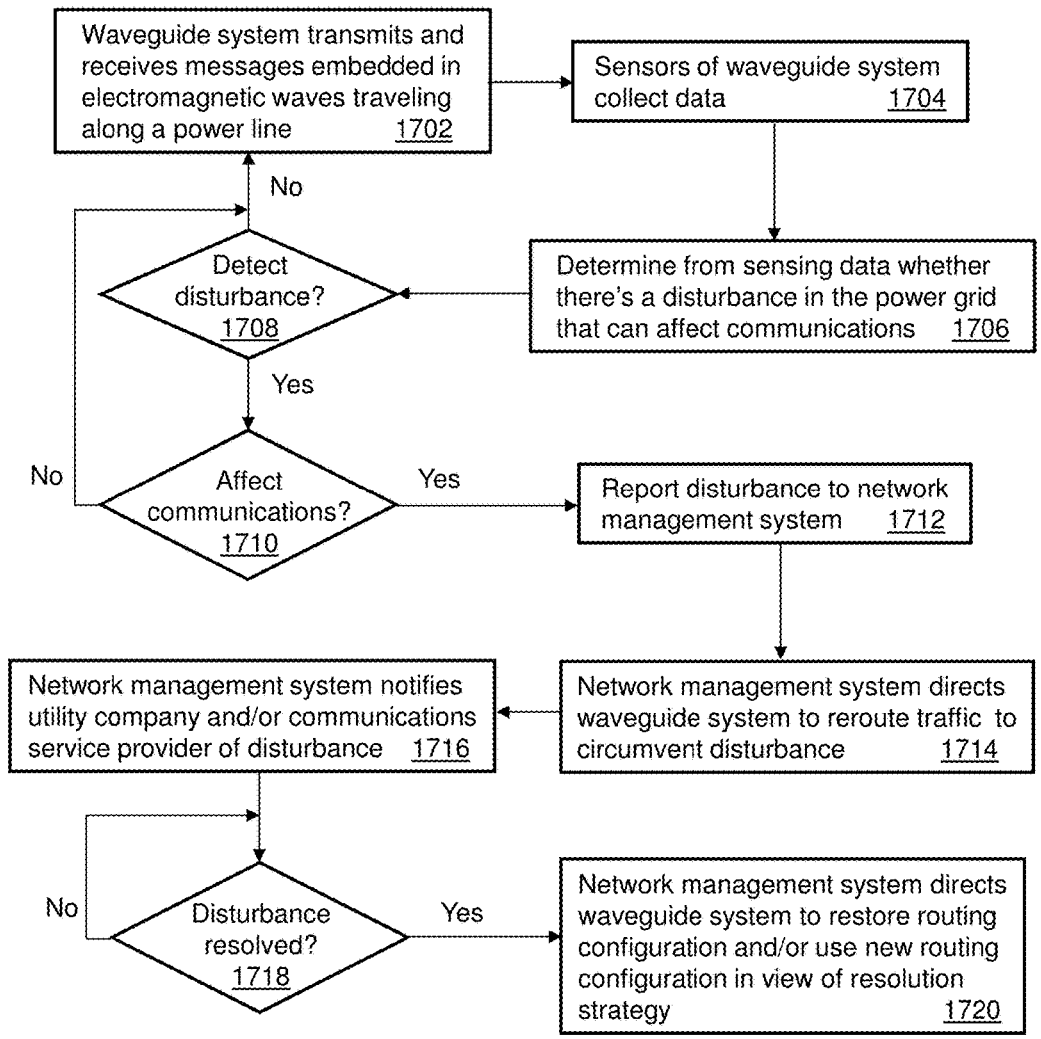
FIG. 17A illustrates a flow diagram of an example, non-limiting embodiment of a method for detecting and mitigating disturbances occurring in a communication network of the system of FIG. 16.

FIG. 17A illustrates a flow diagram of an example, non-limiting embodiment of a method 1700 for detecting and mitigating disturbances occurring in a communication network of the system 1600 of FIG. 16. Method 1700 can begin with step 1702 where a waveguide system 1402 transmits and receives messages embedded in, or forming part of, modulated electromagnetic waves or another type of electromagnetic waves traveling along a surface of a power line 1410. The messages can be voice messages, streaming video, and/or other data/information exchanged between communication devices communicatively coupled to the communication system 1605. At step 1704 the sensors 1404 of the waveguide system 1402 can collect sensing data. In an embodiment, the sensing data can be collected in step 1704 prior to, during, or after the transmission and/or receipt of messages in step 1702. At step 1706 the waveguide system 1402 (or the sensors 1404 themselves) can determine from the sensing data an actual or predicted occurrence of a disturbance in the communication system 1605 that can affect communications originating from (e.g., transmitted by) or received by the waveguide system 1402. The waveguide system 1402 (or the sensors 1404) can process temperature data, signal reflection data, loss of energy data, noise data, vibration data, environmental data, or any combination thereof to make this determination. The waveguide system 1402 (or the sensors 1404) may also detect, identify, estimate, or predict the source of the disturbance and/or its location in the communication system 1605. If a disturbance is neither detected/identified nor predicted/estimated at step 1708, the waveguide system 1402 can proceed to step 1702 where it continues to transmit and receive messages embedded in, or forming part of, modulated electromagnetic waves traveling along a surface of the power line 1410.

If at step 1708 a disturbance is detected/identified or predicted/estimated to occur, the waveguide system 1402 proceeds to step 1710 to determine if the disturbance adversely affects (or alternatively, is likely to adversely affect or the extent to which it may adversely affect) transmission or reception of messages in the communication system 1605. In one embodiment, a duration threshold and a frequency of occurrence threshold can be used at step 1710 to determine when a disturbance adversely affects communications in the communication system 1605. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1605 when the duration threshold alone is exceeded. In another embodiment, a disturbance may be considered as adversely affecting signal integrity in the communication systems 1605 when both the duration threshold and the frequency of occurrence threshold are exceeded. The latter embodiment is thus more conservative than the former embodiment for classifying disturbances that adversely affect signal integrity in the communication system 1605. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1402 may proceed to step 1702 and continue processing messages. For instance, if the disturbance detected in step 1708 has a duration of 1 ms with a single occurrence in a 10 sec time period, then neither threshold will be exceeded. Consequently, such a disturbance may be considered as having a nominal effect on signal integrity in the communication system 1605 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1402 can proceed to step 1712 and report the incident to the network management system 1601. The report can include raw sensing data collected by the sensors 1404, a description of the disturbance if known by the waveguide system 1402, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1402, the report can include a type of disturbance expected, and if predictable, an expected time occurrence of the disturbance, and an expected frequency of occurrence of the predicted disturbance when the prediction is based on historical sensing data collected by the sensors 1404 of the waveguide system 1402.

At step 1714, the network management system 1601 can determine a mitigation, circumvention, or correction technique, which may include directing the waveguide system 1402 to reroute traffic to circumvent the disturbance if the location of the disturbance can be determined. In one embodiment, the waveguide system 1402 detecting the disturbance may direct a repeater 1802 such as the one shown in FIG. 18A to connect the waveguide system 1402 from a primary power line 1804 affected by the disturbance to a secondary power line 1806 to enable the waveguide system 1402 to reroute traffic to a different transmission medium and avoid the disturbance 1801. In an embodiment where the waveguide system 1402 is configured as a repeater, such as repeater 1802, the waveguide system 1402 can itself perform the rerouting of traffic from the primary power line 1804 to the secondary power line 1806. It is further noted that for bidirectional communications (e.g., full or half-duplex communications), the repeater 1802 can be configured to reroute traffic from the secondary power line 1806 back to the primary power line 1804 for processing by the waveguide system 1402.

Figure 18A:
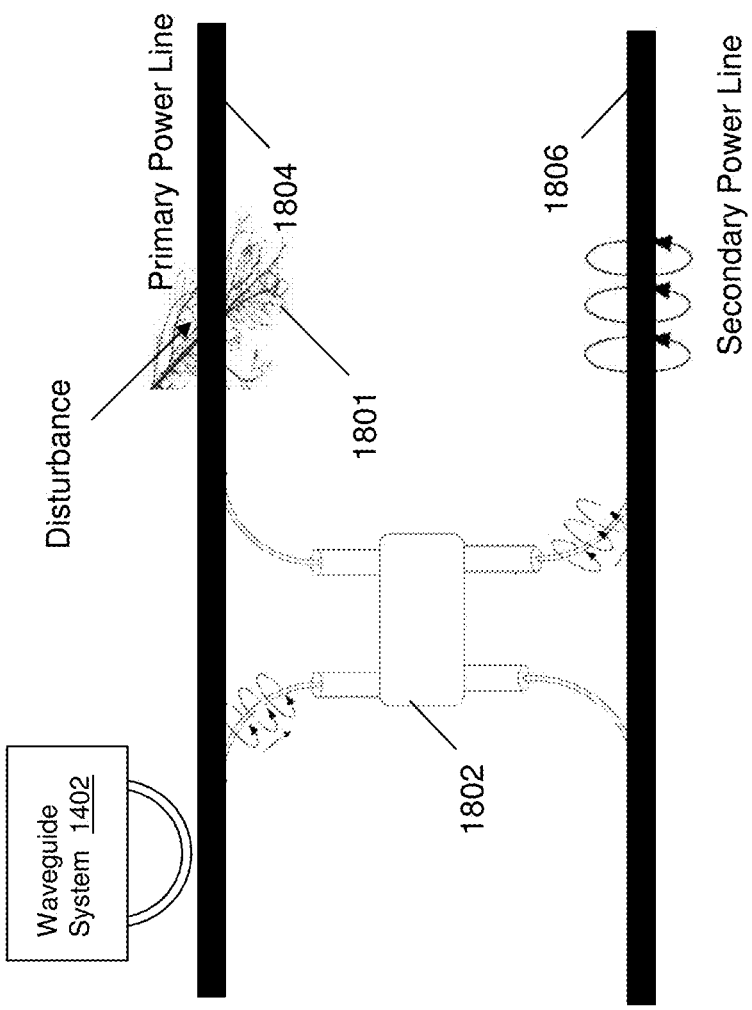
FIG. 18A illustrates an example, non-limiting embodiment for mitigating a disturbance detected by the waveguide system of FIG. 14 as described herein.
Figure 18B:
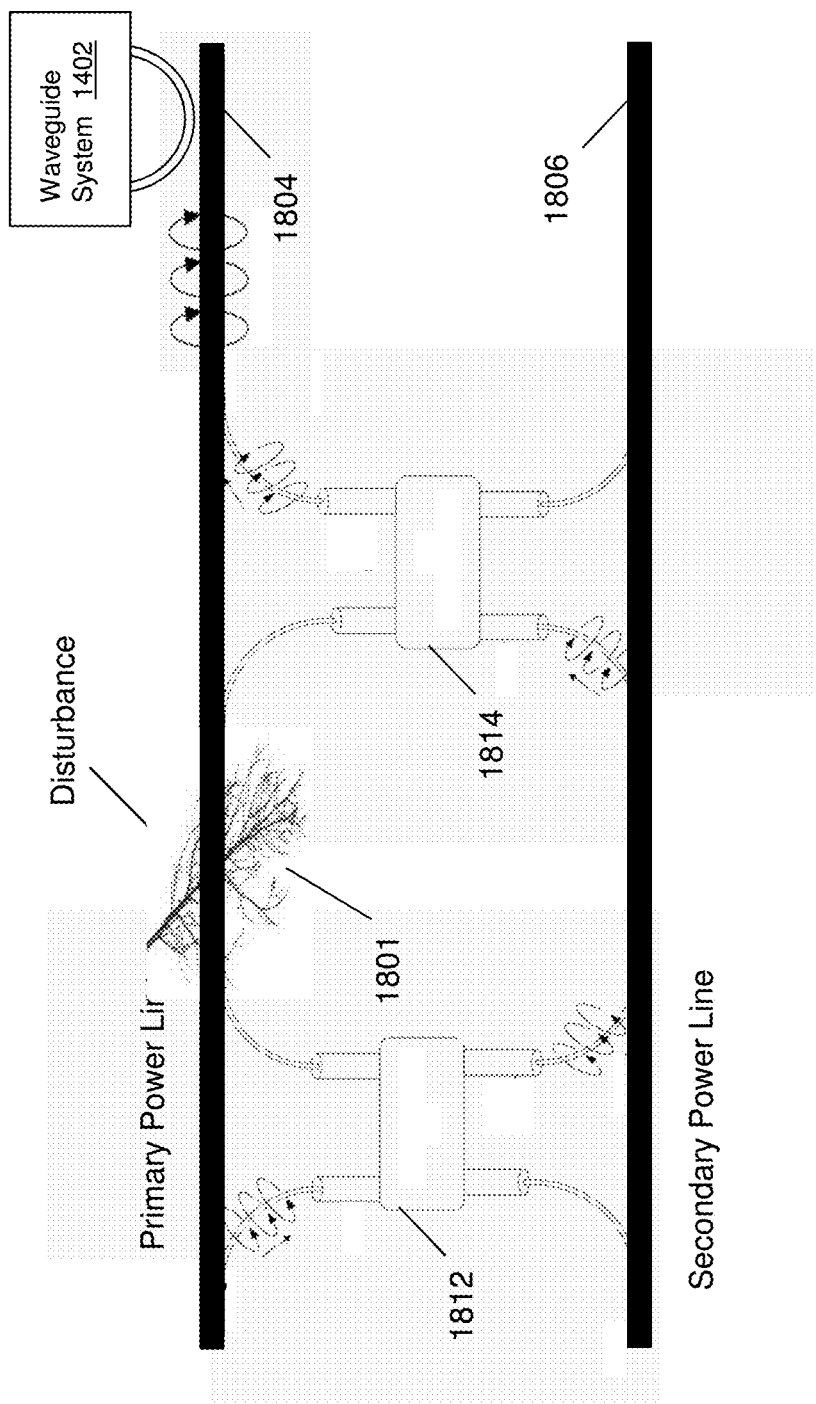
FIG. 18B illustrates another example, non-limiting embodiment for mitigating a disturbance detected by the waveguide system of FIG. 14 as described herein.

In another embodiment, the waveguide system 1402 can redirect traffic by instructing a first repeater 1812 situated upstream of the disturbance and a second repeater 1814 situated downstream of the disturbance to redirect traffic from a primary power line 1804 temporarily to a secondary power line 1806 and back to the primary power line 1804 in a manner that avoids the disturbance 1801 as shown in FIG. 18B. It is further noted that for bidirectional communications (e.g., full or half-duplex communications), the repeaters 1812 and 1814 can be configured to reroute traffic from the secondary power line 1806 back to the primary power line 1804.

To avoid interrupting existing communication sessions occurring on a secondary power line 1806, the network management system 1601 may direct the waveguide system 1402 (in the embodiments of FIGS. 18A-18B) to instruct repeater(s) to utilize unused time slot(s) and/or frequency band(s) of the secondary power line 1806 for redirecting data and/or voice traffic away from the primary power line 1804 to circumvent the disturbance 1801.

At step 1716, while traffic is being rerouted to avoid the disturbance, the network management system 1601 can notify equipment of the utility company 1602 and/or equipment of the communications service provider 1604, which in turn may notify personnel of the utility company 1606 and/or personnel of the communications service provider 1608 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1410 that may change a topology of the communication system 1605.

Once the disturbance has been resolved, the network management system 1601 can direct the waveguide system 1402 at step 1720 to restore the previous routing configuration used by the waveguide system 1402 or route traffic according to a new routing configuration if the restoration strategy used to mitigate the disturbance resulted in a new network topology of the communication system 1605. In another embodiment, the waveguide system 1402 can be configured to monitor mitigation of the disturbance by transmitting test signals on the power line 1410 to determine when the disturbance has been removed. Once the waveguide 1402 detects an absence of the disturbance it can autonomously restore its routing configuration without assistance by the network management system 1601 if it determines the network topology of the communication system 1605 has not changed, or it can utilize a new routing configuration that adapts to a detected new network topology.

Figure 17B:
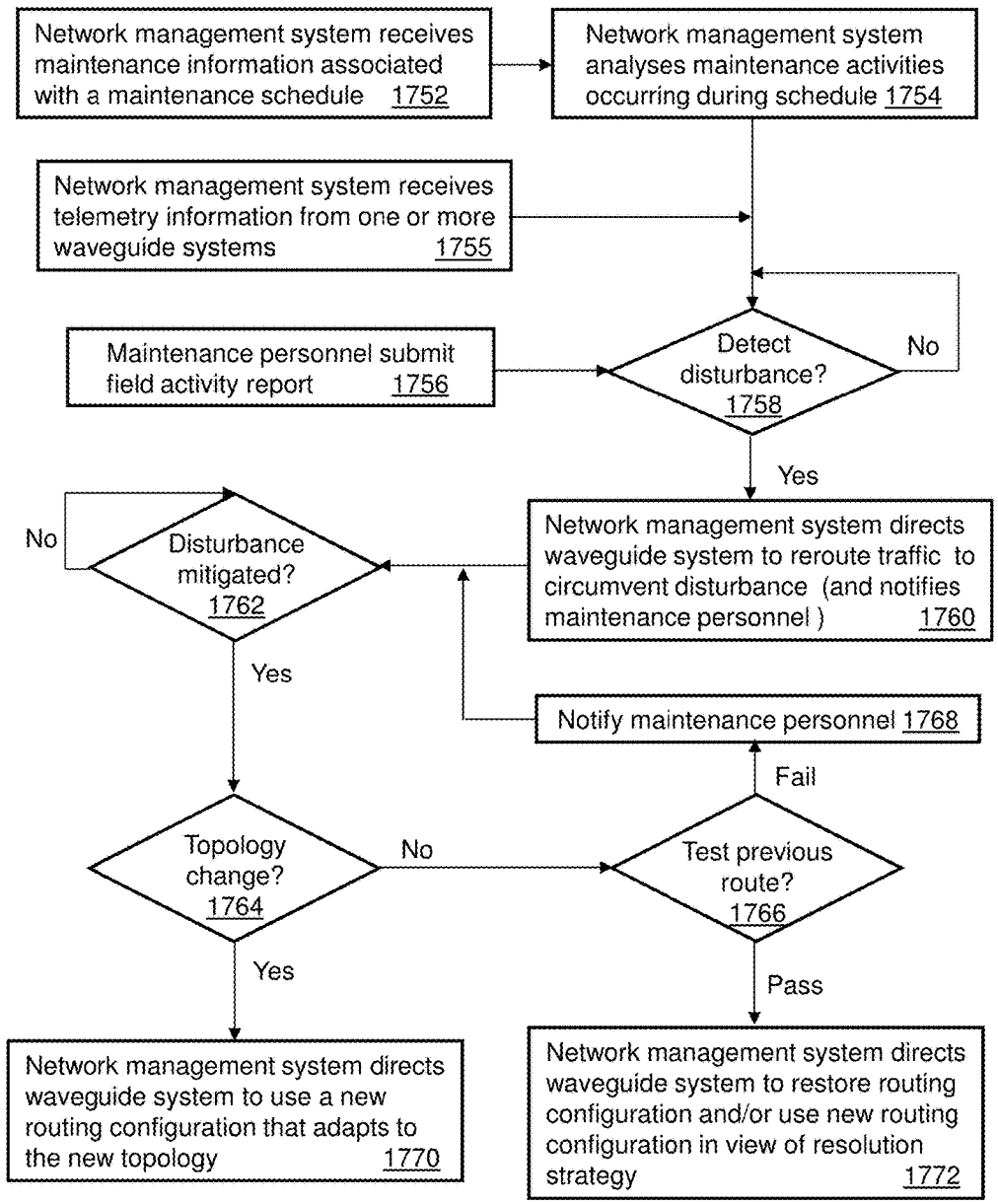
FIG. 17B illustrates a flow diagram of an example, non-limiting embodiment of a method for detecting and mitigating disturbances occurring in a communication network of the system of FIG. 16.

FIG. 17B illustrates a flow diagram of an example, non-limiting embodiment of a method 1750 for detecting and mitigating disturbances occurring in a communication network of the system 1600 of FIG. 16. In one embodiment, method 1750 can begin with step 1752 where a network management system 1601 receives from equipment of the utility company 1602 or equipment of the communications service provider 1604 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1410, scheduled replacement of a waveguide system 1402 on the power line 1410, scheduled reconfiguration of power lines 1410 in the power grid 1603, etc.).

In another embodiment, the network management system 1601 can receive at step 1755 telemetry information from one or more waveguide systems 1402. The telemetry information can include among other things an identity of each waveguide system 1402 submitting the telemetry information, measurements taken by sensors 1404 of each waveguide system 1402, information relating to predicted, estimated, or actual disturbances detected by the sensors 1404 of each waveguide system 1402, location information associated with each waveguide system 1402, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1402 to isolate and identify the disturbance. Additionally, the network management system 1601 can request telemetry information from waveguide systems 1402 in a vicinity of an affected waveguide system 1402 to triangulate a location of the disturbance and/or validate an identification of the disturbance by receiving similar telemetry information from other waveguide systems 1402.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1603 resulting from field personnel addressing discovered issues in the communication system 1605 and/or power grid 1603, changes to one or more waveguide systems 1402 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1402 or other waveguide systems 1402 of the communication system 1605.

When a disturbance is detected or predicted at step 1758, the network management system 1601 can proceed to step 1760 where it can direct one or more waveguide systems 1402 to reroute traffic to circumvent the disturbance similar to the illustrations of FIG. 18A or 18B. When the disturbance is permanent due to a permanent topology change of the power grid 1603, the network management system 1601 can proceed to step 1770 and skip steps 1762, 1764, 1766, and 1772. At step 1770, the network management system 1601 can direct one or more waveguide systems 1402 to use a new routing configuration that adapts to the new topology. However, when the disturbance has been detected from telemetry information supplied by one or more waveguide systems 1402, the network management system 1601 can notify maintenance personnel of the utility company 1606 or the communications service provider 1608 of a location of the disturbance, a type of disturbance if known, and related information that may be helpful to such personnel to mitigate the disturbance. When a disturbance is expected due to maintenance activities, the network management system 1601 can direct one or more waveguide systems 1402 to reconfigure traffic routes at a given schedule (consistent with the maintenance schedule) to avoid disturbances caused by the maintenance activities during the maintenance schedule.

Returning back step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1410, reconfiguring a waveguide system 1402 to utilize a different power line 1410, otherwise utilizing an alternative link to bypass the disturbance and so on. If a topology change has taken place, the network management system 1601 can direct at step 1770 one or more waveguide systems 1402 to use a new routing configuration that adapts to the new topology.

If, however, a topology change has not been reported by field personnel, the network management system 1601 can proceed to step 1766 where it can direct one or more waveguide systems 1402 to send test signals to test a routing configuration that had been used prior to the detected disturbance(s). Test signals can be sent to affected waveguide systems 1402 in a vicinity of the disturbance. The test signals can be used to determine if signal disturbances (e.g., electromagnetic wave reflections) are detected by any of the waveguide systems 1402. If the test signals confirm that a prior routing configuration is no longer subject to previously detected disturbance(s), then the network management system 1601 can at step 1772 direct the affected waveguide systems 1402 to restore a previous routing configuration. If, however, test signals analyzed by one or more waveguide systems 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1402 can be configured to be self-adapting to changes in the power grid 1603 and/or to mitigation of disturbances. That is, one or more affected waveguide systems 1402 can be configured to self monitor mitigation of disturbances and reconfigure traffic routes without requiring instructions to be sent to them by the network management system 1601. In this embodiment, the one or more waveguide systems 1402 that are self-configurable can inform the network management system 1601 of its routing choices so that the network management system 1601 can maintain a macro-level view of the communication topology of the communication system 1605.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 19A:
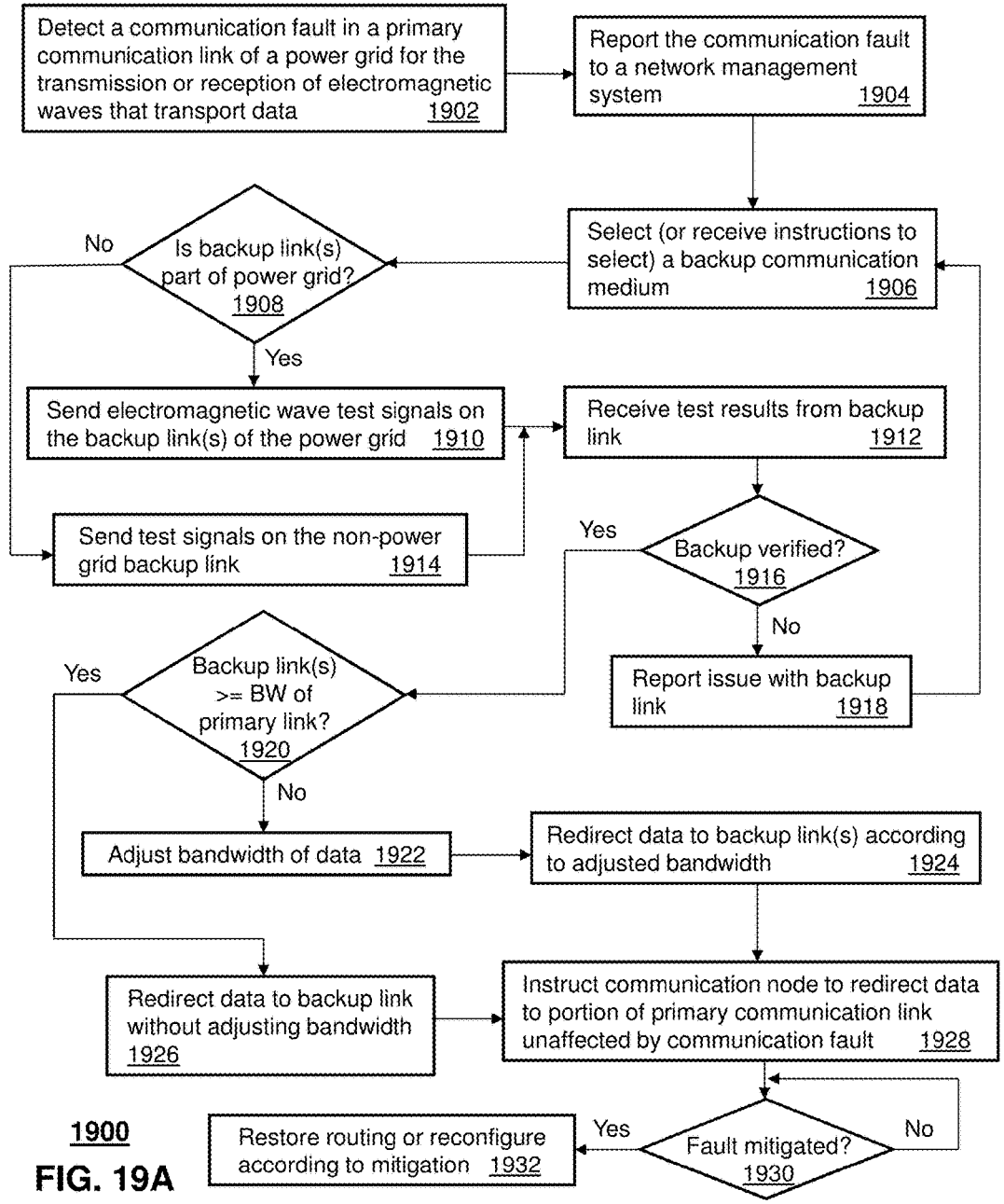
FIG. 19A illustrates a flow diagram of an example, non-limiting embodiment of a method for mitigating faults in a communication system of FIG. 20.
Figure 20:
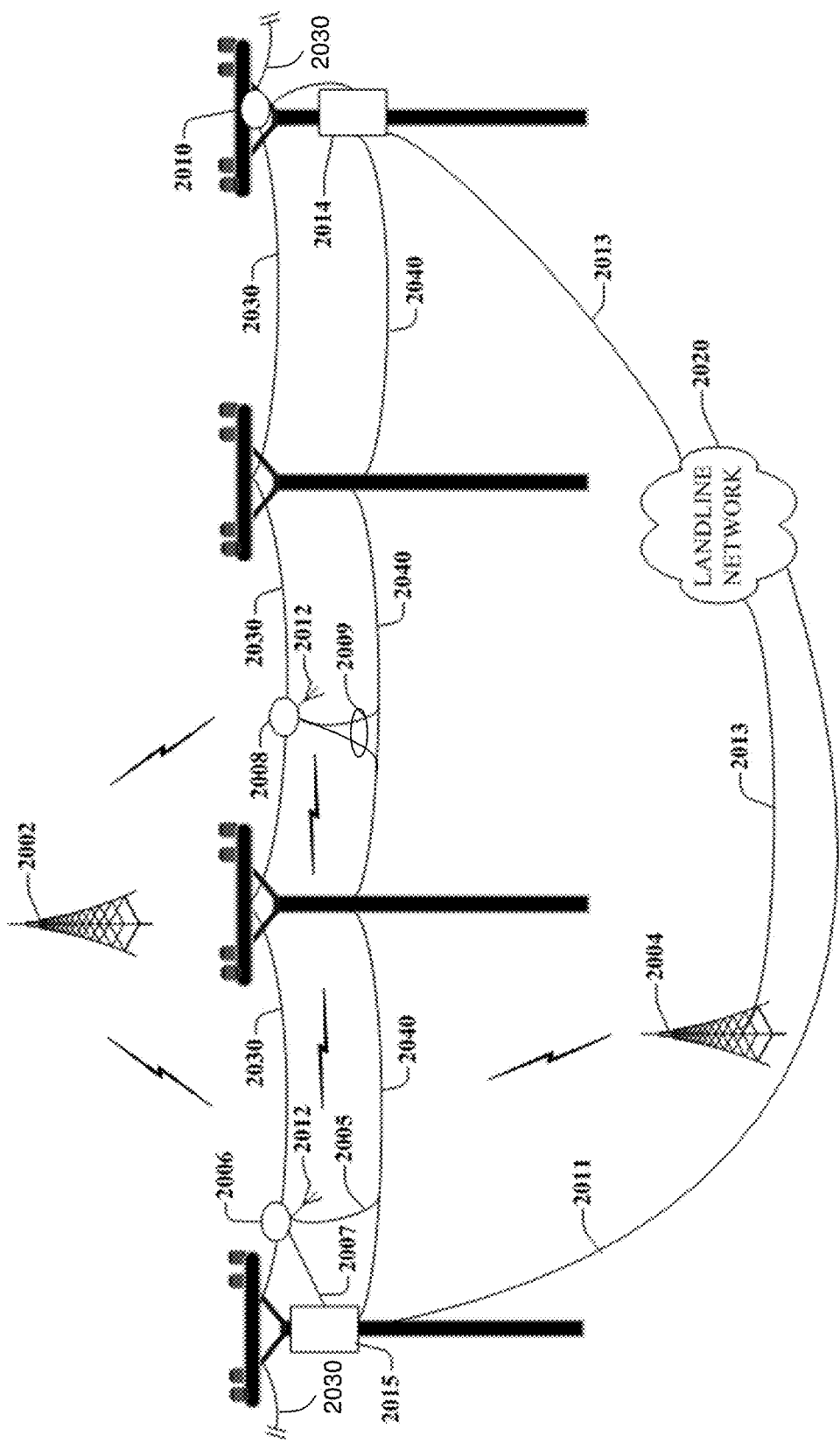
FIG. 20 is a block diagram of an example, non-limiting embodiment of a communication system in accordance with various aspects described herein.

FIG. 19A illustrates a flow diagram of an example, non-limiting embodiment of a method 1900 for mitigating faults in a communication system of FIG. 20. Method 1900 can begin at step 1902 where a waveguide system 1402 such as shown in FIG. 14 detects a fault in a primary communication link depicted by reference 2030 of FIG. 20 (herein referred to as primary communication link 2030). For long-haul communications, the primary communication link 2030 can represent a high voltage power line (e.g., 100 kV-138 kV), an extra high voltage power line (e.g., 230 kV-800 kV), or an ultra high voltage power line (e.g., >800 kV) of the power grid. Generally, such power lines are placed at a high altitude on utility poles in one embodiment for safety reasons and to reduce a likelihood of obstructions from tree limbs. For short-haul communications (e.g., urban, suburban, or rural areas), the primary communication link 2030 can represent a medium voltage power line (e.g., 4 kV to 69 kV), which are generally positioned above lower voltage power lines, telephone lines, and/or coaxial cable lines. Thus it will be appreciated that the primary communication link 2030 can include non-high-voltage (e.g., medium or low voltage) power lines as well at various positions on utility poles without departing from example embodiments.

Obstructions from tree limbs can happen with power lines, which as was described previously can be sensed by sensors of the waveguide system 1402 described in FIG. 14. Generally, a fault can represent any disturbance sensed or detected by the sensors of the waveguide system 1402 that can adversely affect the transmission or reception of electromagnetic waves that transport data and that propagate on a surface of the primary communication link 2030. A non-limiting illustration of data can include voice communication services, internet services, broadcast video services, control data for controlling the distribution of content and/or for establishing voice and/or data communication sessions, voice or data communications from other networks, or other types of data services in any combination thereof.

At step 1904, the waveguide system 1402 can report the fault, or information associated therewith, to a network management system 1601 such as shown in FIGS. 14 and 16. For example, the waveguide system 1402 can identify a type of fault, a location of the fault, quality metrics (described herein) and/or other communication parameter information associated with a fault including signal strength, signal loss, latency, packet loss, etc. In one embodiment, the network management system 1601 can take evasive action by instructing the waveguide system 1402 to select at step 1906 one or more backup communication mediums or links that provide backup communication services in the event of a fault at the primary communication link 2030. In another embodiment, the waveguide system 1402 can autonomously take evasive action to maintain communication services active by selecting at step 1906 one or more backup communication mediums or link. The waveguide system 1402 can be configured to select a backup communication medium or link based on selection criteria. The selection criteria can include quality metrics that can be used to verify that the backup communication medium is suitable for backup communication services. Quality metrics can include without limitation a desired communications bandwidth, a desired Quality of Service (QoS), a desired signal to noise ratio, a desired bit error rate performance, a desired packet loss performance, a desired data throughput, a desired jitter performance, a desired latency performance, and so on.

The waveguide system 1402, which can also be represented by any of references 2006, 2008, or 2010 of FIG. 20 (herein referred to as waveguide systems 2006, 2008, or 2010) can have multiple options for initiating backup communication services. For example, waveguide system 2006 can have an antenna 2012 that can be coupled to a communications interface such as reference 1408 of FIG. 14 to enable the waveguide system 2006 to engage in wireless communications (e.g., LTE, WiFi, 4/5G, millimeter RF communications, or otherwise) with base station 2002, base station 2004, or other waveguide systems such as waveguide system 2008 deploying a wireless communications interface with an antenna 2012.

Waveguide system 2006 can thus redirect data to base station 2002 over a first wireless link. Base station 2002 can in turn redirect the data to waveguide system 2008 over a second wireless link. Waveguide system 2008 can then retransmit the data using electromagnetic waves that propagate on the primary link 2030. Similarly, waveguide system 2006 can redirect data to base station 2004 over a first wireless link. Base station 2004 in turn can redirect data to a landline network 2020 over a high speed wired link 2013 (e.g., fiber). The landline network 2020 can also redirect the data to a local base station 2014 (e.g., a microcell) over another high speed link 2013. The local base station 2014 can then supply the data to waveguide system 2010 which retransmits the data using electromagnetic waves that propagate on the primary communication link 2030. Additionally, waveguide system 2006 can redirect data to waveguide system 2008 over a wireless link. Waveguide system 2008 can then retransmit the data using electromagnetic waves that propagate on the primary communication link 2030.

In each of the above example embodiments, the data is sent by the waveguide system 2006 to the backup communication medium or link, which redirects it back to a portion of the primary communication link 2030 unaffected by the fault. Unaffected portions of the primary communication link 2030 can be identified by the network management system 1601. The network management system 1601 can in turn coordinate the flow of traffic with communication nodes of the backup communication medium selected by waveguide system 2006 to redirect data back to unaffected portions of the primary communication link 2030.

Using a wireless link (that is not capable of millimeter RF communications or RF communications of higher bandwidths) to connect to any of the backup communication mediums or links may, in some embodiments, result in less bandwidth than the original bandwidth capacity of the affected primary communication link 2030. In such embodiments, waveguide system 2006 may need to adjust the bandwidth of the data to accommodate retransmission over a selected backup communication medium as will be addressed by method 1900 at steps 1920, 1922 and 1924. To reduce or eliminate the need for bandwidth adjustments, the waveguide system 2006 can select multiple wireless backup communication mediums to mitigate the need for adjusting the bandwidth of the data by distributing portions of the data between the selected backup communication mediums.

In addition to wireless backup links, the waveguide system 2006 can use a waveguide 2005 (incorporated in waveguide system 2006) that can couple to an unaffected line in its vicinity such as line 2040, which can serve as secondary communication link (herein referred to as secondary communication link 2040) for providing backup communication services. For long-haul communications, the secondary communication link 2040 can represent another high power line if more than one high power line is available, or a medium voltage power line if available. For short-haul communications (e.g., urban, suburban, or rural areas), the secondary communication link 2040 can represent a low voltage power line (e.g., less than 1000 volts such as 240V) for distributing electrical power to commercial and/or residential establishments, telephone lines, or coaxial cable lines. For illustration purposes, line 2040 will be assumed to be a power line, and thus referred to herein as power line 2040. However, it is noted that line 2040 can be a non-power line such as a telephone line, or a coaxial cable accessible to the waveguide system 2006. It is further noted that low voltage power lines, telephone lines, or coaxial cable lines are generally positioned below the medium voltage power line and thus may be more susceptible to obstructions such as tree limbs that may cause a disturbance that adversely affects the transmission or reception of electromagnetic waves on a surface of secondary communication link 2040.

Secondary communication link 2040 enables waveguide system 2006 to communicate with waveguide system 2008, which also has receive and transmit waveguides 2009 incorporated therein and coupled to the secondary communication link 2040. In this configuration, the secondary communication link 2040 can be used to bypass a fault in the primary communication link 2030 that may be occurring between waveguide system 2006 and waveguide system 2008. In this illustration, waveguide system 2008 can reestablish communication services back to a portion of the primary communication link 2030 that is unaffected by the fault detected by waveguide system 2006. If, however, the fault on the primary communication link 2030 affects both waveguide system 2006 and waveguide system 2008, waveguide system 2006 can use the secondary communication link 2040 to communicate with the local base station 2014, which can be configured with a waveguide system of its own such as shown in FIG. 14 to receive and transmit electromagnetic waves that transport the data and that propagate on a surface of the secondary communication link 2040. The local base station 2014 can in turn supply the data to waveguide system 2010 which can redirect its transmission to the primary communication link 2030 to downstream waveguide systems (not shown).

It is further noted that data can be redirected to the secondary communication link 2040 in several ways. In one embodiment, electromagnetic waves propagating on the primary communication link 2030 can be redirected to the secondary communication link 2040. This can be accomplished by connecting one end of waveguide 2005 to the secondary communication link 2040 and the other end of waveguide 2005 to an unaffected portion of the primary communication link 2030. In this configuration, electromagnetic waves flowing on the primary communication link 2030 can be redirected by the waveguide 2005 to the secondary communication link 2040, and electromagnetic waves flowing on the secondary communication link 2030 can be redirected by the waveguide 2005 to the primary communication link 2040.

In one embodiment, the electromagnetic waves propagating through the waveguide 2005 in a direction of the primary communication link 2030 or in a direction of the secondary communication link 2040 can be unamplified. For instance, the waveguide 2005 can be a passive dielectric waveguide device coupled to both ends of the primary and secondary communication links 2030 and 2040, respectively, having no active circuitry for modifying the electromagnetic waves flowing through the waveguide 2005 in either direction. Alternatively, one or more amplifiers can be added to the waveguide 2005 to amplify the electromagnetic waves propagating through the waveguide 2005 in a direction of the primary communication link 2030 and/or in a direction of the secondary communication link 2040. For example, the waveguide 2005 can include active circuits that amplify the electromagnetic waves propagating in a direction of the primary communication link 2030 and/or active circuits that amplify electromagnetic waves propagating in a direction of the secondary communication link 2040.

In yet another embodiment, the waveguide device 2005 can be represented by a repeater such as shown in FIG. 8 which can utilize active circuitry such as shown in FIG. 9 to extract the data included in the electromagnetic waves propagating in the primary communication link 2030, and retransmitting the same data with new electromagnetic waves that are sent to the secondary communication link 2040. Similarly, the circuitry of FIG. 9 can be used to extract data included in the electromagnetic waves propagating in the secondary communication link 2040, and retransmitting the same data with new electromagnetic waves that are sent to the primary communication link 2030.

In yet another embodiment, the waveguide system 2006 can also include a link 2007 that couples the waveguide system 2006 to a local base station 2015 (e.g., a microcell). Link 2007 can represent a high speed communication link such as a fiber link enabling the waveguide system 2006 to redirect data to the local base station 2015, which in turn can direct data to a landline network 2020 that in turn supplies the data to another local base station 2014 that can present such signals to waveguide system 2010 for redirecting the data back to the primary communication link 2030.

Based on the above illustrations, the waveguide system 2006 has several options for selecting at step 1906 one or more backup communication mediums or links depending on its bandwidth needs, which include: (1) a wired connection to local base station 2015 via high speed link 2007 which enables waveguide system 2006 to redirect data back to the primary communication link 2030 via waveguide system 2010, (2) a connection to secondary communication link 2040 via waveguide 2005 of the waveguide system 2006 which enables waveguide system 2006 to redirect data back to the primary communication link 2030 via waveguide system 2008, (3) a connection to secondary communication link 2040 via waveguide 2005 of the waveguide system 2006 which also enables waveguide system 2006 to redirect data back to the primary communication link 2030 via waveguide system 2010 using the local base station 2014, (4) a wireless link to base station 2002 which enables waveguide system 2006 to redirect data back to the primary communication link 2030 via waveguide system 2008, (5) a wireless link to base station 2004 which enables waveguide system 2006 to redirect data back to the primary communication link 2030 via waveguide system 2010 using the local base station 2014, (6) a wireless link to waveguide system 2008 which can redirect data back to the primary communication link 2030, and (7) to avoid bandwidth adjustments, any combination of the above backup communication links may be used to distribute data previously transported by the primary communication link 2030.

Once waveguide system 2006 has selected one or more backup communication links, it can proceed to step 1908 where it can determine whether a particular backup communication link is part of the power grid or otherwise (e.g., wireless link or wired link to a local base station). Since it is possible that more than one backup communication link can be selected by waveguide system 2006, steps 1910 and 1914 may be invoked simultaneously or in sequence for each instance of a backup link of the power grid, a backup wireless link, and/or a backup wired link to a local base station.

For backup links of the power grid, the waveguide system 2006 can be configured to transmit electromagnetic wave test signals on the secondary communication link 2040. The electromagnetic wave test signals can be received by waveguide system 2008 and/or local base station 2014 (assuming it has an integrated waveguide system). The test signals can be analyzed by the waveguide system 2008 and/or the local base station 2014. The test signals can be measured, for example, for signal to noise ratio, data throughput, bit error rate, packet loss rate, jitter, latency, and other metrics that can be compared to the selection criteria by waveguide system 2006. The test results can be transmitted back at step 1912 to waveguide system 2006 by waveguide system 2008 and/or by the local base station 2014 over the secondary communication link 2040, or in the case of waveguide system 2008 over a wireless link, and in the case of local base station 2014 over wired links 2013 and 2011. In addition to analyzing test results sent back from waveguide system 2008 and/or local base station 2014 according to the selection criteria, waveguide system 2006 can also perform autonomous tests on the secondary communication link 2040 such as signal reflection measurements and other measurements described in the subject disclosure.

For non-power grid backup links, the waveguide system 2006 can send test signals appropriate for the type of backup medium being used. In the case of wireless links, the waveguide system 2006 can send wireless test signals to base station 2002, base station 2004, and/or waveguide system 2008. The waveguide system 2006 can determine a received signal strength indication (RSSI) for each wireless link, signal to noise ratios for each wireless link, data throughputs, bit error rates, packet loss rates, and other measurements applicable to the selection criteria for determining the suitability of each wireless link. Test results can also be received at step 1912 by waveguide system 2006 from base station 2002, 2004, and/or waveguide system 2008 over the wireless link. In the case of a wired (non-power grid) link such as link 2007, the waveguide 2006 can send test signals for testing communications with waveguide system 2010. Similarly, test results can be received back from waveguide system 2010 and/or intermediate nodes (e.g., landline network 2020 and/or local base station 2015) for comparison to the selection criteria.

At step 1916, the waveguide system 2006 can assess whether a backup link is suitable for backup communication services in accordance with the selection criteria used by the waveguide system 2006. If a backup link is not available or suitable for backup communication services, the waveguide system 2006 can proceed to step 1918 and report this issue to the network management system 1601 via an available backup link, and proceed to select another backup link (if available) at step 1906. If another backup link is selected, the waveguide system 2006 can perform steps 1908-1912 as previously described. If one or more backup links have been verified at step 1916 to be suitable for backup communication services, then the waveguide system 2006 can proceed to step 1920 to determine if the backup link(s) provide sufficient bandwidth to support the bandwidth being used in the primary communication link 2030 to transport the data.

If the backup link(s) cannot support the bandwidth originally used for transmission of the data on the primary communication link 2030, the waveguide system 2006 can proceed to step 1922 to adjust the bandwidth of the data so that it is suitable for the backup link(s). If real-time transmissions are present, for example, real-time audio or video signals, a transcoder can transcode these real-time signals to reduce the bit rate to conform to the adjusted bandwidth. In another embodiment, the transmission rate of non-real-time signals can be reduced to preserve the quality of service associated with real-time signals included in the data. In this step, the waveguide system 2006 can inform the network management system 1601 via an available backup link that the bandwidth of the data will be adjusted. The network management system 1601 can in one embodiment inform devices affected by the fault (via, for example, backup links) that communications bandwidth must be adjusted to accommodate backup services. Alternatively, the waveguide system 2006 can notify the affected devices via the backup link(s) of the change in bandwidth.

Once bandwidth has been adjusted at step 1922, the waveguide system 2006 can proceed to step 1924 and begin to redirect data via the backup link(s). If bandwidth adjustment is not necessary, the waveguide system 2006 can proceed to step 1926 and redirect data according to its original bandwidth. In another embodiment, if the bandwidth capacity of the backup link(s) cannot support the bandwidth originally used for transmission of the data on the primary communication link 2030, the waveguide system 2006 can proceed to step 1906 to select a different backup link.

In one embodiment, the backup link(s) (i.e., secondary communication links) may be shared with other communication devices (e.g., waveguide systems or other communication nodes). In one embodiment, the waveguide system 2006 can be configured to select an operating frequency for transmitting and receiving data over the backup link(s) that differs from the operating frequency used by the other communication devices. In another embodiment, the waveguide system 2006 can be configured to select time slot assignments for transmitting and receiving data over the backup link(s) that differs from time slot assignments used by the other communication devices. In yet another embodiment, the waveguide system 2006 can be configured to select a combination of one or more operating frequencies and one or more time slot assignments for transmitting and receiving data over the backup link(s) that differ from one or more operating frequencies and one or more time slot assignments used by the other communication devices.

In instances where the backup link(s) have communication access to the power grid at a point where the primary communication link 2030 is unaffected by the fault, the waveguide system 2006 can instruct at step 1928 one or more communication nodes in the backup link(s) to redirect the data back to the primary communication link 2030 at an unaffected location in the power grid determined by the waveguide system 2006 or at an unaffected location identified by the network management system 1601 and conveyed to the waveguide system 2006, thereby circumventing the fault.

While the backup link(s) are in use, the network management system 1601 can be directing personnel of a power utility or communications company to resolve the fault as previously described in the subject disclosure. Once the fault has been resolved at step 1930, the network management system 1601 can instruct at step 1932 the waveguide system 2006 (and other communication nodes in the backup link(s)) to restore or reconfigure routing of the data according a mitigation strategy used to resolve the fault. Alternatively, the waveguide system 2006 can monitor the power grid for mitigation of the fault, and autonomously determine whether it can reuse a prior routing configuration or whether it must use a new routing configuration based on a detectable change in the network topology of the power grid. It will be appreciated that faults detected by one or more waveguide systems 2006 can be the result of power outages due to broken power lines caused by weather conditions, malfunctioning transformers, or otherwise. The network management system 1601 can also be used to coordinate mitigation of power outages based on fault notices sent to the network management system 1601 by one or more waveguide systems 2006. It is also appreciated that secondary communication links (e.g., backup links) can also be represented by underground transmission mediums such as conduits, underground power lines, and so on.

While for purposes of simplicity of explanation, the respective processes are shown and described as a series of blocks in FIG. 19A, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. It is further noted that the processes of FIG. 19A can be further modified to perform any of the embodiments described in the subject disclosure, such as, for example, embodiments relating to circumventing disturbances in a power grid such as shown in FIGS. 18A and 18B.

Figure 19B:
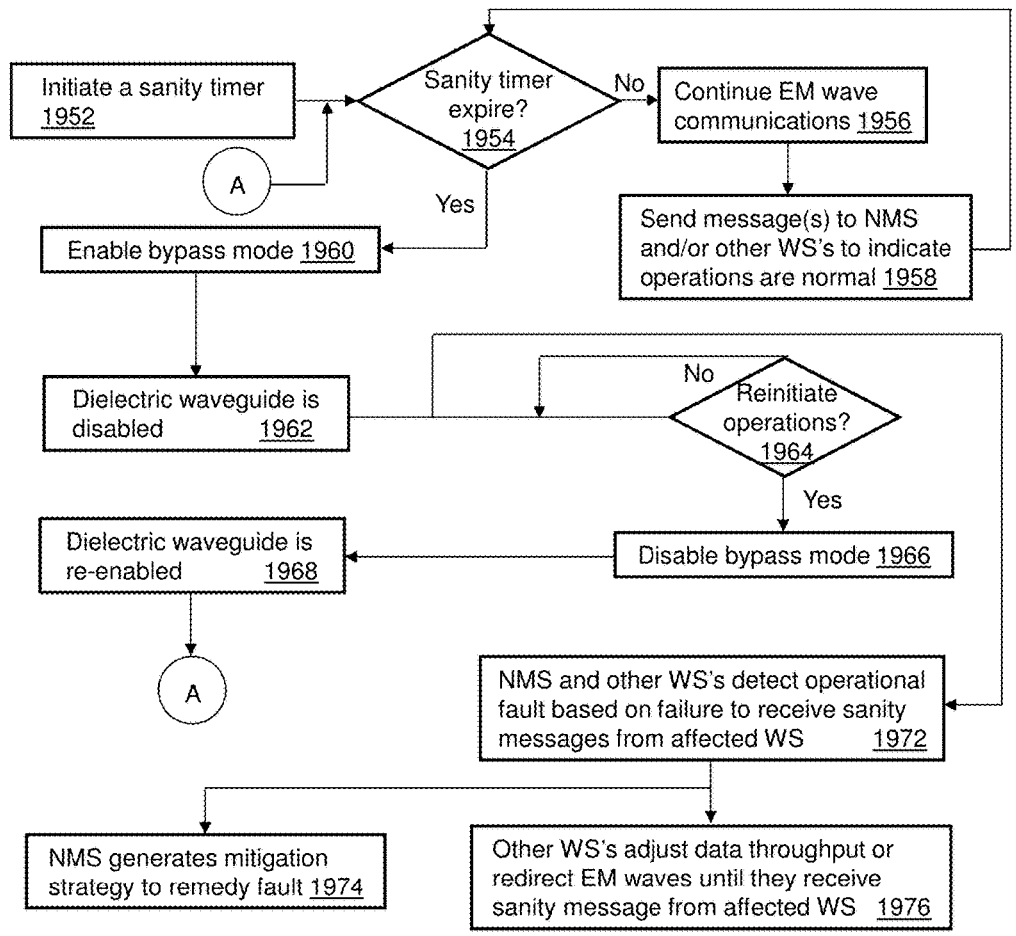
FIG. 19B illustrates a flow diagram of an example, non-limiting embodiment of a method for mitigating faults in a communication system of FIG. 20.

FIG. 19B illustrates a flow diagram of an example, non-limiting embodiment of a method 1950 for mitigating faults in the communication system of FIG. 20. Method 1950 can begin with initiating at step 1952 a sanity timer at a waveguide system 1402. The term "sanity timer" is chosen for illustration purposes only. Other terminology, such as a fault timer, suggestive of a device utilized for detecting a fault in operations of a waveguide system 1402 can be used in the subject disclosure. A sanity timer can comprise a clock or timer circuit, such as a watchdog timer (WDT) or computer operating properly (COP) timer or other timing mechanism or circuit, that counts down for a predefined period, or otherwise signals when such predefined period has started/ended. For example, the sanity timer can have a countdown period of 250 ms or another desired time period. In one embodiment, a sanity timer can comprise a stand-alone circuit that operates independently from a processor or other processing circuit of the waveguide system 1402, which executes instructions to perform the processes described in the subject disclosure. For example, when the waveguide system 1402 undergoes a power cycle or a hard or soft reset, the sanity timer circuit can reinitiate operations (including resetting its timer) independently from the processor's execution of instructions. By separating the operations of the sanity timer from the processor, a corruption in instructions executed by the processor, or other malfunction, will be detected by a failure of the processor to restart or reset the timer at step 1954. In one embodiment, expiration of the timer can result in the timer generating an interrupt signal that resets operations of the processor along with invoking a bypass mode described below. However, it will be appreciated that in alternate embodiments, the operations of the sanity timer can also be performed in conjunction with the processor's execution of instructions.

So long as the processor periodically restarts or resets the sanity timer at step 1954, or is otherwise aware of whether the predefined time period threshold has been exceeded, the processor of waveguide system 1402 can continue at step 1956 to transmit and receive electromagnetic waves along a surface of a transmission medium such as the power line 1410 of FIG. 14. As an added precaution, the waveguide system 1402 can be configured to send messages at step 1958 to the network management system 1601 and other waveguide systems 1402 in its vicinity to notify them that operations continue to be normal. These messages can be sent by the waveguide system 1402 every 15 mins or at other suitable intervals.

Figure 3B:
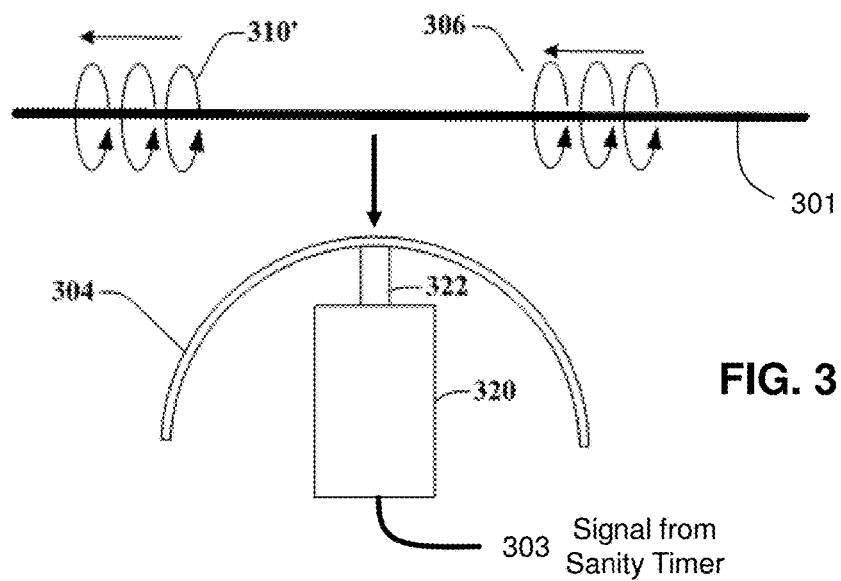

Referring back to step 1954, if the processor fails to restart the sanity timer, the sanity timer will eventually expire (or alternatively, the processor can otherwise determine that the predefined time period threshold has been exceeded). Upon doing so, the sanity timer can be configured to enable a bypass mode of a bypass circuit 320 such as shown in FIGS. 3A-3B. The bypass circuit 320 can comprise an electromechanical device such as a linear motor, a retractable piston, retractable ball screw, an actuator motor, or other suitable device for controlling a position of a slideable arm 322 attached to the dielectric waveguide 304. When the bypass mode is triggered, the bypass circuit 302 can be configured at step 1962 to disable operations of a dielectric waveguide 304.

While the bypass mode is described above in terms of enabling the bypass mode in response to a single expiration of the sanity timer, in other embodiments, the sanity timer can include an expiration counter that is incremented upon the expiration of the sanity timer and reset when the sanity timer is reset or restarted. In this case, the sanity timer can ignore a single expiration and enable the bypass mode only when the expiration counter indicates that the sanity timer has expired in two more consecutive countdown intervals. In addition, the sanity timer can optionally perform one or more restorative operations prior to the enablement of the bypass mode. For example, after N consecutive expirations (such as N=1, 2, 3 . . . ), the sanity timer can trigger a soft reboot or restart of the processor. If expiration continues in further countdown intervals and the expiration counter reaches a larger value of M (where M>N) indicating M consecutive expirations, the sanity timer can trigger a full or hard reboot of the processor. If expiration continues in further countdown intervals and the expiration counter reaches a larger value of P (where P>M) indicating P consecutive expirations, the sanity timer can determine that the processor is in an unrestorable state and resort to enabling the bypass mode.

When the bypass mode is enabled, the bypass circuit 320 retracts a slideable arm 322 away from a transmission medium 301 (such as power line 1410) to prevent electromagnetic waves 306 propagating along a surface of the transmission medium 301 to couple onto a surface of the dielectric waveguide 304. Similarly, the retraction of the slideable arm 322 prevents electromagnetic waves transmitted onto the surface of the dielectric waveguide 304 (by, for example, a transmitter portion of a transceiver such as shown in FIGS. 5A and 9—discussed below) from coupling onto the surface of the transmission medium 301. Accordingly, in the bypass mode, the bypass circuit 320 enables electromagnetic waves 306 propagating on the surface of the transmission medium 301 to bypass the waveguide system 1402, substantially or wholly unaltered by the dielectric waveguide 304 as depicted by electromagnetic waves 310'.

In addition to disabling the waveguide system 1402, the network management system 1601 and other waveguide systems 1402 in a vicinity of the affected waveguide system 1402 can be configured to detect at step 1972 a fault in operations of the affected waveguide system 1402 due to a failure of receiving messages (indicating operations are normal) from the affected waveguide system 1402 as previously described at step 1958. The network management system 1601 can in step 1974 determine a mitigation strategy to remedy the fault, which may include determining and/or utilizing a rerouting strategy for other waveguide systems 1402 and/or notifying field personnel as described by the methods of FIGS. 17A-17B. The unaffected waveguide systems 1402 in the vicinity of the affected waveguide system 1402 can be configured at step 1976 to reduce data throughput of data transported by the electromagnetic waves, and/or redirect the electromagnetic waves to a backup communication link as described by the method of FIG. 19A.

FIG. 3A, in contrast, depicts an embodiment where the bypass mode is disabled. When the bypass mode is disabled, the bypass circuit 320 is configured to cause the slideable arm 322 to slide outward towards the transmission medium 301 to position the dielectric waveguide 304 in proximity to the transmission medium 301. In this configuration, electromagnetic waves 306 propagating on the transmission medium 301 can couple onto the dielectric waveguide 304 such as shown by electromagnetic waves 308 for processing by a receiver portion of a transceiver such as shown in FIGS. 5A and 9. Residual electromagnetic waves 310 can continue to propagate on the transmission medium 301 after the coupling has taken place. Similarly, electromagnetic waves transmitted on a surface of the dielectric waveguide 304 can induce electromagnetic waves (similar to electromagnetic waves 306) onto the surface of the transmission medium 301.

While FIGS. 3A and 3B illustrate the enabling and disabling of a bypass mode for a particular dielectric waveguide 304, other dielectric waveguides and other coupling devices for receiving or transmitting electromagnetic waves along the outer surface of the transmission medium 301 can be bypassed in a similar fashion. Further, while the above description has focused on a linear engagement and retraction of the dielectric waveguide 304 via a slidable arm 322, other engagement and retraction motions such as by rocking and/or rotating, can be employed in various alternative embodiments not specifically shown.

Further, while FIGS. 3A and 3B illustrate the enabling and disabling of a bypass mode for a single dielectric waveguide 304, the techniques described herein can be employed for a waveguide system that employs multiple dielectric waveguides and other coupling devices for receiving or transmitting electromagnetic waves along the outer surface of the transmission medium 301. For example, the detection of a processor fault can trigger a bypass mode that retracts or otherwise disengages each of the coupling devices.

The sanity timer can be configured to supply a signal 303 to control operations of the bypass circuit 320 as shown in FIGS. 3A-3B. Signal 303 can be a digital signal that represents one of two states: bypass mode enabled, or bypass mode disabled. When the bypass mode is enabled (operations fault) at step 1960, the bypass circuit 320 will retract the slideable arm 322 as shown in FIG. 3B, thereby disabling operations of the waveguide system 1402. When the bypass mode is disabled (normal operations), the bypass circuit 320 will position the slideable arm 322 as shown in FIG. 3A thereby enabling operations of the waveguide system 1402.

Referring back to step 1962, once the waveguide system 1402 is disabled by way of relocating the dielectric waveguide 304 as shown in FIG. 3B, the waveguide system 1402 can be prompted to reinitiate operations at step 1964. In one embodiment, operations of the waveguide system 1402 can be reinitiated by the expiration of the sanity timer causing a power cycling or soft reset of the waveguide system 1402. In one embodiment, this process can be accomplished by the signal 303 causing the power management system 1405 of the waveguide system 1402 to recycle power of the waveguide system 1402 or by causing a reset circuit of the waveguide system 1402 to perform a soft reset of the processor when the signal 303 is in the bypass mode state at step 1960. Once the power cycle or soft reset is complete, the sanity timer can be restarted/reset, which in turn disables the bypass mode by de-asserting signal 303 and causing the bypass circuit 320 to resort to the state of FIG. 3A. Contemporaneously, the processor can begin executing instructions, while the sanity timer restarts the countdown. So long as the processor restarts/resets the sanity timer before it expires at step 1954, operations can continue normally according to steps 1956 and 1958.

In alternative embodiment, when power is cycled or when a soft reset is performed, the processor of the waveguide system 1402 can execute instructions, but await instructions from the network management system 1601 to enable operations of the waveguide system 1402. To prevent the waveguide system 1402 from causing electromagnetic wave interference on the transmission medium 301, the bypass circuit 320 can be maintained in the bypass mode state of FIG. 3B while the processor awaits instructions from the network management system 1601. To accomplish this, the sanity timer can be configured instead with two signals 303 and 303'. Signal 303 can be used to maintain the bypass mode enabled, while signal 303' can be used to initiate a power cycle or soft reset as previously described. When the power cycle or soft reset is complete, signal 303' is de-asserted by the sanity timer, while signal 303 is maintained asserted in the bypass mode. While the processor awaits instructions, the waveguide system 1402 can utilize communication means other than the transmission medium 301, such as a wireless antenna 112 shown in FIG. 1, to communicate with other communication nodes in order to receive instructions from the network management system 1601. Once the network management 1601 provides instructions to reinstate operations, the processor of the waveguide system 1402 can restart or reset the sanity timer, which in turn disables the bypass mode at step 1966 by de-asserting signals 303 and 303'. This in turn re-enables operations of the waveguide system 1402 by repositioning the dielectric waveguide 304 according to FIG. 3A and restarting the sanity timer for processing at step 1954.

Figure 19C:
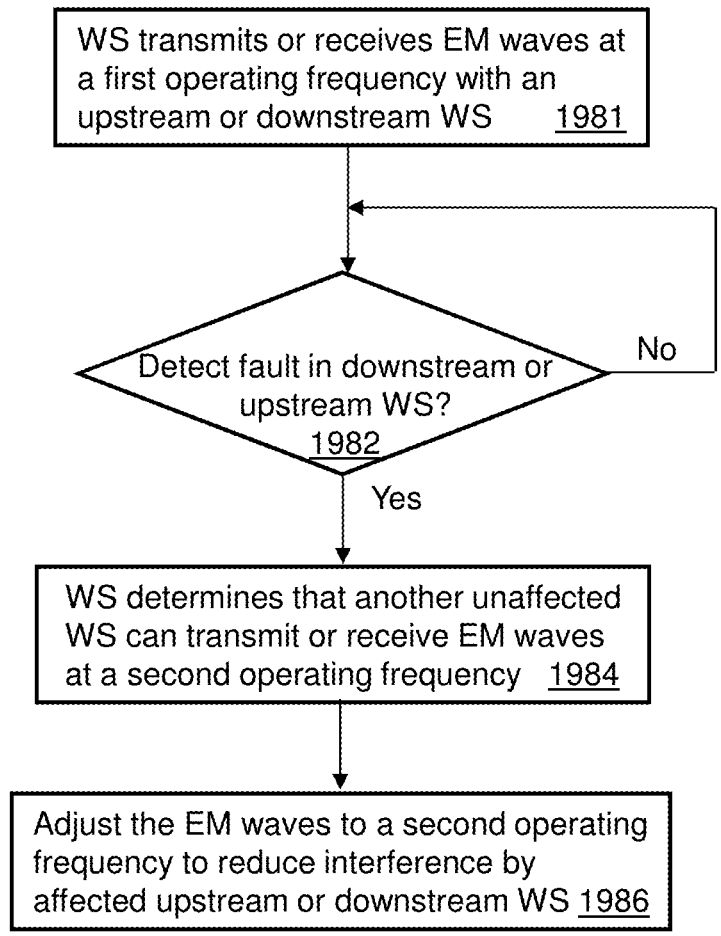
FIG. 19C illustrates a flow diagram of an example, non-limiting embodiment of a method for mitigating faults in a communication system of FIG. 20.

FIG. 19C illustrates a flow diagram of an example, non-limiting embodiment of a method 1980 for mitigating faults in the communication system of FIG. 20 by configuring waveguide systems 1402 that share the same transmission medium 301 to transmit and receive electromagnetic waves at different operating frequencies and/or with differing guided wave modes. For example, waveguide system 2006 of FIG. 20 can be configured to communicate at step 1981 with waveguide system 2008 at a first operating frequency or first guided wave mode. Waveguide system 2008 in turn can be configured to communicate with waveguide system 2010 at a second operating frequency or guided wave mode. If, for example, waveguide system 2006 and/or waveguide system 2010 detects at step 1982 that waveguide system 2008 has experienced an operational fault due to a failure to restart/reset the sanity timer and/or failing to send a sanity message at step 1958 to waveguide systems 2006 and 2010, respectively, then waveguide system 2006 and 2010 can proceed to step 1984 to determine whether another unaffected waveguide system can continue communication services.

This determination can be performed by the unaffected waveguide systems 1402 by utilizing wireless communications or other backup communication links discussed earlier to communicate with each other. At step 1984, the unaffected waveguide systems can, for example, share the operating frequency or guided wave mode they used to communicate with the affected waveguide system 2008, and other available operating frequencies or guided wave modes that they can be configured to use. With this information, waveguide systems 2006 and 2010 can choose at step 1986, for example, a third operating frequency or guided wave mode that differs from the first operating frequency or guided wave mode used between waveguide systems 2006 and 2008 and the second operating frequency or guided wave mode used between waveguide systems 2008 and 2010. By choosing a third operating frequency or guided wave mode that differs from the first and the second operating frequencies or guided wave modes previously used by waveguide system 2008, electromagnetic waves at the third operating or guided wave mode may be less susceptible to interference caused by the waveguide system 2008 if due to a malfunction it continues to send electromagnetic waves at the first and the second operating frequencies, respectively.

In yet another embodiment, where the waveguide system includes multiple coupling devices for operation in a multi-input multi-output (MIMO) configuration with a corresponding plurality of MIMO modes, the method 1950 can also be adapted to configure waveguide systems 1402 that share the same transmission medium 301 to transmit and receive electromagnetic waves at different MIMO modes. For example, waveguide system 2006 of FIG. 20 can be configured to communicate at step 1981 with waveguide system 2008 at a first MIMO mode. If, for example, waveguide system 2006 and/or waveguide system 2010 detects at step 1982 that waveguide system 2008 has experienced an operational fault due to a failure to restart/reset the sanity timer and/or failing to send a sanity message at step 1958 to waveguide systems 2006 and 2010, respectively, then the waveguide systems 2006 and 2010 can bypass the affected waveguide system 2008 and optionally communicate via a different MIMO mode. Consider the example where waveguide system 2006 communicates with waveguide system 2008 via a first MIMO mode that employs a plurality of parallel transmit streams that include separate data. When waveguide system 2008 is bypassed and waveguide system 2006 must transmit over a long distance to reach the waveguide system 2010, the waveguide system 2006 may change to a second MIMO mode to transmit a plurality of parallel transmit streams that include redundant data, decreasing the data throughput, but increasing the probability that the data is correctly received.

While for purposes of simplicity of explanation, the respective processes are shown and described as a series of blocks in FIG. 19B, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it will be appreciated that method 1950 can be adapted to use bypass techniques other than those shown in FIGS. 3A-3B.

Electromagnetic waves as described by the subject disclosure can be affected by the presence of a physical object (e.g., a bare wire or other conductor, a dielectric, an insulated wire, a conduit or other hollow element, a bundle of insulated wires that is coated, covered or surrounded by a dielectric or insulator or other wire bundle, or another form of solid, liquid or otherwise non-gaseous transmission medium) so as to be at least partially bound to or guided by the physical object and so as to propagate along a transmission path of the physical object. Such a physical object can operate as a transmission medium that guides, by way of an interface of the transmission medium (e.g., an outer surface, inner surface, an interior portion between the outer and the inner surfaces or other boundary between elements of the transmission medium), the propagation of electromagnetic waves ("guided electromagnetic waves"), which in turn can carry energy and/or data along the transmission path from a sending device to a receiving device.

Unlike free space propagation of wireless signals such as unguided (or unbounded) electromagnetic waves that decrease in intensity inversely by the square of the distance traveled by the unguided electromagnetic waves, guided electromagnetic waves can propagate along a transmission medium with less loss in magnitude per unit distance than experienced by unguided electromagnetic waves.

Unlike electrical signals, guided electromagnetic waves can propagate from a sending device to a receiving device without requiring a separate electrical return path between the sending device and the receiving device. As a consequence, guided electromagnetic waves can propagate from a sending device to a receiving device along a transmission medium having no conductive components (e.g., a dielectric strip), or via a transmission medium having no more than a single conductor (e.g., a single bare wire or insulated wire). Even if a transmission medium includes one or more conductive components and the guided electromagnetic waves propagating along the transmission medium generate currents that flow in the one or more conductive components in a direction of the guided electromagnetic waves, such guided electromagnetic waves can propagate along the transmission medium from a sending device to a receiving device without requiring a flow of opposing currents on an electrical return path between the sending device and the receiving device.

In a non-limiting illustration, consider electrical systems that transmit and receive electrical signals between sending and receiving devices by way of conductive media. Such systems generally rely on electrically separate forward and return paths. For instance, consider a coaxial cable having a center conductor and a ground shield that are separated by an insulator. Typically, in an electrical system a first terminal of a sending (or receiving) device can be connected to the center conductor, and a second terminal of the sending (or receiving) device can be connected to the ground shield. If the sending device injects an electrical signal in the center conductor via the first terminal, the electrical signal will propagate along the center conductor causing forward currents in the center conductor, and return currents in the ground shield. The same conditions apply for a two terminal receiving device.

In contrast, consider a waveguide system such as described in the subject disclosure, which can utilize different embodiments of a transmission medium (including among others a coaxial cable) for transmitting guided electromagnetic waves without an electrical return path. In one embodiment, for example, the waveguide system of the subject disclosure can be configured to induce guided electromagnetic waves that propagate along an outer surface of a coaxial cable. Although the guided electromagnetic waves will cause forward currents on the ground shield, the guided electromagnetic waves do not require return currents to enable the guided electromagnetic waves to propagate along the outer surface of the coaxial cable. The same can be said of other transmission media used by a waveguide system for the transmission of guided electromagnetic waves. For example, guided electromagnetic waves induced by the waveguide system on an outer surface of a bare wire, or an insulated wire can propagate along the bare wire or the insulated bare wire without an electrical return path.

Consequently, electrical systems that require two or more conductors for carrying forward and reverse currents on separate conductors to enable the propagation of electrical signals injected by a sending device are distinct from waveguide systems that induce guided electromagnetic waves on an interface of a transmission medium without the need of an electrical return path to enable the propagation of the guided electromagnetic waves along the interface of the transmission medium.

It is further noted that guided electromagnetic waves as described in the subject disclosure can have an electromagnetic field structure that lies primarily or substantially outside of a transmission medium so as to be bound to or guided by the transmission medium and so as to propagate non-trivial distances on or along an outer surface of the transmission medium. In other embodiments, guided electromagnetic waves can have an electromagnetic field structure that lies primarily or substantially inside a transmission medium so as to be bound to or guided by the transmission medium and so as to propagate non-trivial distances within the transmission medium. In other embodiments, guided electromagnetic waves can have an electromagnetic field structure that lies partially inside and partially outside a transmission medium so as to be bound to or guided by the transmission medium and so as to propagate non-trivial distances along the transmission medium.

As used herein, the term "millimeter-wave" can refer to electromagnetic waves that fall within the "millimeter-wave frequency band" of 30 GHz to 300 GHz. The term "microwave" can refer to electromagnetic waves that fall within the "microwave frequency band" of 300 MHz to 300 GHz.

As used herein, the term "antenna" can refer to a device that is part of a transmitting or receiving system to radiate or receive wireless signals.

Figure 21:
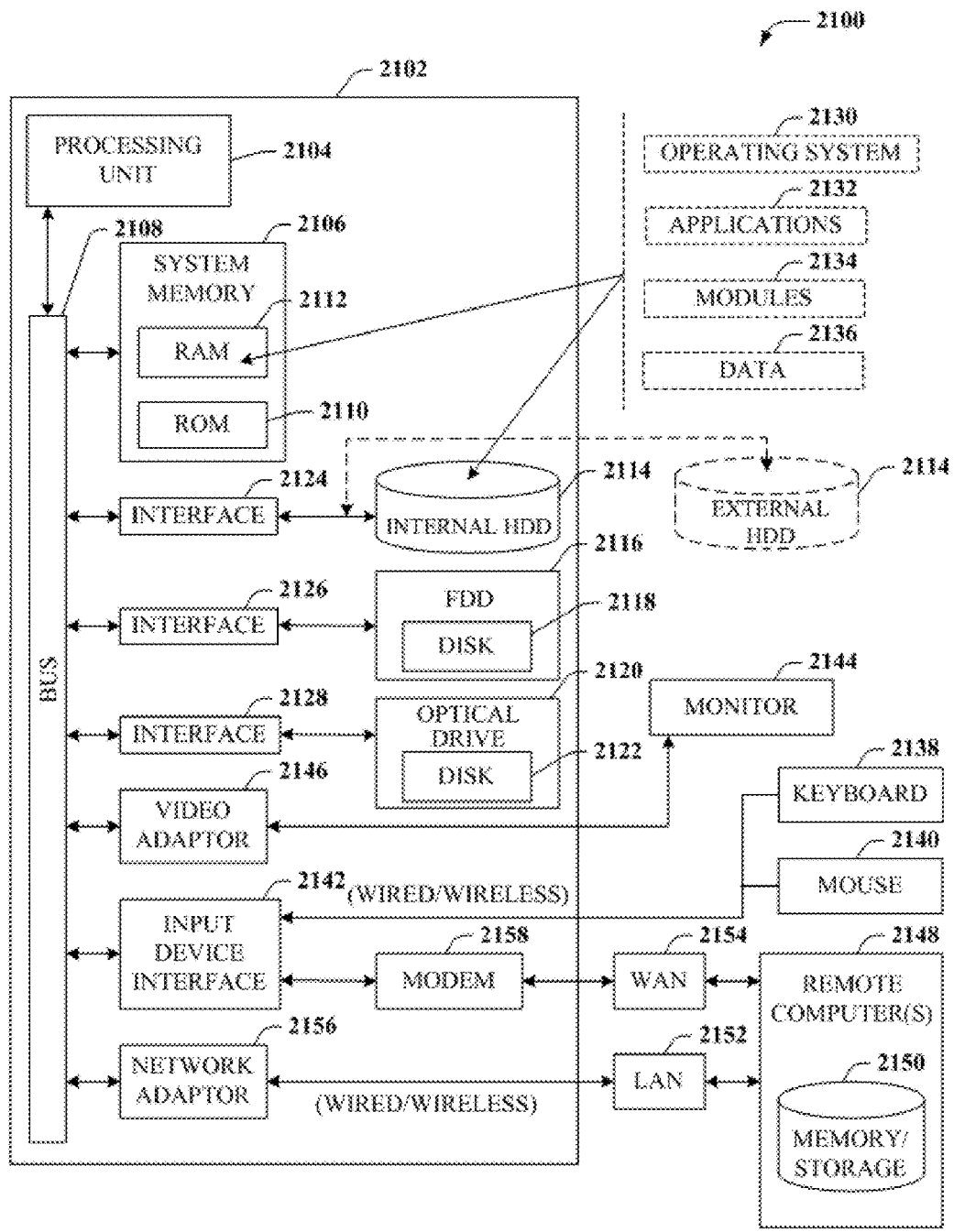
FIG. 21 is a block diagram of an example, non-limiting embodiment of a computing environment in accordance with various aspects described herein.

Referring now to FIG. 21, there is illustrated a block diagram of a computing environment in accordance with various aspects described herein. In order to provide additional context for various embodiments of the embodiments described herein, FIG. 21 and the following discussion are intended to provide a brief, general description of a suitable computing environment 2100 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes processor as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 21, the example environment 2100 for transmitting and receiving signals via or forming at least part of a base station (e.g., base station devices 102, 104, or 520) or central office (e.g., central office 101, 1411, or 2000). At least a portion of the example environment 2100 can also be used for repeater devices (e.g., repeater devices 710, or 806). The example environment can comprise a computer 2102, the computer 2102 comprising a processing unit 2104, a system memory 2106 and a system bus 2108. The system bus 2108 couples system components including, but not limited to, the system memory 2106 to the processing unit 2104. The processing unit 2104 can be any of various commercially available processors. Dual microprocessors and other multiprocessor architectures can also be employed as the processing unit 2104.

The system bus 2108 can be any of several types of bus structure that can further interconnect to a memory bus (with or without a memory controller), a peripheral bus, and a local bus using any of a variety of commercially available bus architectures. The system memory 2106 comprises ROM 2110 and RAM 2112. A basic input/output system (BIOS) can be stored in a non-volatile memory such as ROM, erasable programmable read only memory (EPROM), EEPROM, which BIOS contains the basic routines that help to transfer information between elements within the computer 2102, such as during startup. The RAM 2112 can also comprise a high-speed RAM such as static RAM for caching data.

The computer 2102 further comprises an internal hard disk drive (HDD) 2114 (e.g., EIDE, SATA), which internal hard disk drive 2114 can also be configured for external use in a suitable chassis (not shown), a magnetic floppy disk drive (FDD) 2116, (e.g., to read from or write to a removable diskette 2118) and an optical disk drive 2120, (e.g., reading a CD-ROM disk 2122 or, to read from or write to other high capacity optical media such as the DVD). The hard disk drive 2114, magnetic disk drive 2116 and optical disk drive 2120 can be connected to the system bus 2108 by a hard disk drive interface 2124, a magnetic disk drive interface 2126 and an optical drive interface 2128, respectively. The interface 2124 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2102, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 2112, comprising an operating system 2130, one or more application programs 2132, other program modules 2134 and program data 2136. All or portions of the operating system, applications, modules, and/or data can also be cached in the RAM 2112. The systems and methods described herein can be implemented utilizing various commercially available operating systems or combinations of operating systems. Examples of application programs 2132 that can be implemented and otherwise executed by processing unit 2104 include the diversity selection determining performed by repeater device 806. Base station device 508 shown in FIG. 5A, also has stored on memory many applications and programs that can be executed by processing unit 2104 in this exemplary computing environment 2100.

A user can enter commands and information into the computer 2102 through one or more wired/wireless input devices, e.g., a keyboard 2138 and a pointing device, such as a mouse 2140. Other input devices (not shown) can comprise a microphone, an infrared (IR) remote control, a joystick, a game pad, a stylus pen, touch screen or the like. These and other input devices are often connected to the processing unit 2104 through an input device interface 2142 that can be coupled to the system bus 2108, but can be connected by other interfaces, such as a parallel port, an IEEE 1394 serial port, a game port, a universal serial bus (USB) port, an IR interface, etc.

A monitor 2144 or other type of display device can be also connected to the system bus 2108 via an interface, such as a video adapter 2146. It will also be appreciated that in alternative embodiments, a monitor 2144 can also be any display device (e.g., another computer having a display, a smart phone, a tablet computer, etc.) for receiving display information associated with computer 2102 via any communication means, including via the Internet and cloud-based networks. In addition to the monitor 2144, a computer typically comprises other peripheral output devices (not shown), such as speakers, printers, etc.

The computer 2102 can operate in a networked environment using logical connections via wired and/or wireless communications to one or more remote computers, such as a remote computer(s) 2148. The remote computer(s) 2148 can be a workstation, a server computer, a router, a personal computer, portable computer, microprocessor-based entertainment appliance, a peer device or other common network node, and typically comprises many or all of the elements described relative to the computer 2102, although, for purposes of brevity, only a memory/storage device 2150 is illustrated. The logical connections depicted comprise wired/wireless connectivity to a local area network (LAN) 2152 and/or larger networks, e.g., a wide area network (WAN) 2154. Such LAN and WAN networking environments are commonplace in offices and companies, and facilitate enterprise-wide computer networks, such as intranets, all of which can connect to a global communications network, e.g., the Internet.

When used in a LAN networking environment, the computer 2102 can be connected to the local network 2152 through a wired and/or wireless communication network interface or adapter 2156. The adapter 2156 can facilitate wired or wireless communication to the LAN 2152, which can also comprise a wireless AP disposed thereon for communicating with the wireless adapter 2156.

When used in a WAN networking environment, the computer 2102 can comprise a modem 2158 or can be connected to a communications server on the WAN 2154 or has other means for establishing communications over the WAN 2154, such as by way of the Internet. The modem 2158, which can be internal or external and a wired or wireless device, can be connected to the system bus 2108 via the input device interface 2142. In a networked environment, program modules depicted relative to the computer 2102 or portions thereof, can be stored in the remote memory/storage device 2150. It will be appreciated that the network connections shown are example and other means of establishing a communications link between the computers can be used.

The computer 2102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 22:
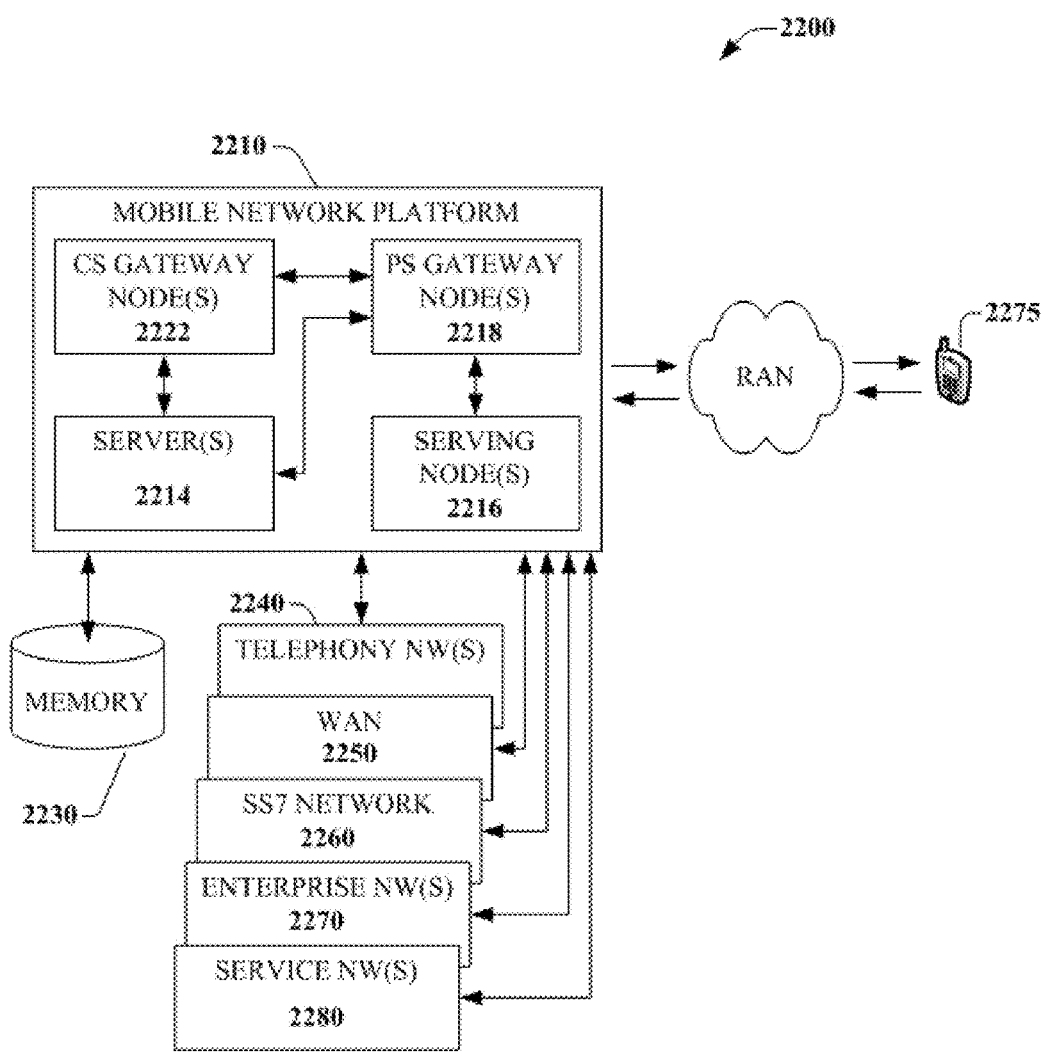
FIG. 22 is a block diagram of an example, non-limiting embodiment of a mobile network platform in accordance with various aspects described herein.

FIG. 22 presents an example embodiment 2200 of a mobile network platform 2210 that can implement and exploit one or more aspects of the disclosed subject matter described herein. In one or more embodiments, the mobile network platform 2210 can generate and receive signals transmitted and received by base stations (e.g., base station devices 102, 104 or 520), central office (e.g., central office 101, 1411, or 2000), or repeater devices (e.g., repeater devices 710, or 806) associated with the disclosed subject matter. Generally, wireless network platform 2210 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 2210 can be included in telecommunications carrier networks, and can be considered carrier-side components as discussed elsewhere herein. Mobile network platform 2210 comprises CS gateway node(s) 2212 which can interface CS traffic received from legacy networks like telephony network(s) 2240 (e.g., public switched telephone network (PSTN), or public land mobile network (PLMN)) or a signaling system #7 (SS7) network 2270. Circuit switched gateway node(s) 2212 can authorize and authenticate traffic (e.g., voice) arising from such networks. Additionally, CS gateway node(s) 2212 can access mobility, or roaming, data generated through SS7 network 2270; for instance, mobility data stored in a visited location register (VLR), which can reside in memory 2230. Moreover, CS gateway node(s) 2212 interfaces CS-based traffic and signaling and PS gateway node(s) 2218. As an example, in a 3GPP UMTS network, CS gateway node(s) 2212 can be realized at least in part in gateway GPRS support node(s) (GGSN). It should be appreciated that functionality and specific operation of CS gateway node(s) 2212, PS gateway node(s) 2218, and serving node(s) 2216, is provided and dictated by radio technology(ies) utilized by mobile network platform 2210 for telecommunication.

In addition to receiving and processing CS-switched traffic and signaling, PS gateway node(s) 2218 can authorize and authenticate PS-based data sessions with served mobile devices. Data sessions can comprise traffic, or content(s), exchanged with networks external to the wireless network platform 2210, like wide area network(s) (WANs) 2250, enterprise network(s) 2270, and service network(s) 2280, which can be embodied in local area network(s) (LANs), can also be interfaced with mobile network platform 2210 through PS gateway node(s) 2218. It is to be noted that WANs 2250 and enterprise network(s) 2260 can embody, at least in part, a service network(s) like IP multimedia subsystem (IMS). Based on radio technology layer(s) available in technology resource(s) 2217, packet-switched gateway node(s) 2218 can generate packet data protocol contexts when a data session is established; other data structures that facilitate routing of packetized data also can be generated. To that end, in an aspect, PS gateway node(s) 2218 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 2200, wireless network platform 2210 also comprises serving node(s) 2216 that, based upon available radio technology layer(s) within technology resource(s) 2217, convey the various packetized flows of data streams received through PS gateway node(s) 2218. It is to be noted that for technology resource(s) 2217 that rely primarily on CS communication, server node(s) can deliver traffic without reliance on PS gateway node(s) 2218; for example, server node(s) can embody at least in part a mobile switching center. As an example, in a 3GPP UMTS network, serving node(s) 2216 can be embodied in serving GPRS support node(s) (SGSN).

For radio technologies that exploit packetized communication, server(s) 2214 in wireless network platform 2210 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by wireless network platform 2210. Data streams (e.g., content(s) that are part of a voice call or data session) can be conveyed to PS gateway node(s) 2218 for authorization/authentication and initiation of a data session, and to serving node(s) 2216 for communication thereafter. In addition to application server, server(s) 2214 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 2210 to ensure network's operation and data integrity in addition to authorization and authentication procedures that CS gateway node(s) 2212 and PS gateway node(s) 2218 can enact. Moreover, provisioning server(s) can provision services from external network(s) like networks operated by a disparate service provider; for instance, WAN 2250 or Global Positioning System (GPS) network(s) (not shown). Provisioning server(s) can also provision coverage through networks associated to wireless network platform 2210 (e.g., deployed and operated by the same service provider), such as the distributed antennas networks shown in FIG. 1(*s*) that enhance wireless service coverage by providing more network coverage. Repeater devices such as those shown in FIGS. 7, 8, and 9 also improve network coverage in order to enhance subscriber service experience by way of UE 2275.

It is to be noted that server(s) 2214 can comprise one or more processors configured to confer at least in part the functionality of macro network platform 2210. To that end, the one or more processor can execute code instructions stored in memory 2230, for example. It is should be appreciated that server(s) 2214 can comprise a content manager 2215, which operates in substantially the same manner as described hereinbefore.

In example embodiment 2200, memory 2230 can store information related to operation of wireless network platform 2210. Other operational information can comprise provisioning information of mobile devices served through wireless platform network 2210, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 2230 can also store information from at least one of telephony network(s) 2240, WAN 2250, enterprise network(s) 2260, or SS7 network 2270. In an aspect, memory 2230 can be, for example, accessed as part of a data store component or as a remotely connected memory store.

In order to provide a context for the various aspects of the disclosed subject matter, FIG. 22, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 23:
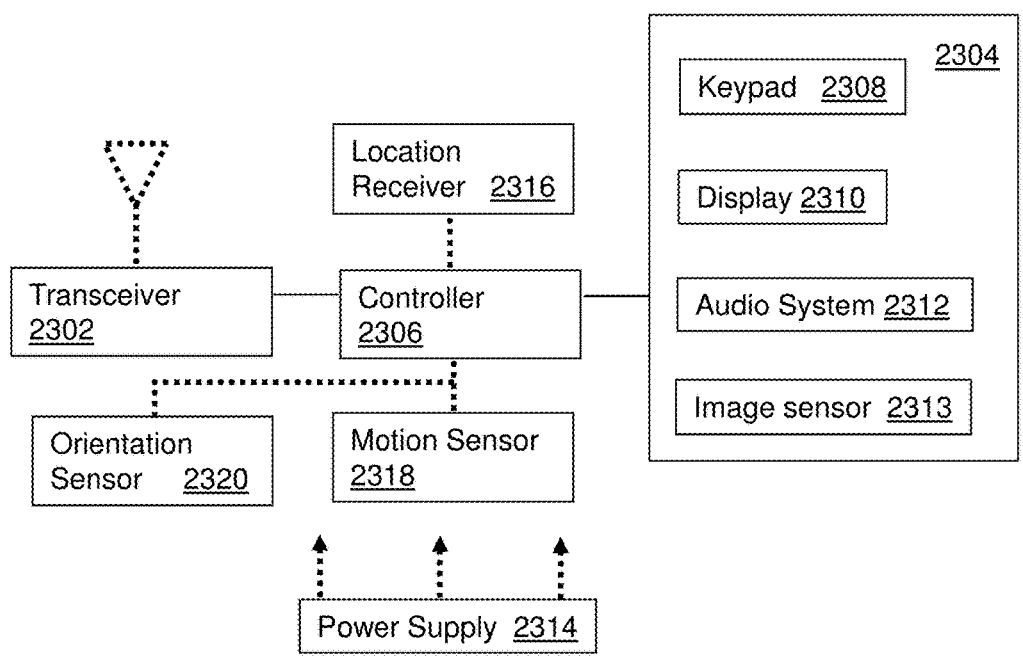
FIG. 23 is a block diagram of an example, non-limiting embodiment of a communication device in accordance with various aspects described herein.

FIG. 23 depicts an illustrative embodiment of a communication device 2300. The communication device 2300 can serve as an illustrative embodiment of devices such as mobile devices and in-building devices referred to by the subject disclosure (e.g., in FIGS. 1 and 14).

The communication device 2300 can comprise a wireline and/or wireless transceiver 2302 (herein transceiver 2302), a user interface (UI) 2304, a power supply 2314, a location receiver 2316, a motion sensor 2318, an orientation sensor 2320, and a controller 2306 for managing operations thereof. The transceiver 2302 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 2302 can also be adapted to support circuit-switched wireline access technologies (such as PSTN), packet-switched wireline access technologies (such as TCP/IP, VoIP, etc.), and combinations thereof.

The UI 2304 can include a depressible or touch-sensitive keypad 2308 with a navigation mechanism such as a roller ball, a joystick, a mouse, or a navigation disk for manipulating operations of the communication device 2300. The keypad 2308 can be an integral part of a housing assembly of the communication device 2300 or an independent device operably coupled thereto by a tethered wireline interface (such as a USB cable) or a wireless interface supporting for example Bluetooth®. The keypad 2308 can represent a numeric keypad commonly used by phones, and/or a QWERTY keypad with alphanumeric keys. The UI 2304 can further include a display 2310 such as monochrome or color LCD (Liquid Crystal Display), OLED (Organic Light Emitting Diode) or other suitable display technology for conveying images to an end user of the communication device 2300. In an embodiment where the display 2310 is touch-sensitive, a portion or all of the keypad 2308 can be presented by way of the display 2310 with navigation features.

The display 2310 can use touch screen technology to also serve as a user interface for detecting user input. As a touch screen display, the communication device 2300 can be adapted to present a user interface having graphical user interface (GUI) elements that can be selected by a user with a touch of a finger. The touch screen display 2310 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 2310 can be an integral part of the housing assembly of the communication device 2300 or an independent device communicatively coupled thereto by a tethered wireline interface (such as a cable) or a wireless interface.

The UI 2304 can also include an audio system 2312 that utilizes audio technology for conveying low volume audio (such as audio heard in proximity of a human ear) and high volume audio (such as speakerphone for hands free operation). The audio system 2312 can further include a microphone for receiving audible signals of an end user. The audio system 2312 can also be used for voice recognition applications. The UI 2304 can further include an image sensor 2313 such as a charged coupled device (CCD) camera for capturing still or moving images.

The power supply 2314 can utilize common power management technologies such as replaceable and rechargeable batteries, supply regulation technologies, and/or charging system technologies for supplying energy to the components of the communication device 2300 to facilitate long-range or short-range portable communications. Alternatively, or in combination, the charging system can utilize external power sources such as DC power supplied over a physical interface such as a USB port or other suitable tethering technologies.

The location receiver 2316 can utilize location technology such as a global positioning system (GPS) receiver capable of assisted GPS for identifying a location of the communication device 2300 based on signals generated by a constellation of GPS satellites, which can be used for facilitating location services such as navigation. The motion sensor 2318 can utilize motion sensing technology such as an accelerometer, a gyroscope, or other suitable motion sensing technology to detect motion of the communication device 2300 in three-dimensional space. The orientation sensor 2320 can utilize orientation sensing technology such as a magnetometer to detect the orientation of the communication device 2300 (north, south, west, and east, as well as combined orientations in degrees, minutes, or other suitable orientation metrics).

The communication device 2300 can use the transceiver 2302 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 2306 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 2300.

Other components not shown in FIG. 23 can be used in one or more embodiments of the subject disclosure. For instance, the communication device 2300 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used to determine positions around a wire that dielectric waveguides 604 and 606 should be placed in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, $x=(x1, x2, x3, x4, \ldots, xn)$, to a confidence that the input belongs to a class, that is, $f(x)=confidence$ (class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," "subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A method, comprising:
    detecting, by a waveguide system comprising a processing circuit, a fault in operations of the waveguide system, wherein the detecting comprises determining a timer has expired before receiving a signal from the processing circuit of the waveguide system; and
    enabling, by the waveguide system, a bypass mode of a bypass circuit responsive to the detecting the fault, wherein subsequent to the bypass mode being enabled, electromagnetic waves propagating along a surface of a transmission medium bypass the waveguide system, wherein during the bypass mode the waveguide system is disabled from processing the electromagnetic waves propagating along the surface of the transmission medium, and wherein the bypass mode is enabled upon expiration of the timer.

2. The method of claim 1, wherein the waveguide system comprises a coupling device that facilitates transmission or reception of the electromagnetic waves that propagate along the surface of the transmission medium.

3. The method of claim 2, wherein the bypass circuit disables the coupling device by relocating the coupling device to a position away from the transmission medium.

4. The method of claim 1, wherein the bypass circuit comprises an electromechanical device.

5. The method of claim 4, wherein transmission or reception of the electromagnetic waves by the waveguide system is disabled by the bypass circuit when the timer expires.

6. The method of claim 1, further comprising ceasing to send a message to one or more other waveguide systems responsive to detecting the fault, wherein the message indicates to the one or more other waveguide systems that the waveguide system is operating properly.

7. The method of claim 6, wherein the one or more other waveguide systems adjust a transmission of the electromagnetic waves responsive to not receiving the message from the waveguide system during a predetermined schedule.

8. The method of claim 7, wherein the one or more other waveguide systems adjust a transmission of the electromagnetic waves by modifying a transmission rate of data transported by the electromagnetic waves.

9. The method of claim 1, further comprising ceasing to send a message to a network management system responsive to the detecting the fault, wherein the message indicates to the network management system that the waveguide system is operating properly.

10. The method of claim 9, wherein the network management system detects the fault in the waveguide system responsive to not receiving the message from the waveguide system during a predetermined schedule.

11. The method of claim 9, wherein the network management system determines a mitigation strategy to remedy the fault in the waveguide system responsive to not receiving the message from the waveguide system during a predetermined schedule.

12. The method of claim 1, further comprising disabling, by the waveguide system, the bypass mode responsive to the waveguide system completing a power cycle or reset cycle of the waveguide system.

13. The method of claim 1, further comprising disabling, by the waveguide system, the bypass mode responsive to receiving instructions from a network management system that manages operations of a plurality of waveguide systems including the waveguide system.

14. A machine-readable storage medium, comprising executable instructions that, when executed by a processing system of a waveguide system, facilitate performance of operations, the operations comprising A method, comprising:
    detecting a fault in operations of the waveguide system, wherein the detecting comprises determining a timer has expired before receiving a signal from the processing system of the waveguide system; and
    enabling a bypass mode of a bypass circuit responsive to the detecting the fault, wherein subsequent to the bypass mode being enabled, electromagnetic waves propagating along a surface of a transmission medium bypass the waveguide system, wherein during the bypass mode the waveguide system is disabled from processing the electromagnetic waves propagating along the surface of the transmission medium, and wherein the bypass mode is enabled upon expiration of the timer.

15. The machine-readable storage medium of claim 14, wherein the waveguide system comprises a coupling device that facilitates transmission or reception of the electromagnetic waves that propagate along the surface of the transmission medium.

16. The machine-readable storage medium of claim 15, wherein the bypass circuit disables the coupling device by relocating the coupling device to a position away from the transmission medium.

17. A transmission system, comprising:
    a coupling device that facilitates transmission or reception of electromagnetic waves that propagate along a surface of a transmission medium;
    a bypass circuit for disabling the transmission or reception of electromagnetic waves by the coupling device;
    a memory that stores instructions; and
    a processor coupled to the memory, wherein responsive to executing the instructions, the processor performs operations comprising restarting a timer to prevent the bypass circuit from disabling the transmission or reception of electromagnetic waves by the coupling device, wherein when the processor fails to restart the timer the bypass circuit enables a bypass mode that disables the transmission or reception of the electromagnetic waves by the coupling device, wherein during the bypass mode the processor is disabled from processing the electromagnetic waves propagating along the surface of the transmission medium, and wherein the bypass mode is enabled upon expiration of the timer.

18. The transmission system of claim 17, wherein the bypass circuit disables the coupling device by relocating the coupling device to a position that reduces interference by the coupling device on the electromagnetic waves propagating along the surface of the transmission medium.

19. The transmission system of claim 17, wherein the bypass circuit disables the coupling device by configuring the coupling device to redirect the electromagnetic waves received by the coupling device onto the surface of the transmission medium.

20. The transmission system of claim 17, wherein the restarting the timer reinitiates a countdown cycle by the timer, and wherein expiration of the timer signals the bypass circuit that a fault has occurred affecting operations of the transmission system.

* * * * *